United States Patent [19]

Rowell, Jr. et al.

[11] 4,264,958

[45] Apr. 28, 1981

[54] VIDEO PROCESSOR FOR A SPECTRUM ANALYZER

[75] Inventors: Joseph Rowell, Jr., Santa Rosa; Michael S. Marzalek, Cotati; Michael J. Neering, Santa Rosa, all of Calif.

[73] Assignee: Hewlett-Packard Company, Palo Alto, Calif.

[21] Appl. No.: 932,692

[22] Filed: Aug. 10, 1978

[51] Int. Cl.[3] .............................................. G01R 23/00

[52] U.S. Cl. .................................... 364/485; 307/353; 324/77 B; 328/151; 340/709; 340/71 A; 364/518

[58] Field of Search ............... 364/485, 487, 518, 521, 364/576; 324/77 B, 77 D, 77 A; 340/709, 711; 328/138, 141, 155, 151, 115–117; 307/353

[56] References Cited

U.S. PATENT DOCUMENTS

| | | | |
|---|---|---|---|
| 3,614,408 | 10/1971 | Watkin et al. | 364/487 |
| 3,786,351 | 1/1974 | Priebe, Jr. | 324/77 B |
| 3,881,097 | 4/1975 | Lehmann et al. | 324/77 D |
| 4,024,414 | 5/1977 | Gurry | 328/151 |
| 4,086,651 | 4/1978 | Muir et al. | 364/487 |
| 4,143,365 | 3/1979 | Cayzac et al. | 307/353 |

OTHER PUBLICATIONS

"A 5 MHz Digitally Controlled Spectrum Analyzer", Tekscope (USA), vol. 7, No. 3 (1975), pp. 3–7.

*Primary Examiner*—Errol A. Krass

*Attorney, Agent, or Firm*—David A. Boone

[57] ABSTRACT

An input signal is mixed with sampling signals from oscillators which vary the frequency of the sampling signal from a first frequency to a second frequency. The resulting Intermediate Frequency (IF) signal is processed and digital values are stored in a memory in response thereto. Waveforms are then displayed which correspond to these frequency and amplitude values. Various input and display circuits facilitate the display and interpretation of these waveforms.

20 Claims, 151 Drawing Figures

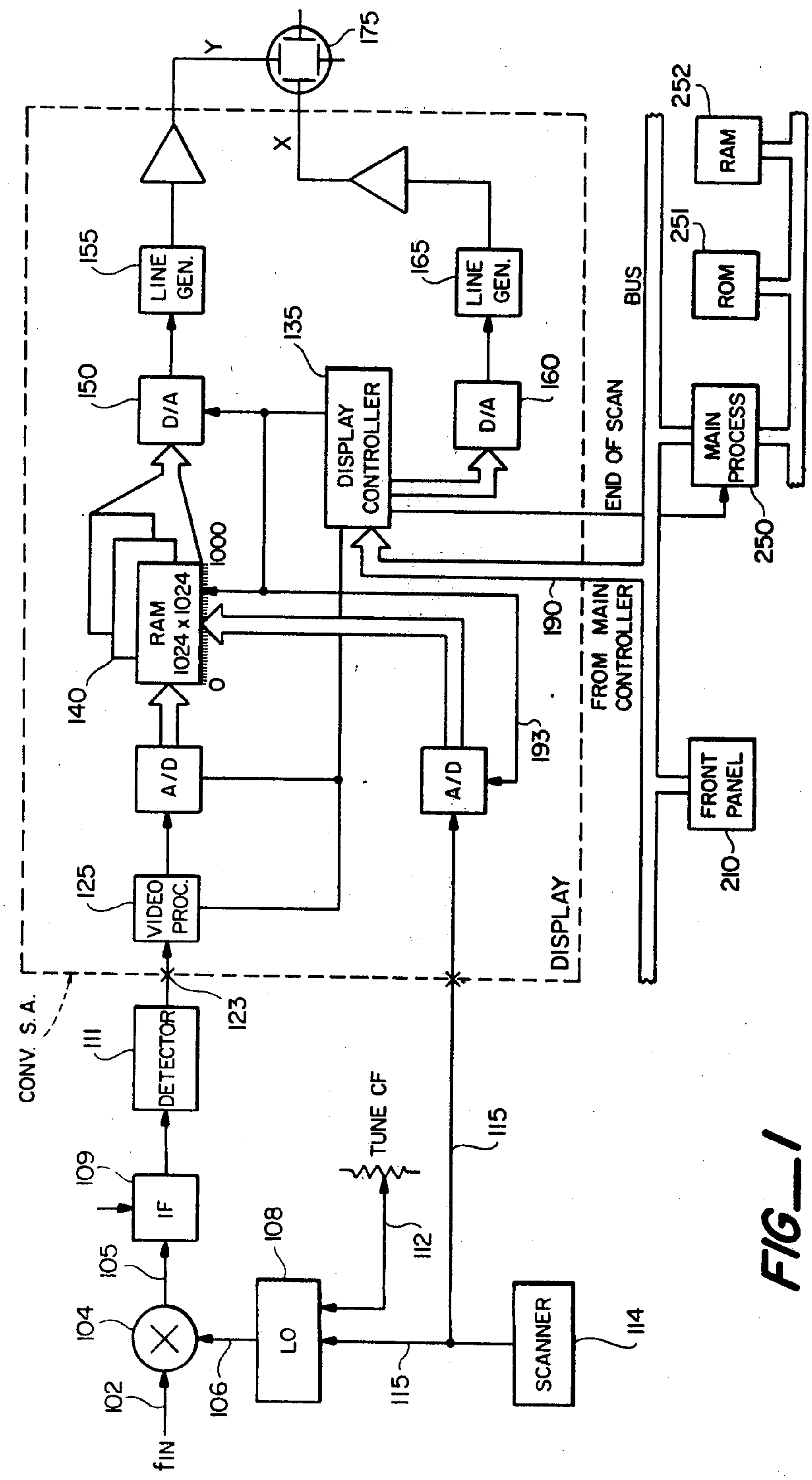
FIG_1

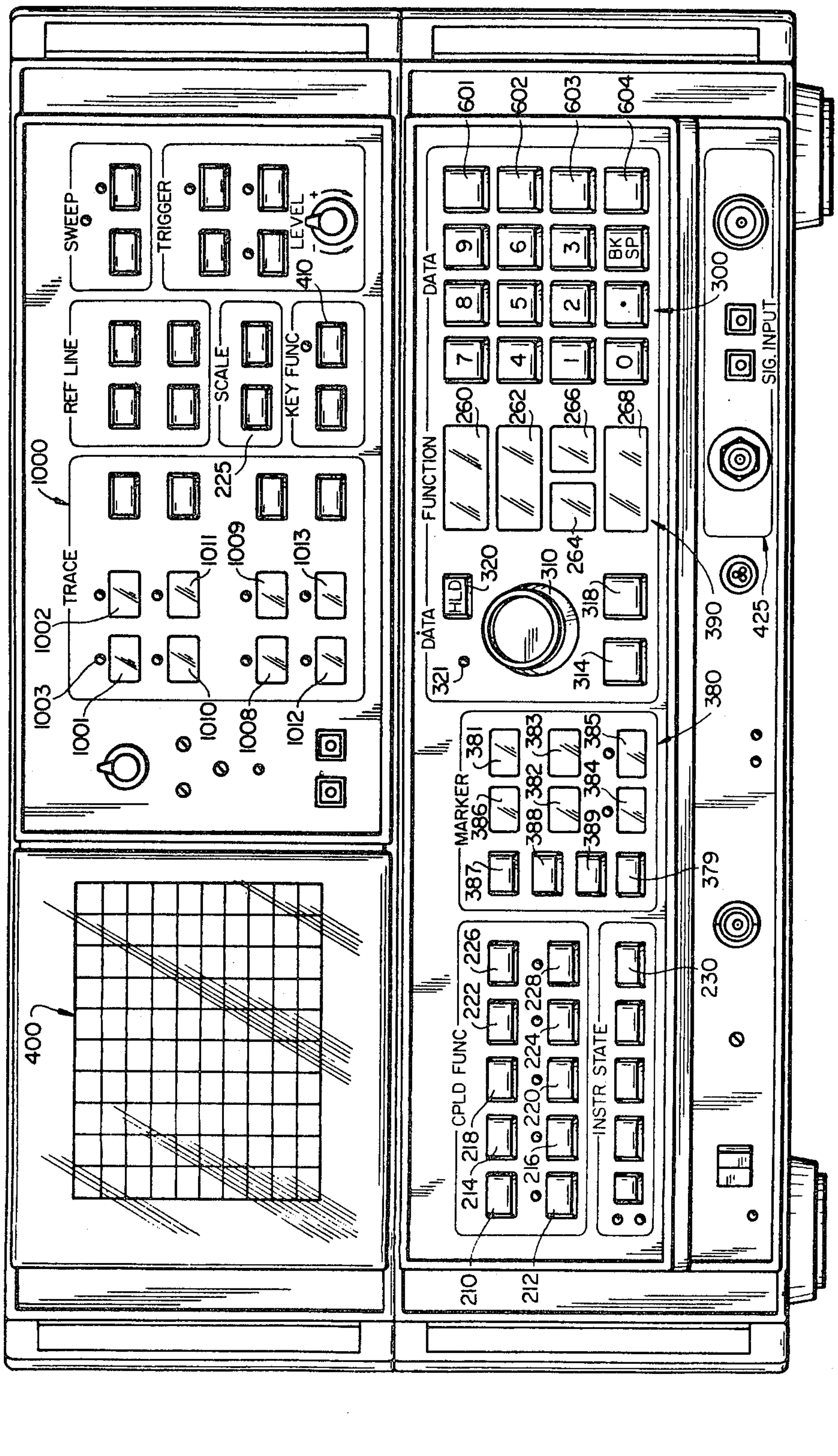
FIG_2

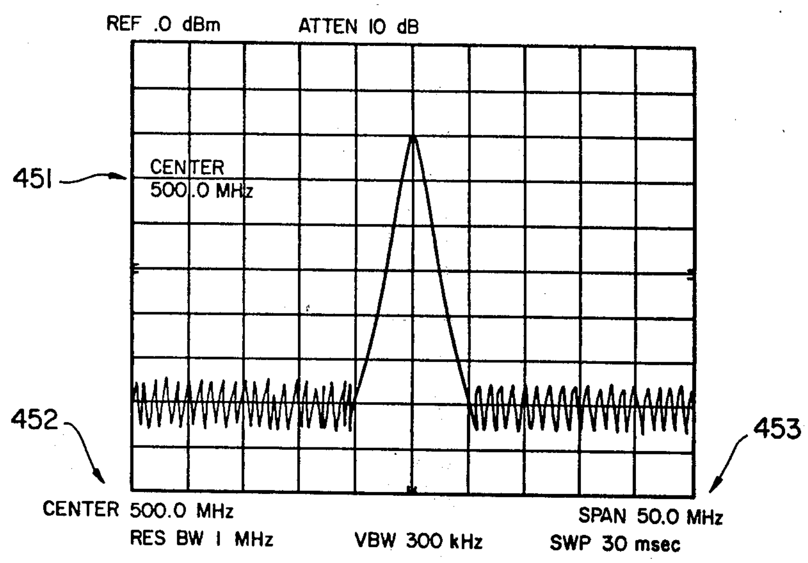
FIG_3
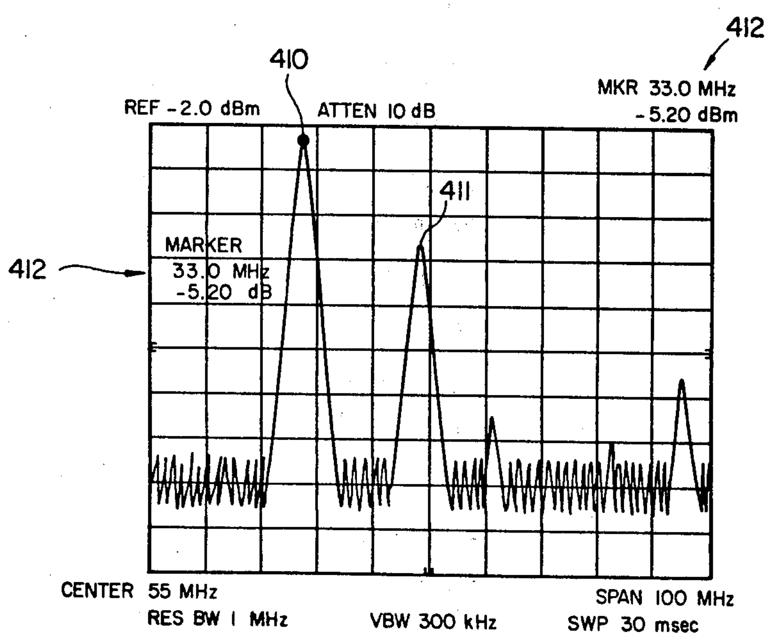
FIG_4

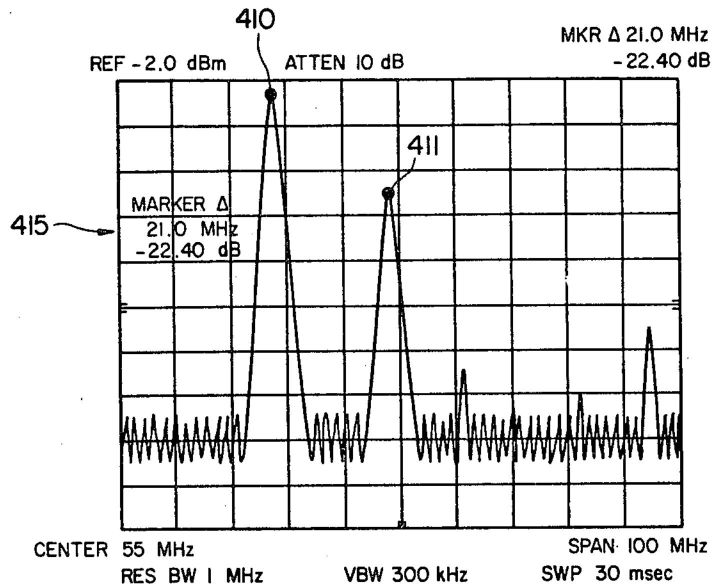
FIG_5
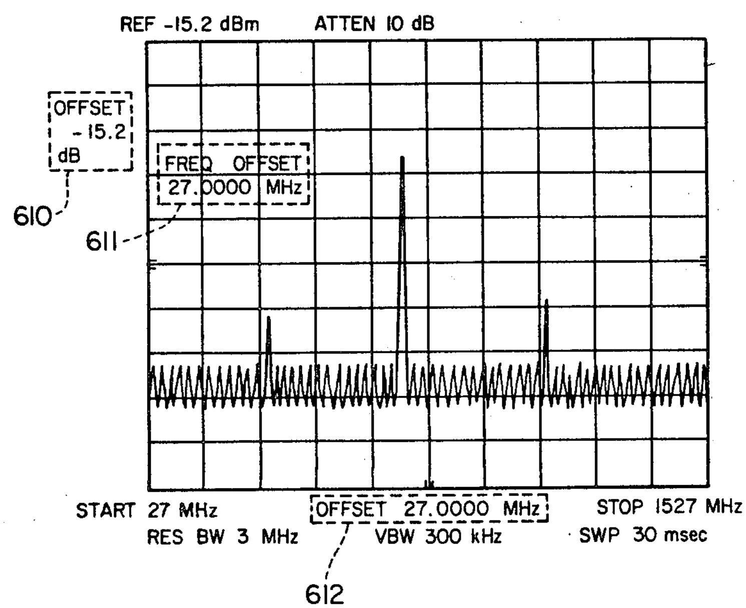
FIG_6

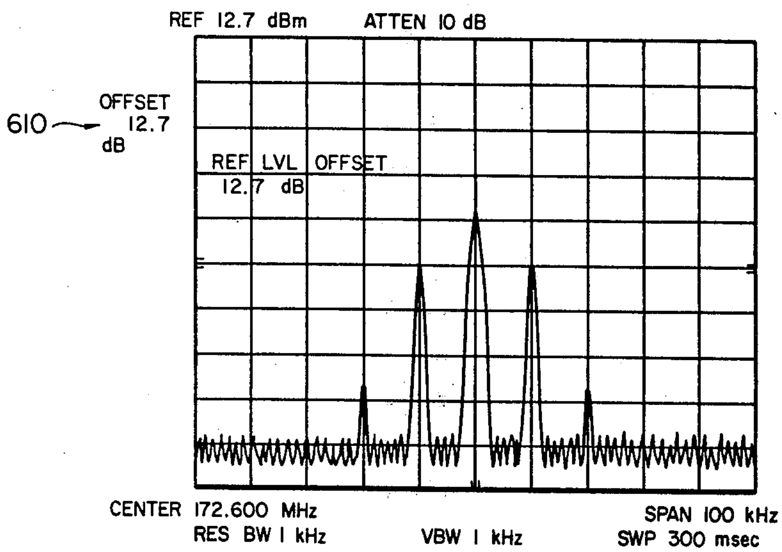
FIG_7
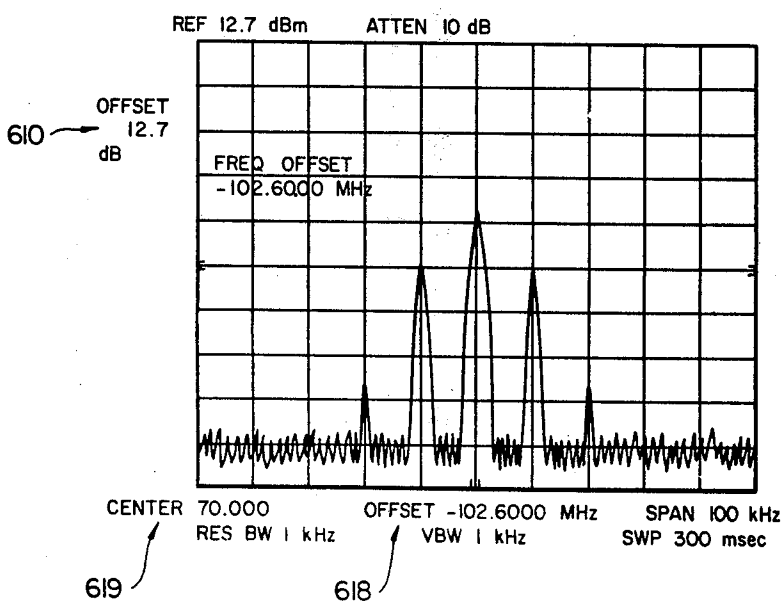
FIG_8

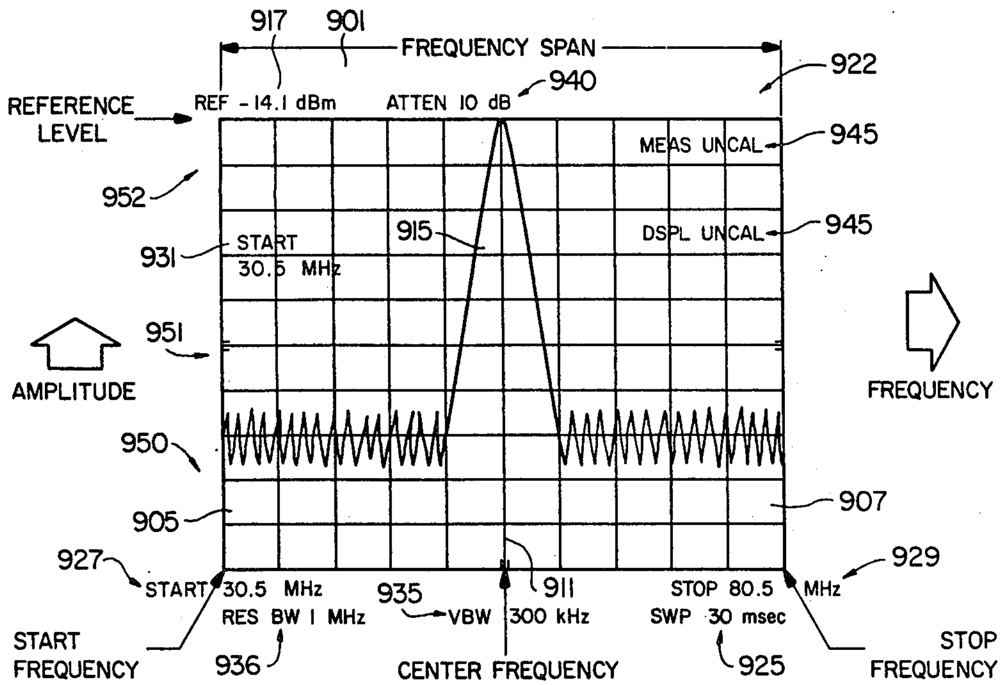
FIG_9
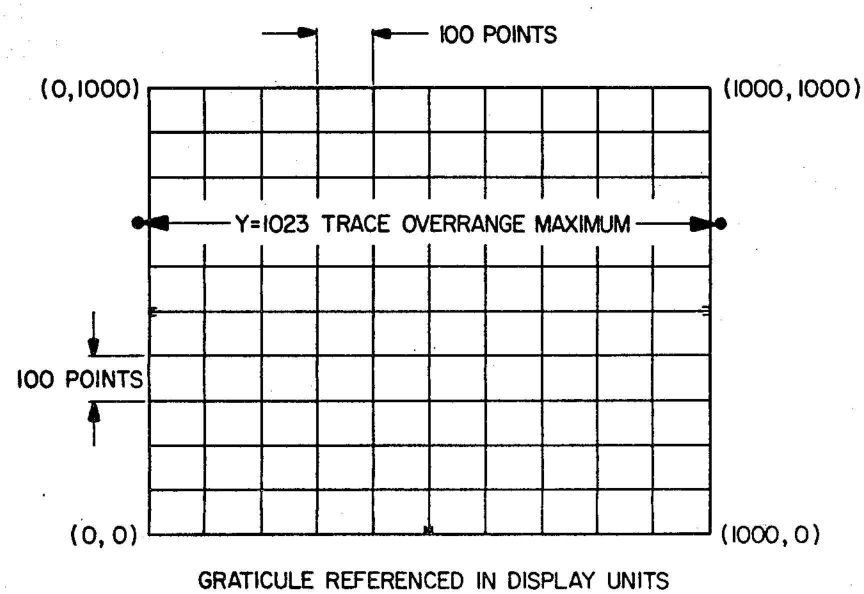
FIG_10

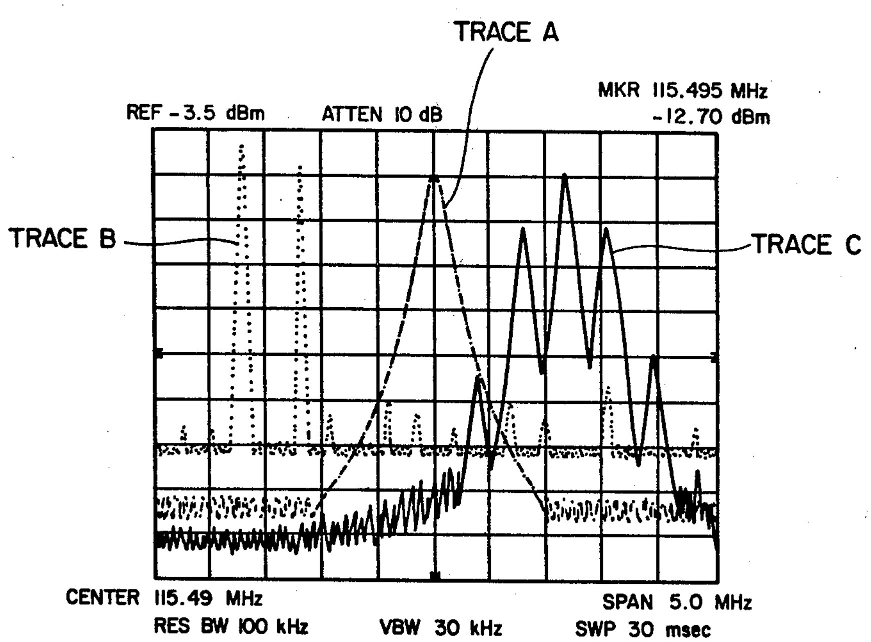
FIG_11
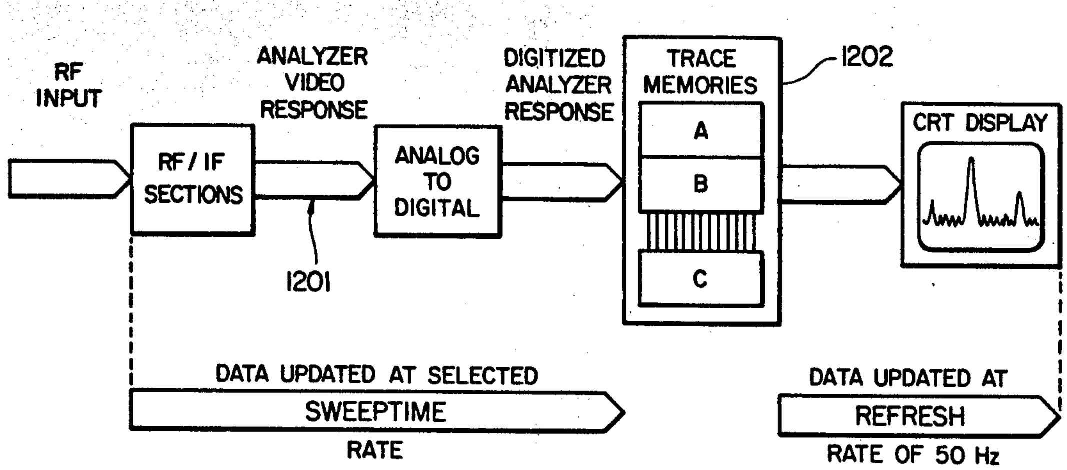
FIG_12

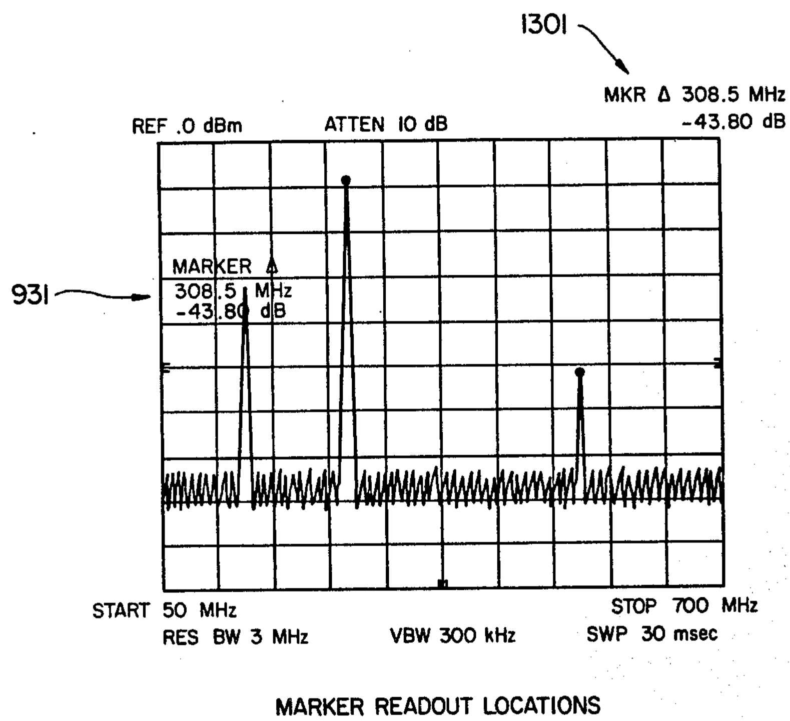
FIG_13

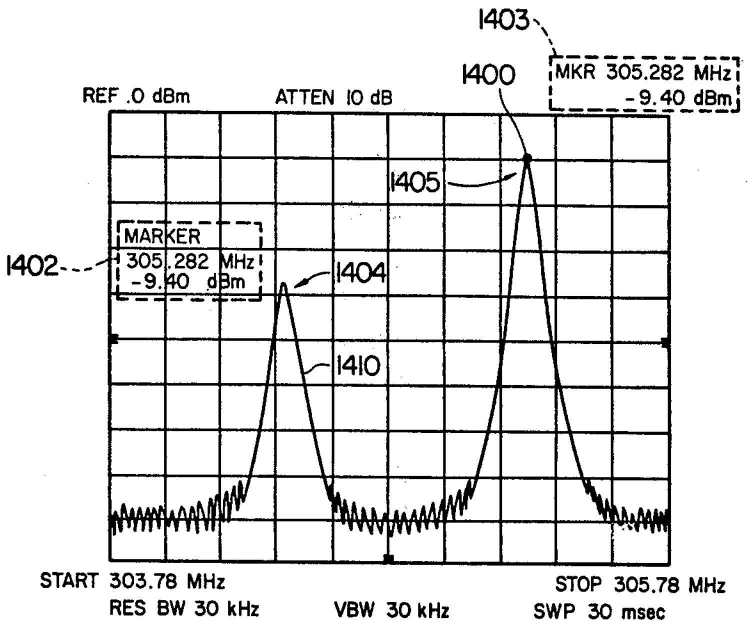
FIG_14A
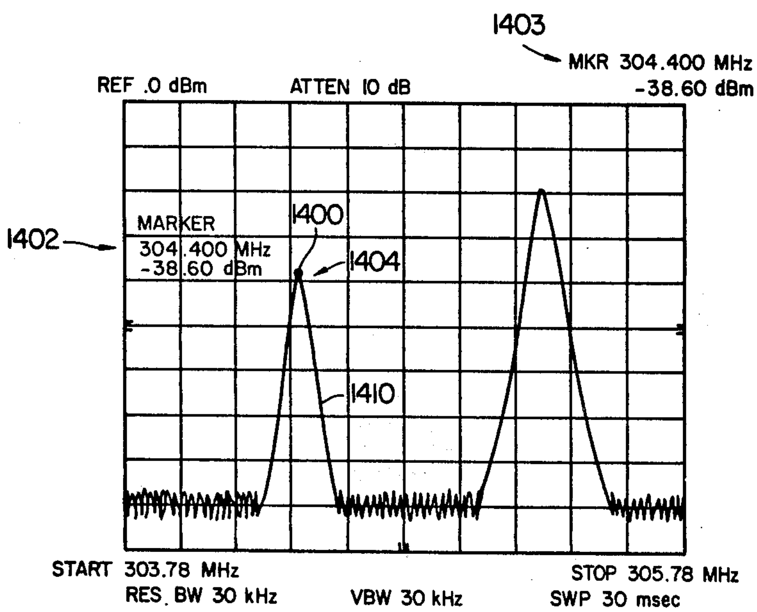
FIG_14B

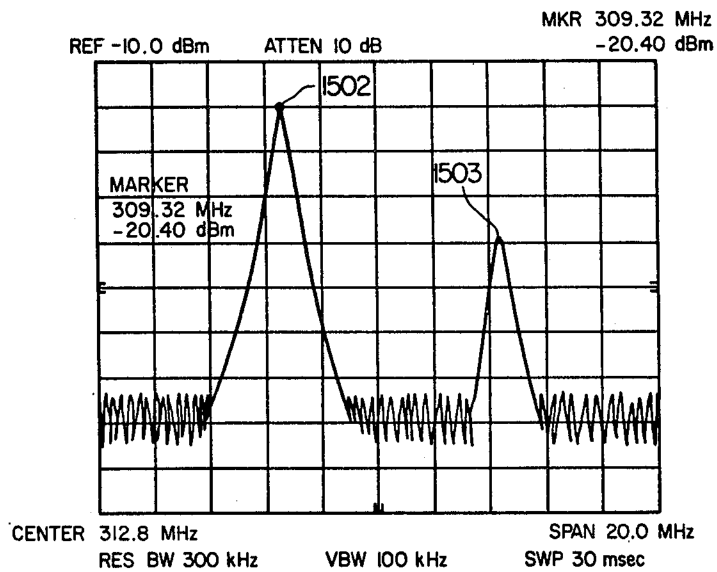
FIG_15A
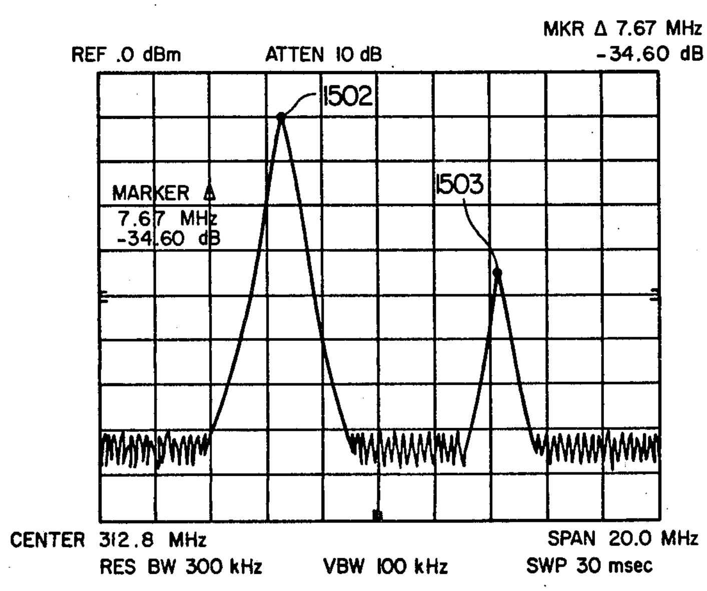
FIG_15B

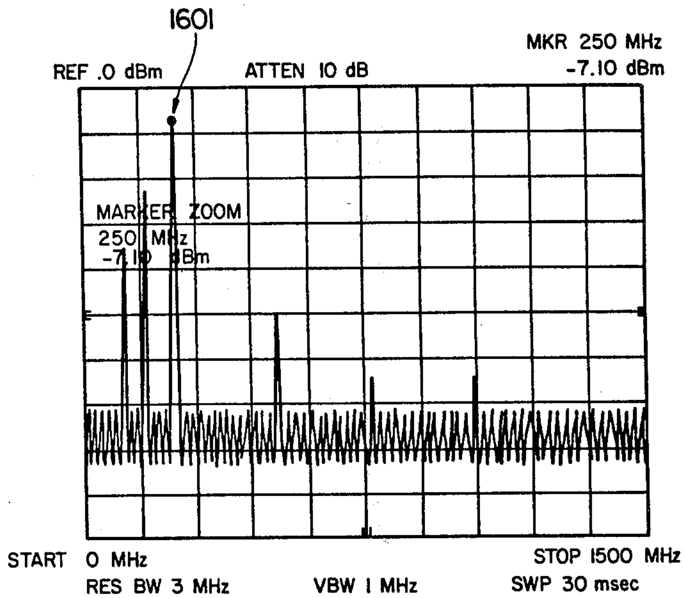
FIG_16A
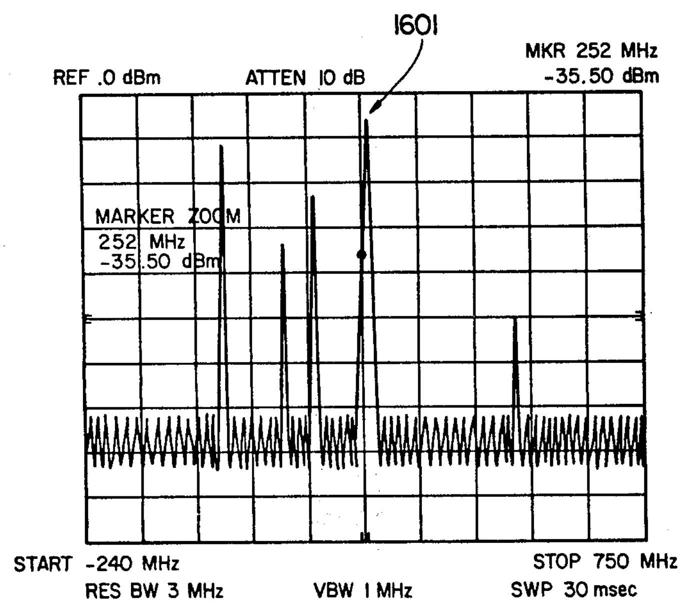
FIG_16B

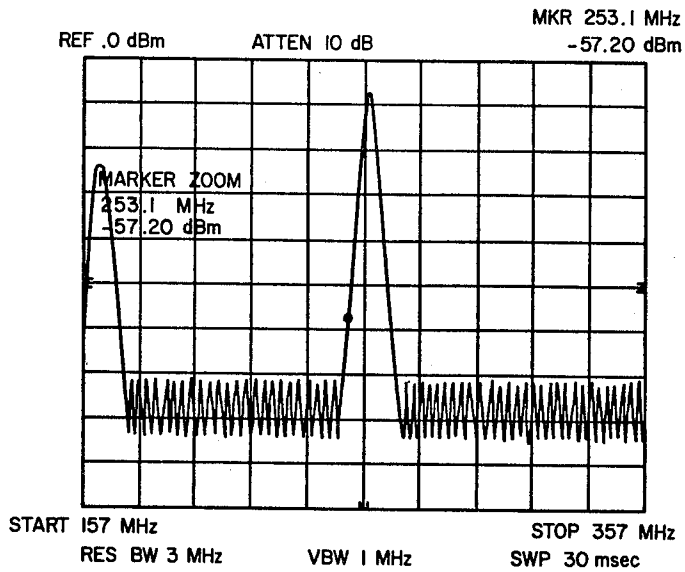
FIG_16C
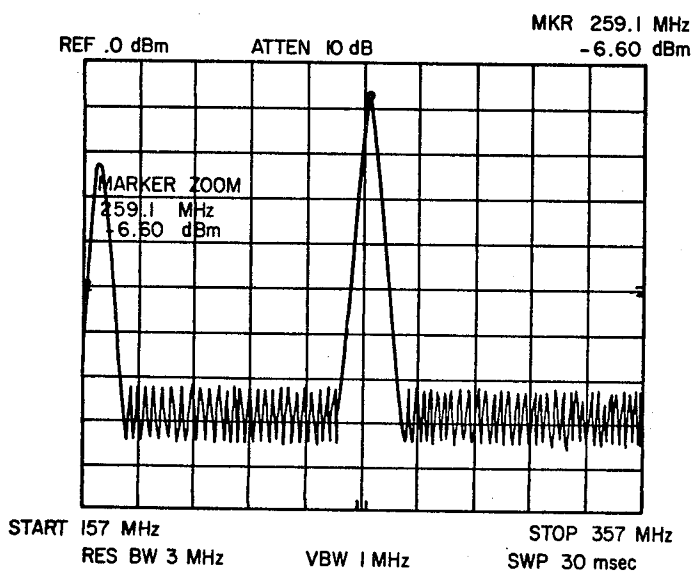
FIG_16D

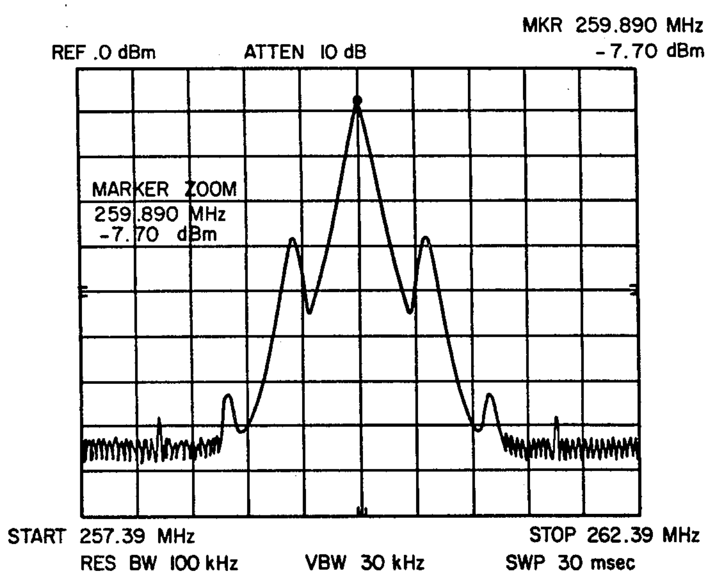
FIG_16E

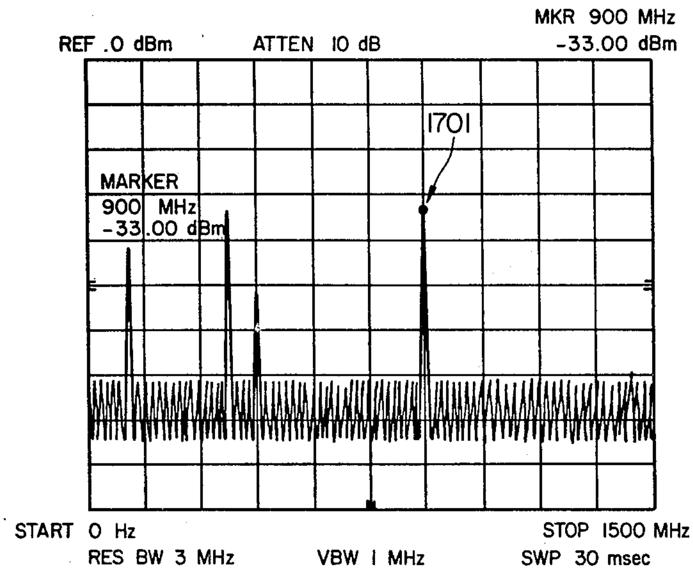
FIG_17A
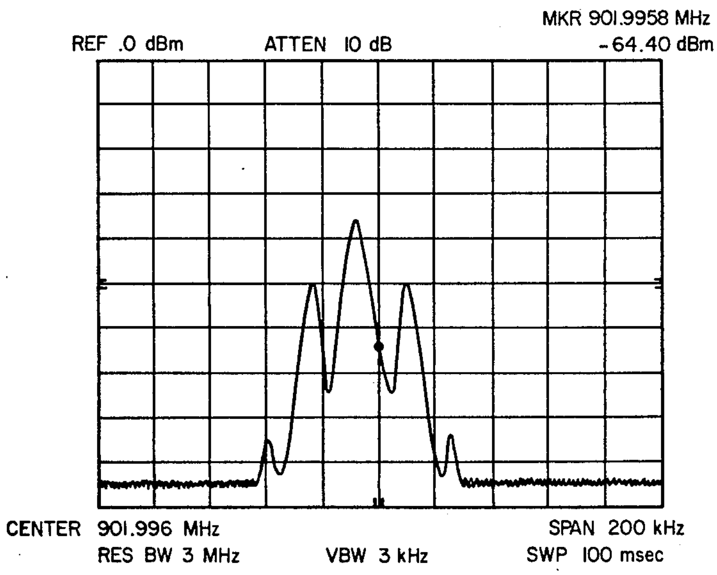
FIG_17B

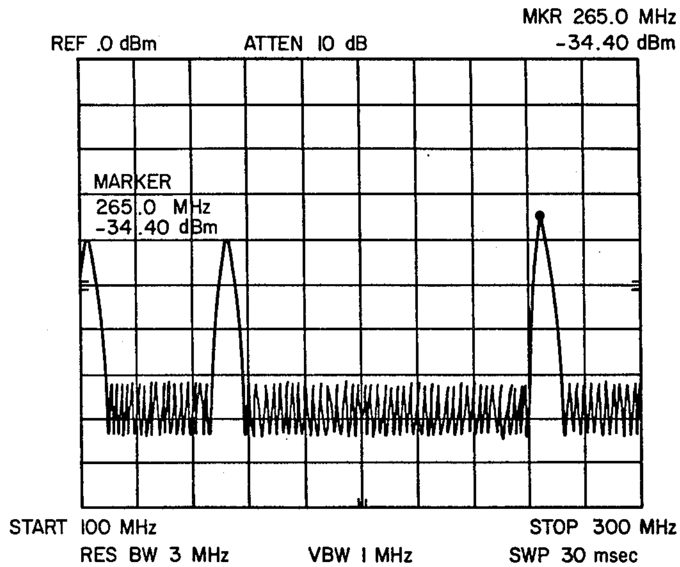
FIG_18A
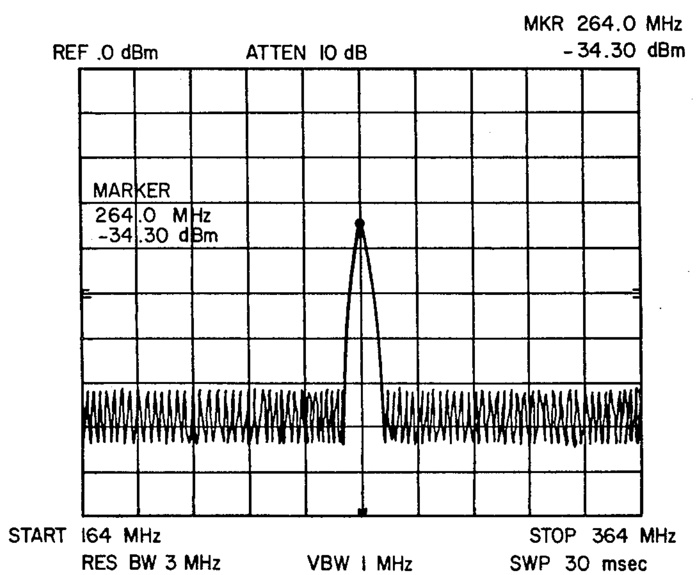
FIG_18B

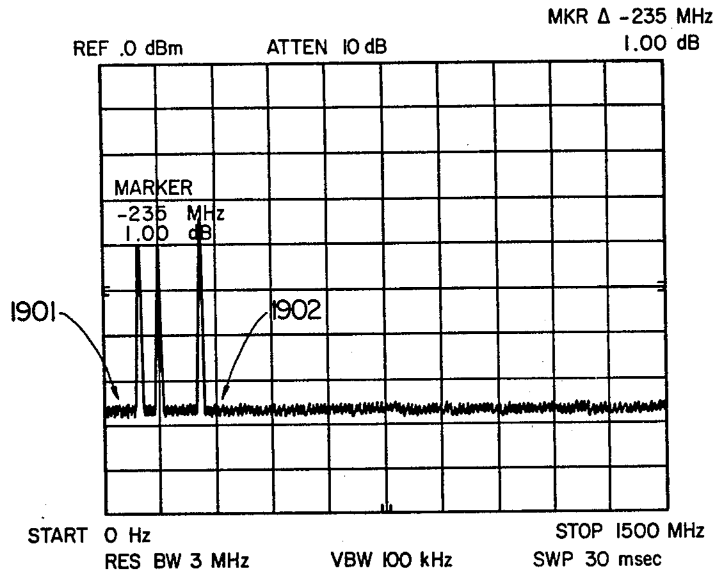
FIG_19A
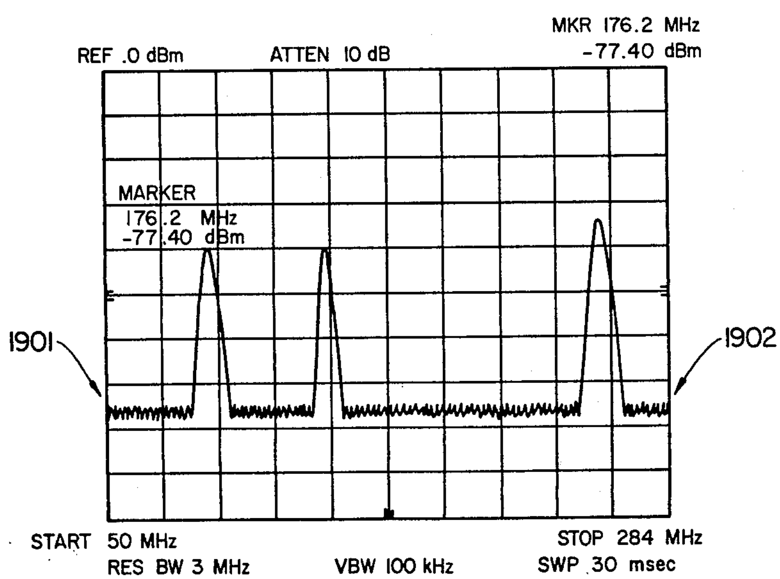
FIG_19B

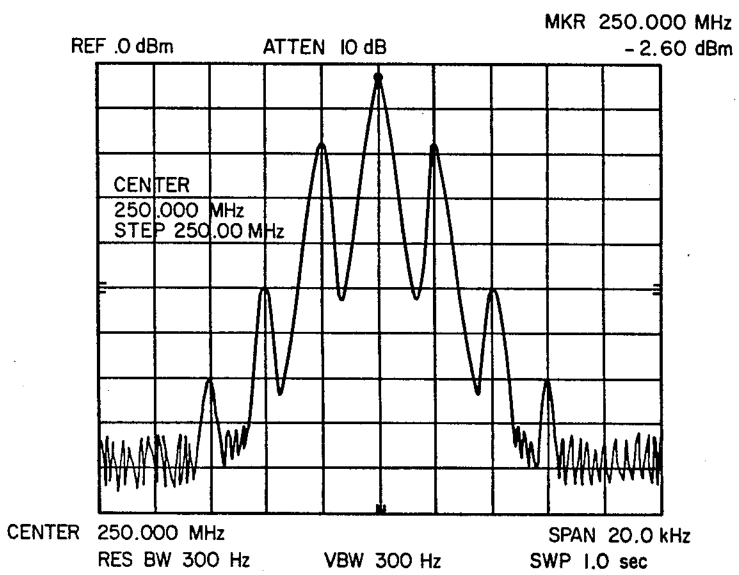
FIG_19C

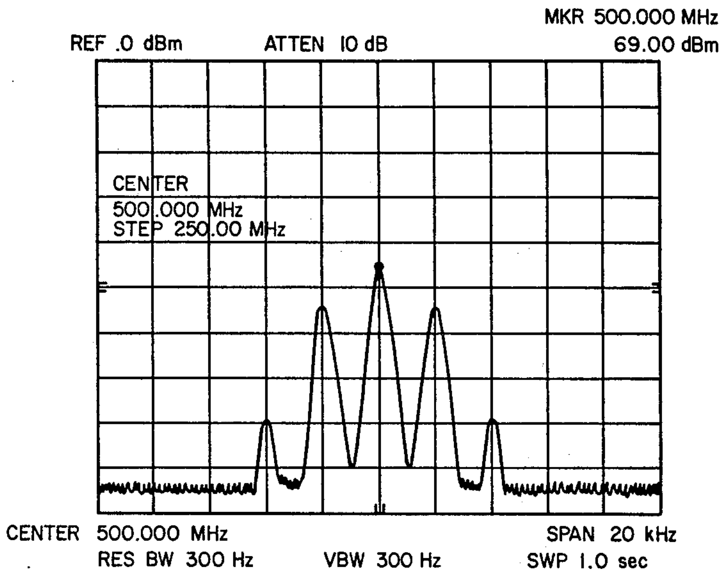
SECOND HARMONIC
FIG_19D
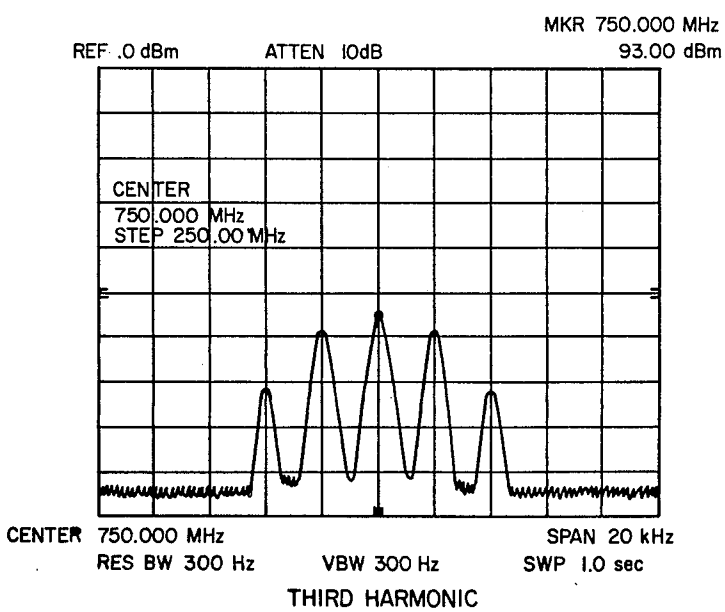
THIRD HARMONIC
FIG_19E

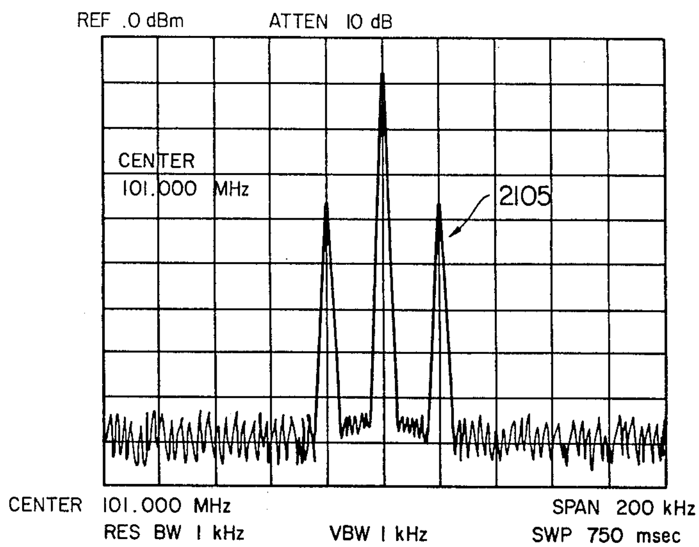
FIG_19F
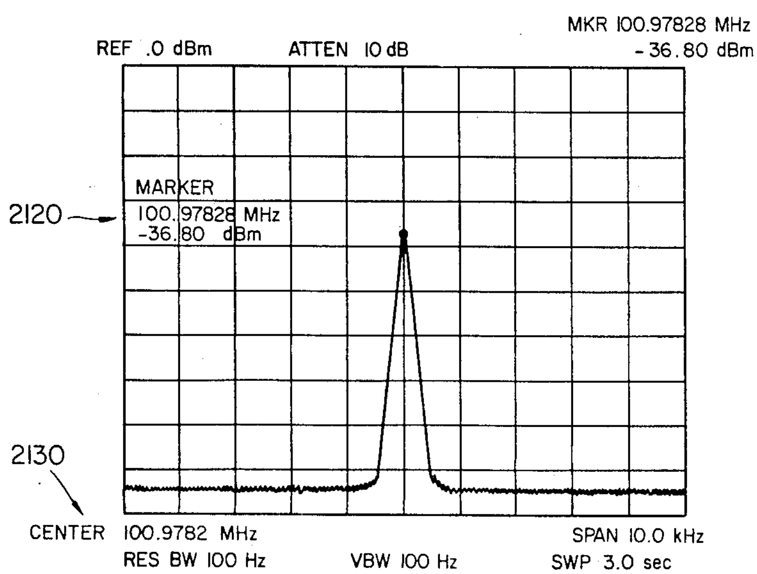
FIG_19G

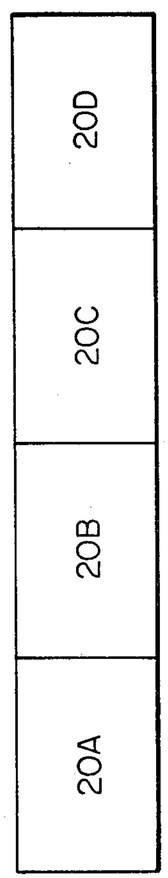
FIG_20

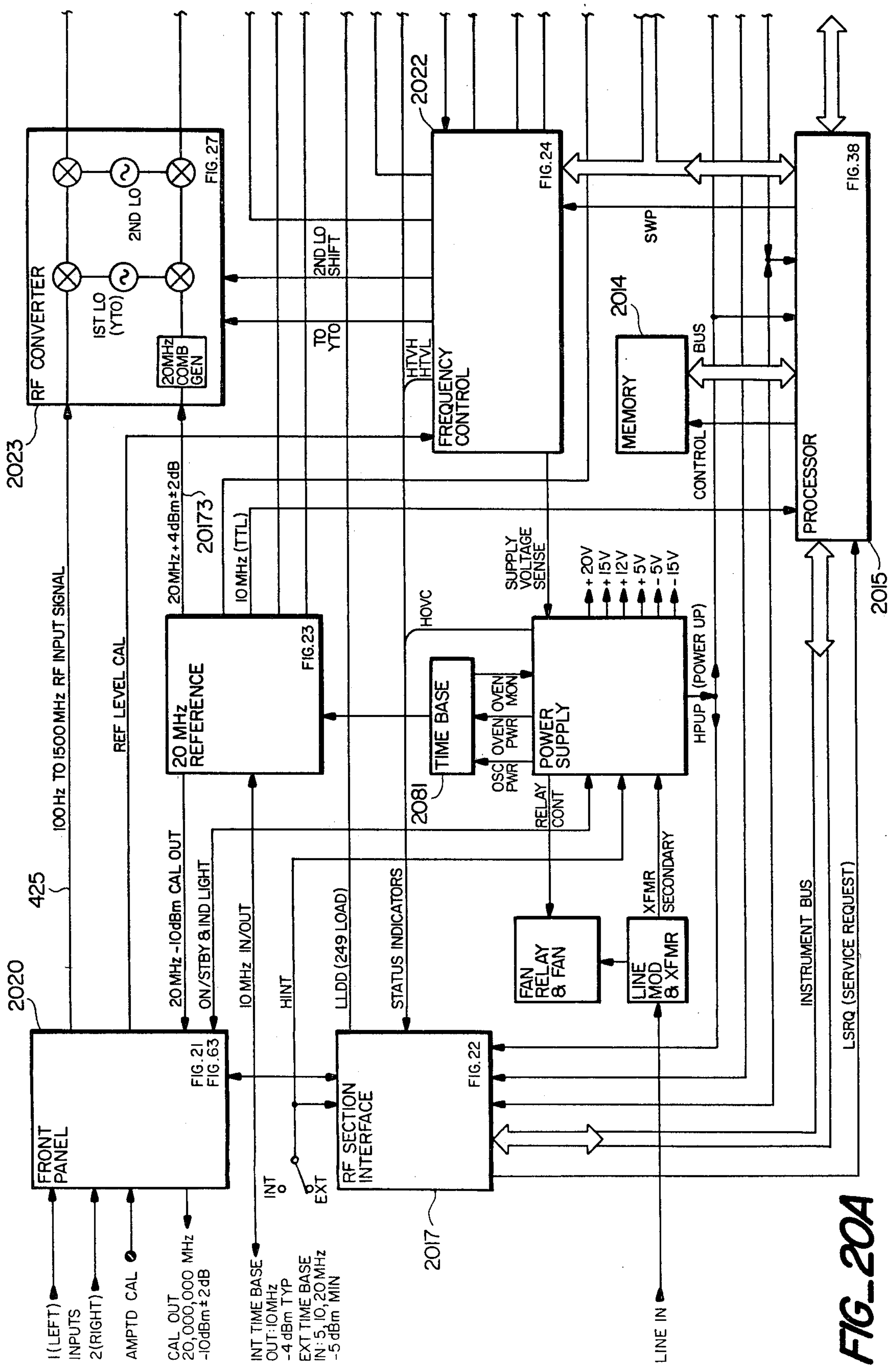
FIG_20A

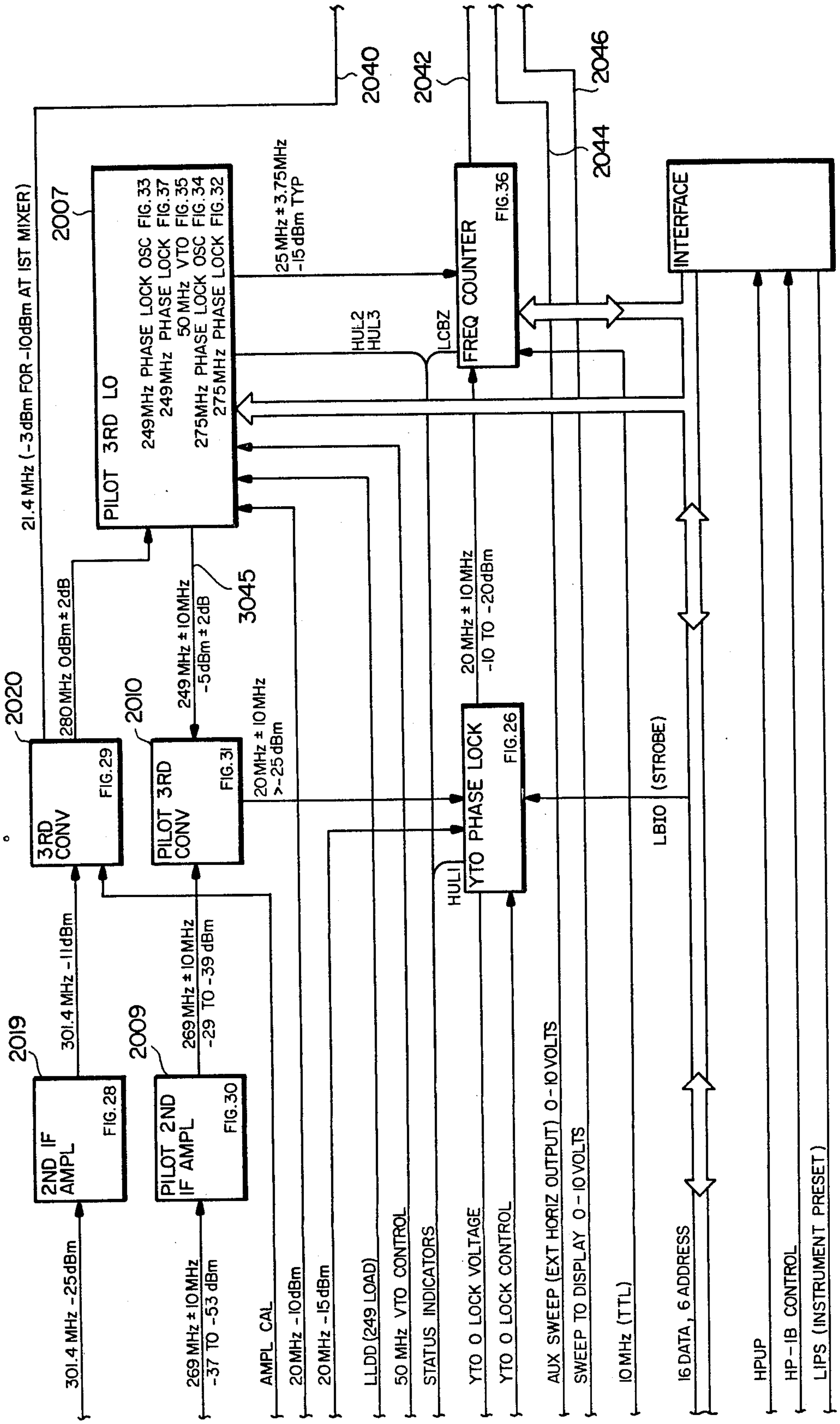
FIG_20B

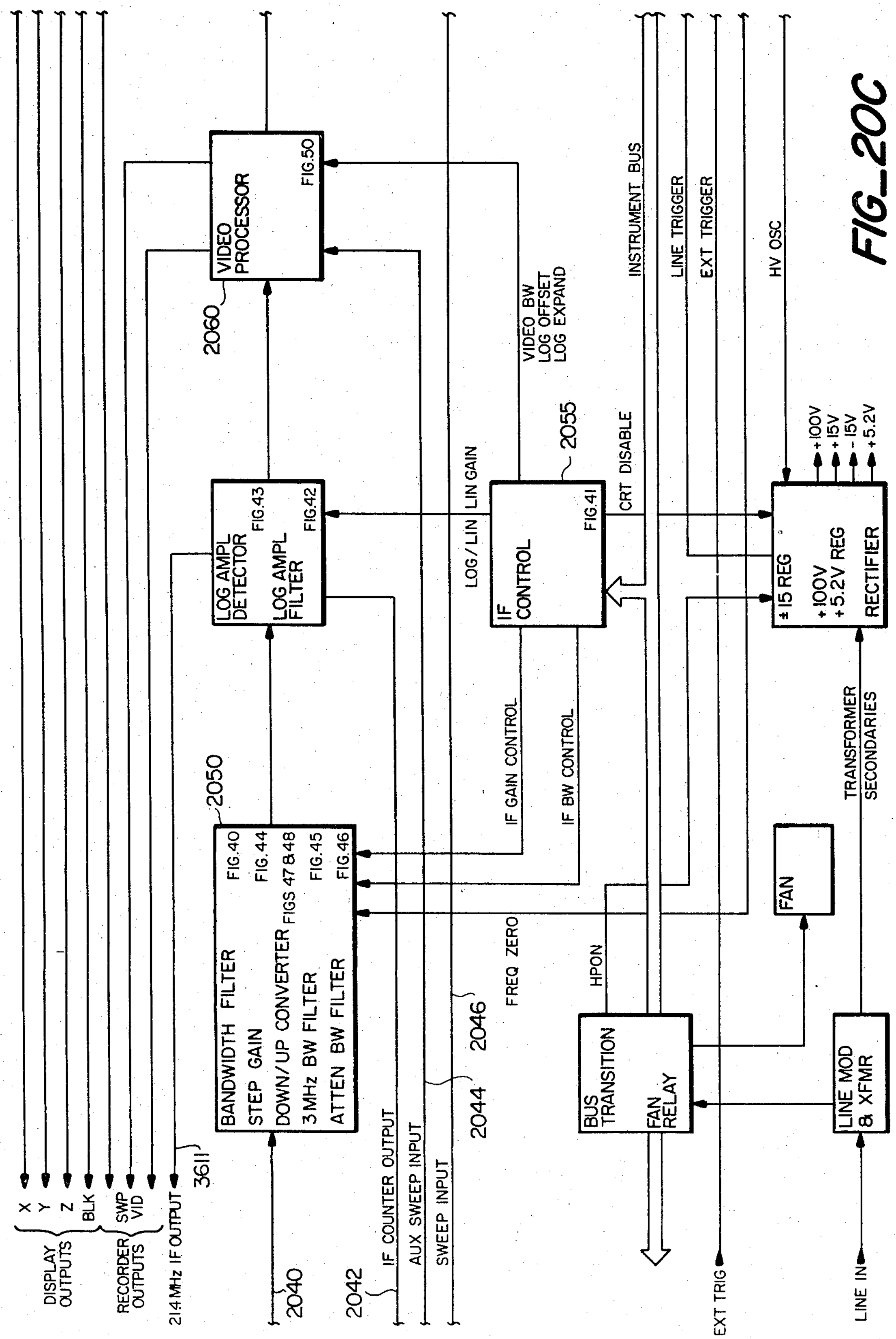
FIG_20C

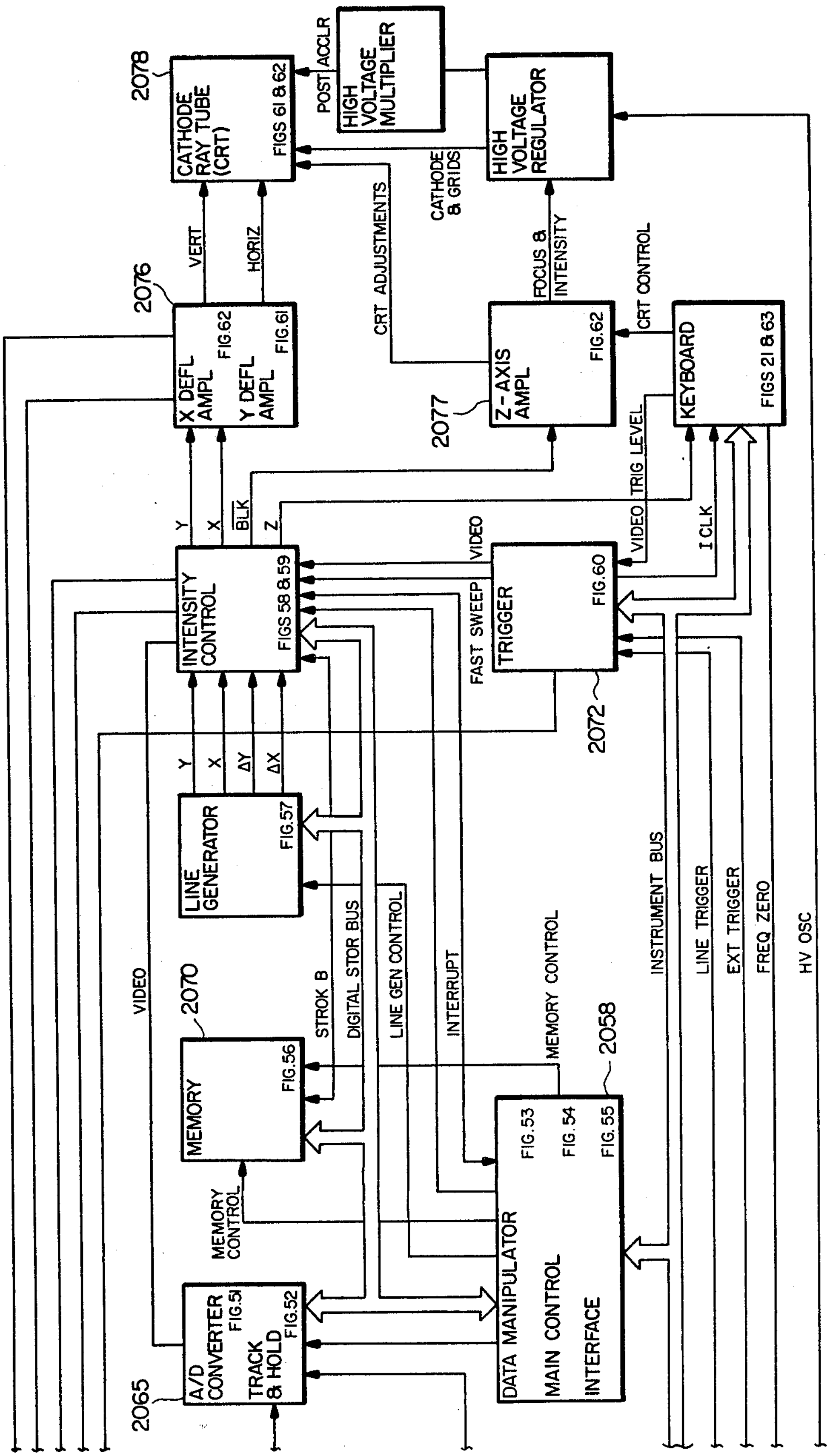
FIG_20D

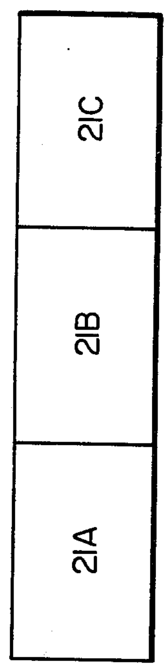
FIG_21

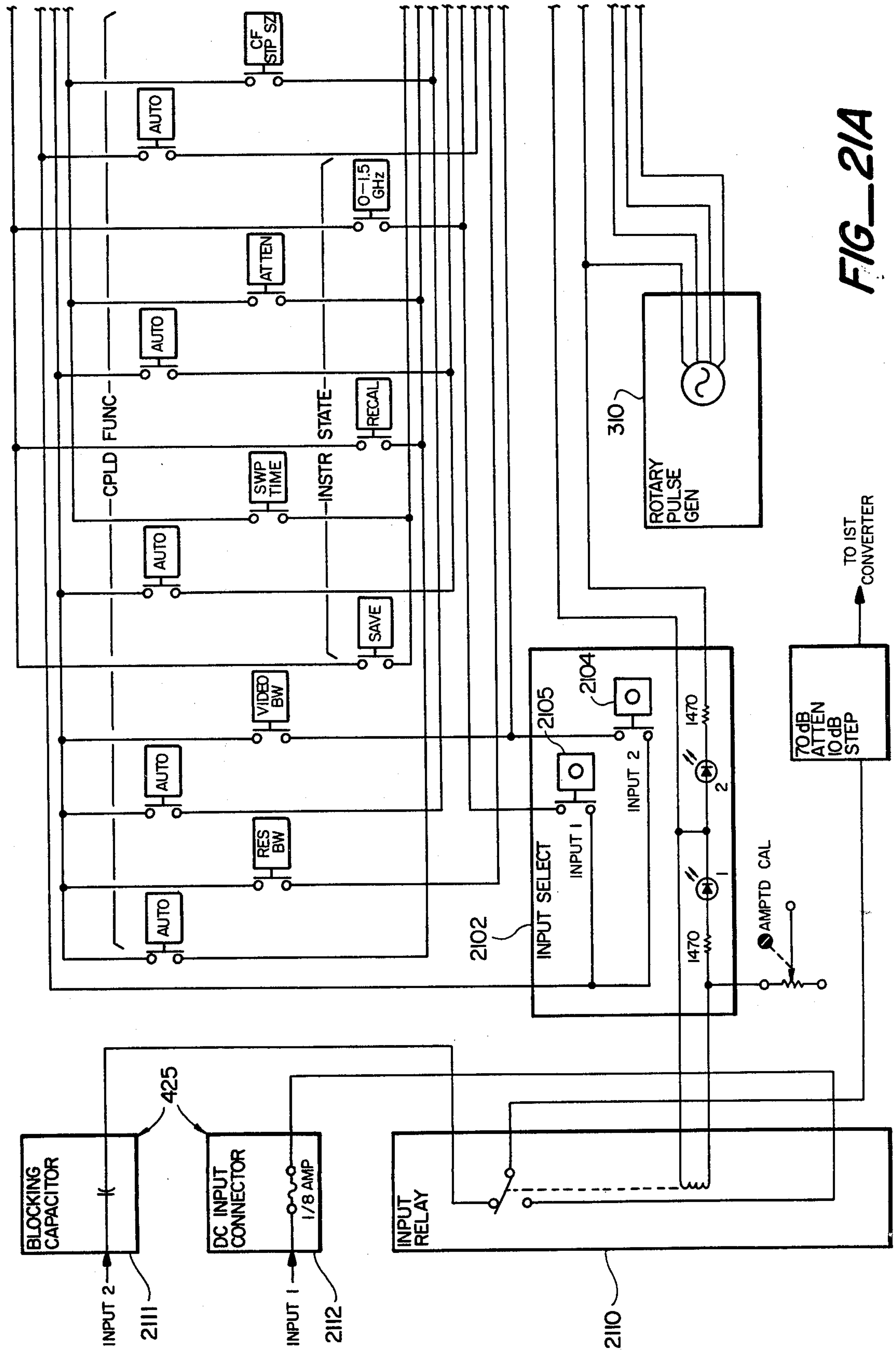
FIG_21A

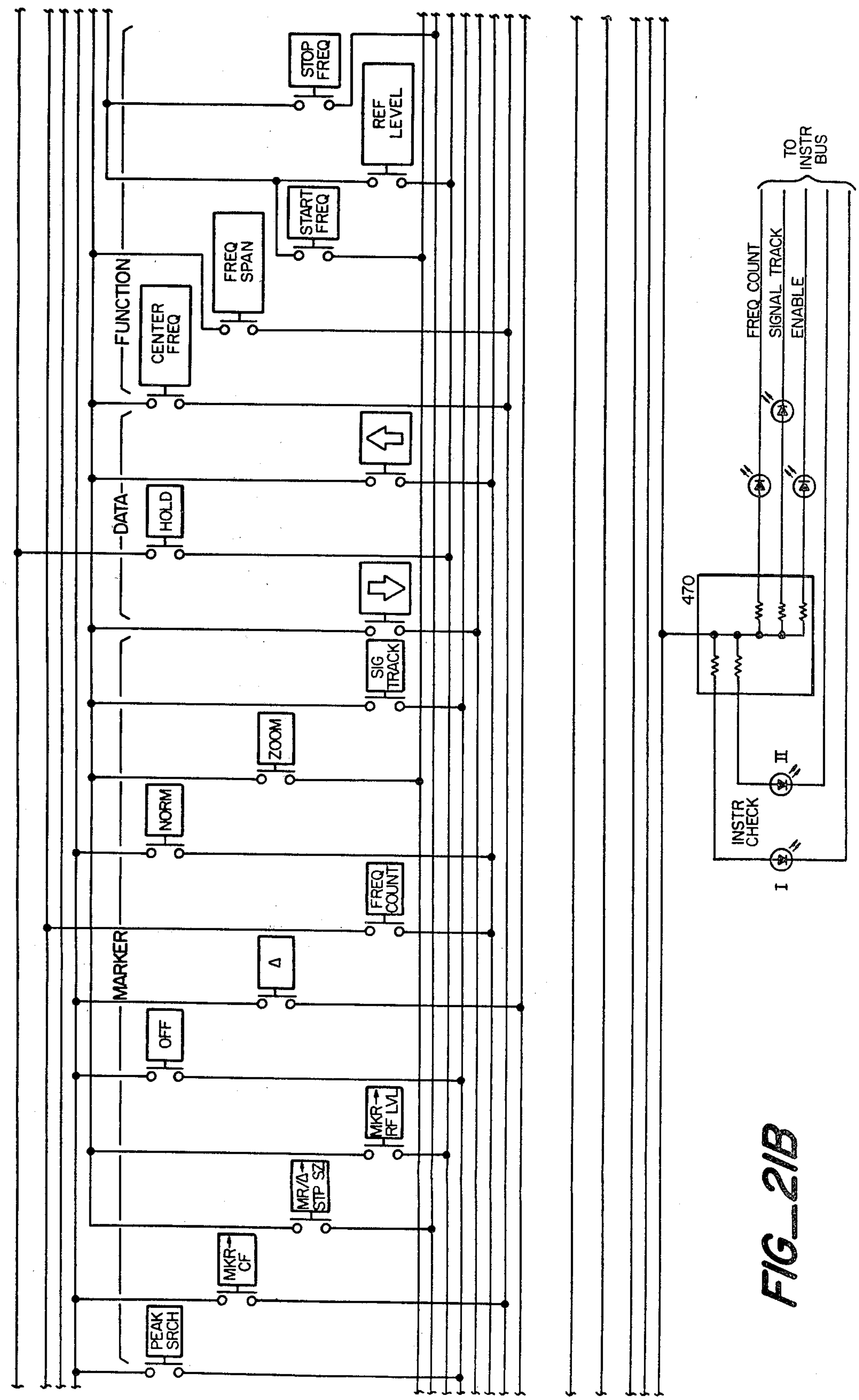
FIG_21B

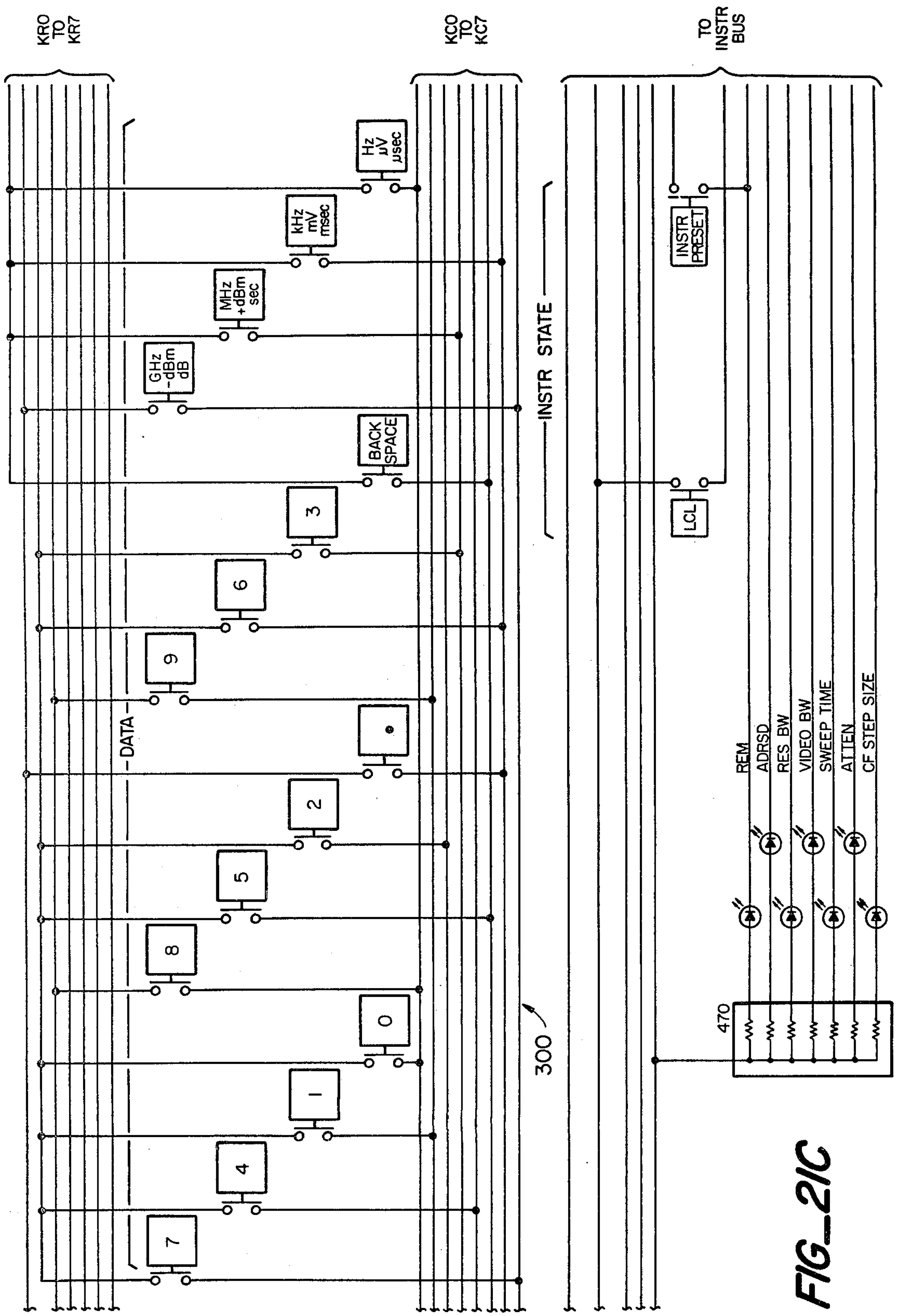
FIG_21C

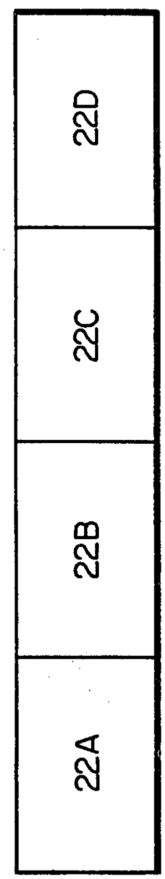
FIG_22

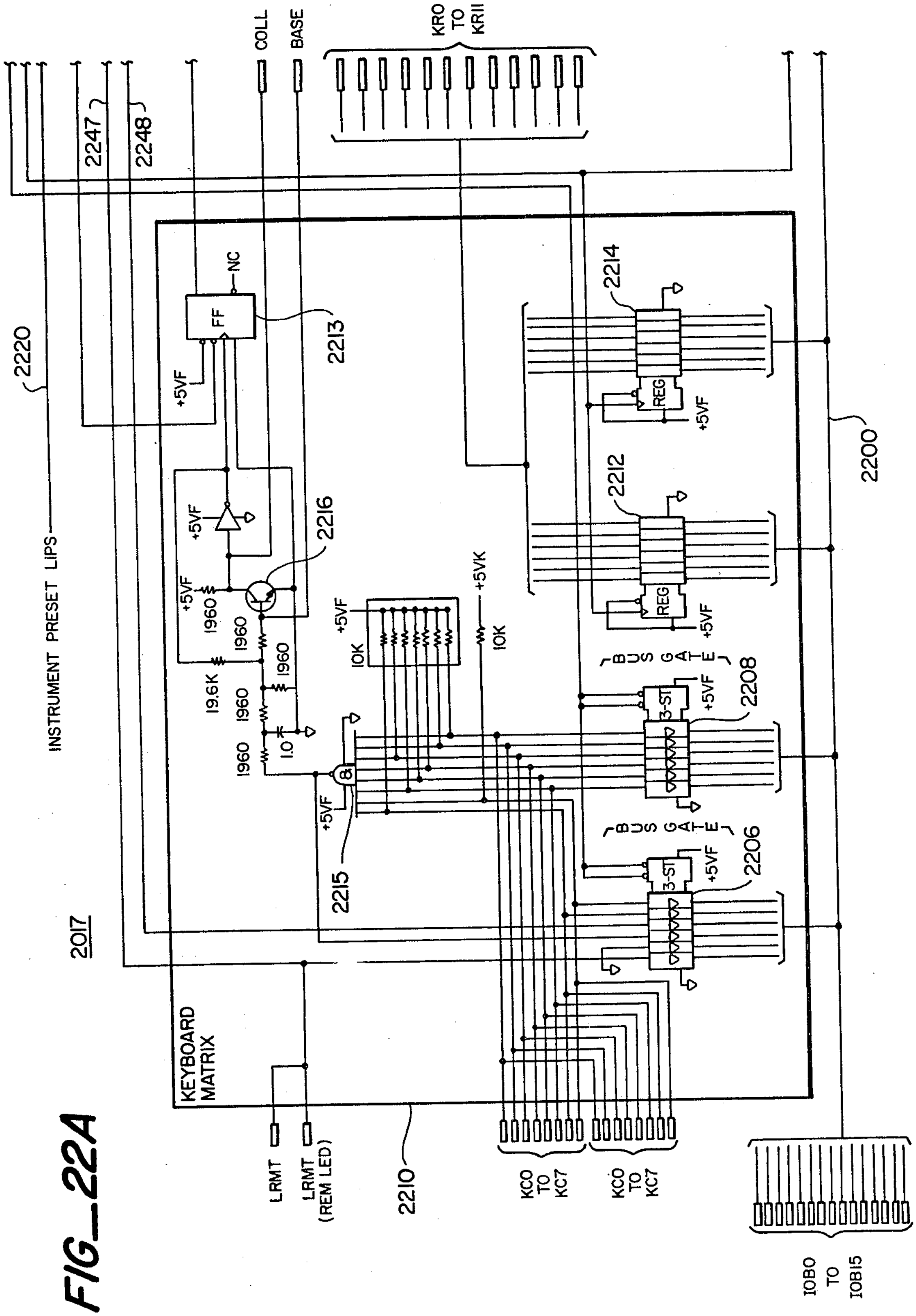
FIG_22A

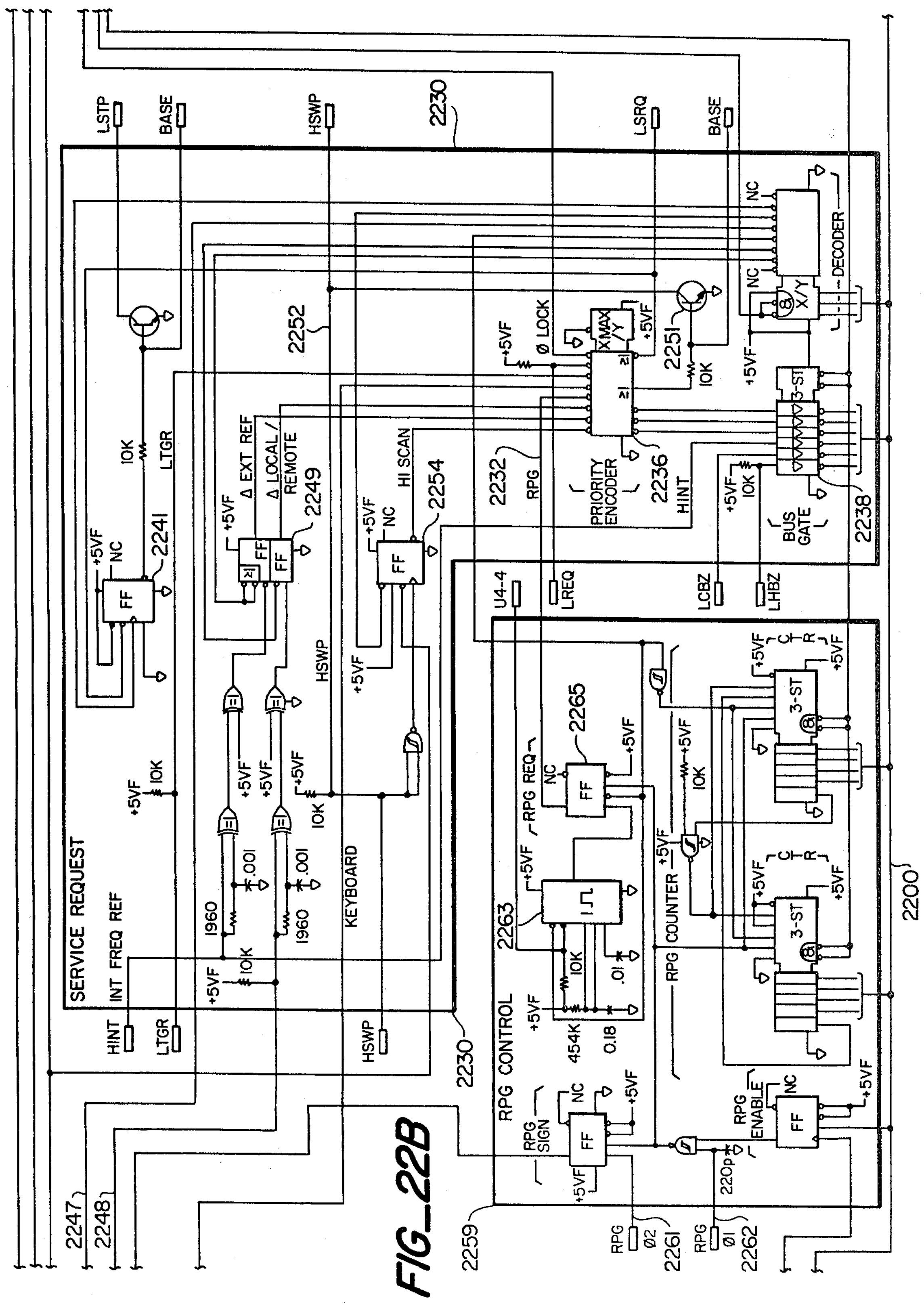
FIG_22B

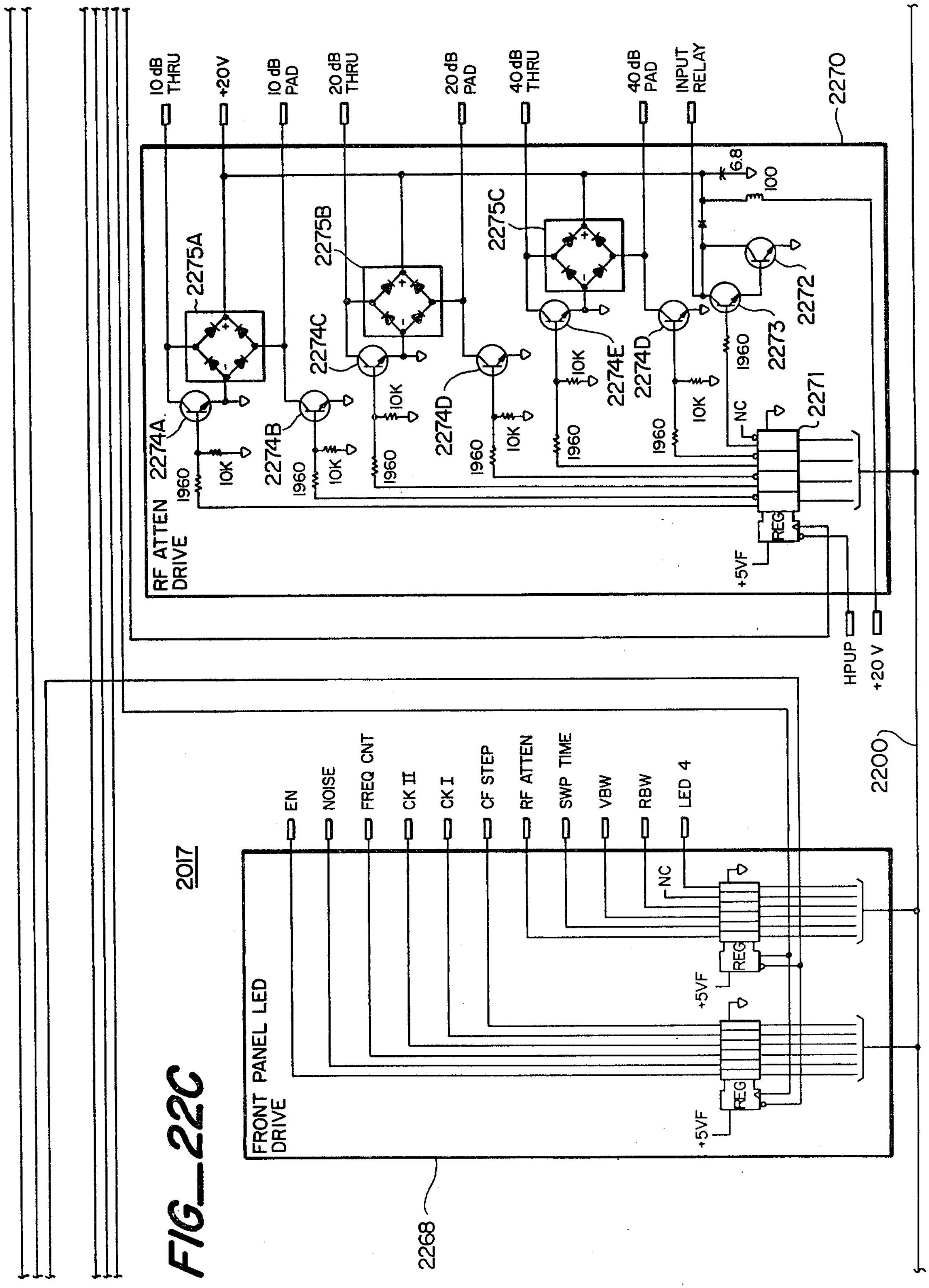
FIG_22C

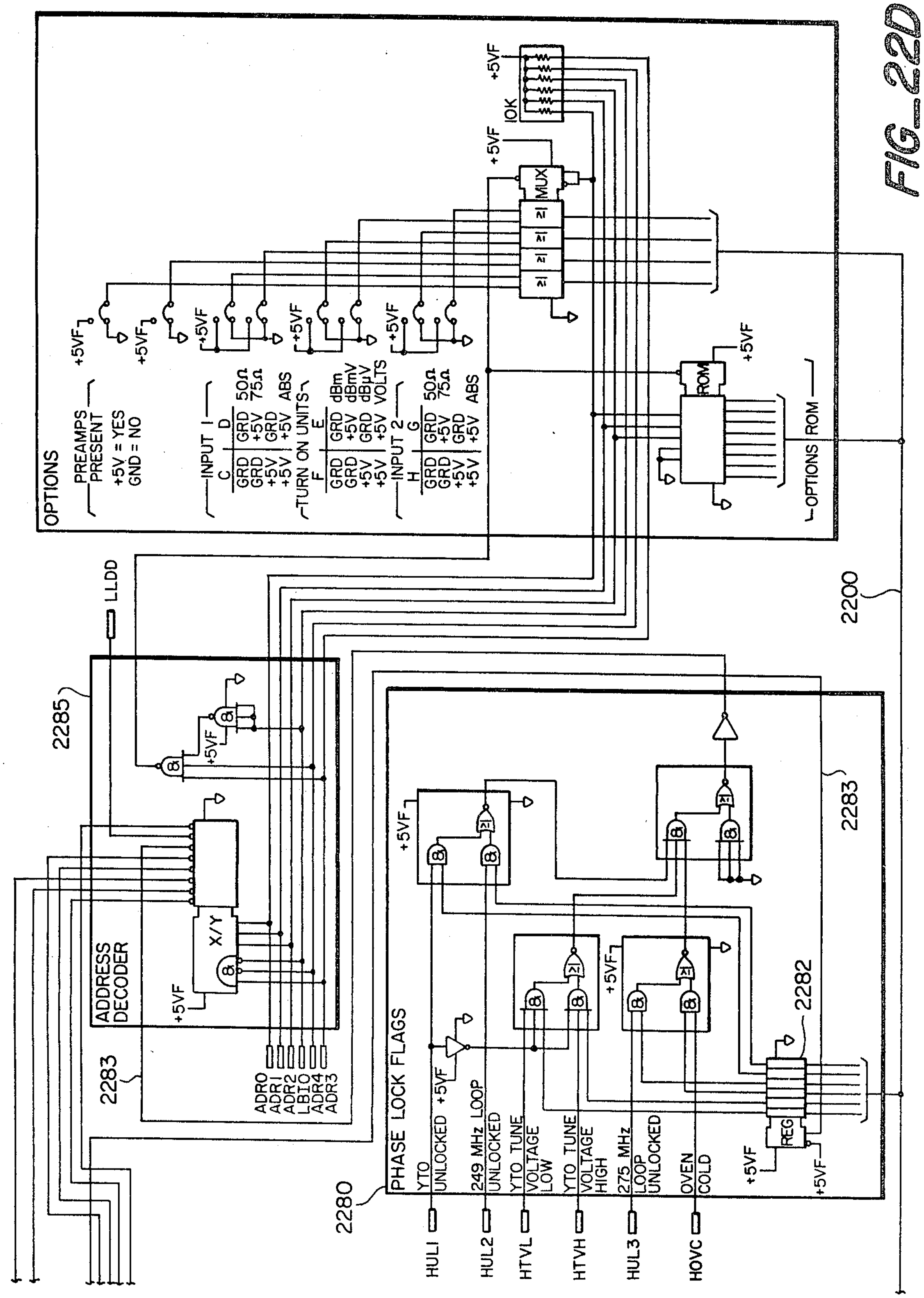
FIG_22D

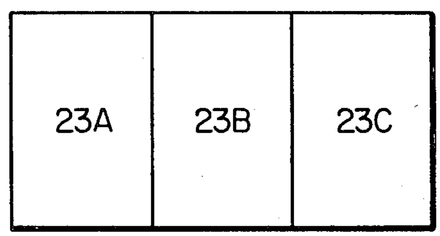
FIG_23

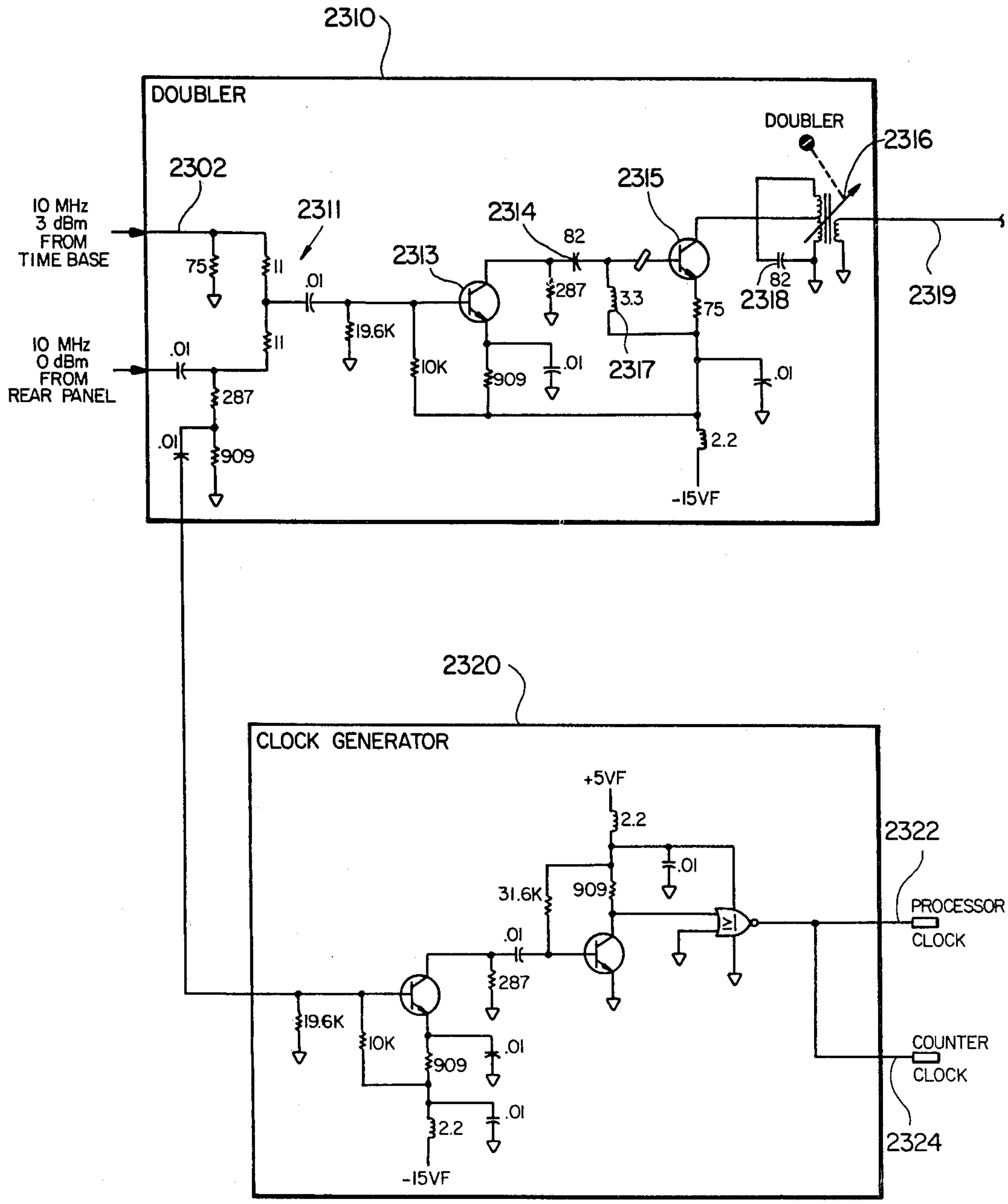
FIG_23A

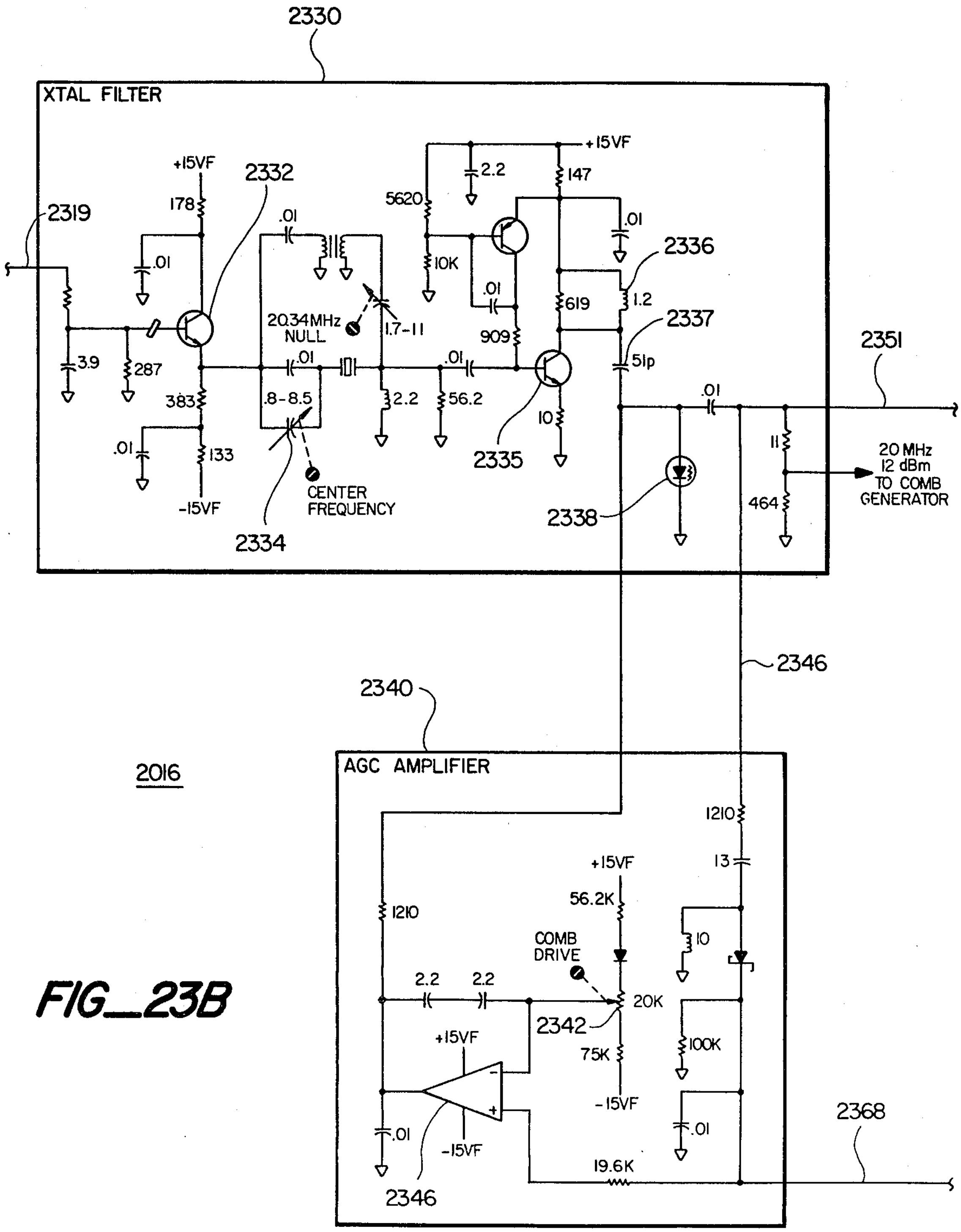
FIG_23B

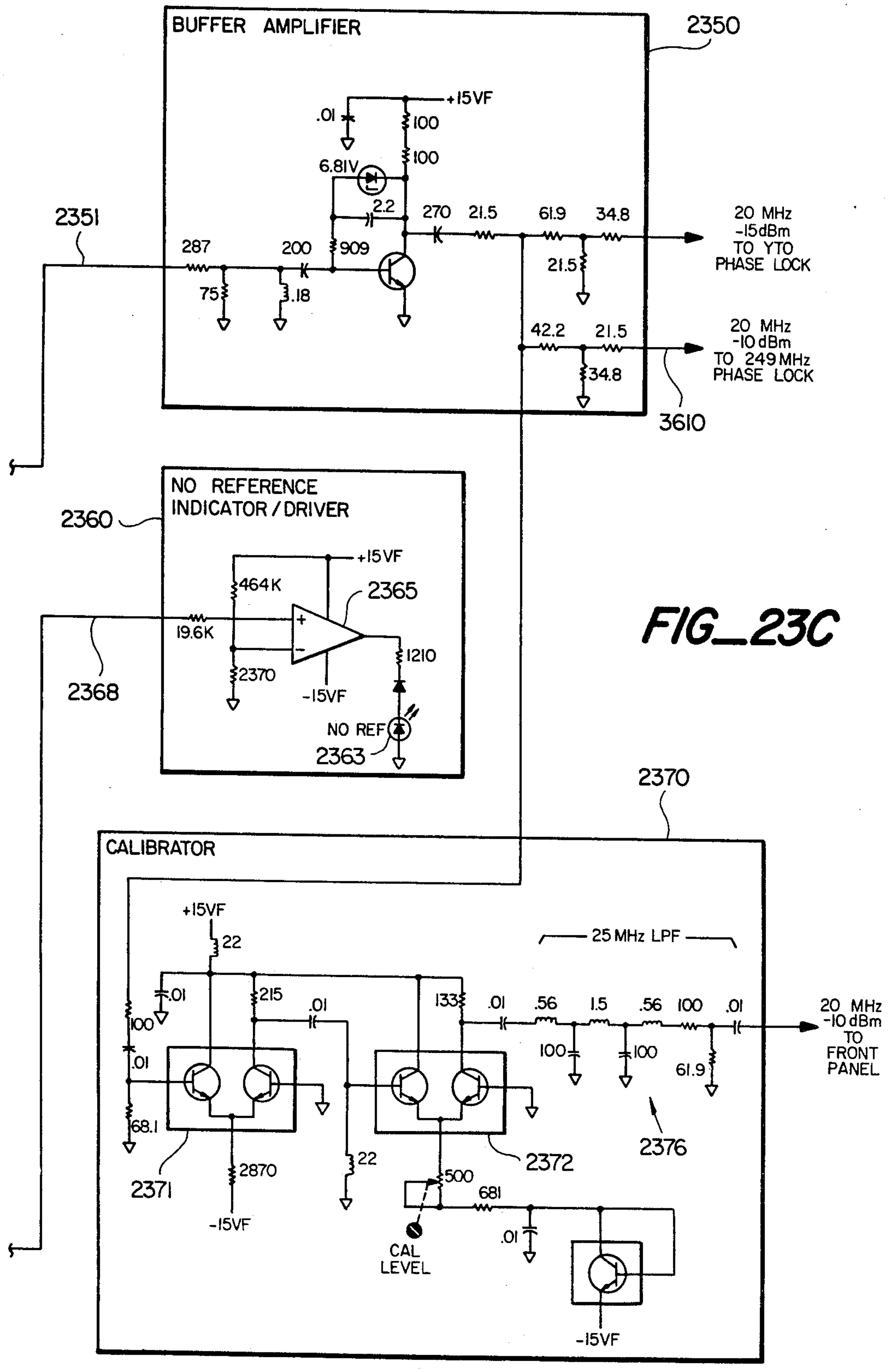
FIG_23C

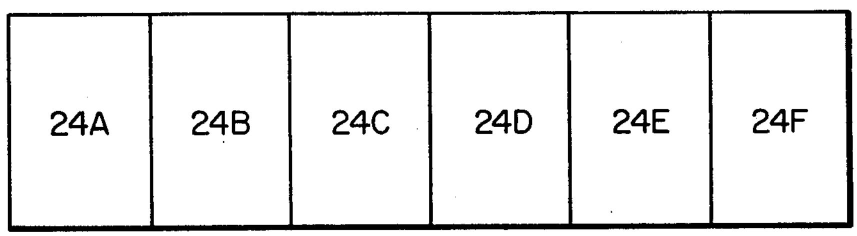
FIG_24

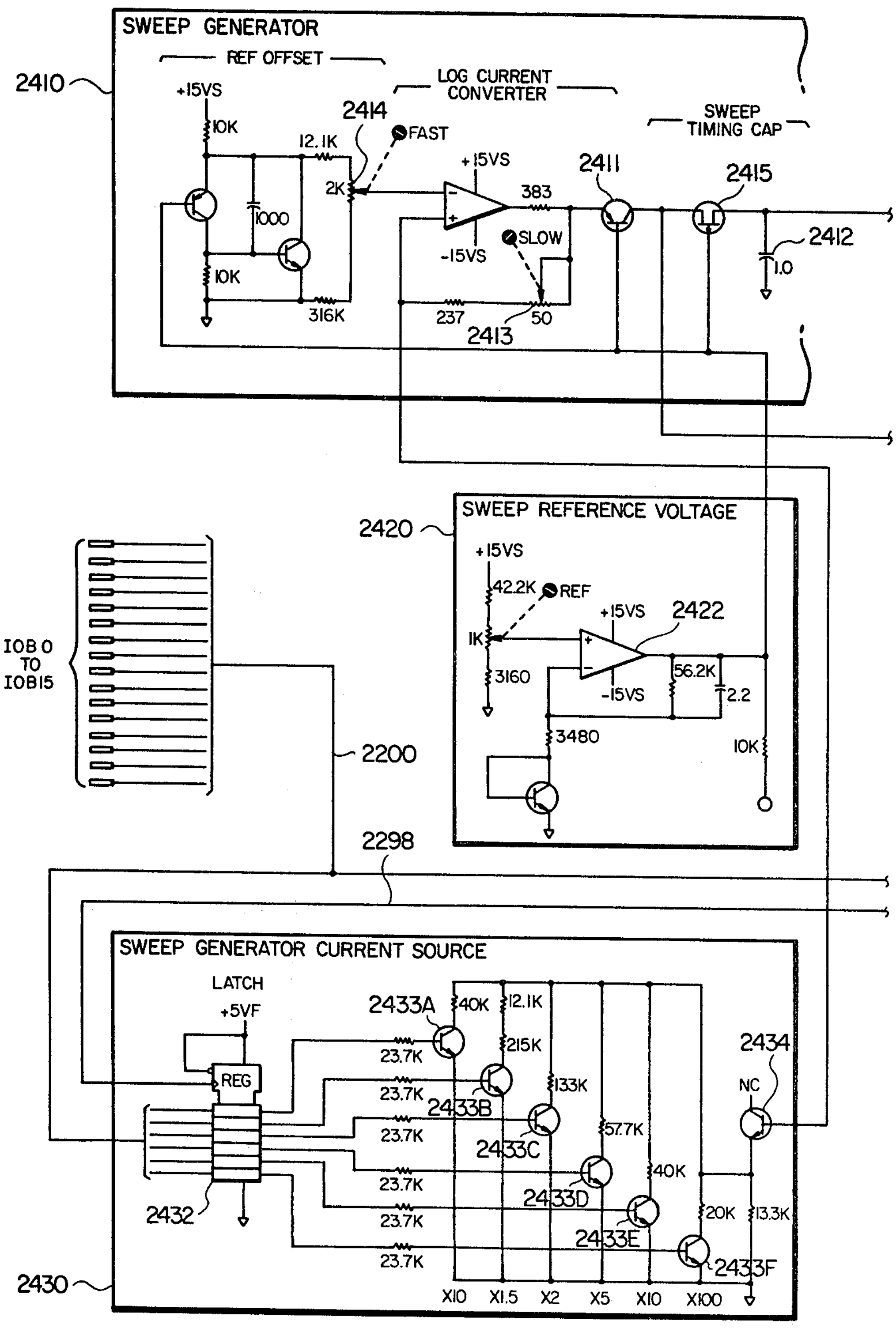
FIG_24A

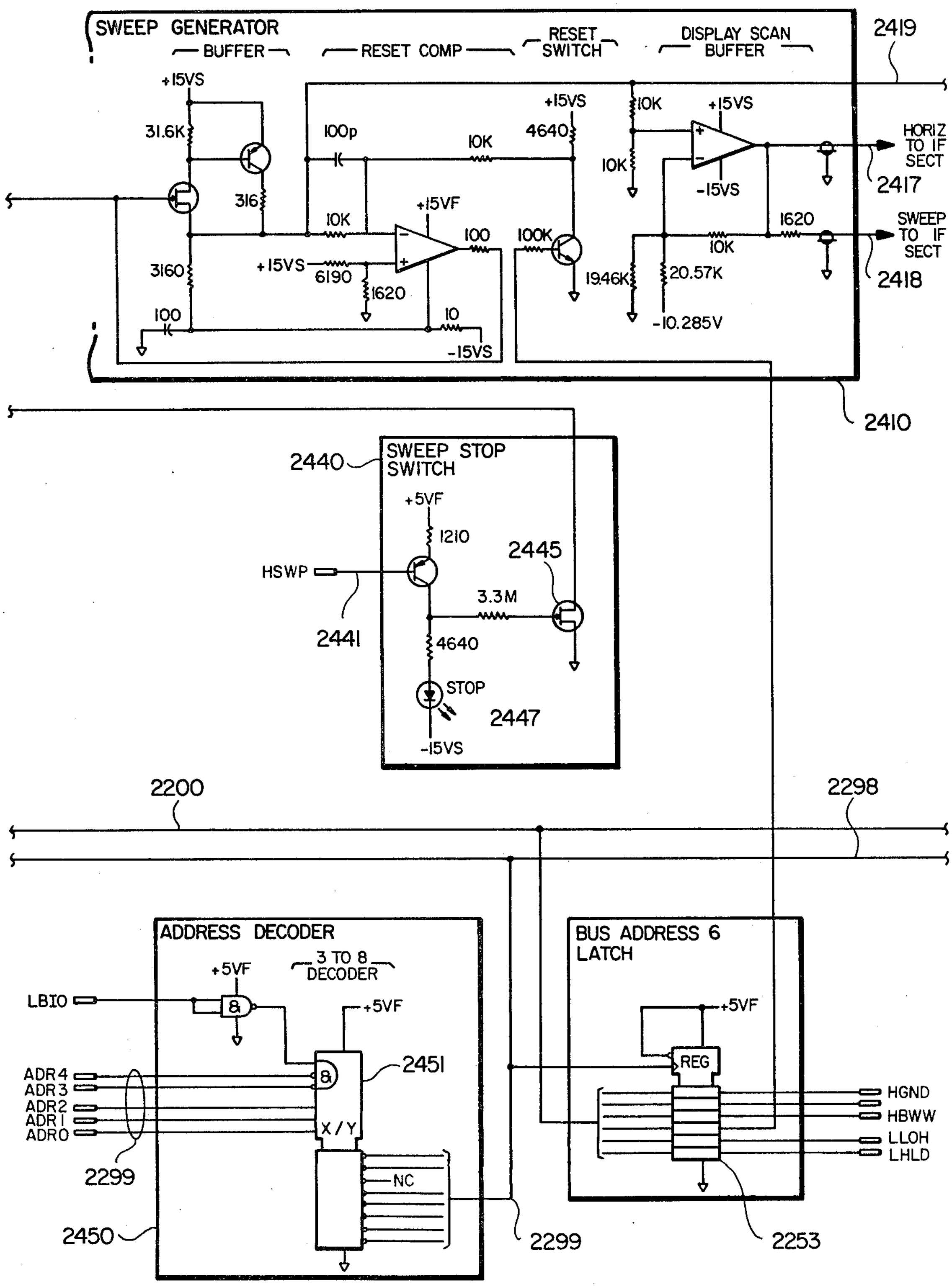
FIG_24B

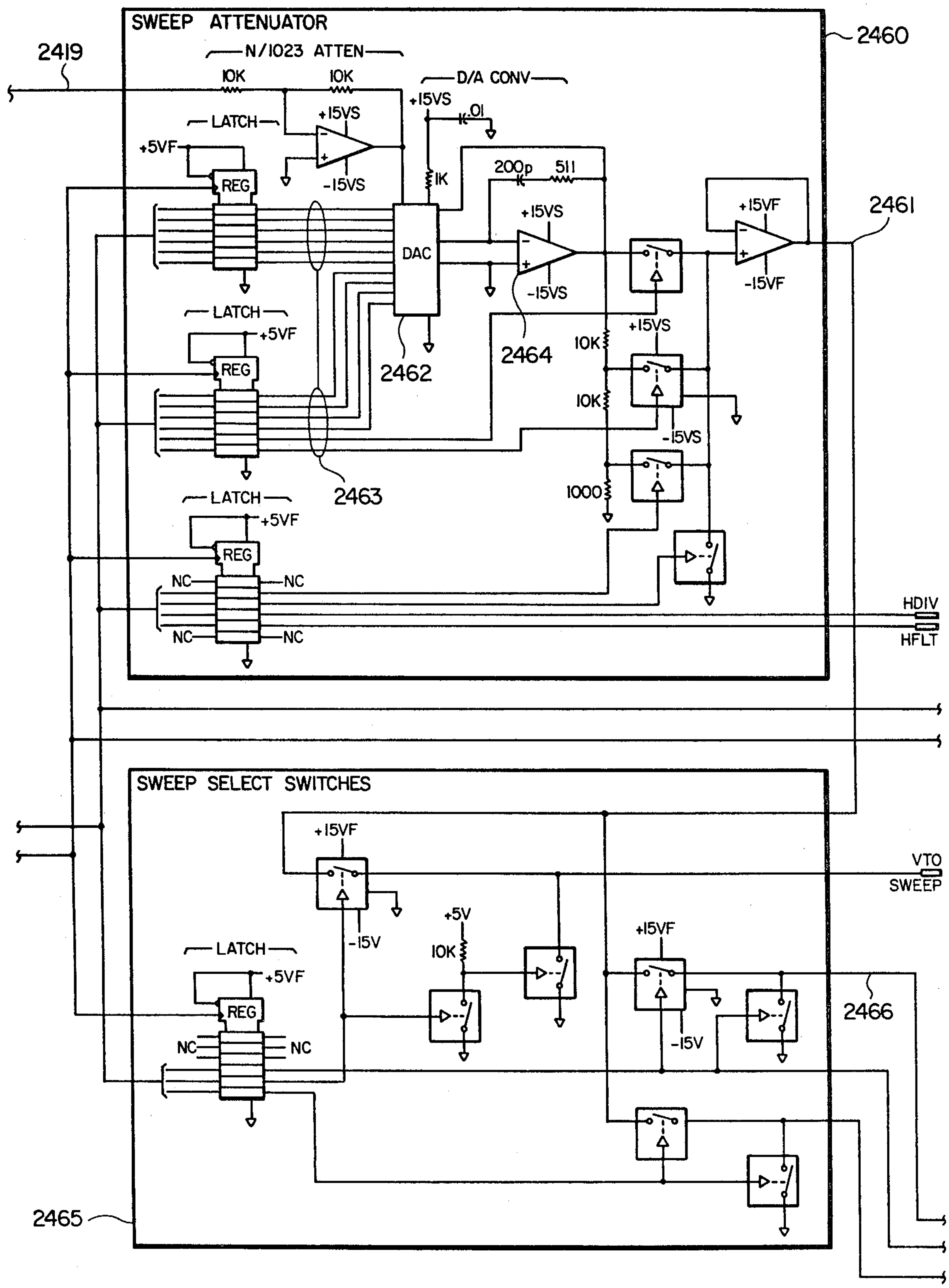
FIG_24C

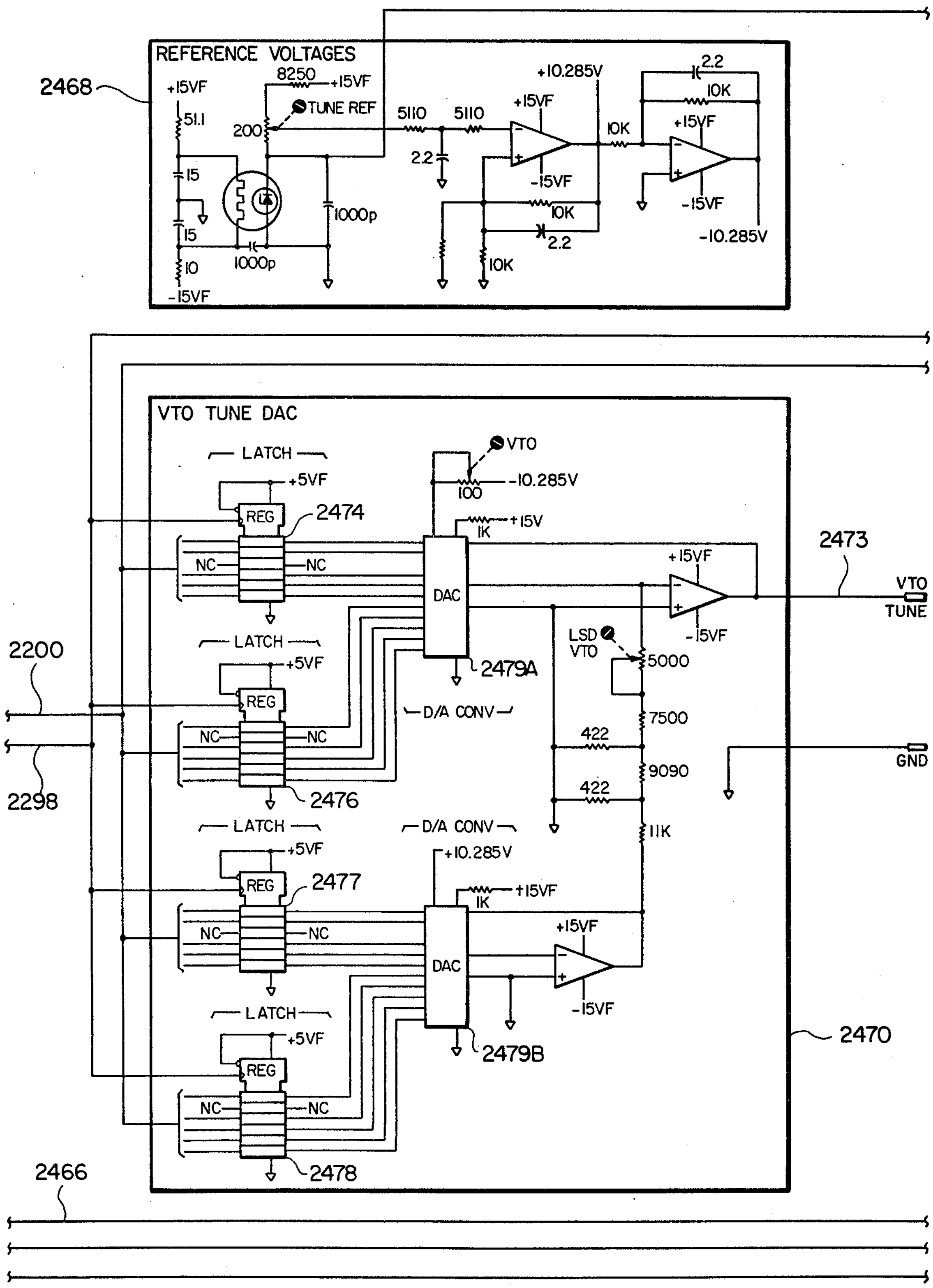
FIG_24D

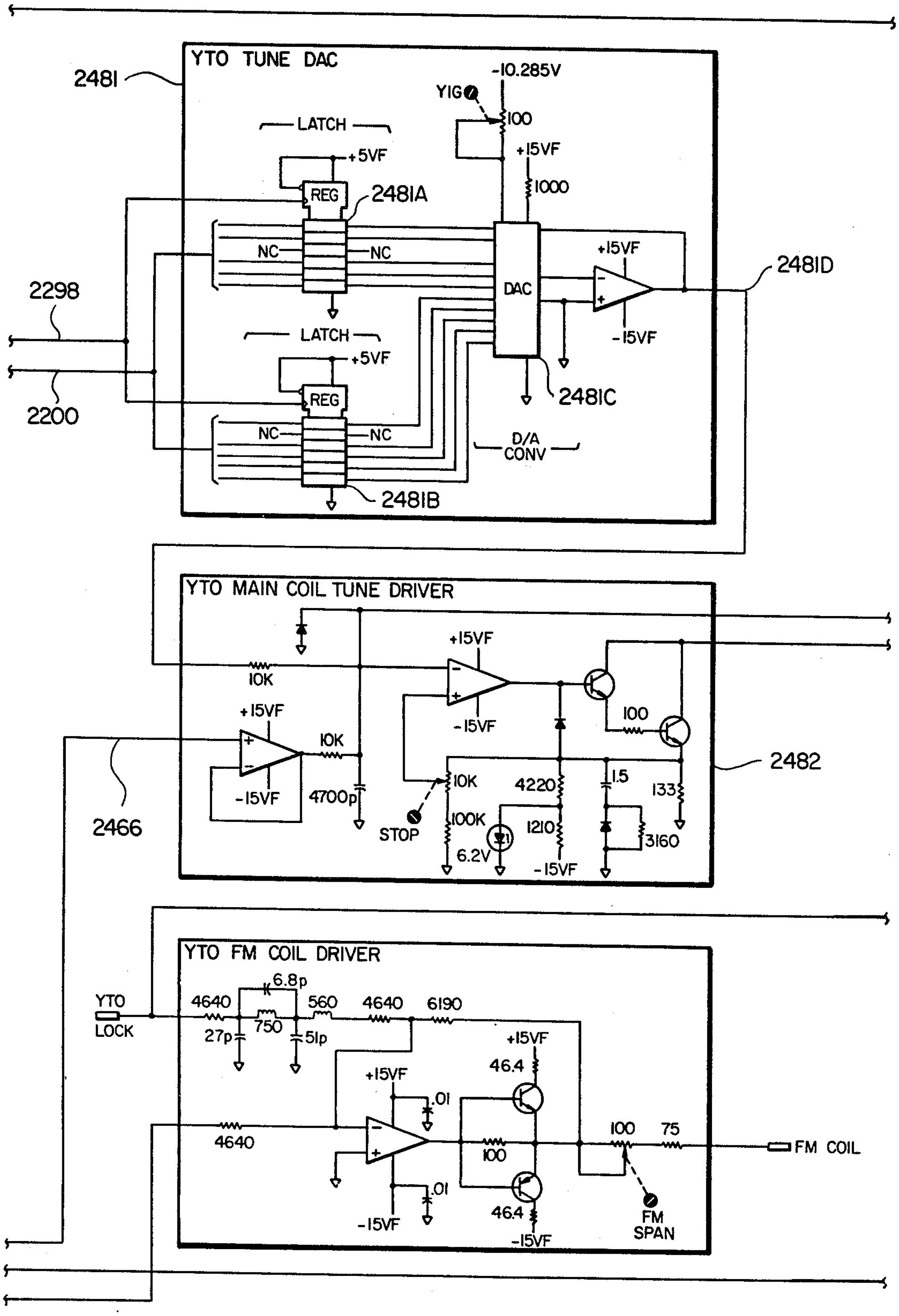
FIG_24E

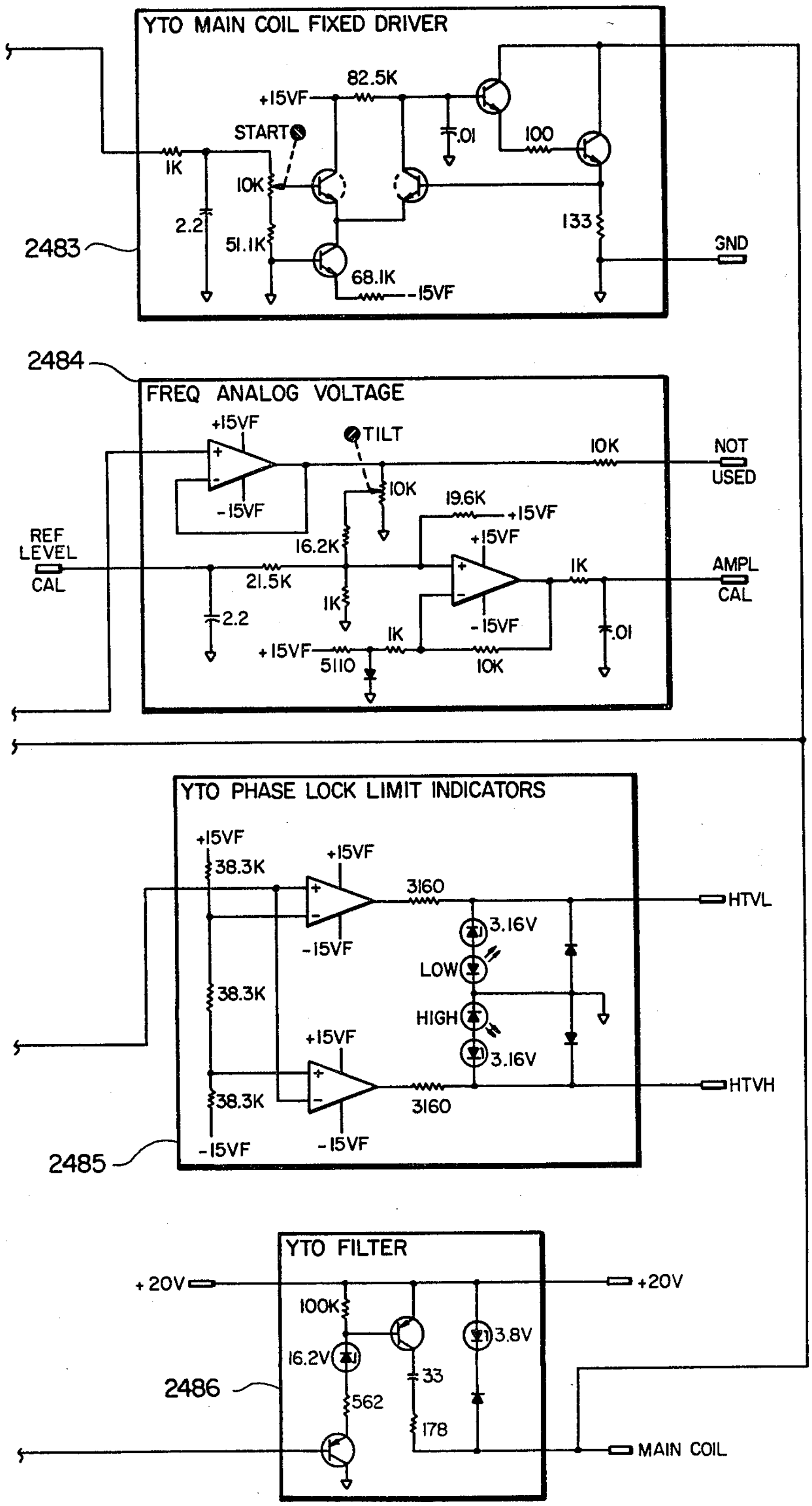
FIG_24F

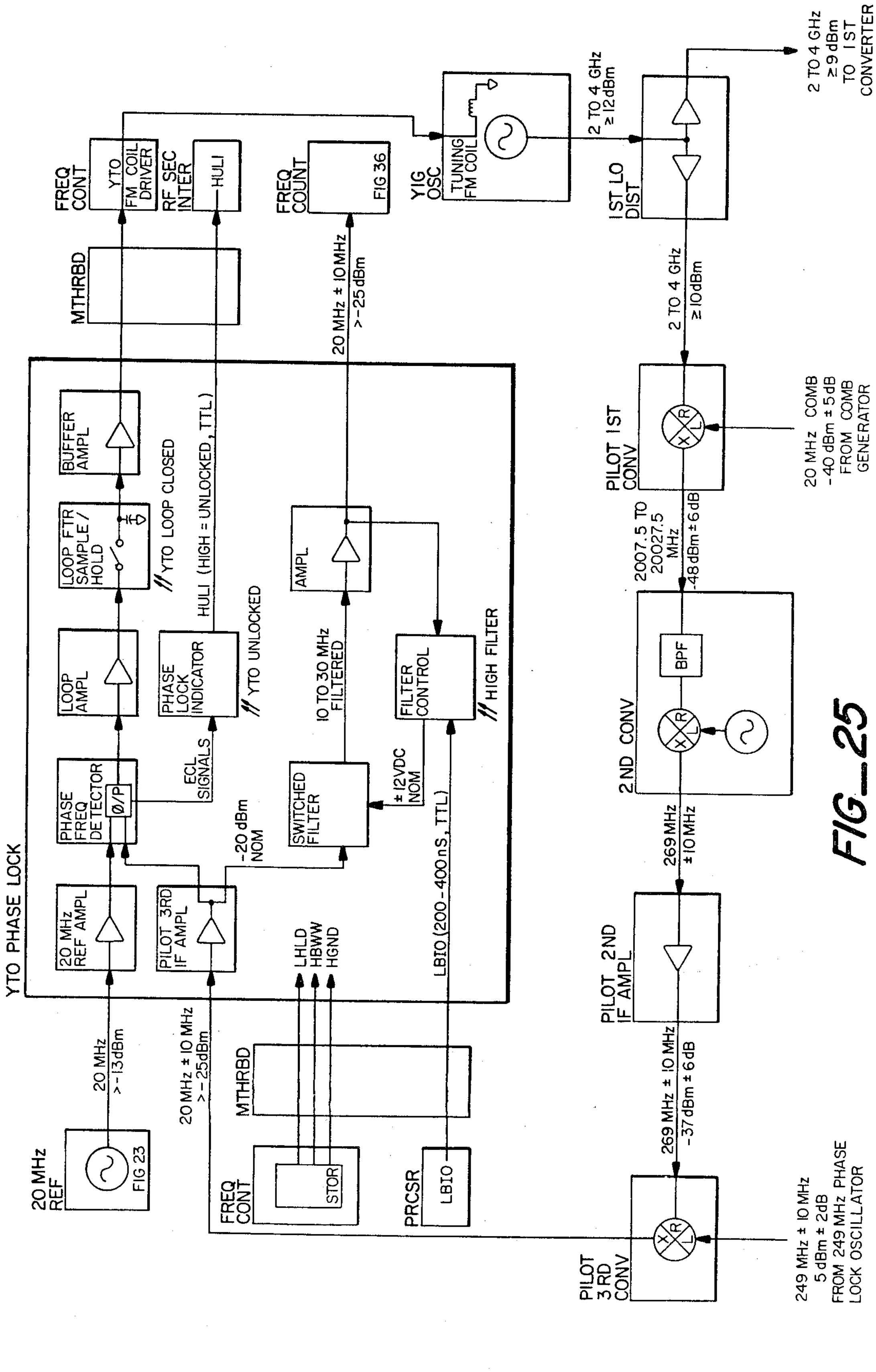
FIG_25

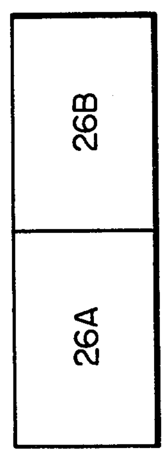
FIG_26

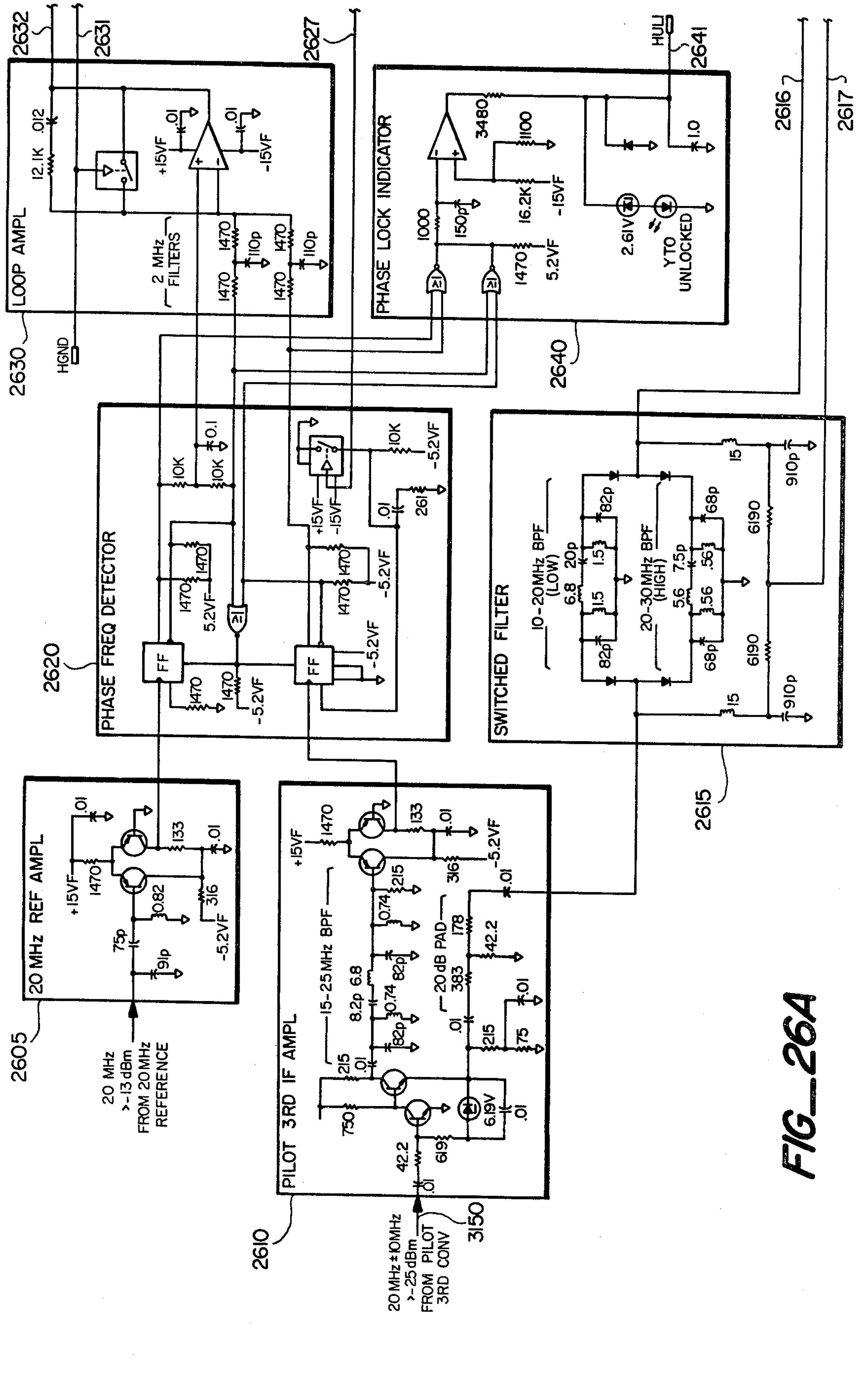
FIG_26A

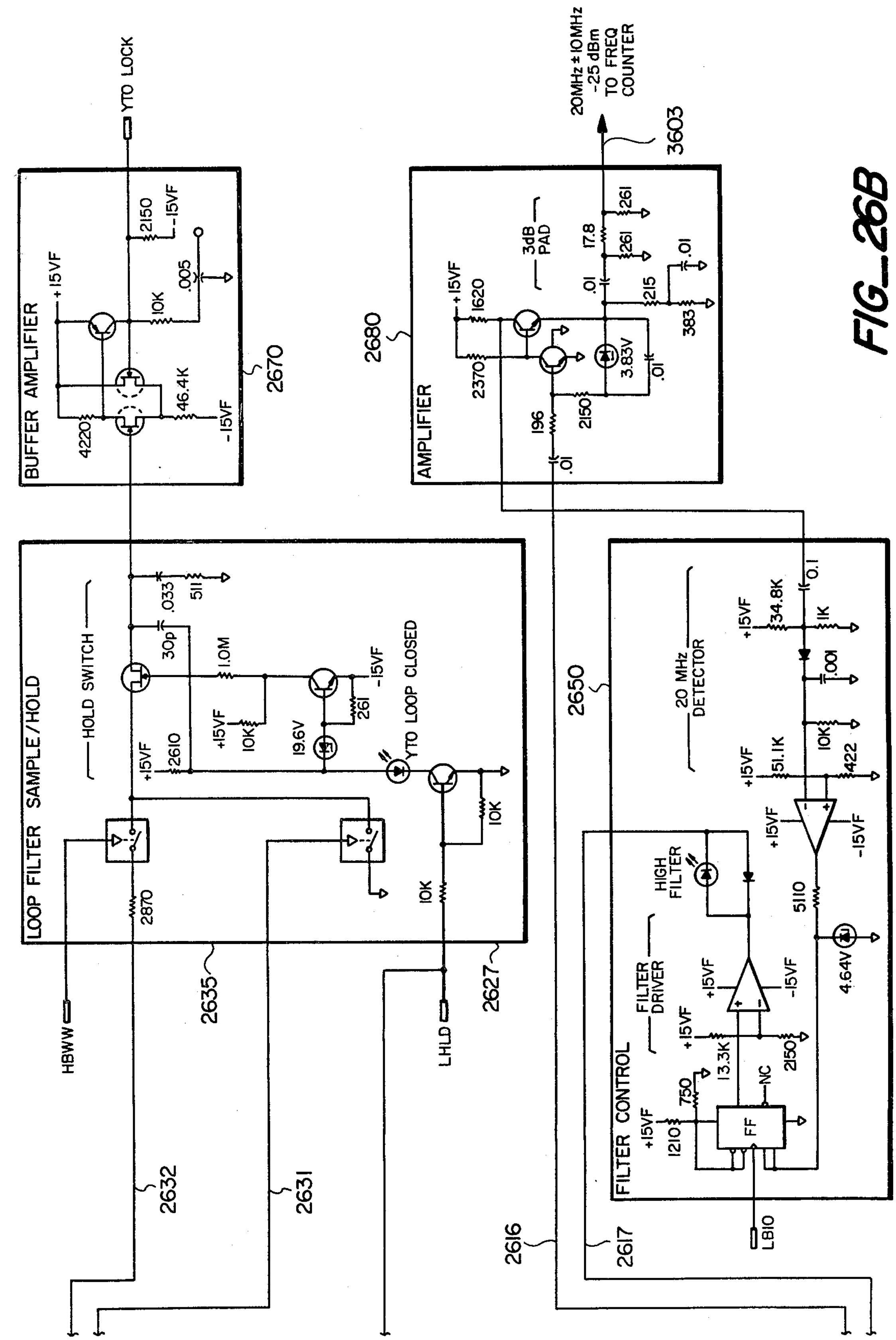
FIG_26B

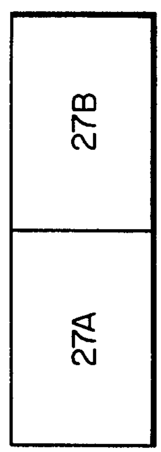
FIG_27

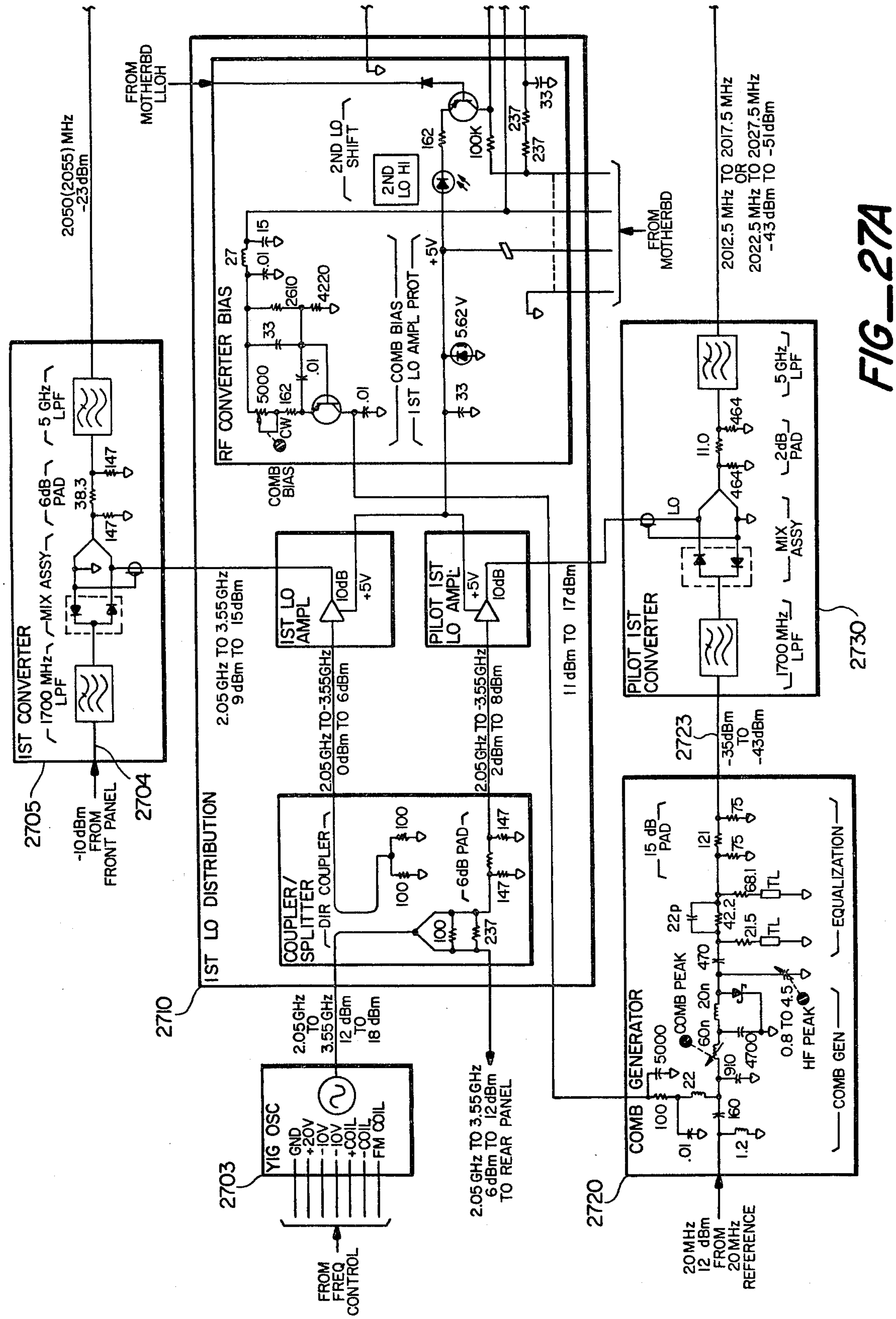
FIG_27A

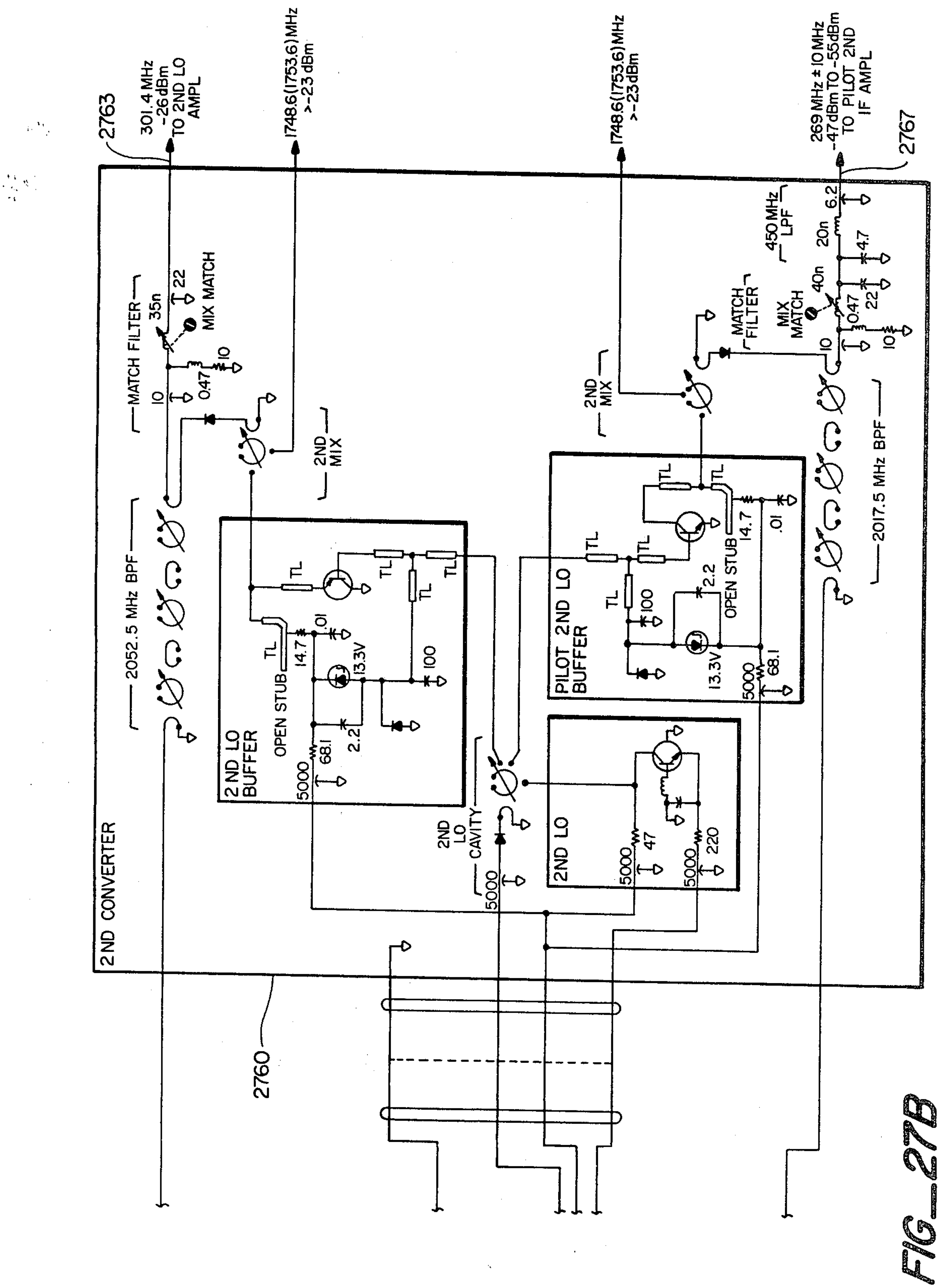
FIG_27B

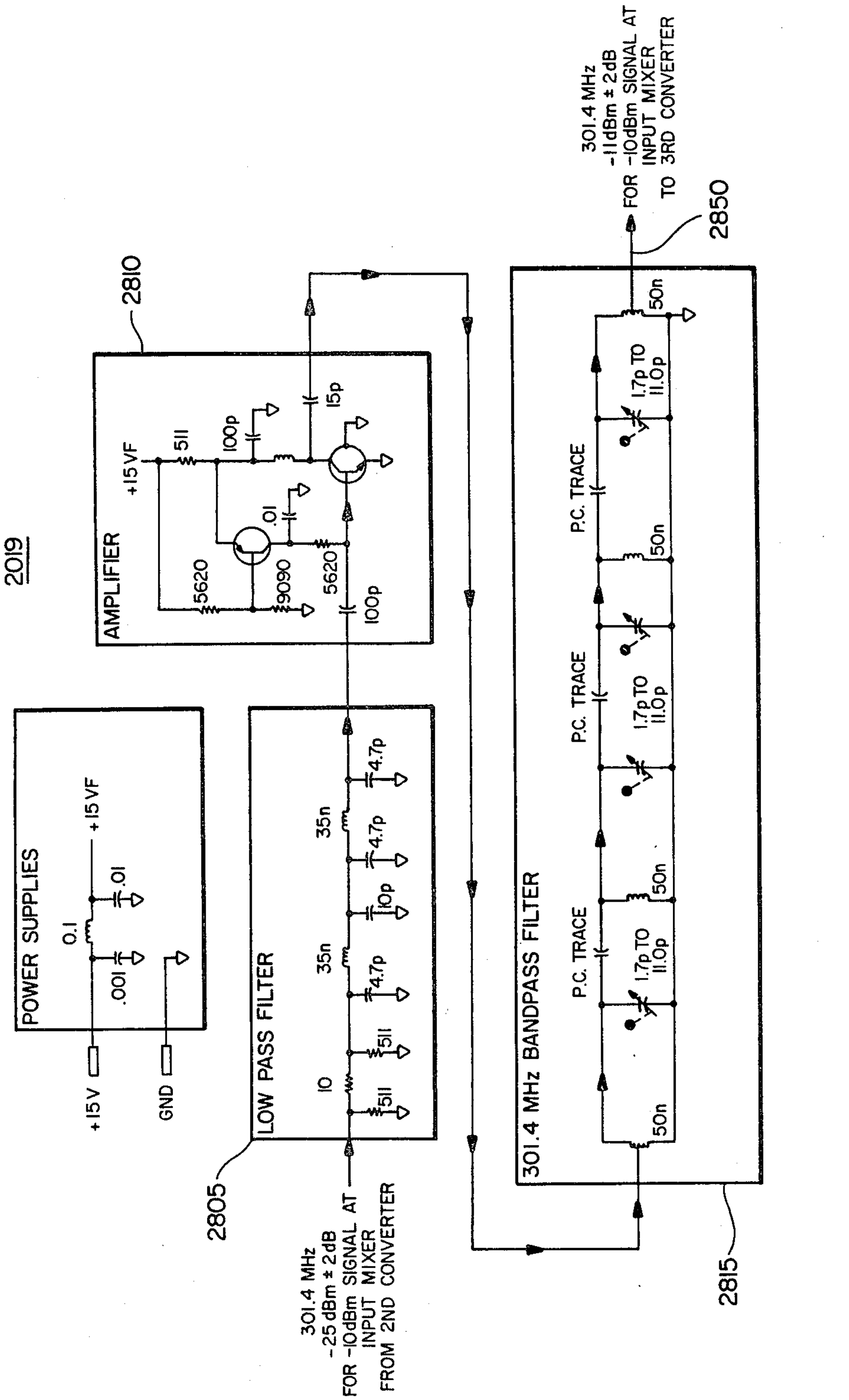
FIG_28

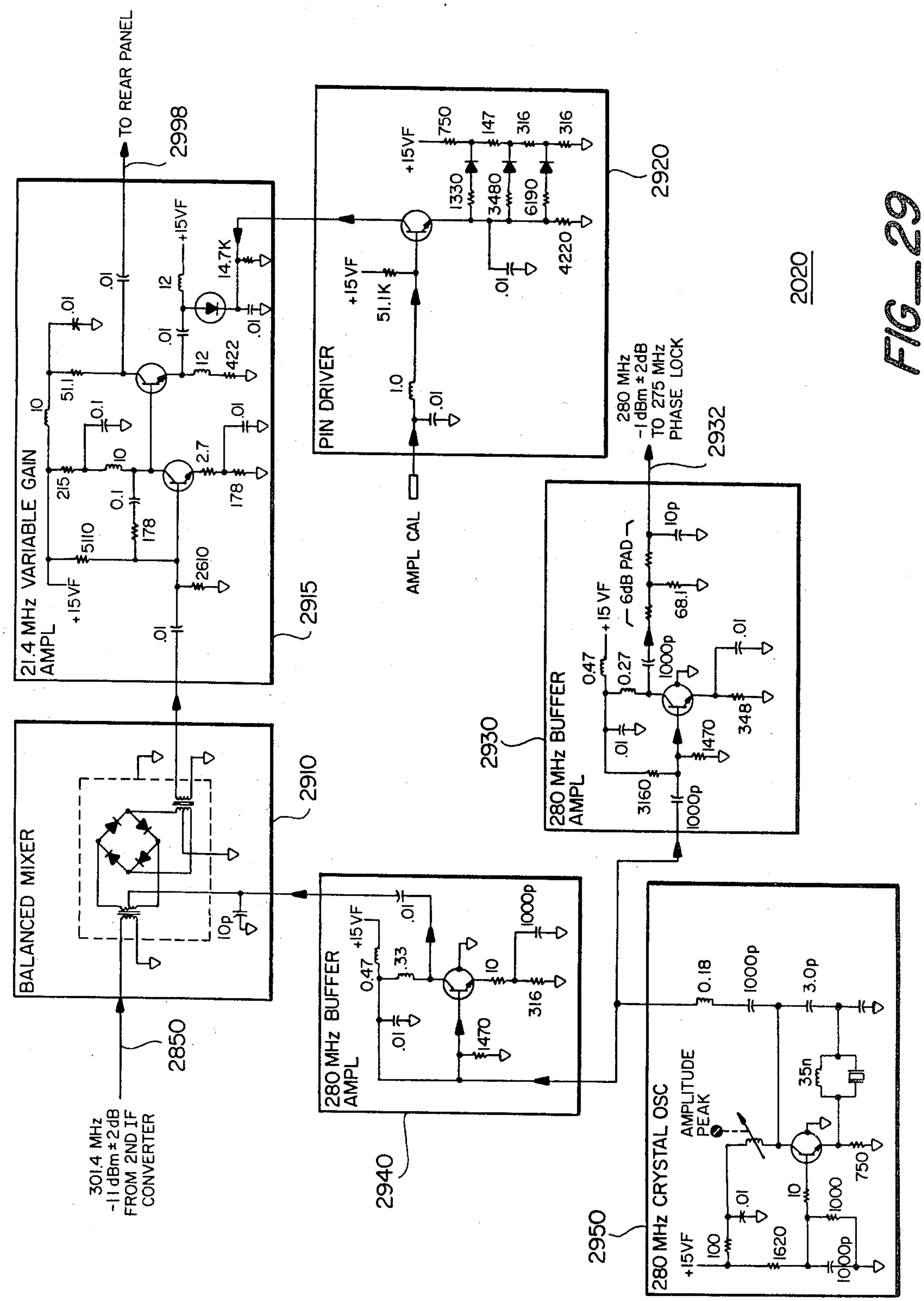
FIG_29

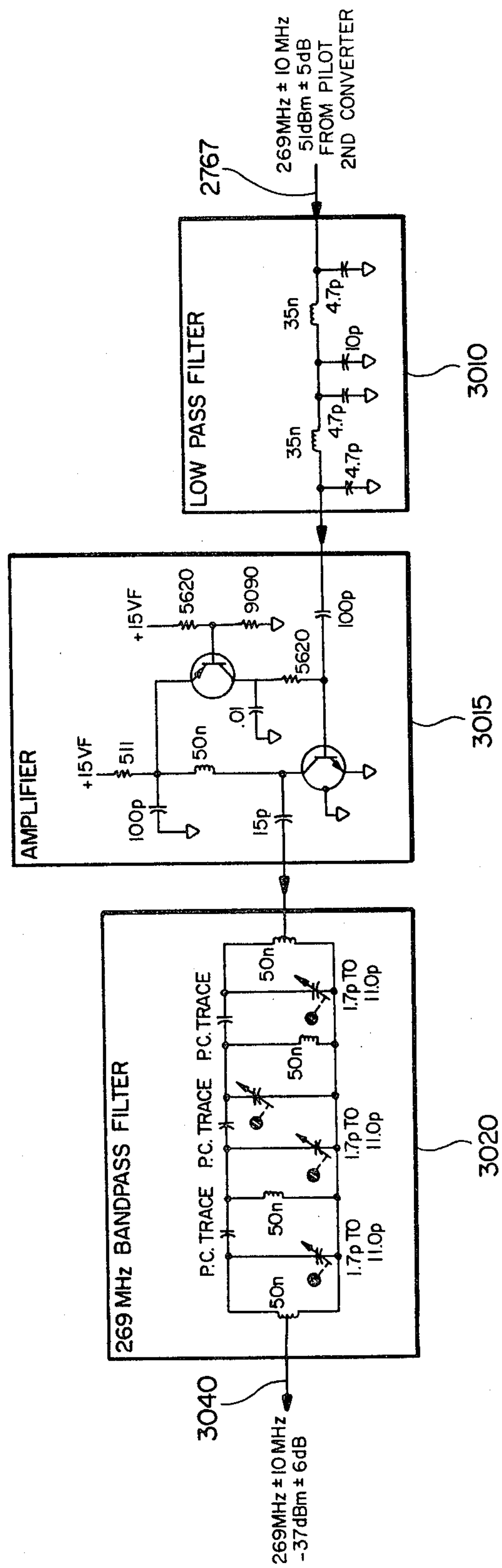
FIG_30

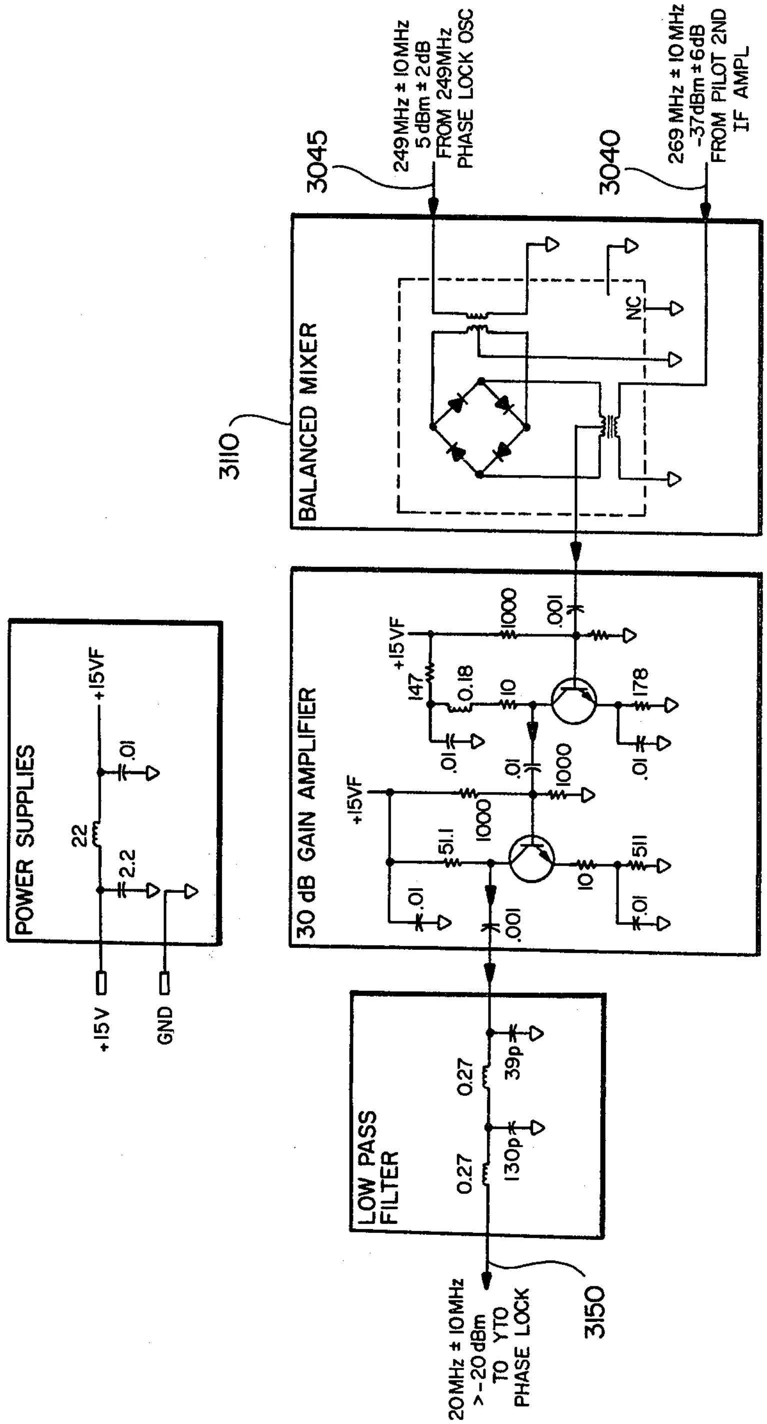
FIG_31

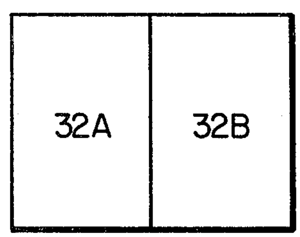
FIG_32

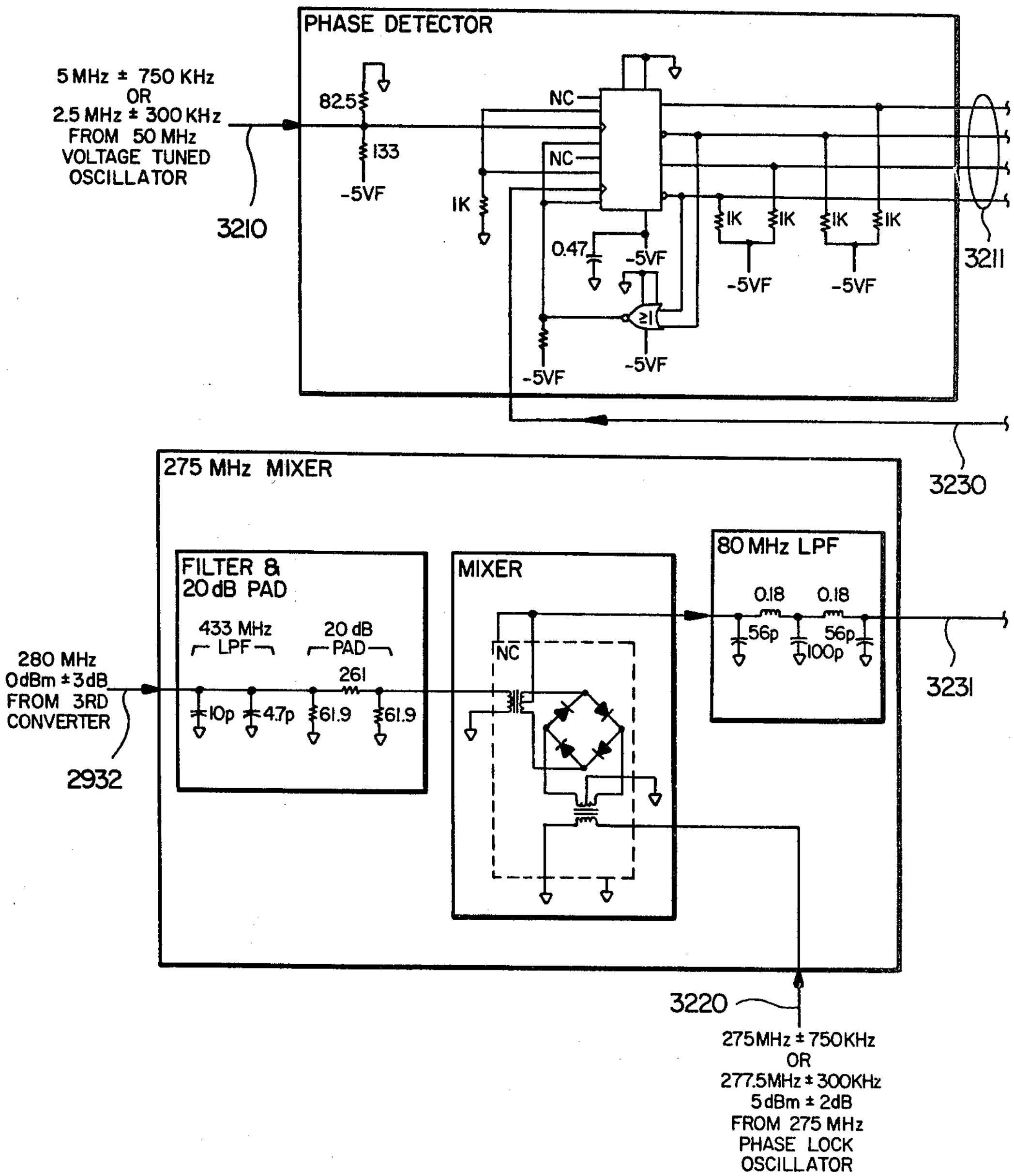
FIG_32A

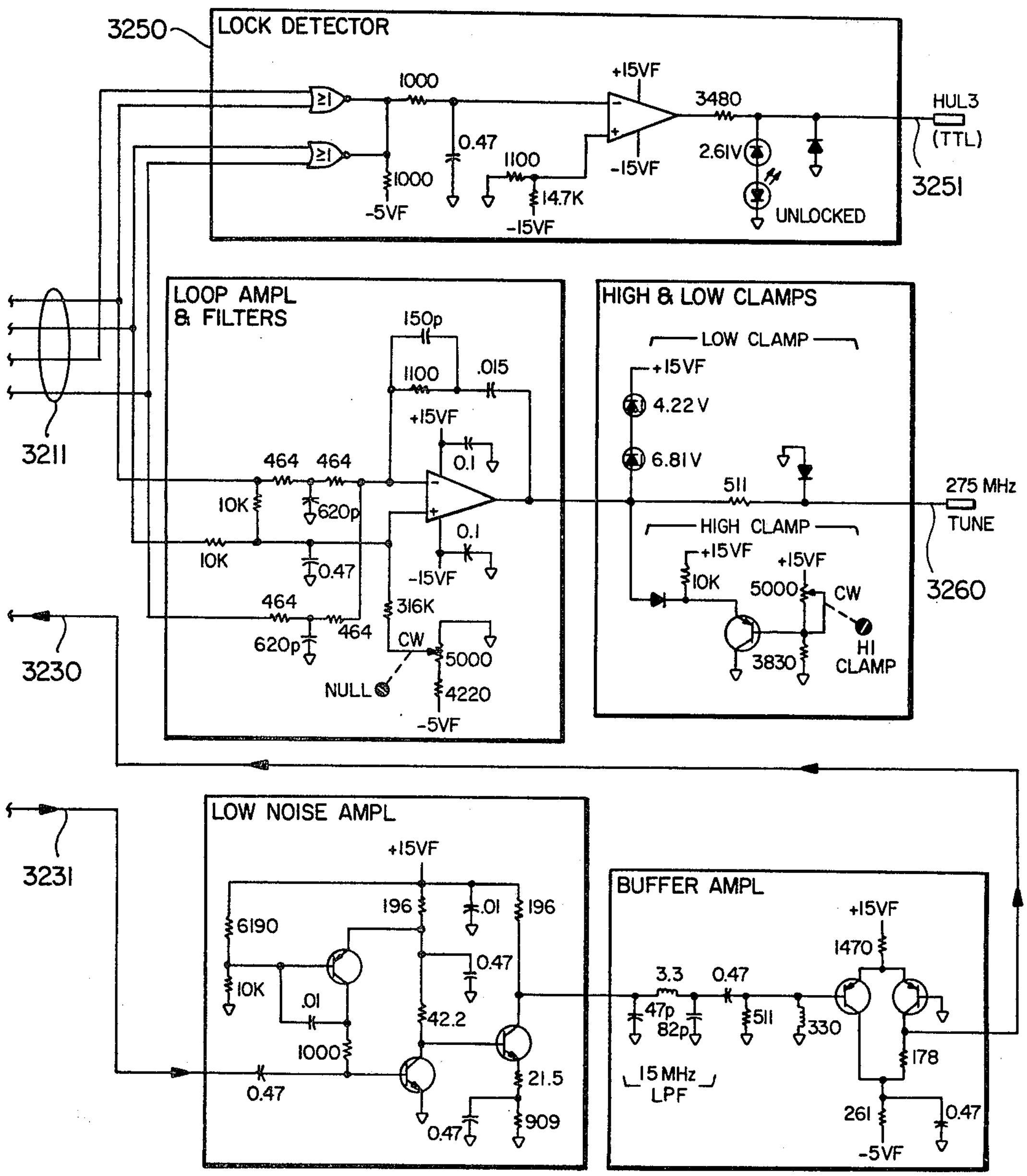
FIG_32B

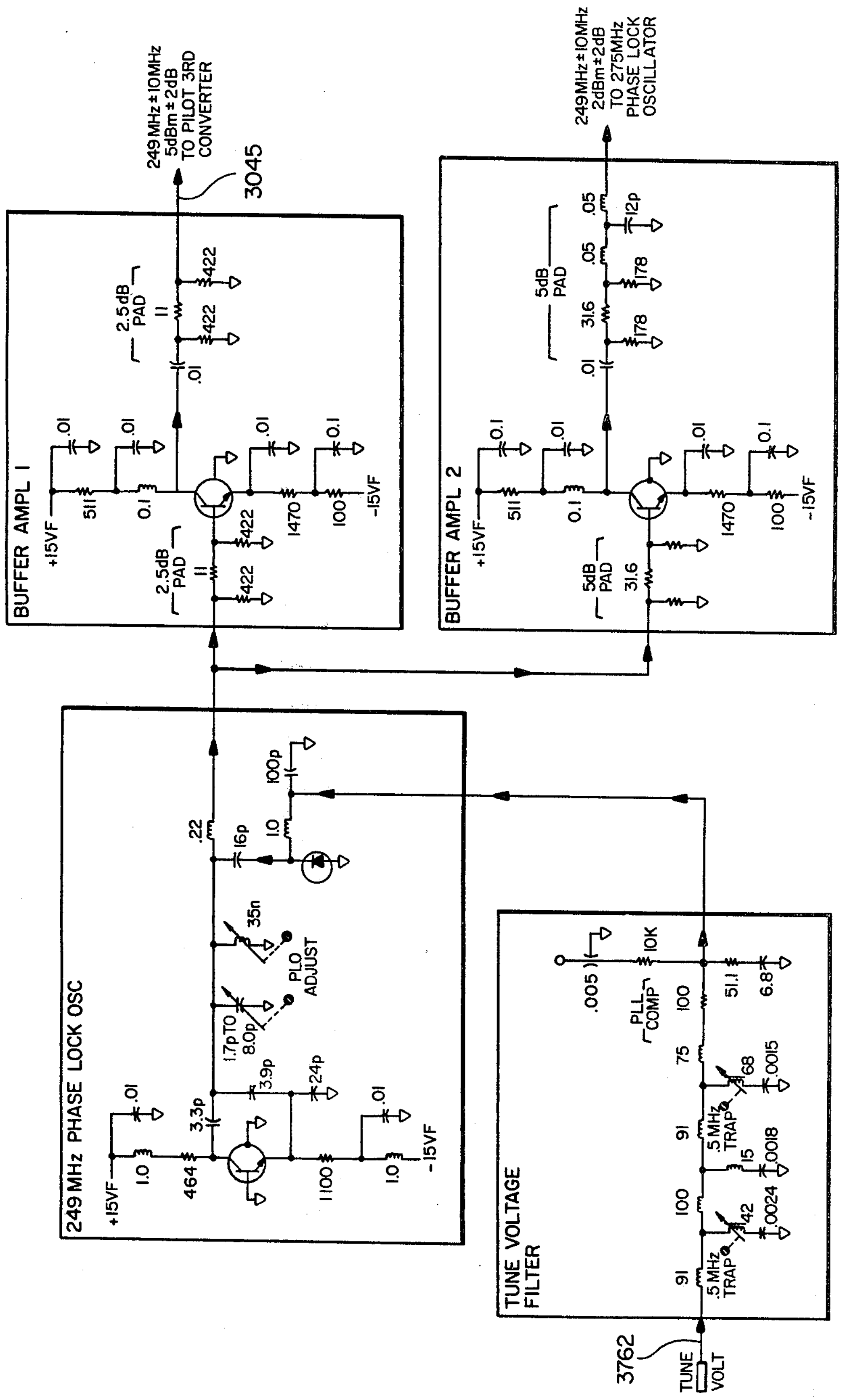
FIG_33

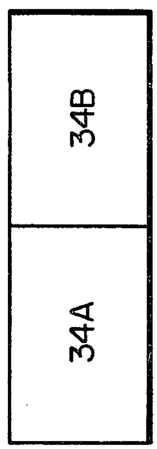
FIG_34

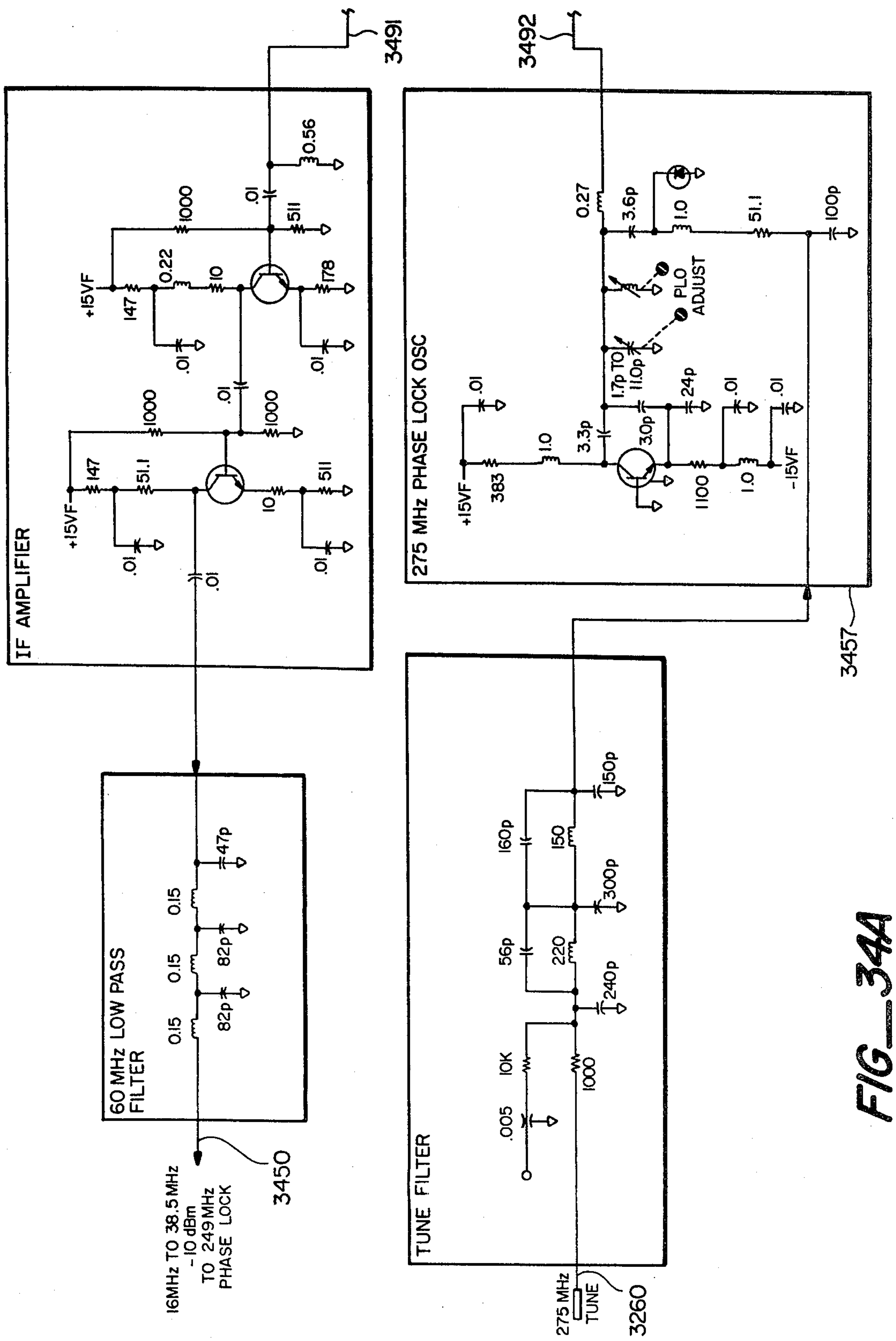
FIG_34A

FIG_34B
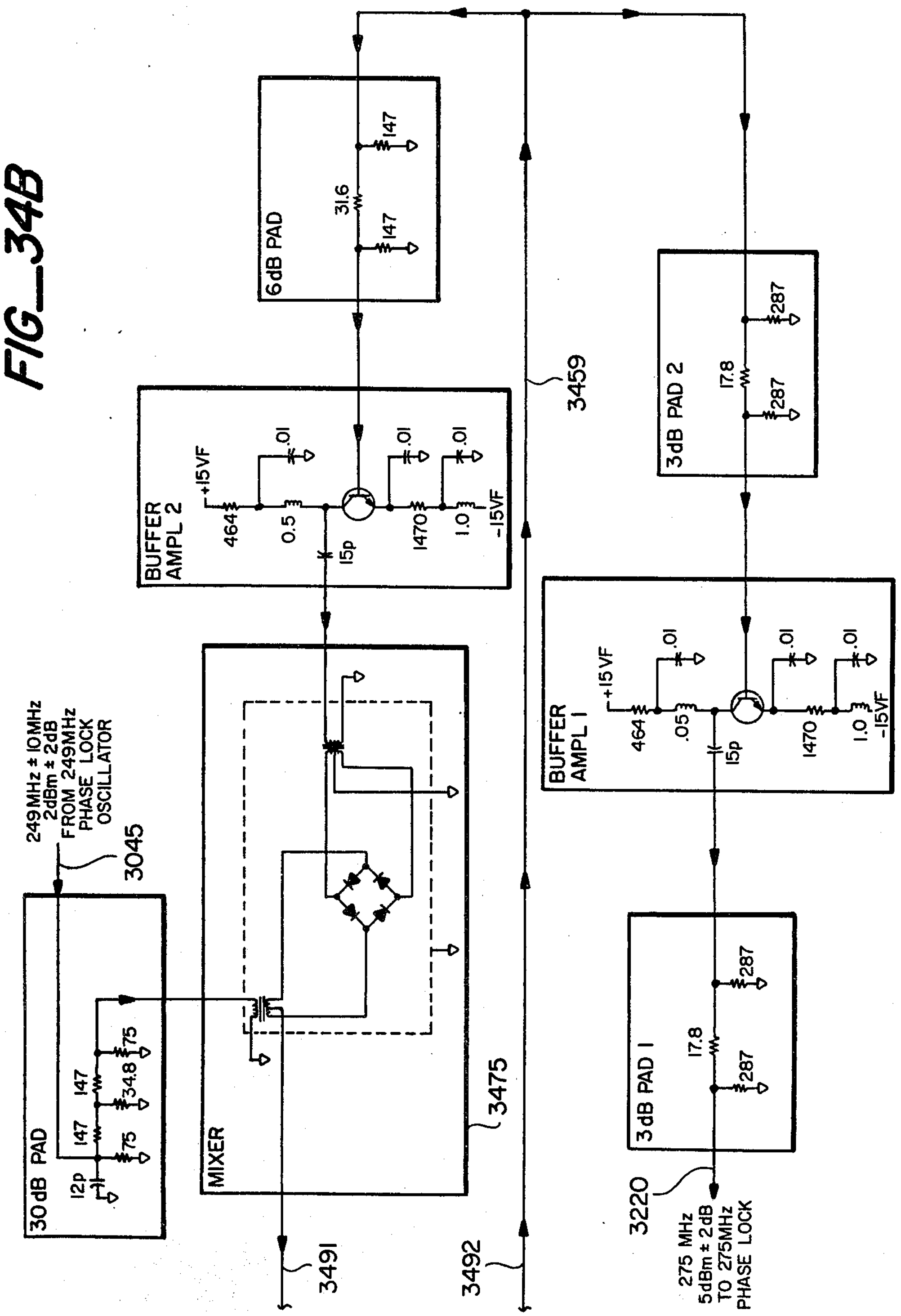

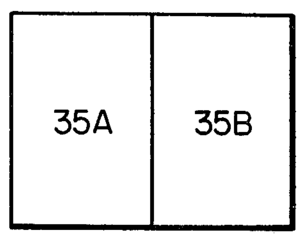
FIG_35

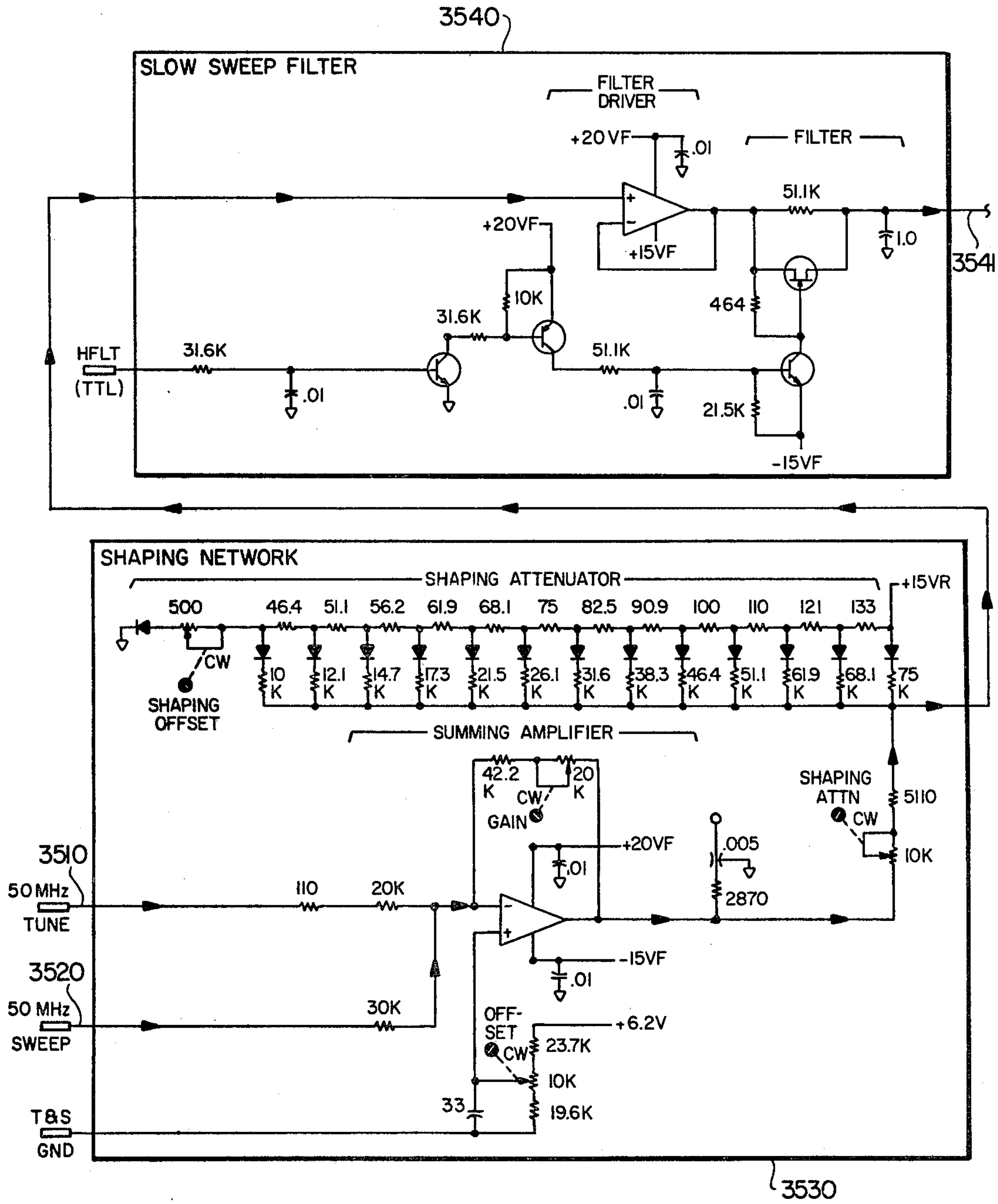
FIG_35A

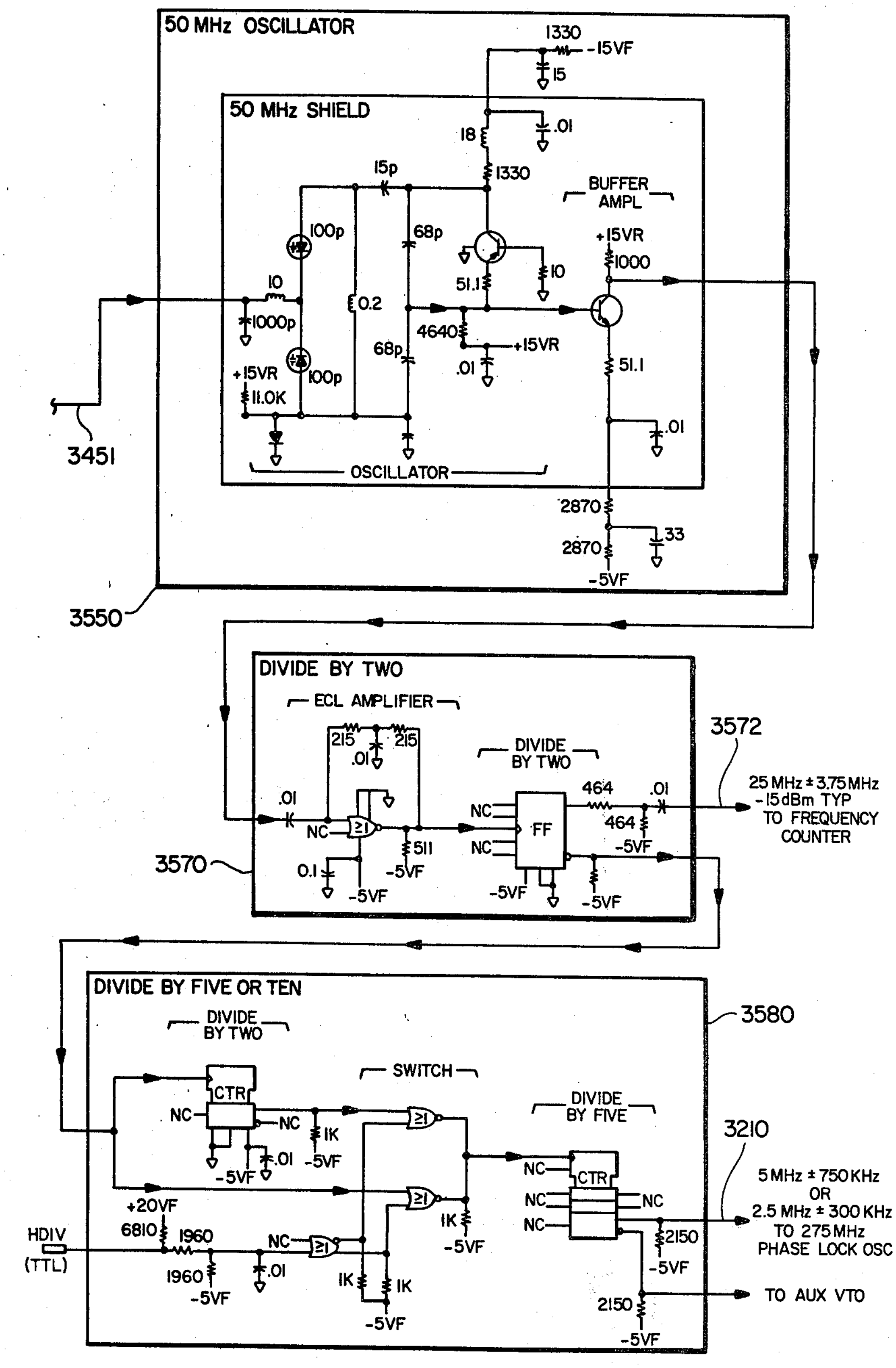
FIG_35B

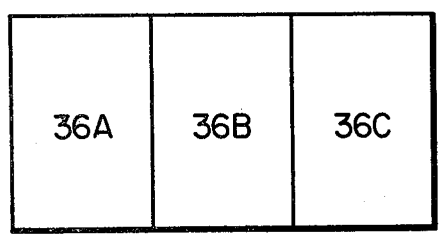
FIG_36

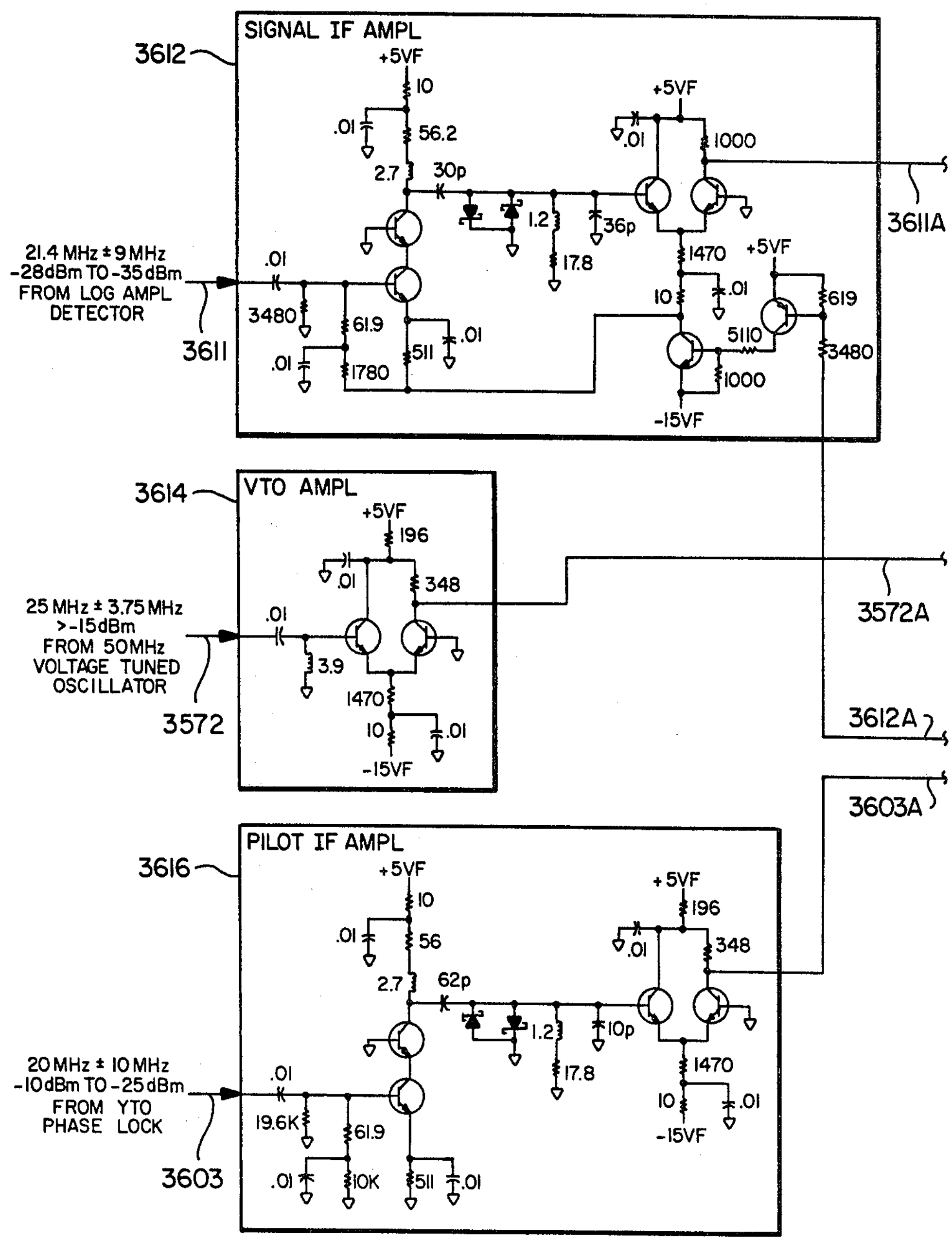
FIG_36A

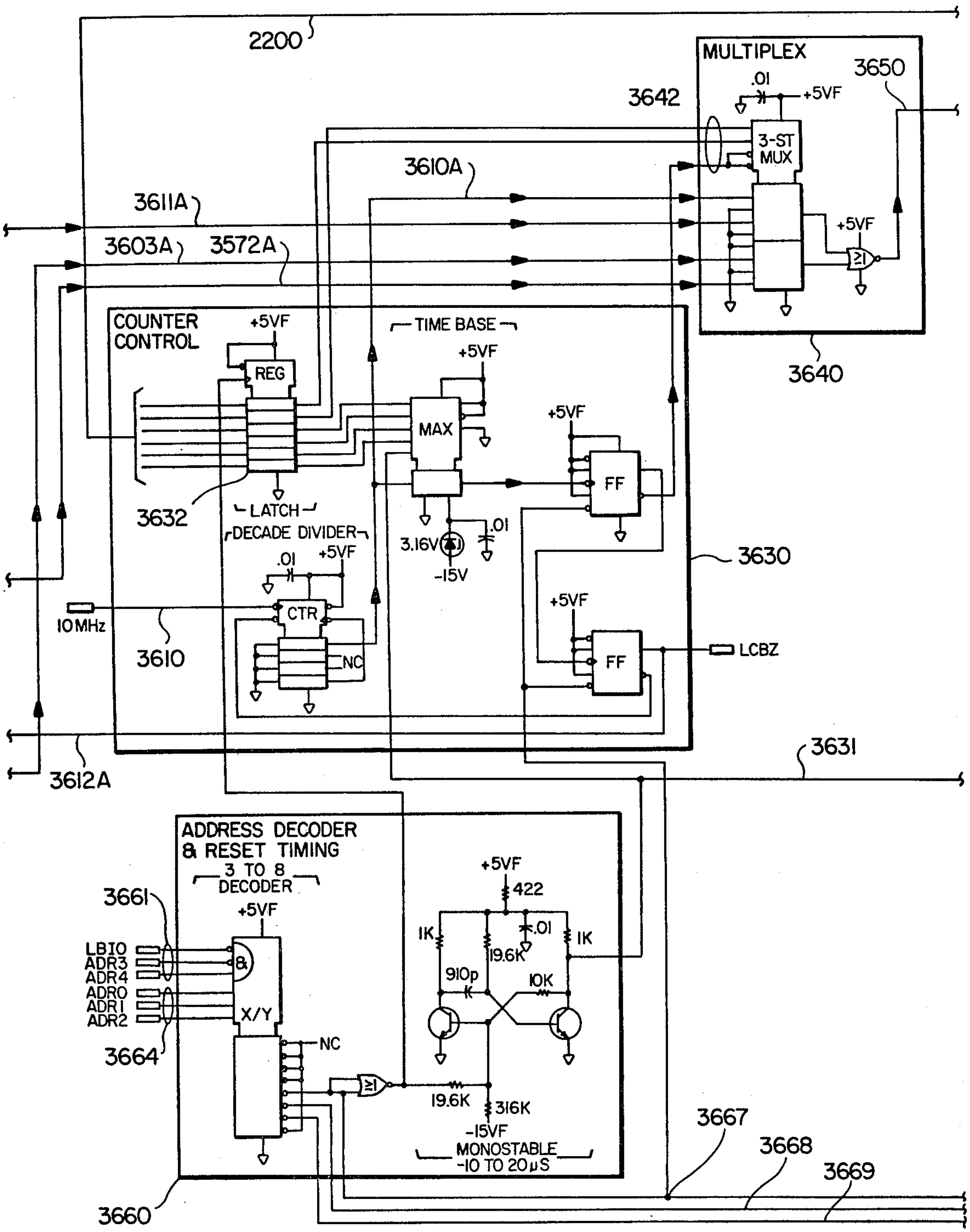
FIG_36B

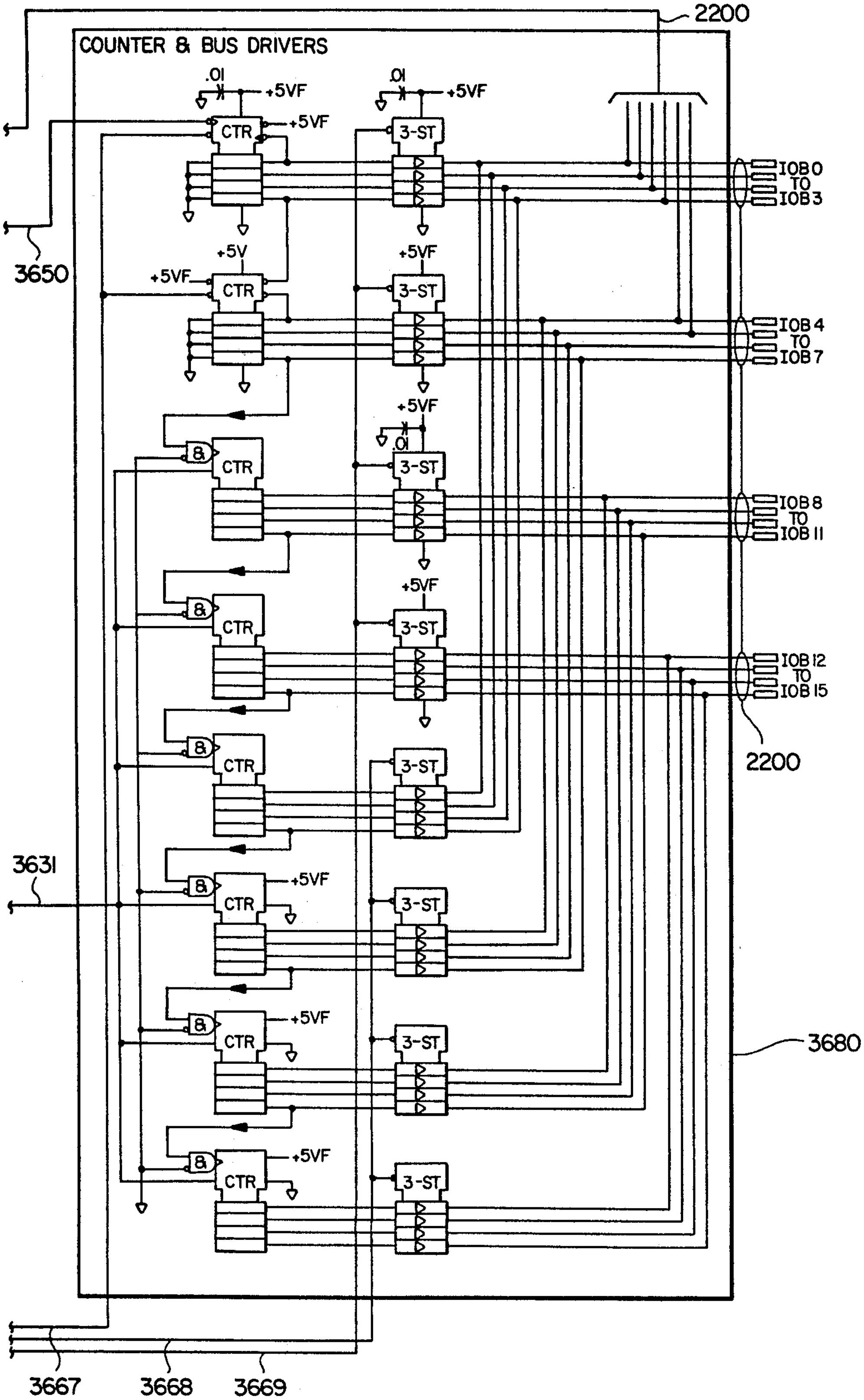
FIG_36C

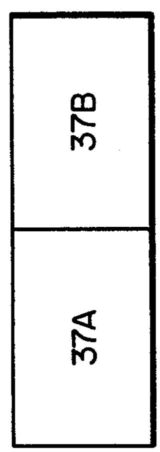
FIG_37

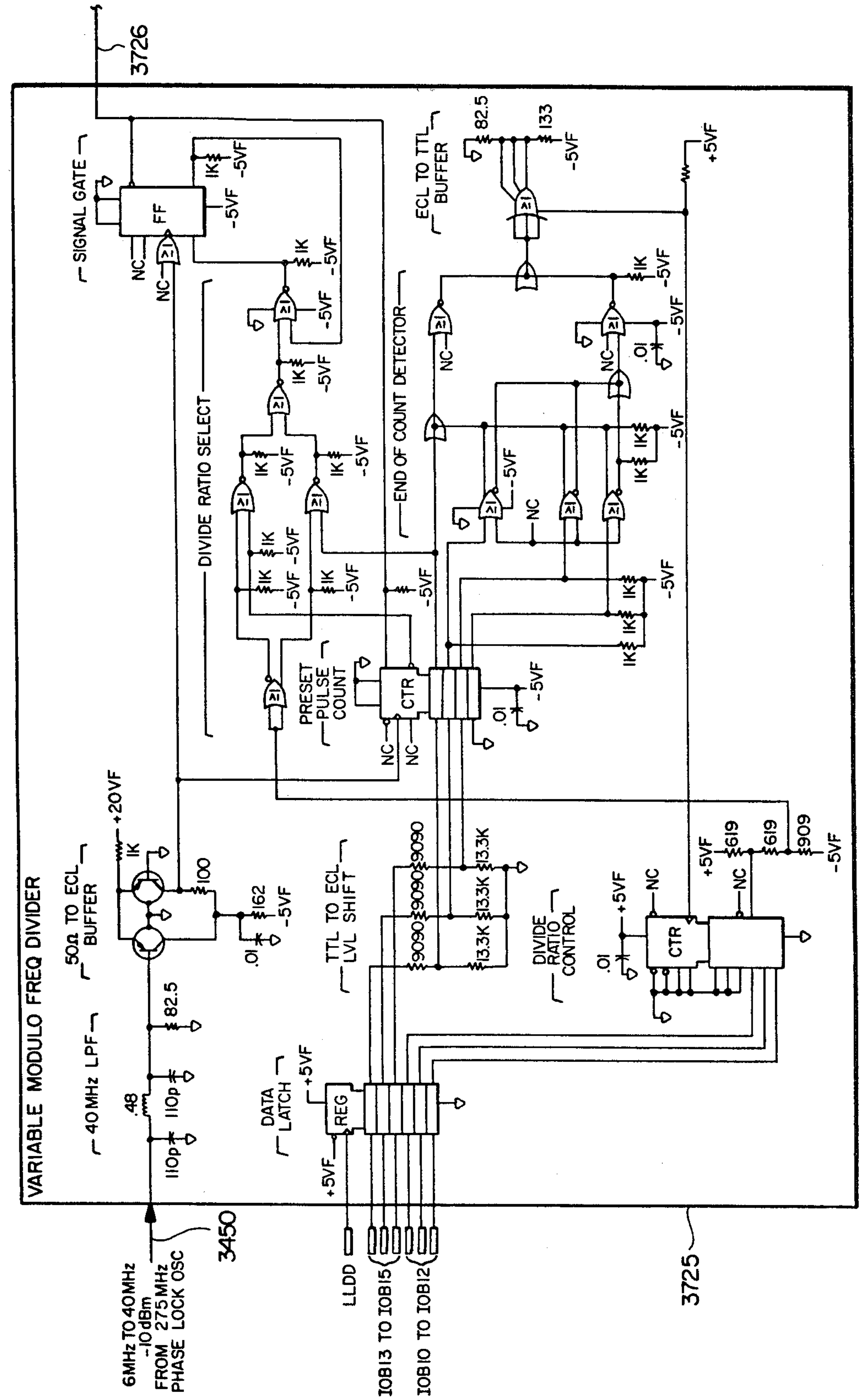
FIG_37A

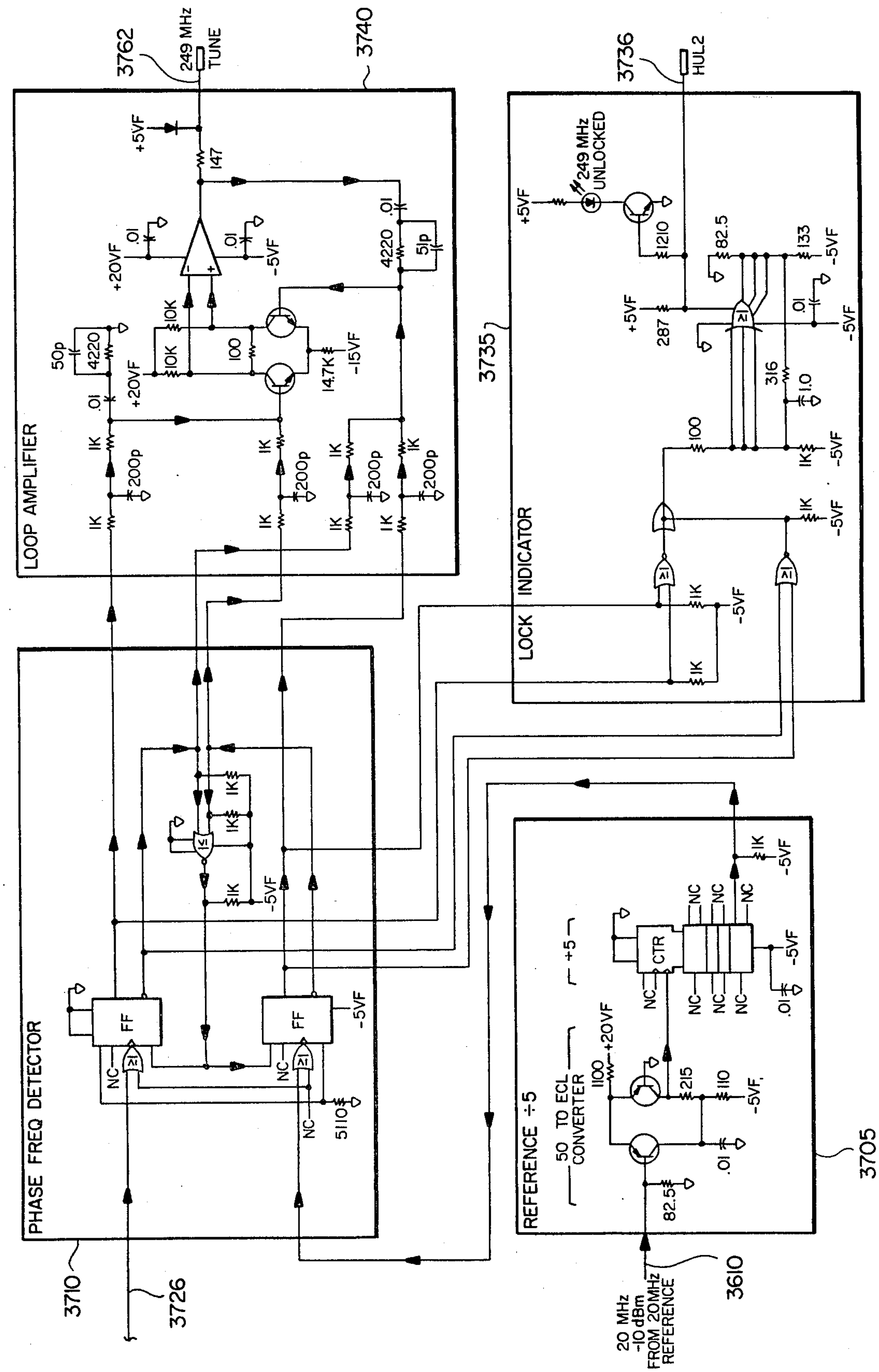
FIG_37B

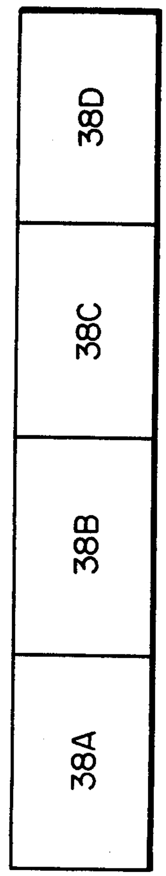
FIG_38

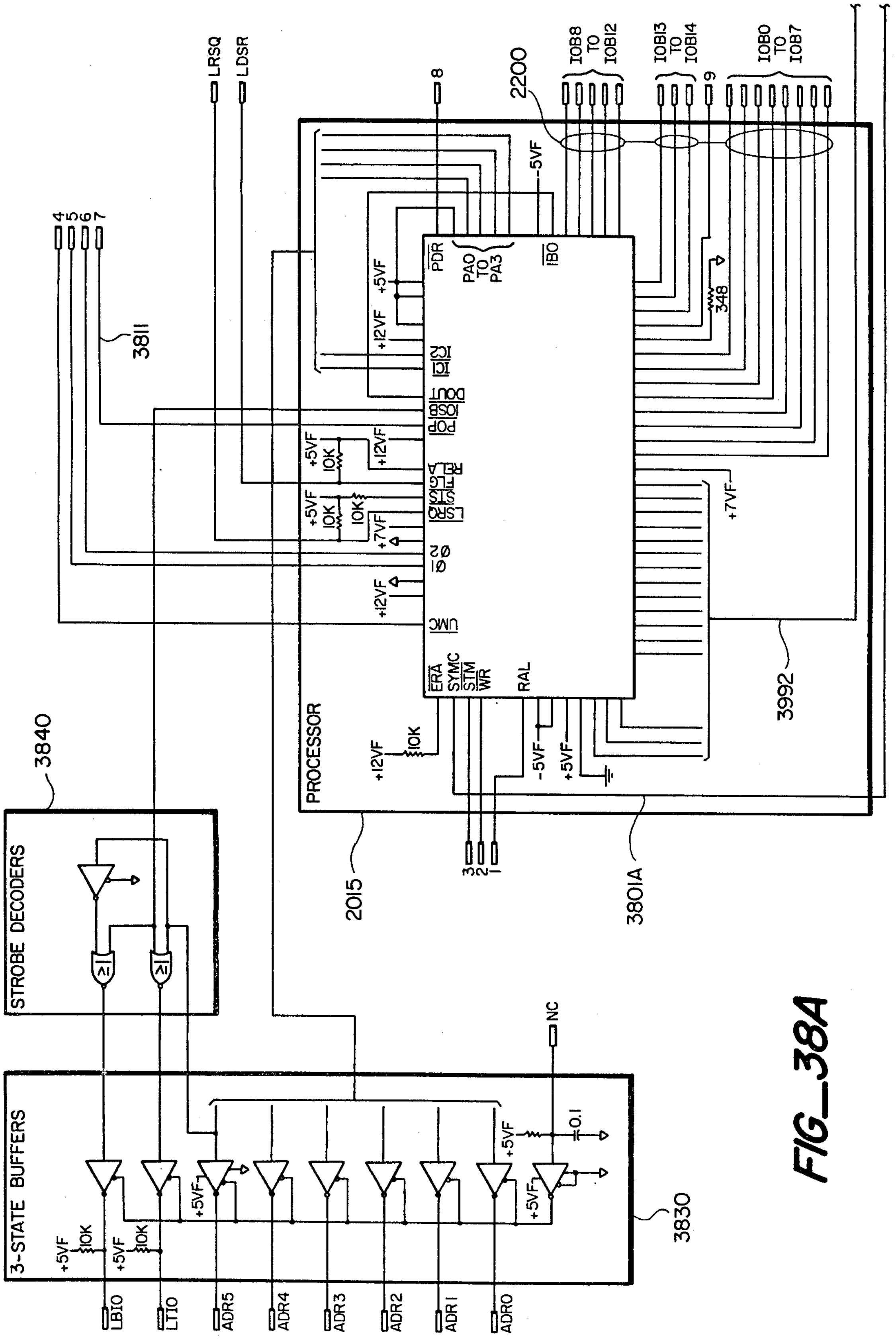
FIG_38A

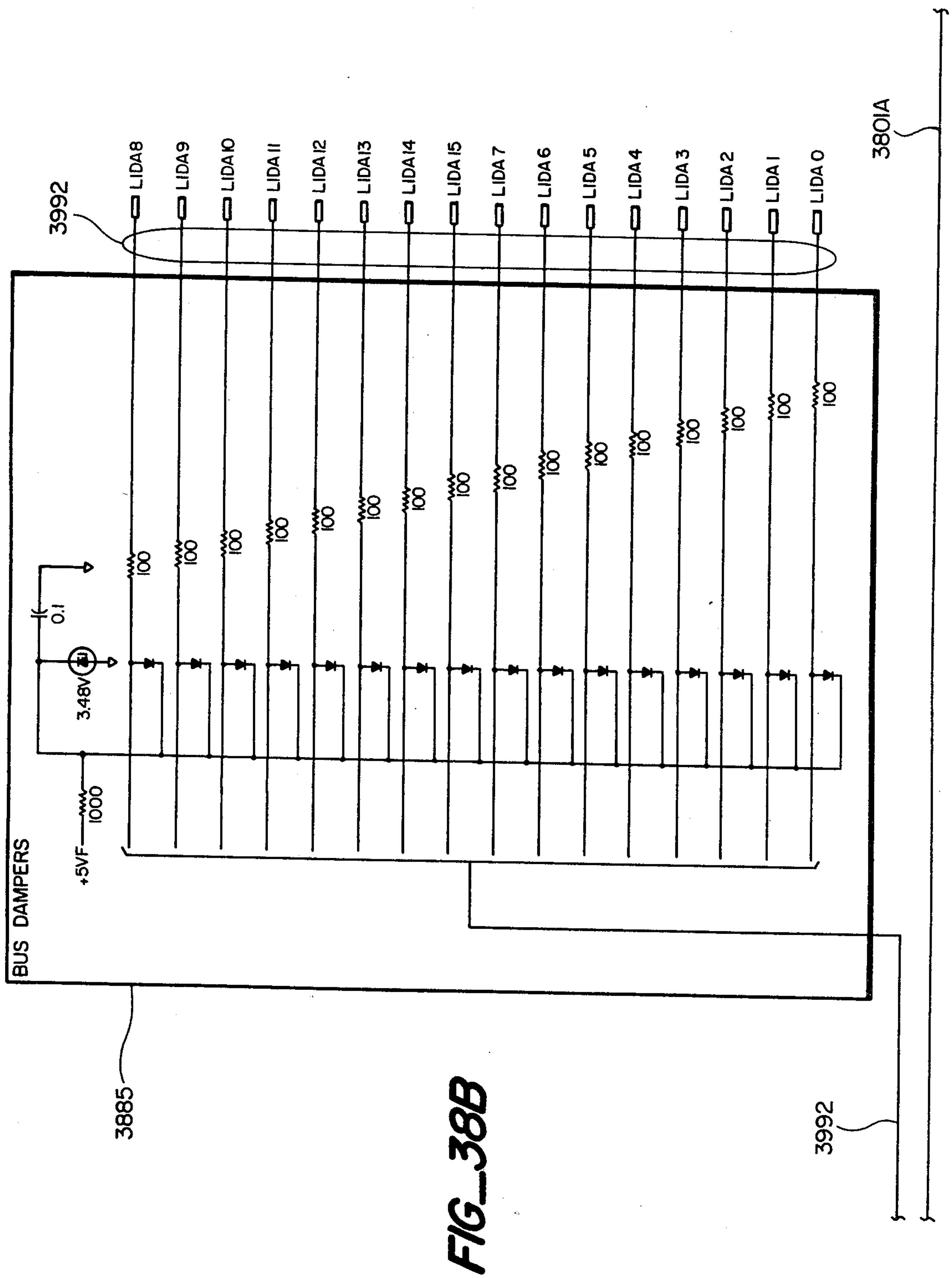
FIG_38B

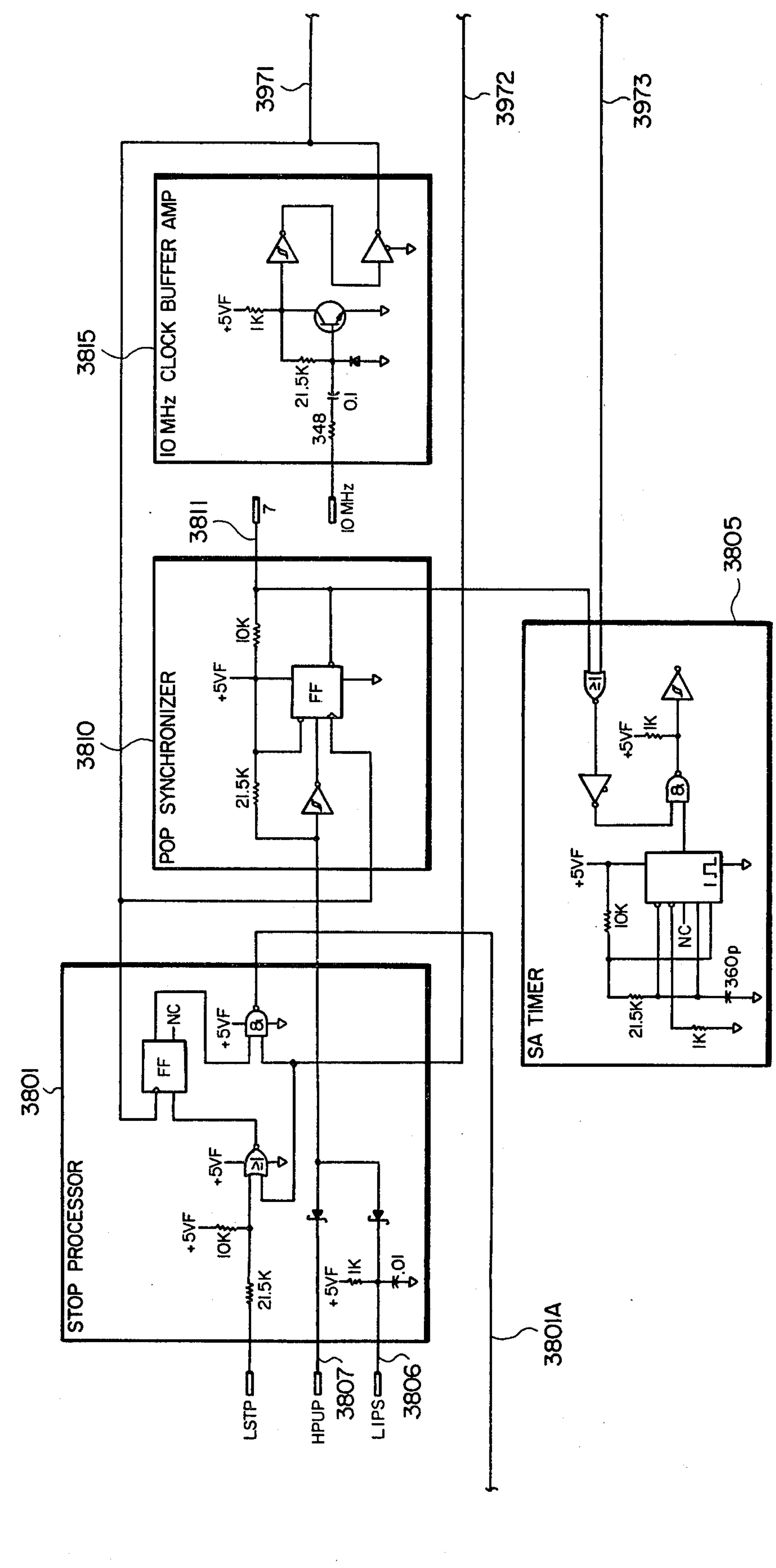
FIG_38C

FIG_38D
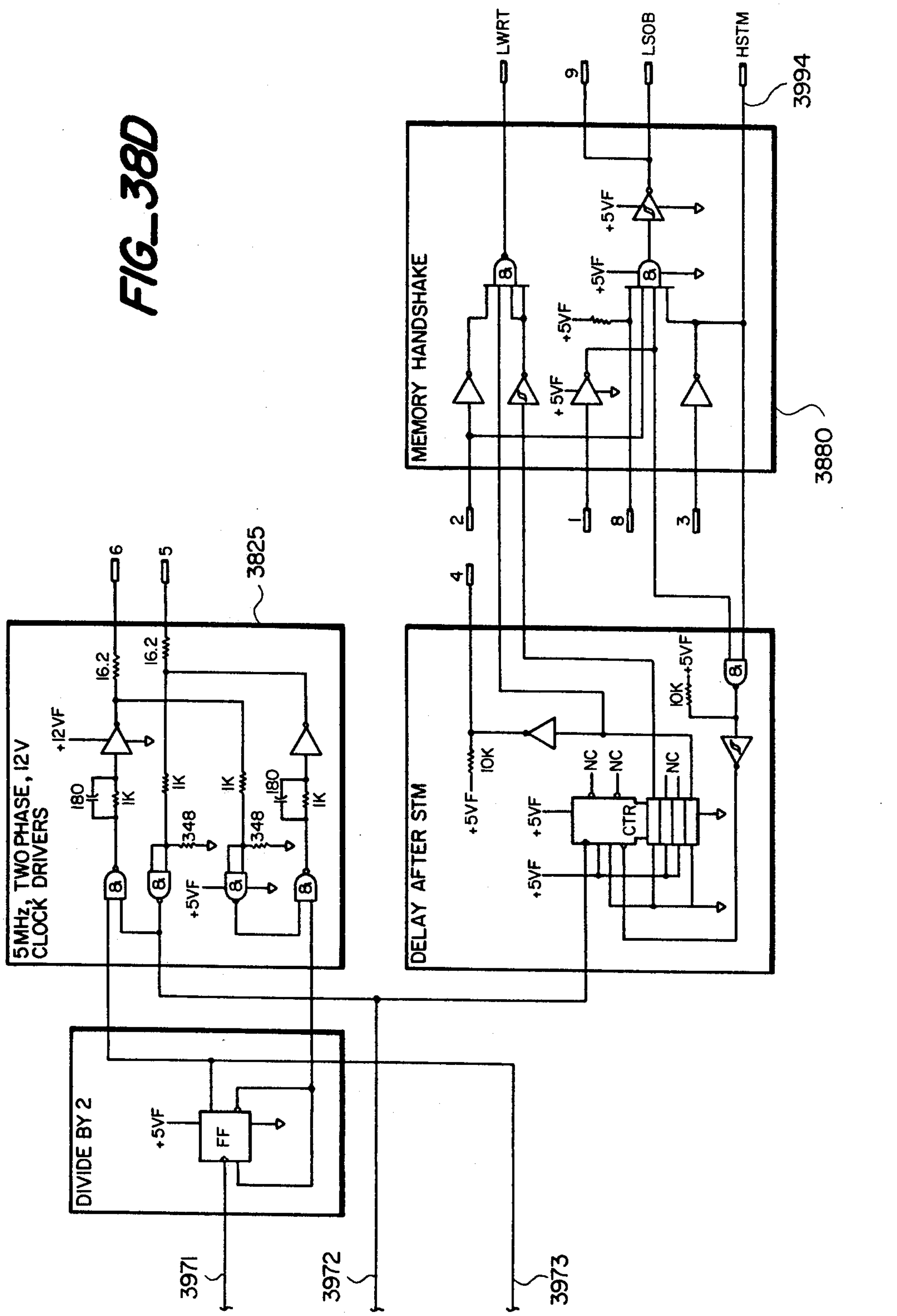

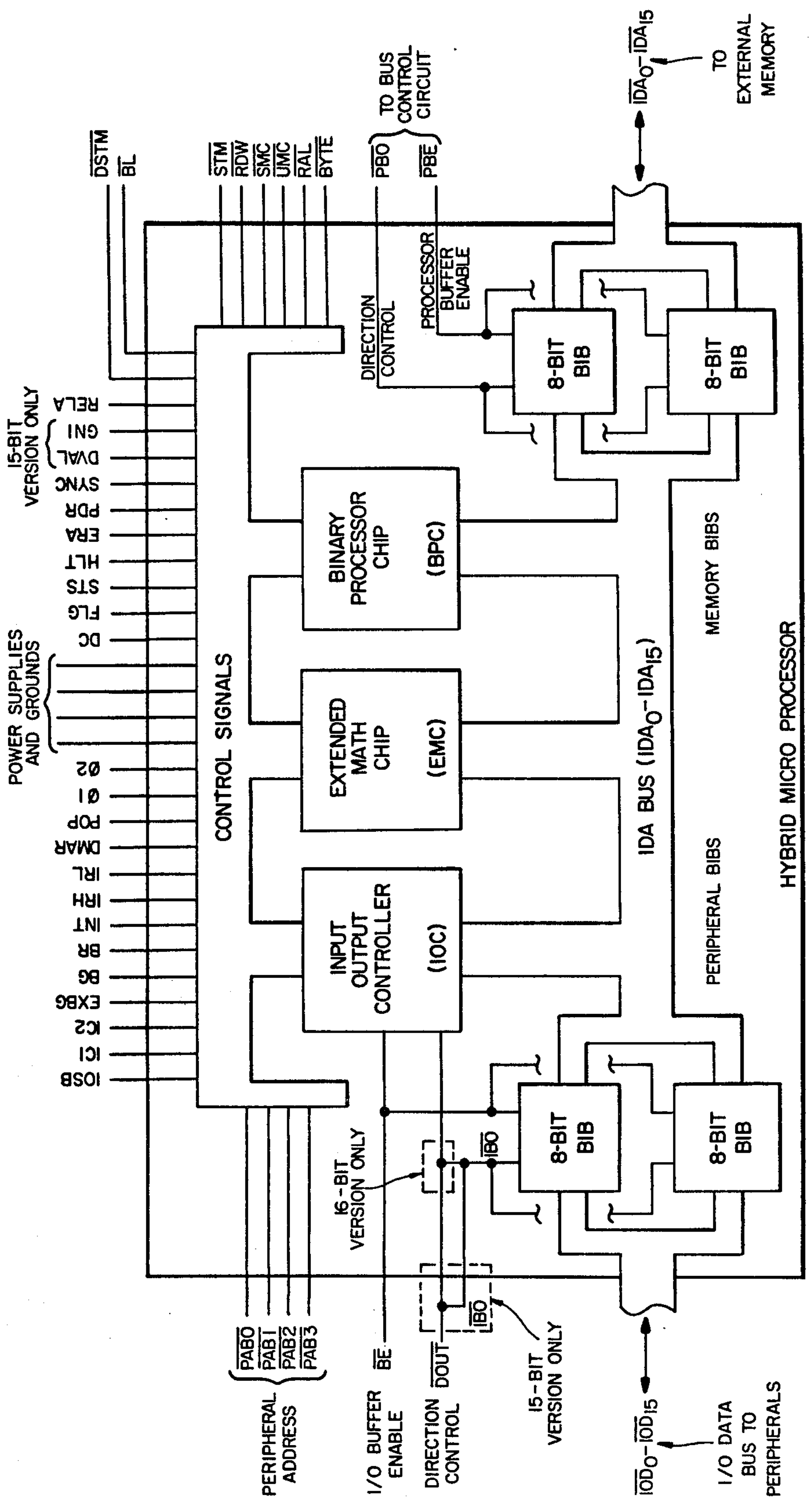
FIG_39

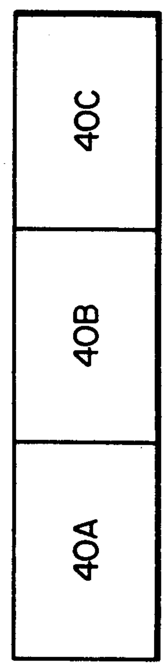
FIG_40

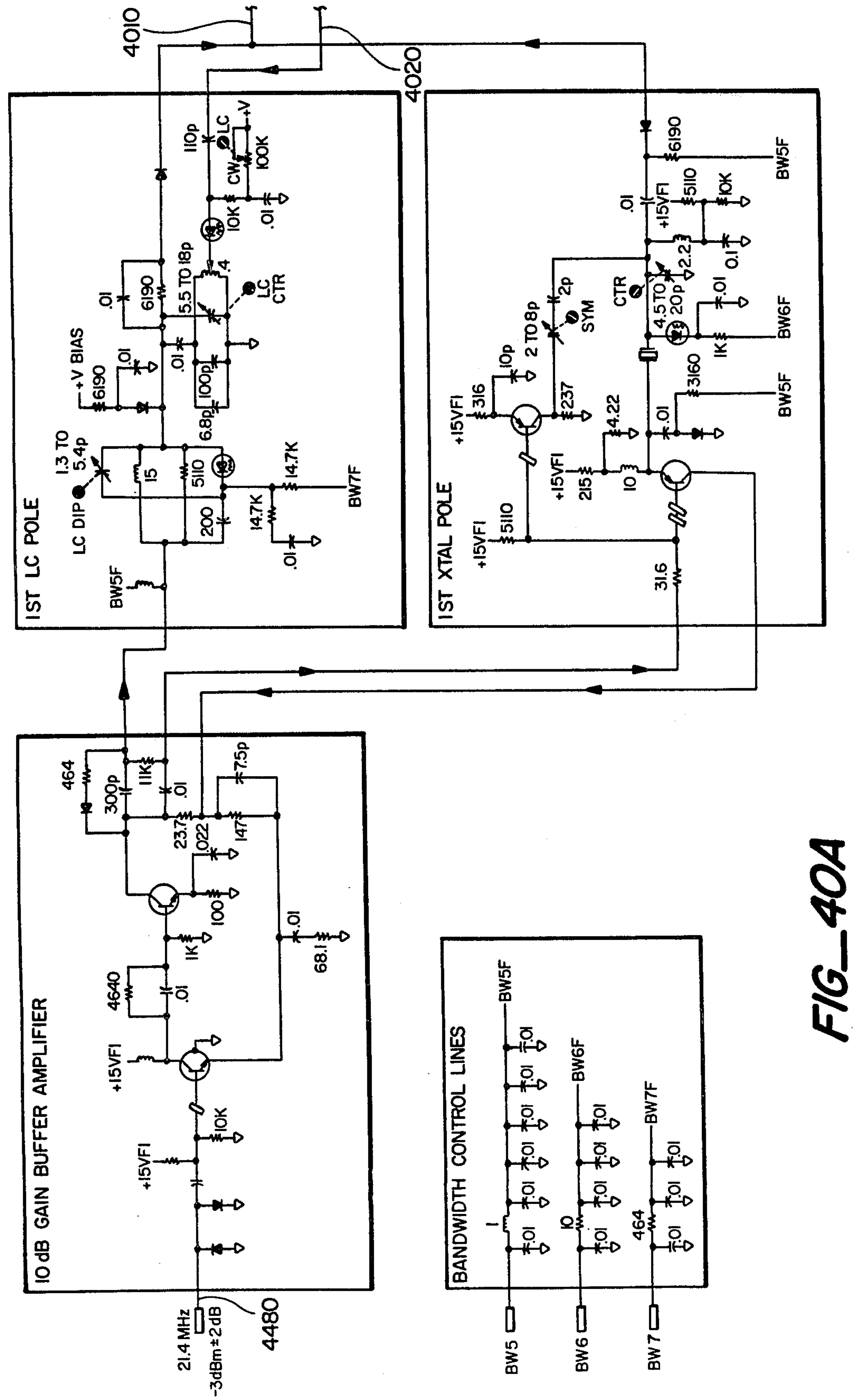
FIG_40A

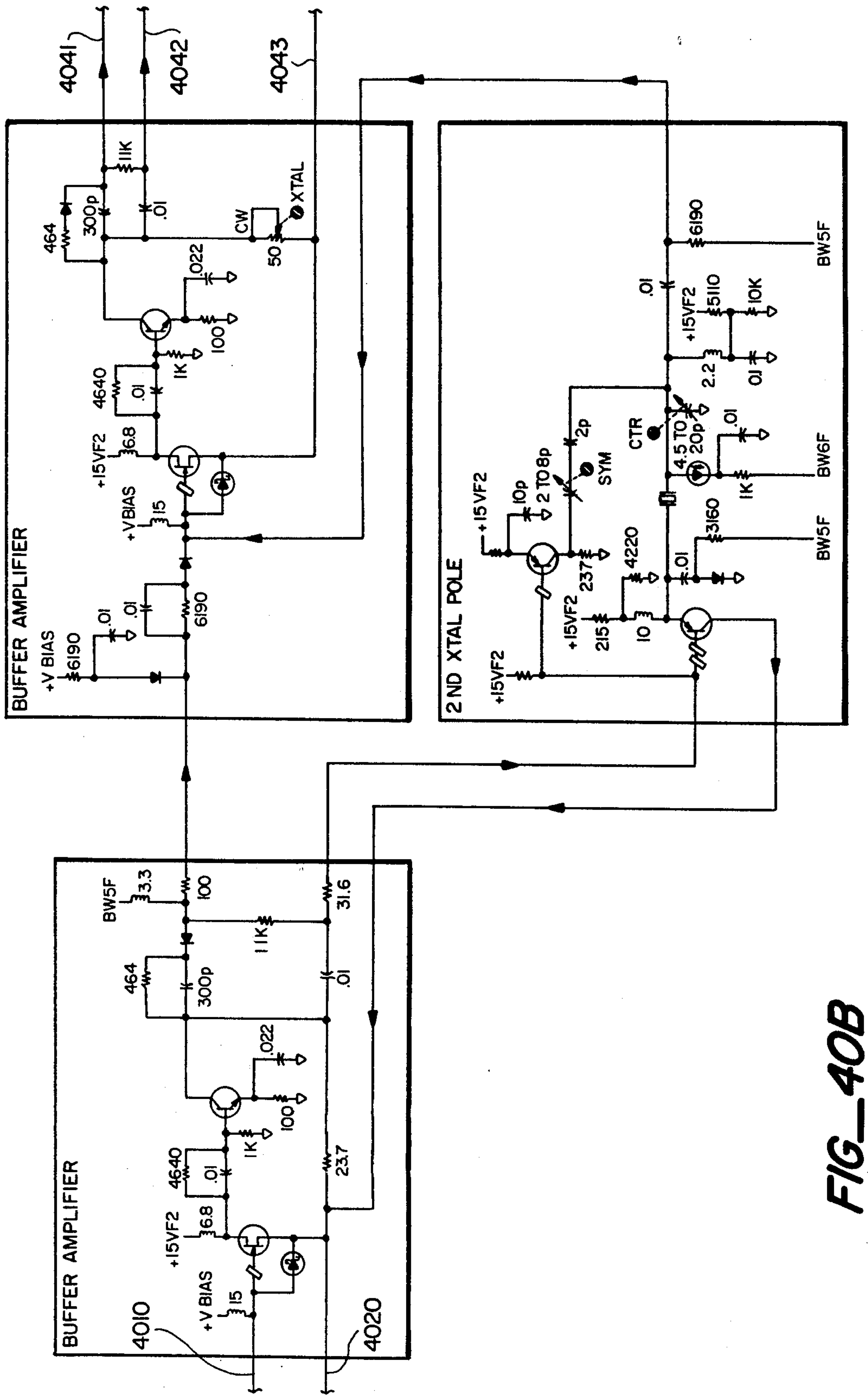
FIG_40B

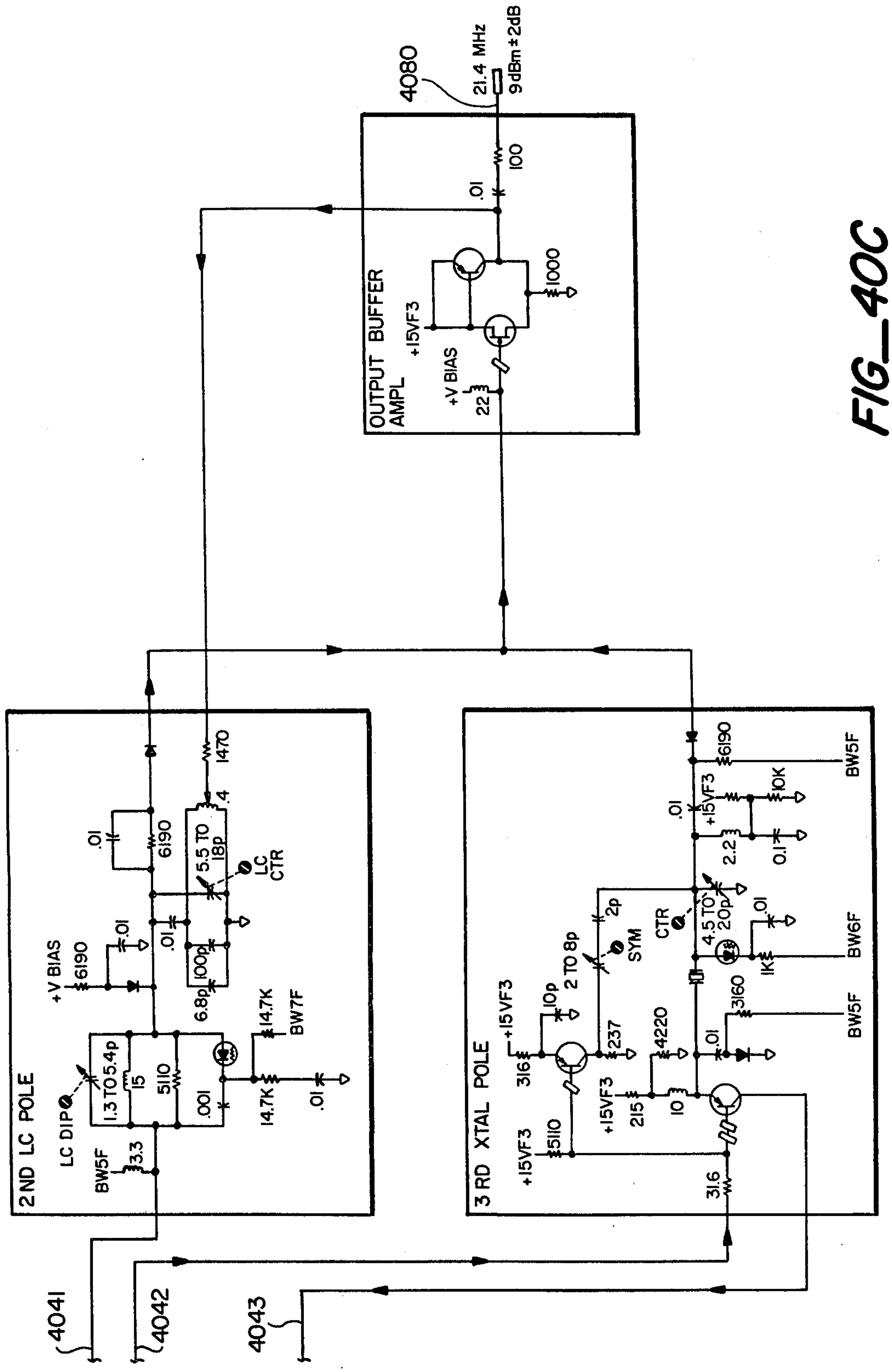
FIG_40C

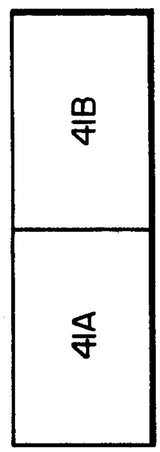
FIG_41

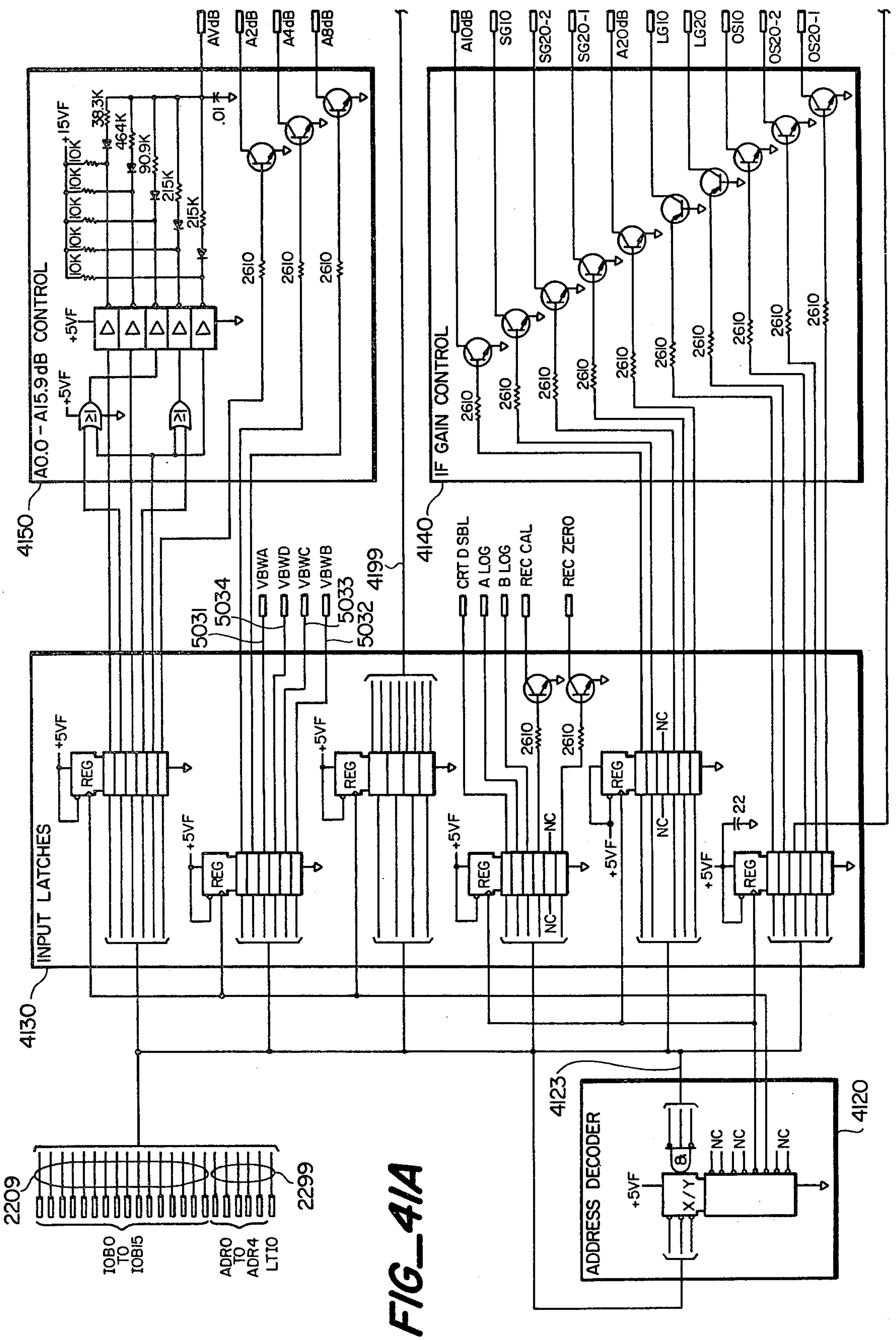
FIG_41A

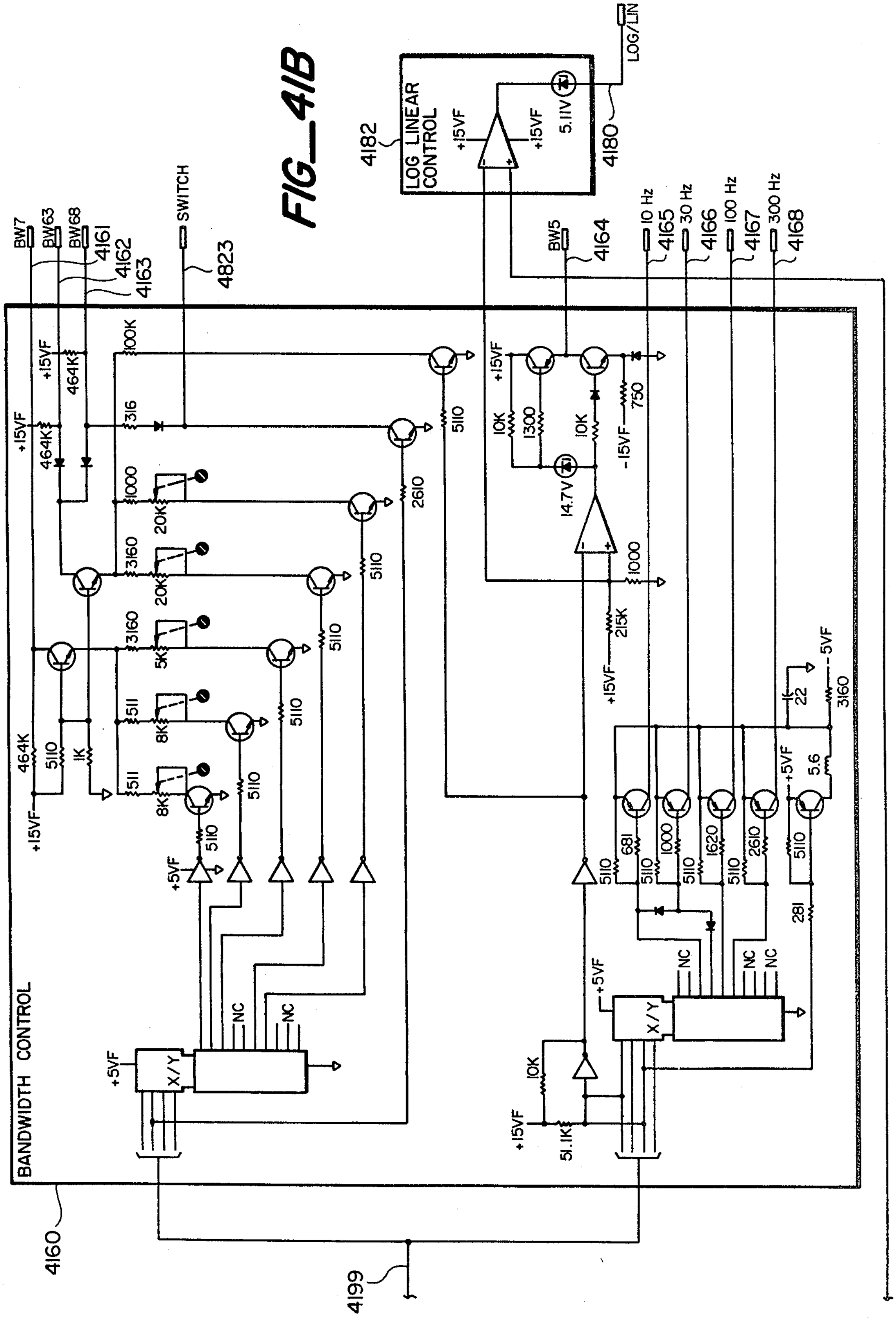
FIG_41B

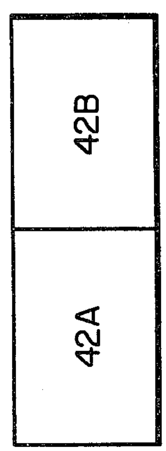
FIG_42

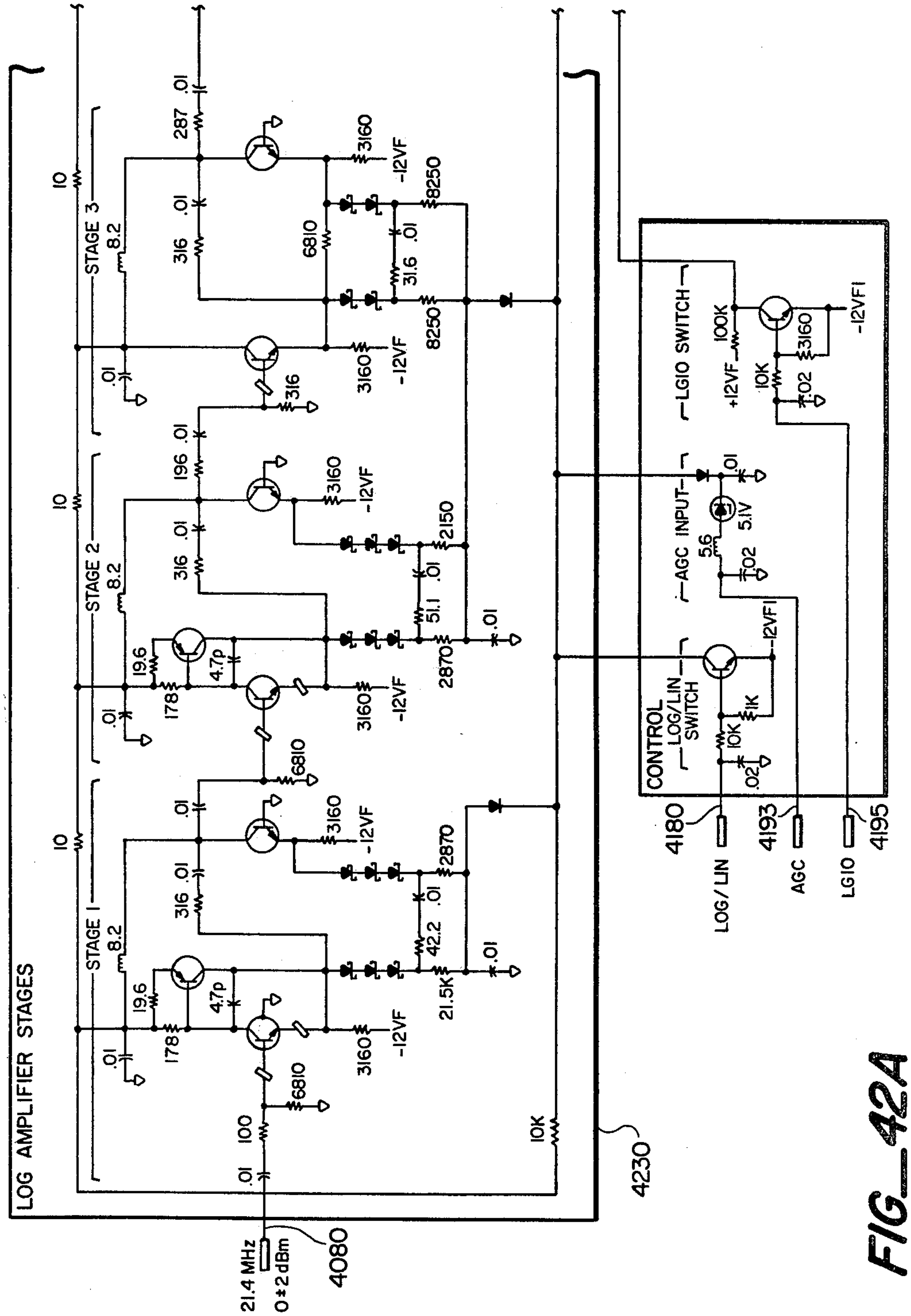
FIG_42A

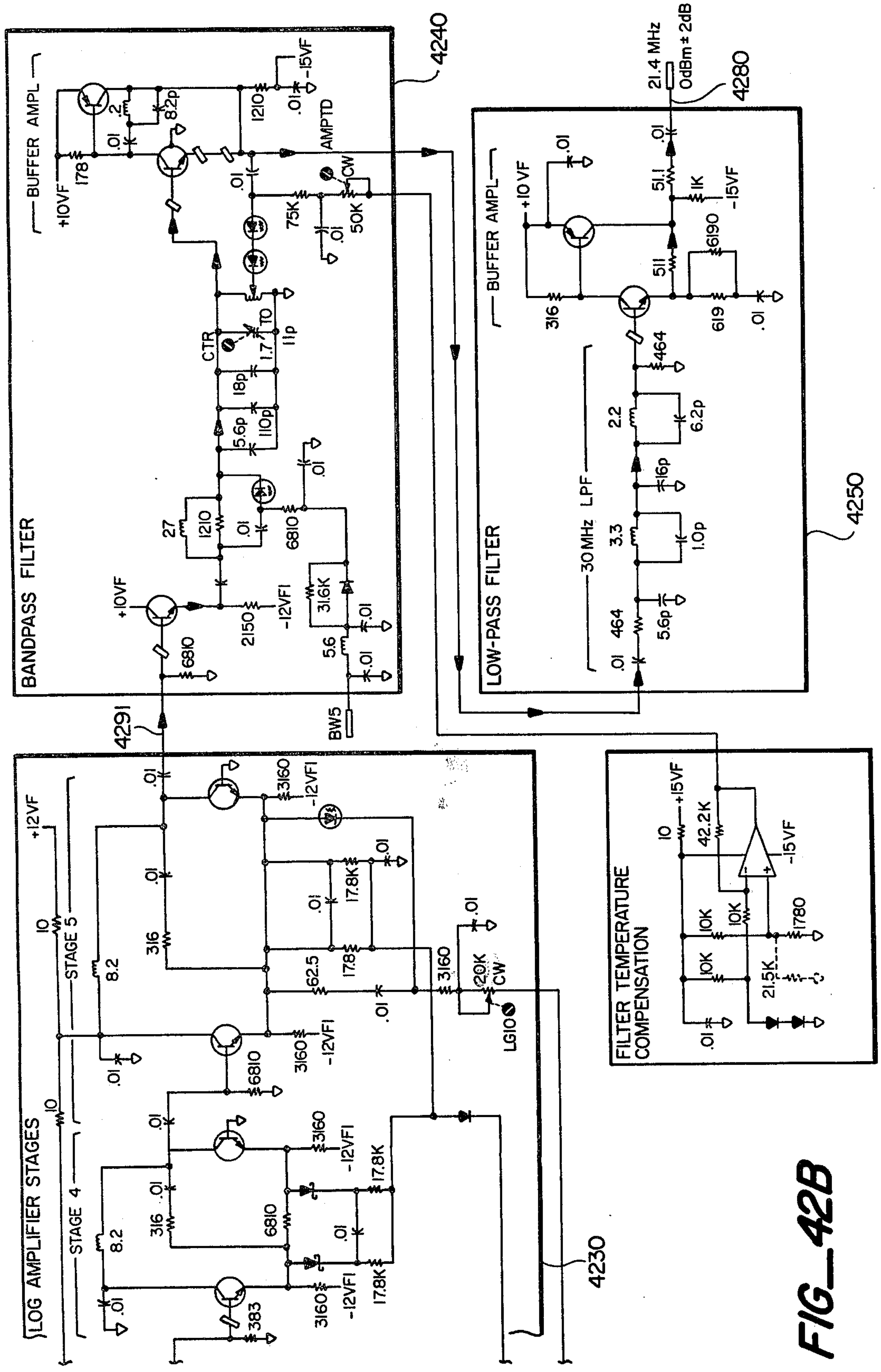
FIG_42B

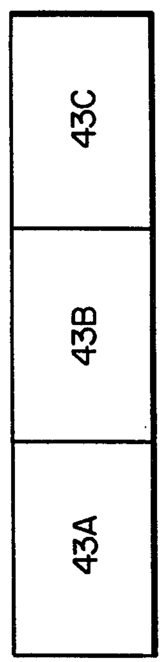
FIG_43

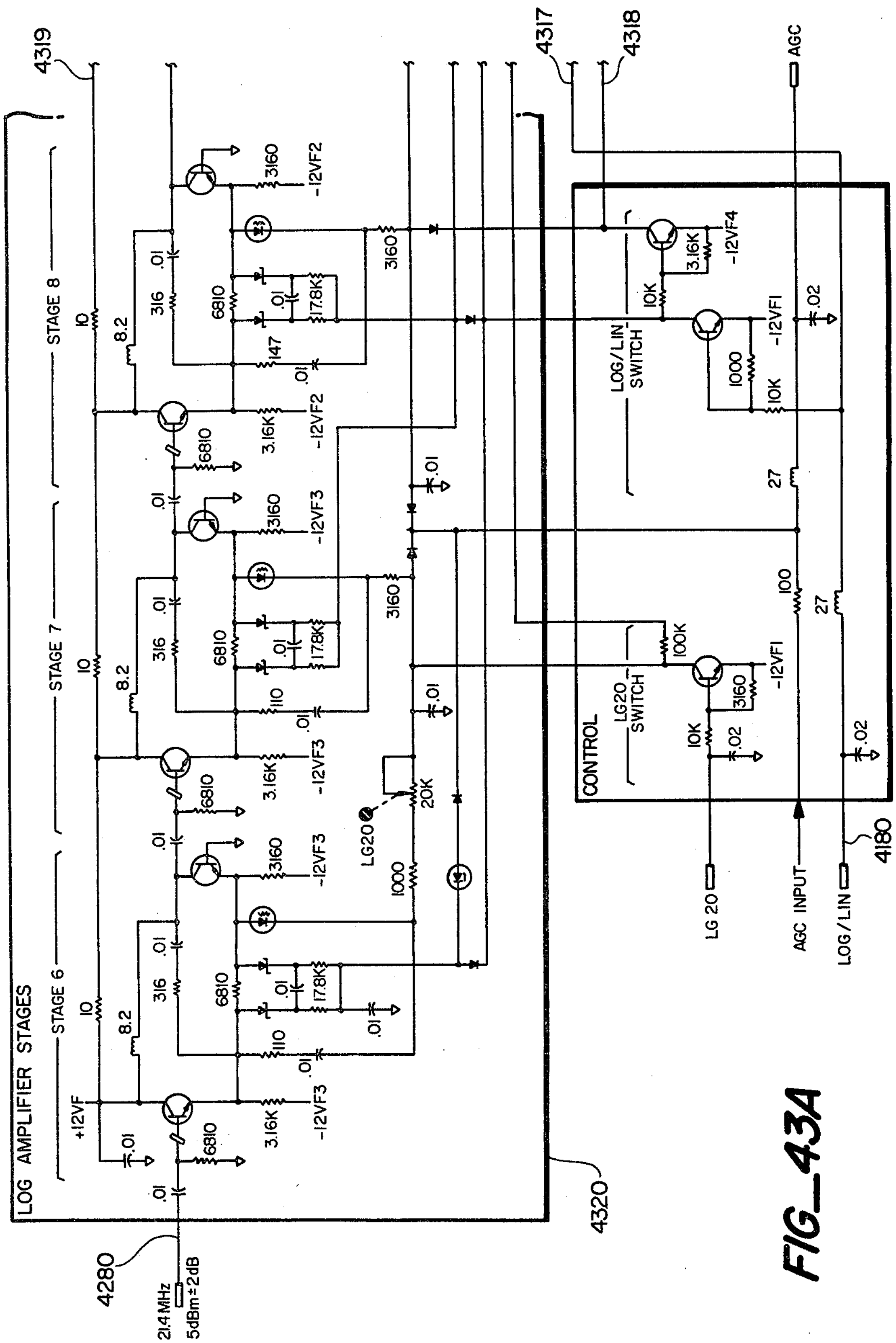
FIG_43A

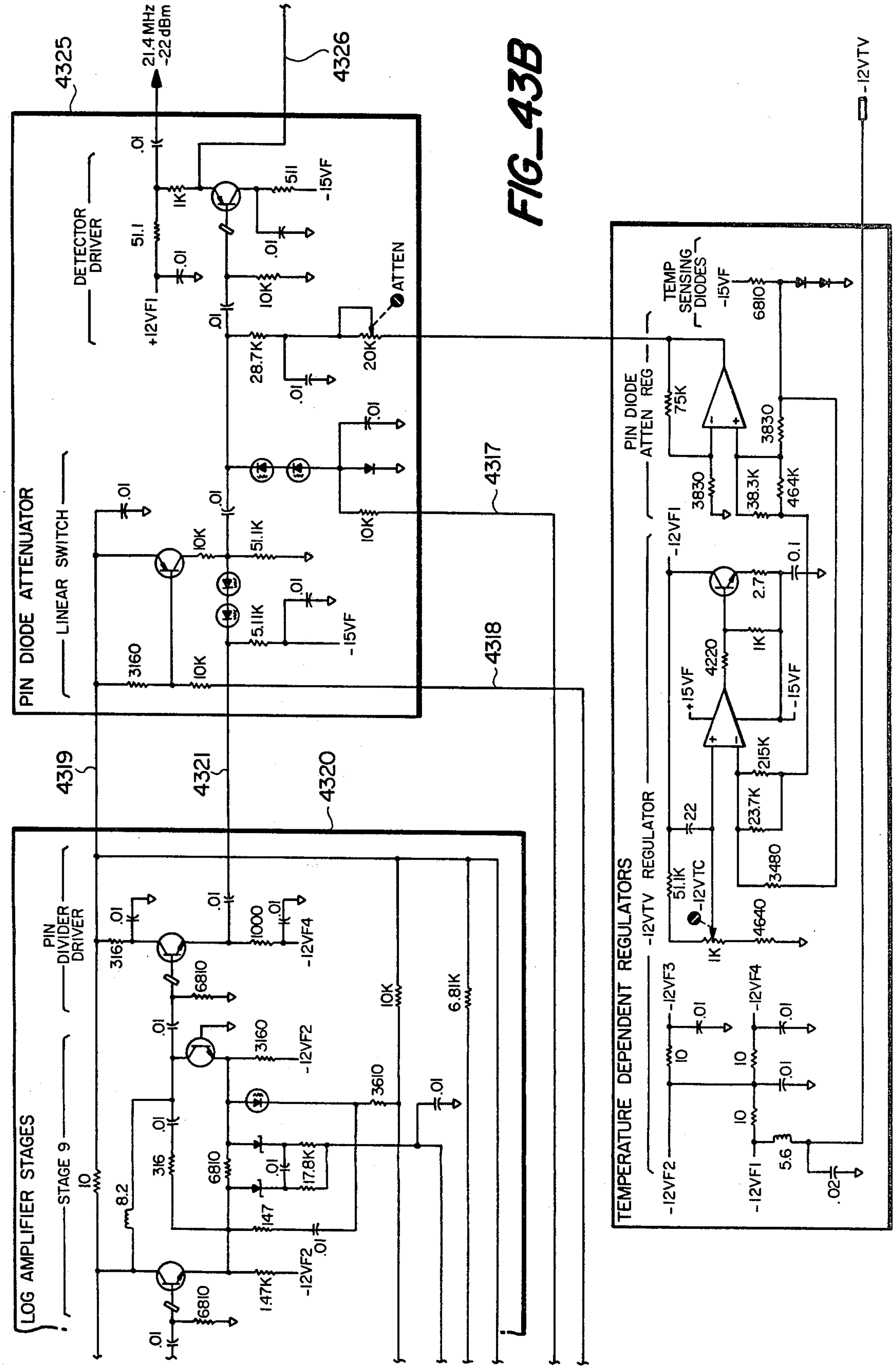
FIG_43B

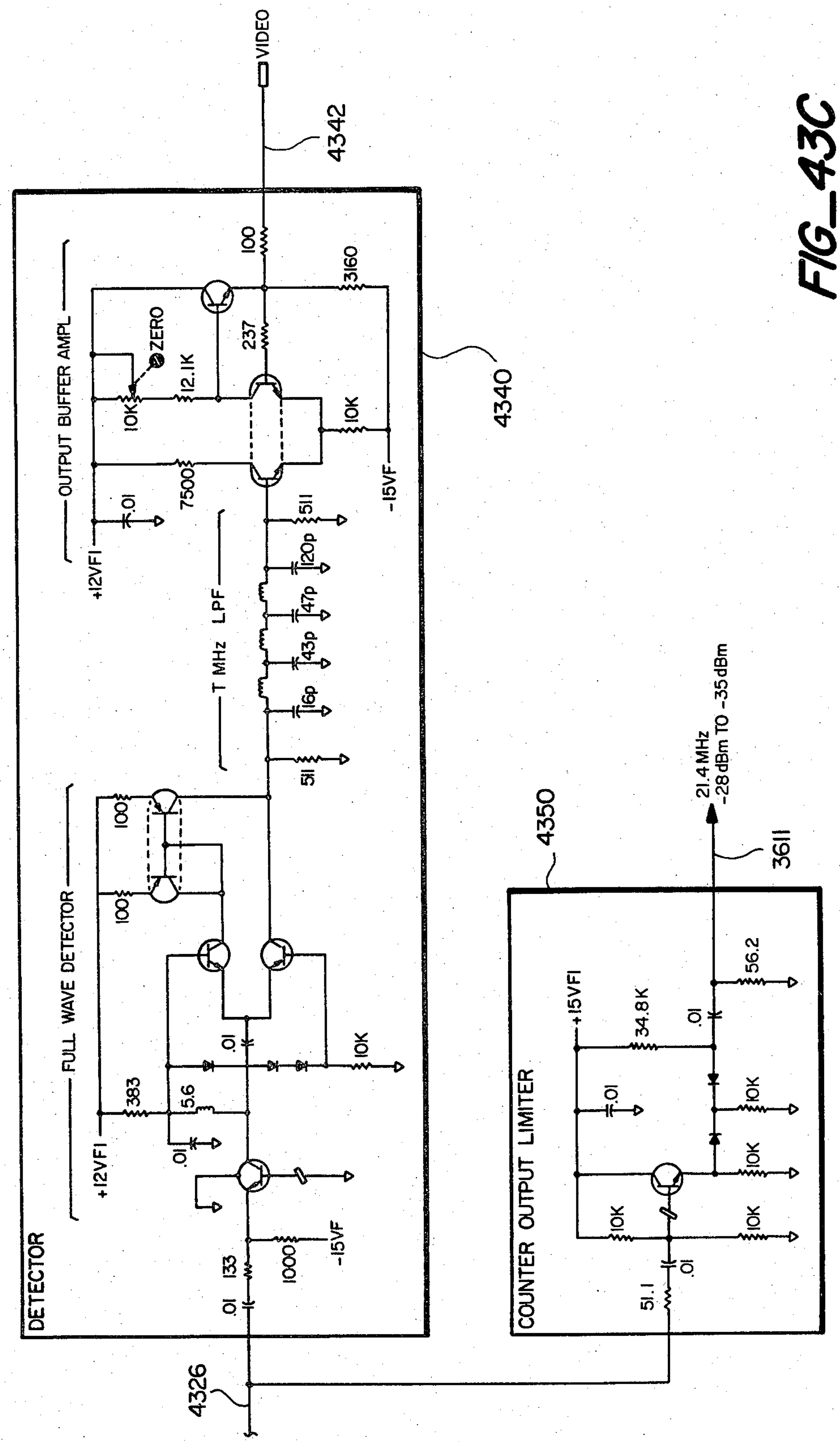
FIG_43C

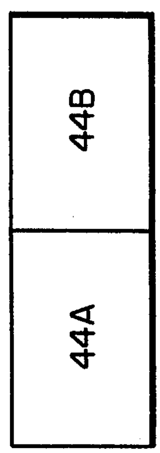
FIG_44

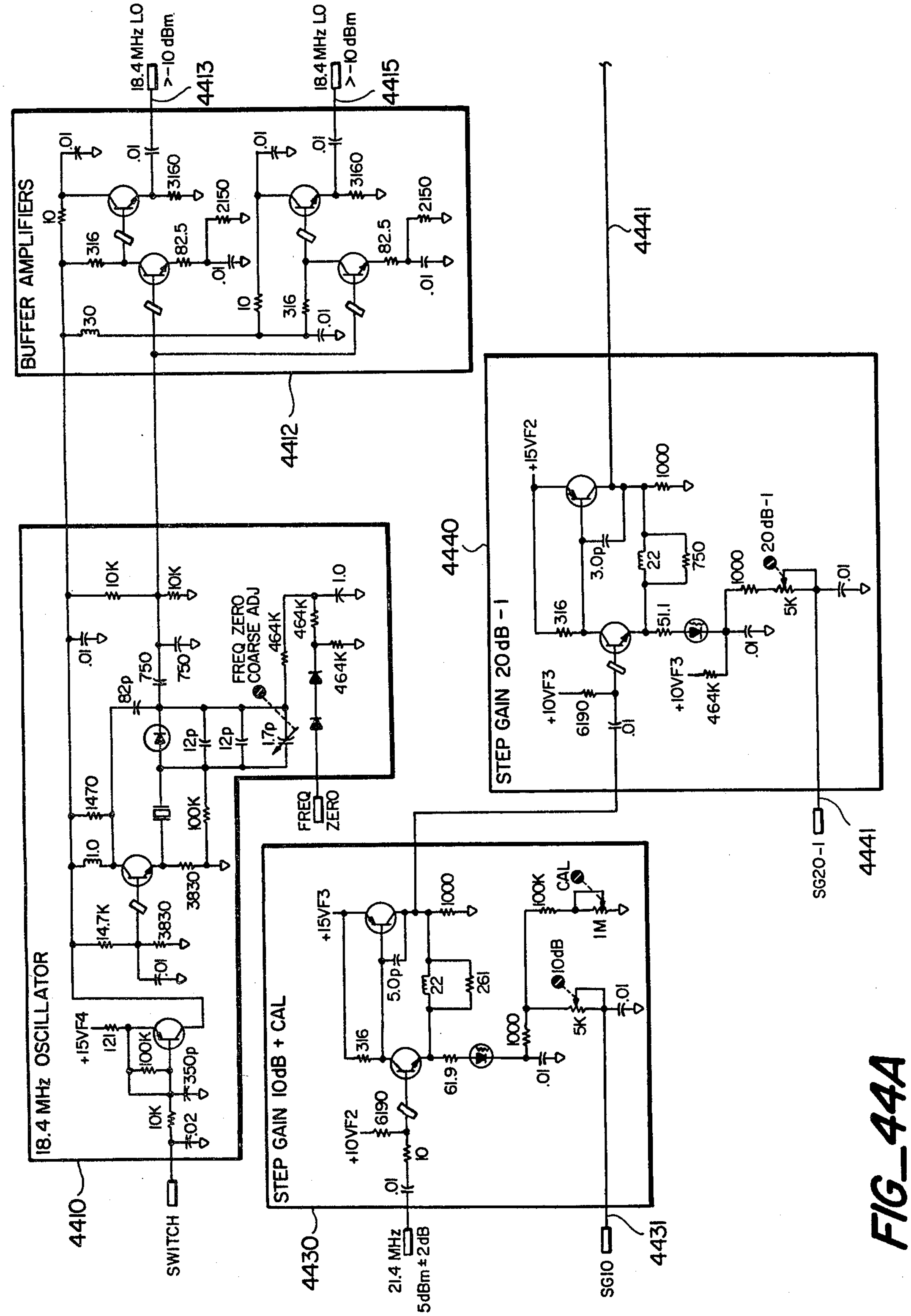
FIG_44A

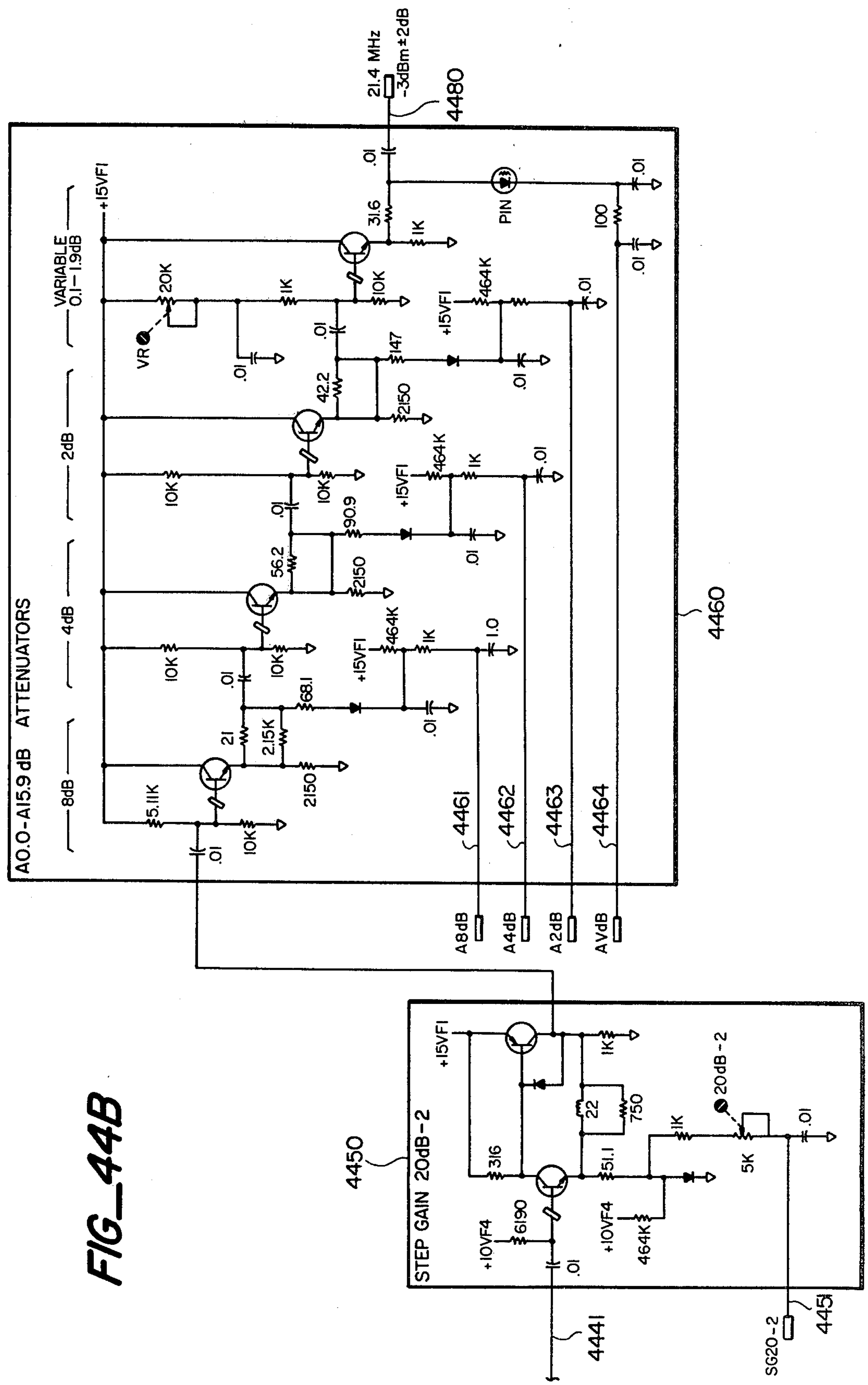
FIG_44B

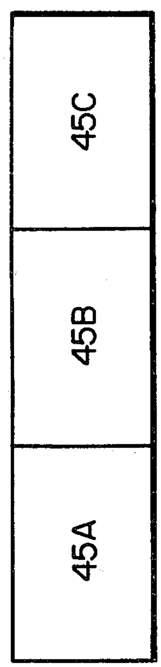
FIG_45

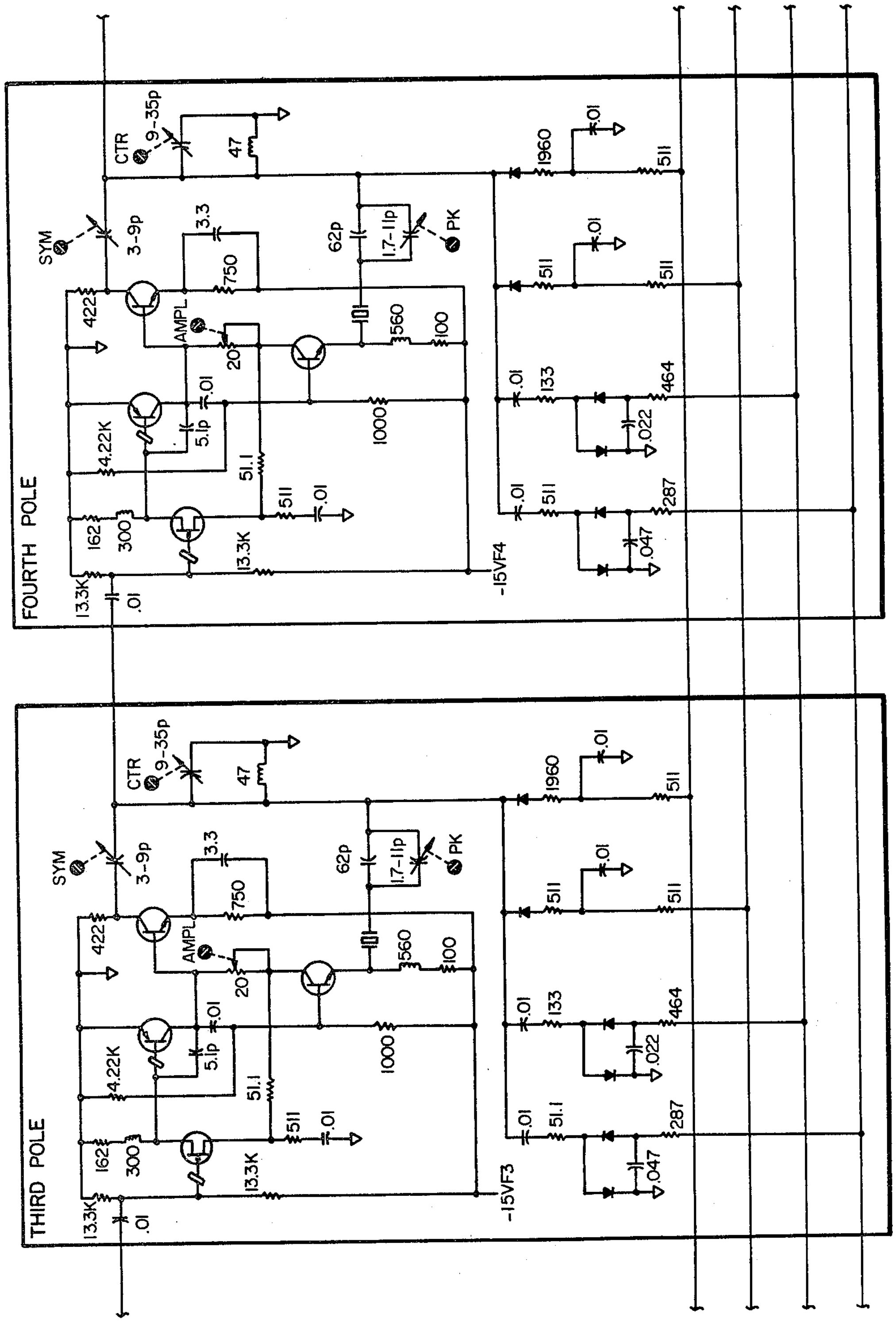
FIG__45B

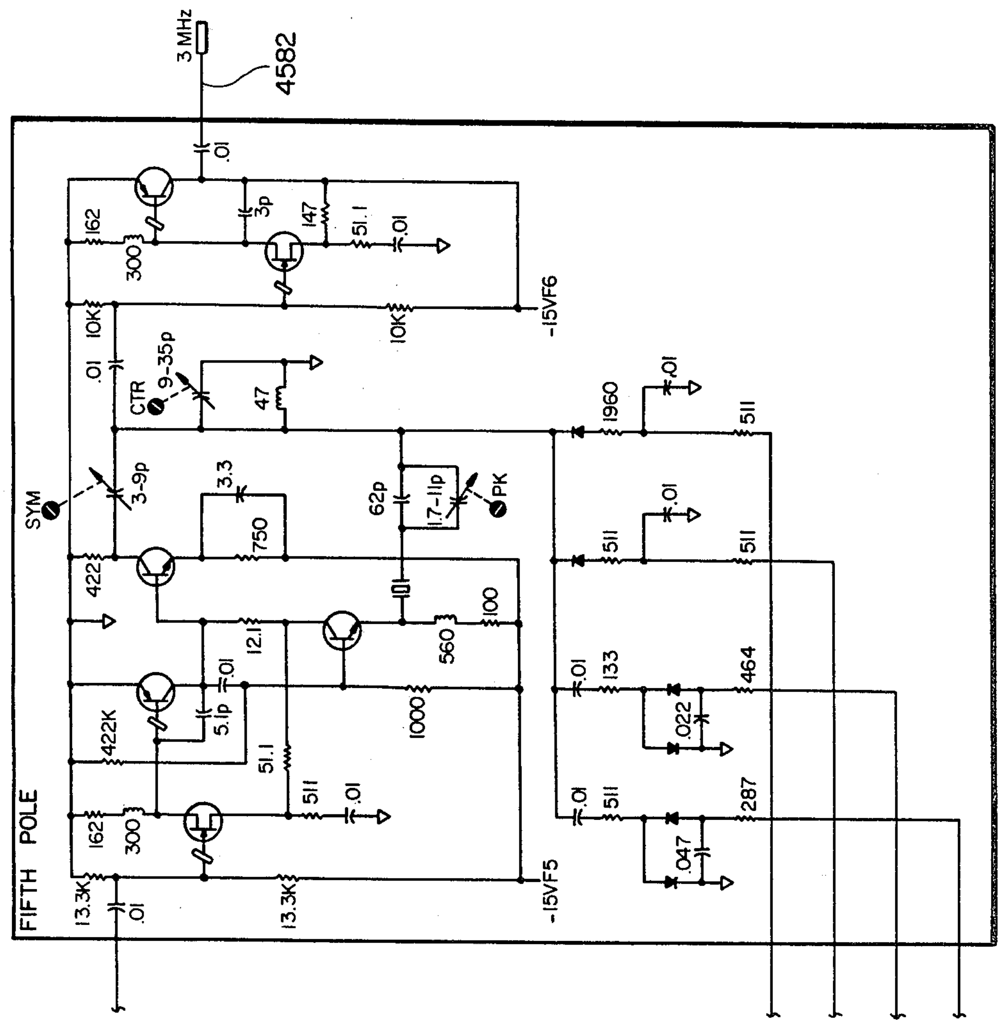
FIG_45C

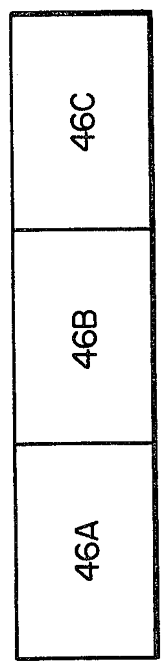
FIG_46

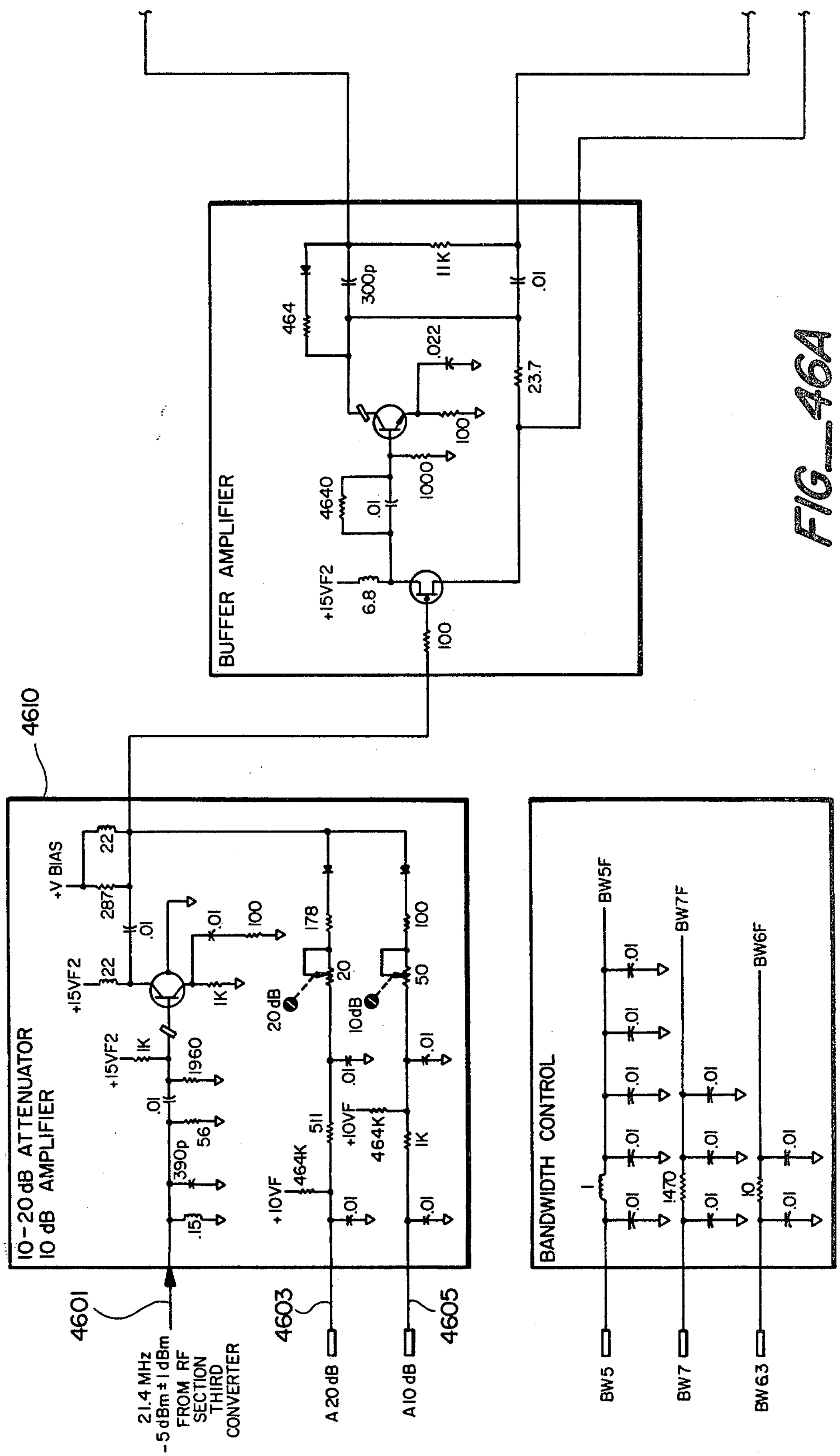
FIG_46A

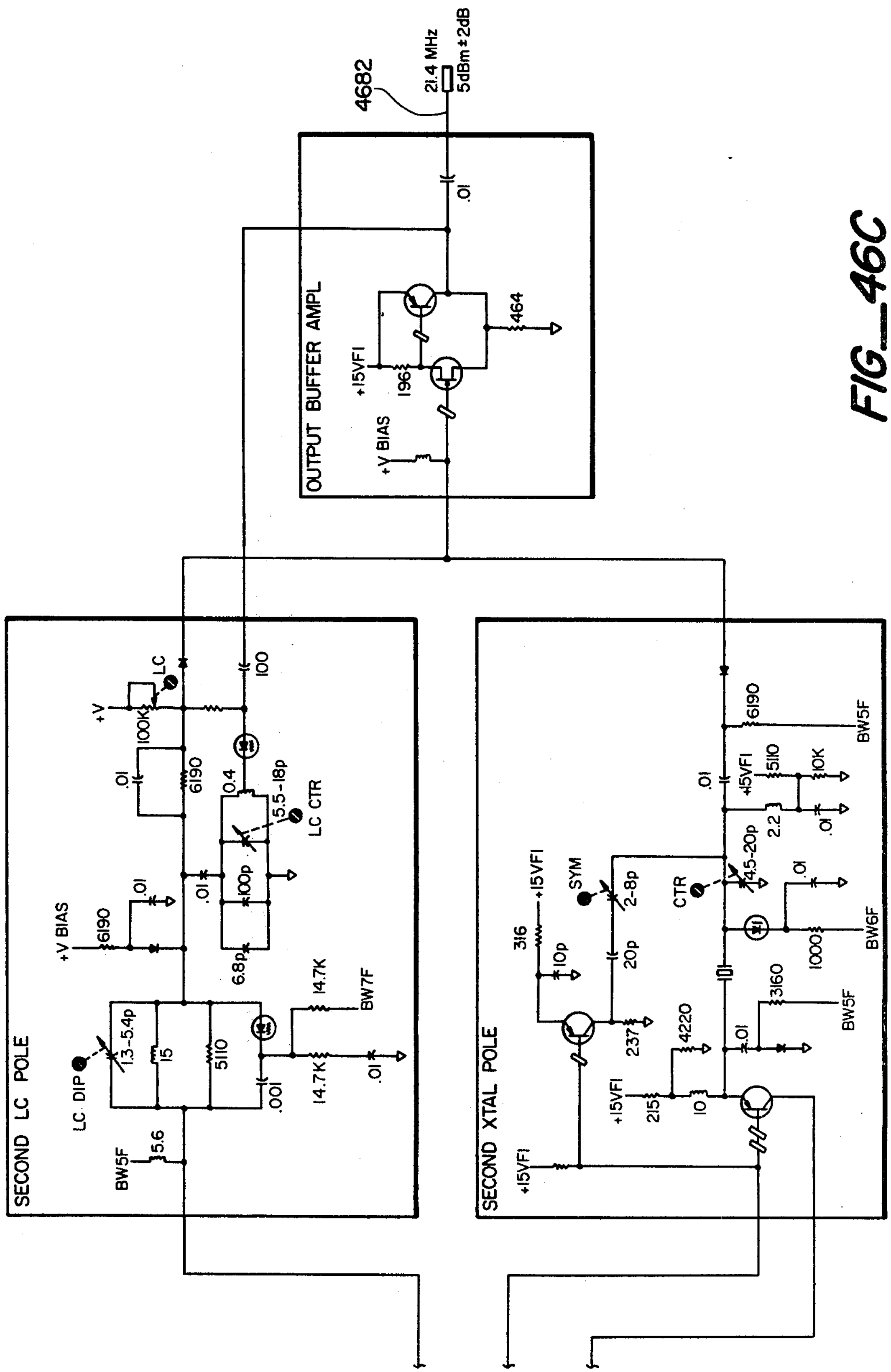
FIG_46C

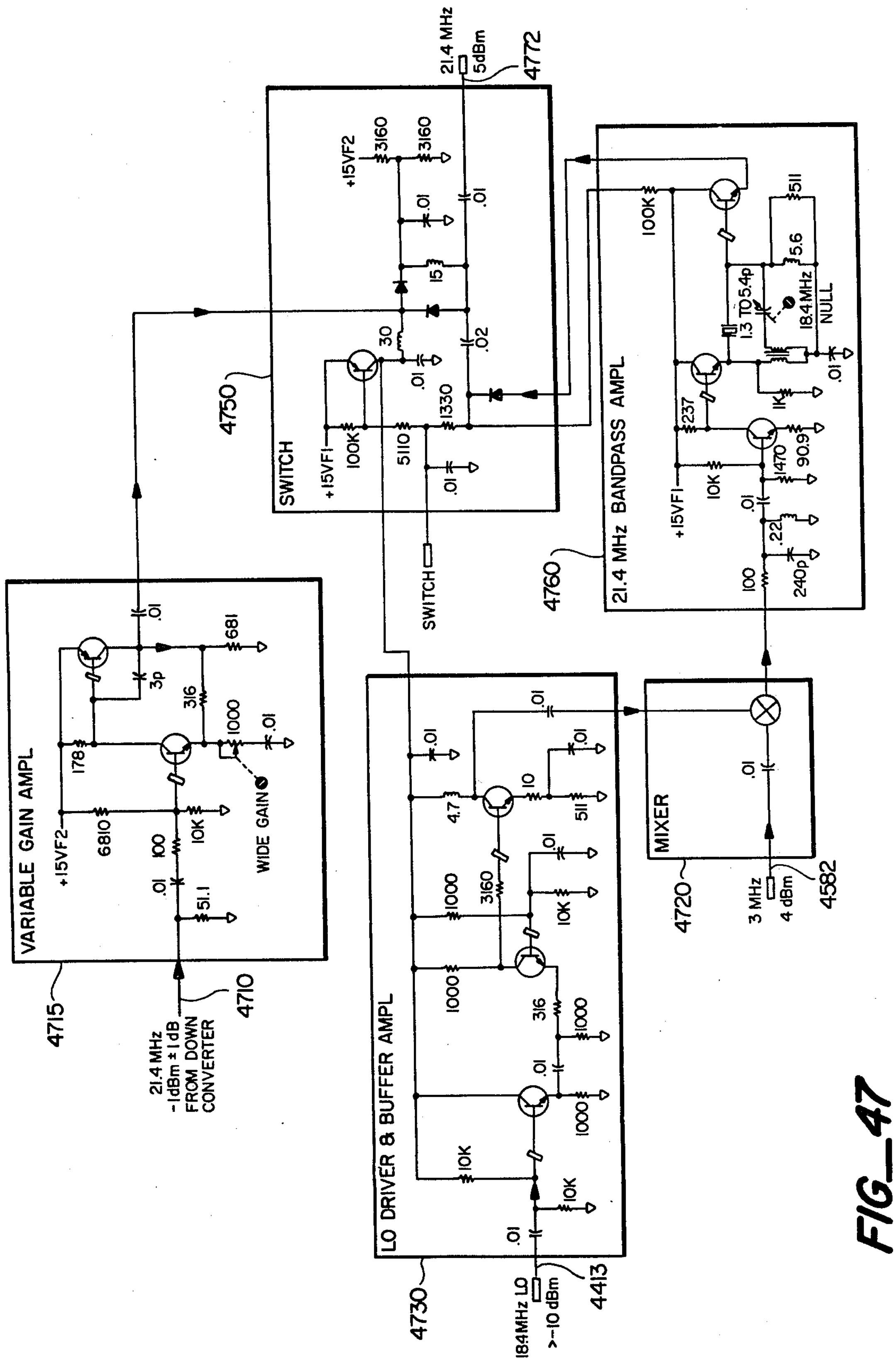
FIG_47

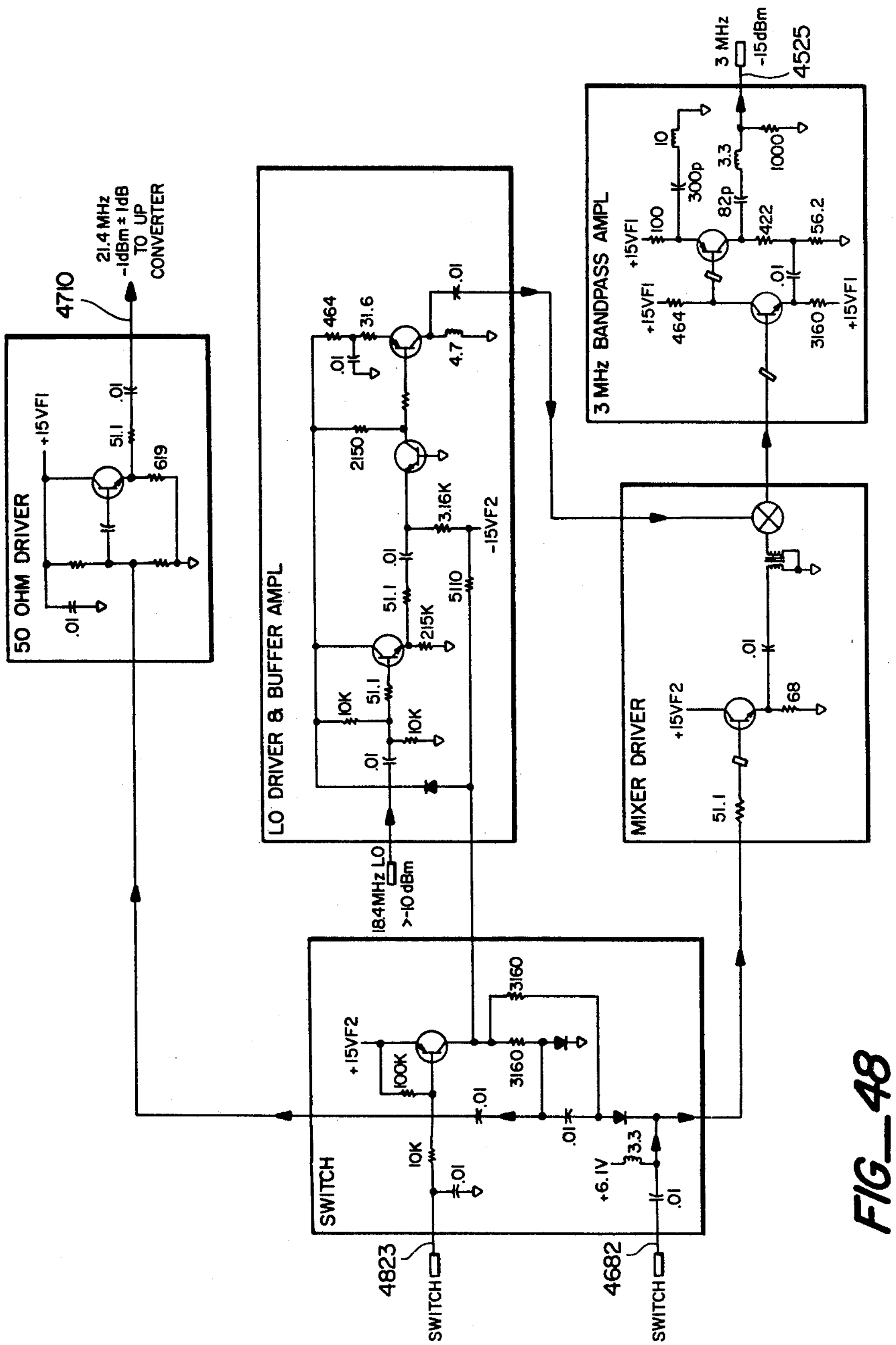
FIG_48

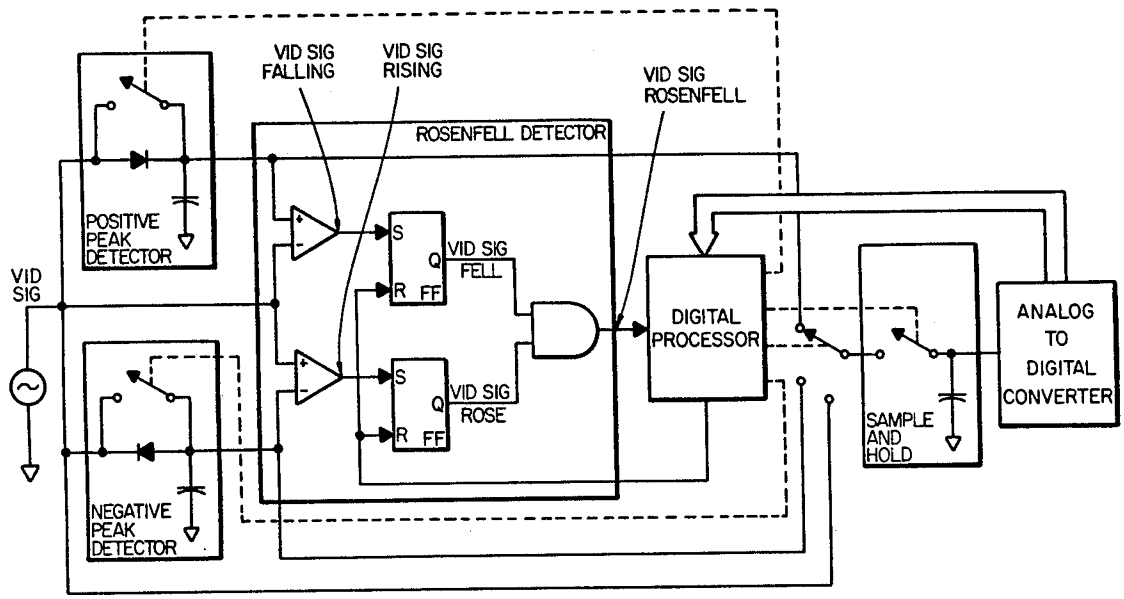
FIG_49A
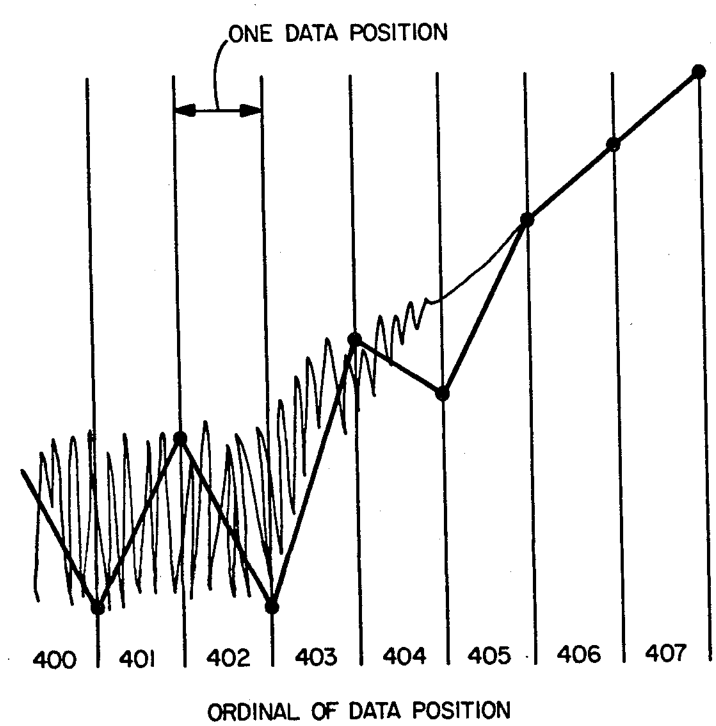
FIG_49B

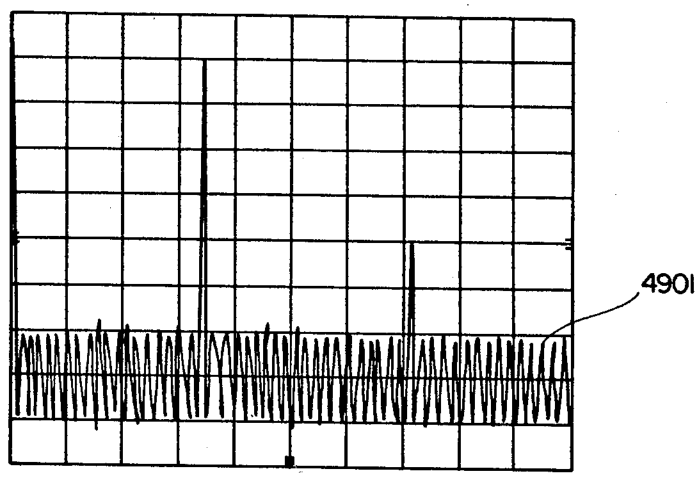
FIG_49C-1
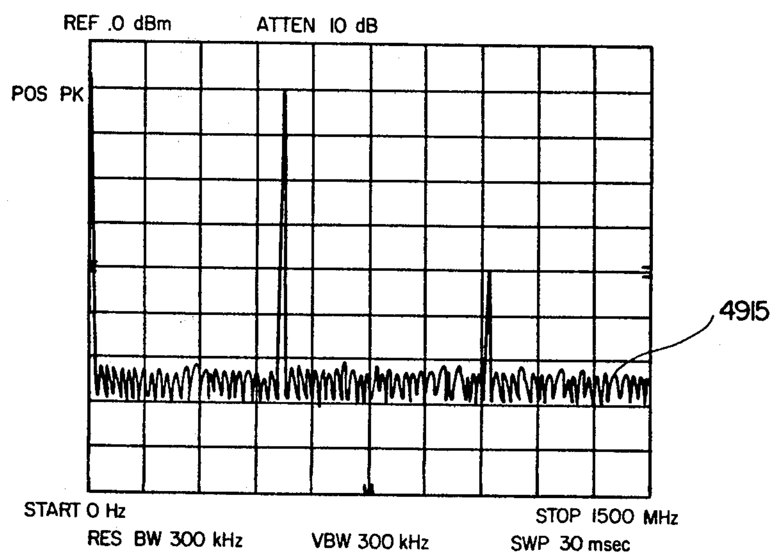
FIG_49C-2

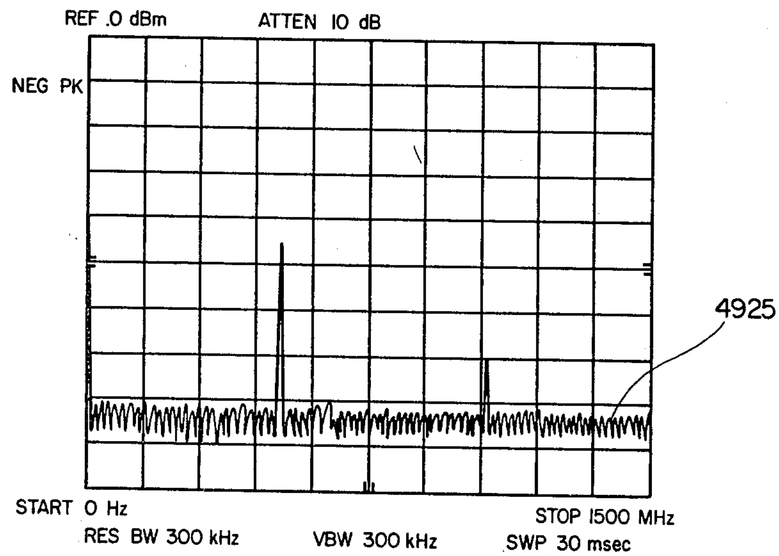
FIG_49C-3
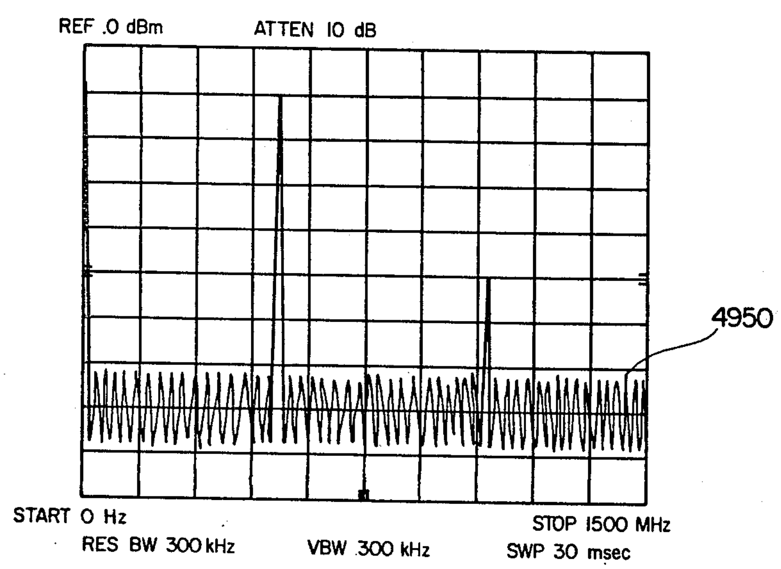
FIG_49C-4

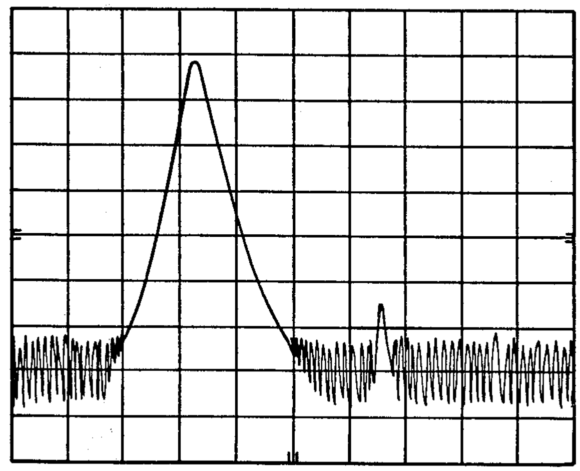
FIG_49D-1
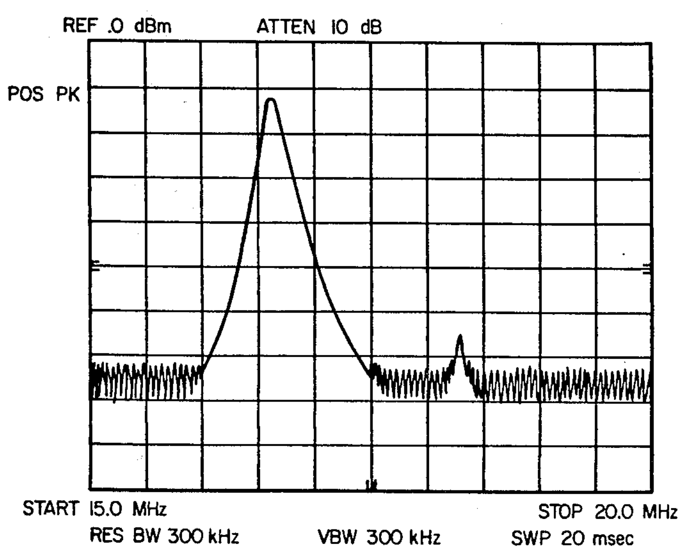
FIG_49D-2

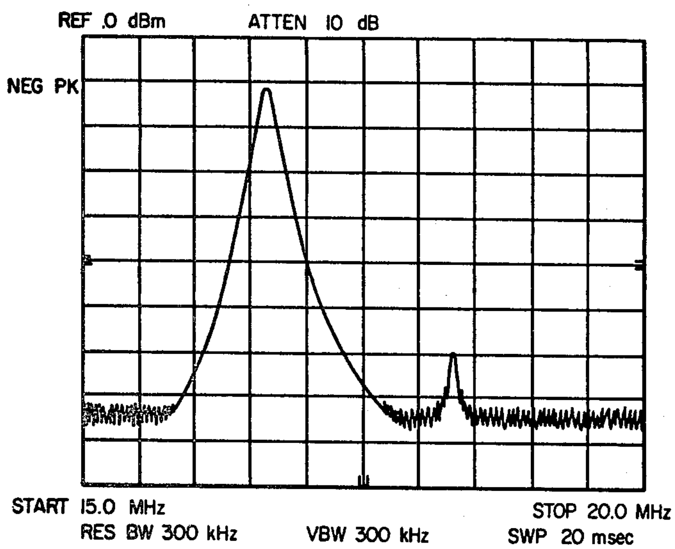
FIG_49D-3
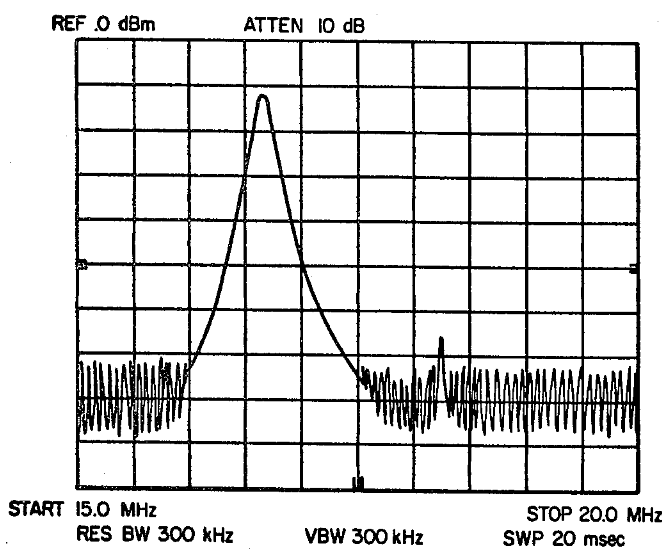
FIG_49D-4

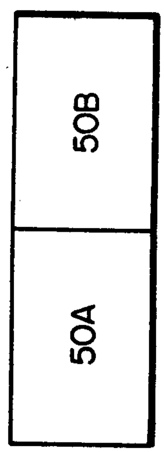
FIG_50

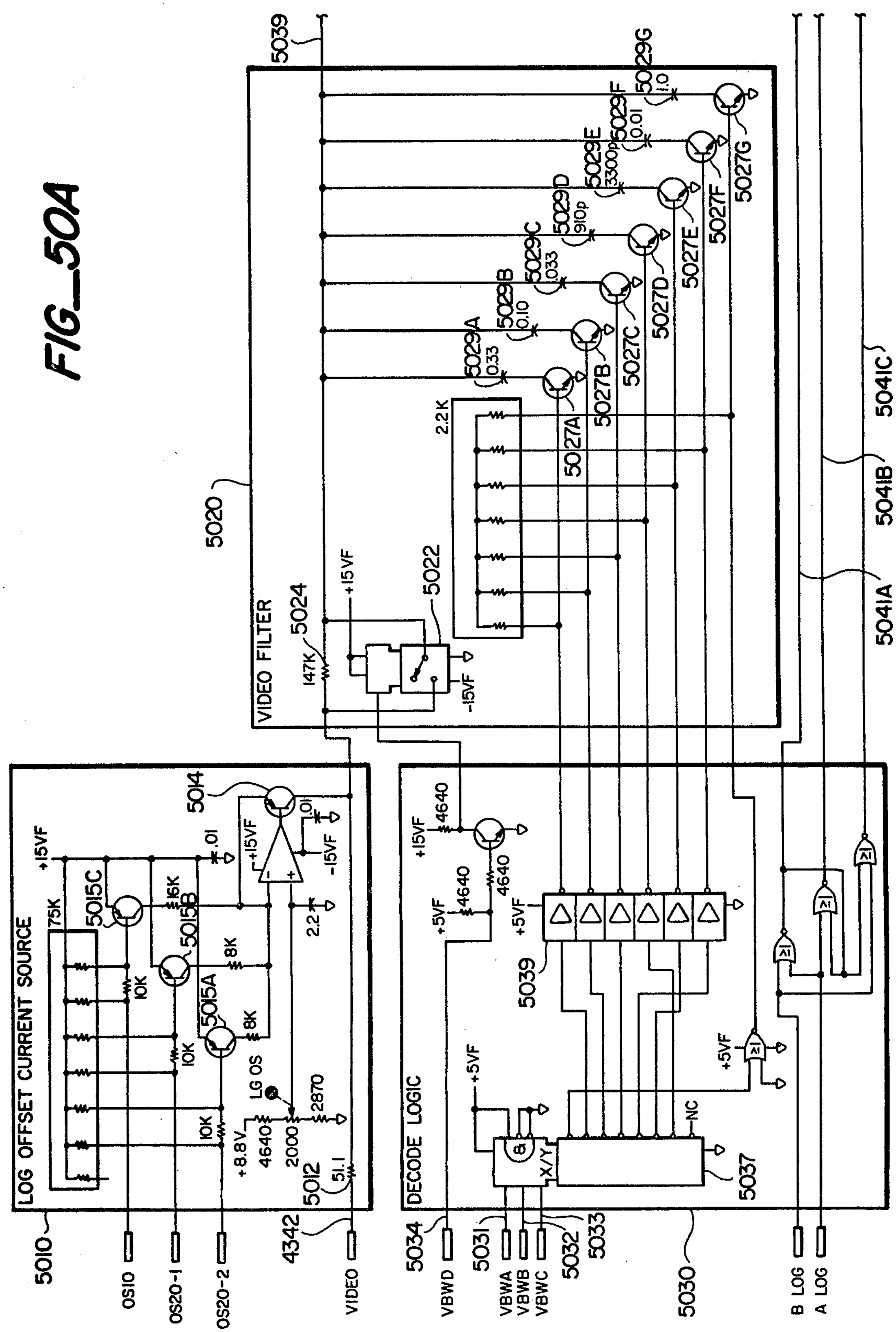
FIG_50A

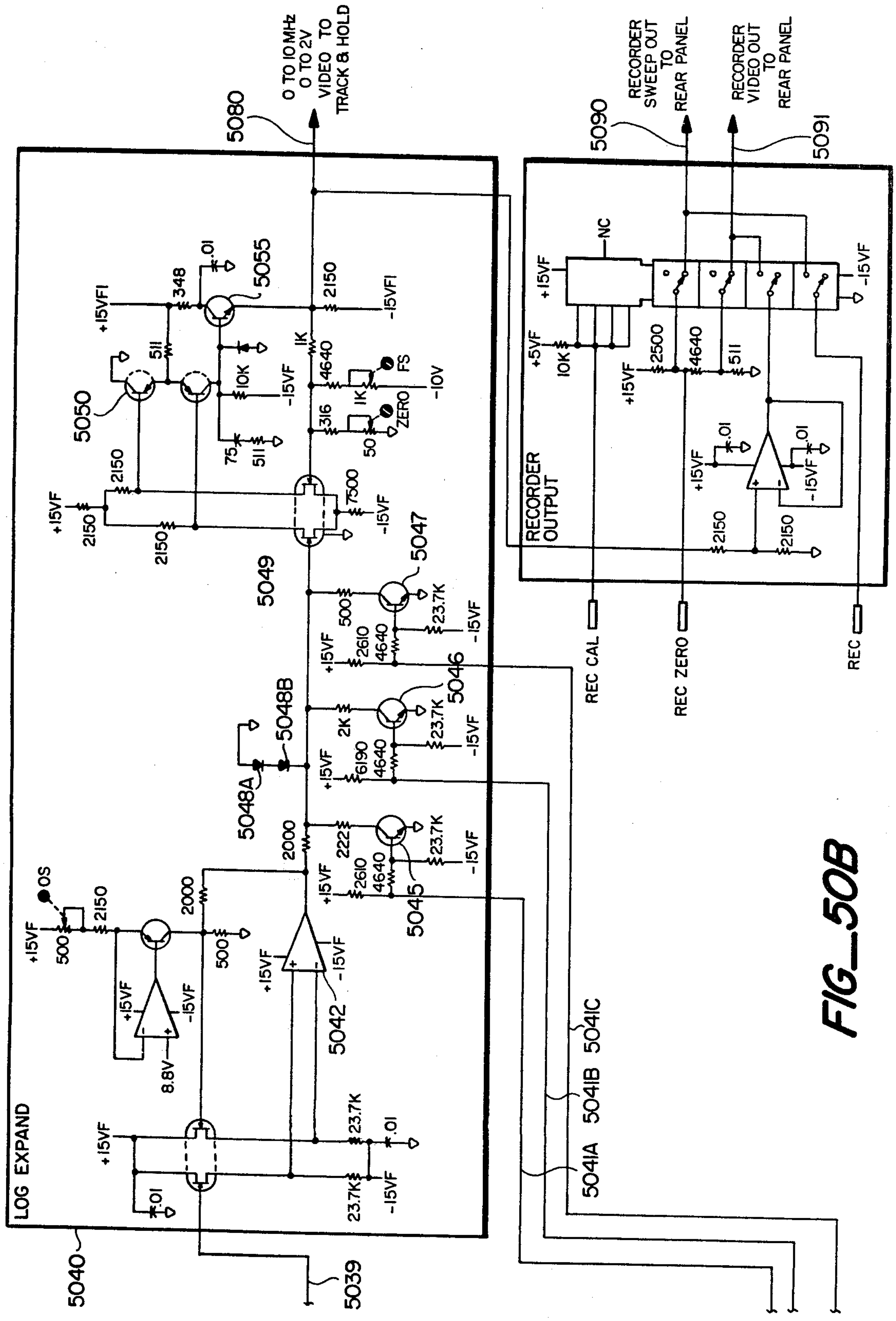
FIG_50B

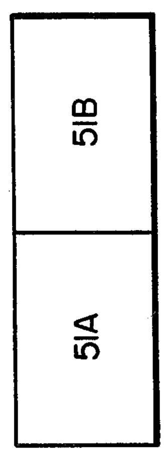
FIG_51

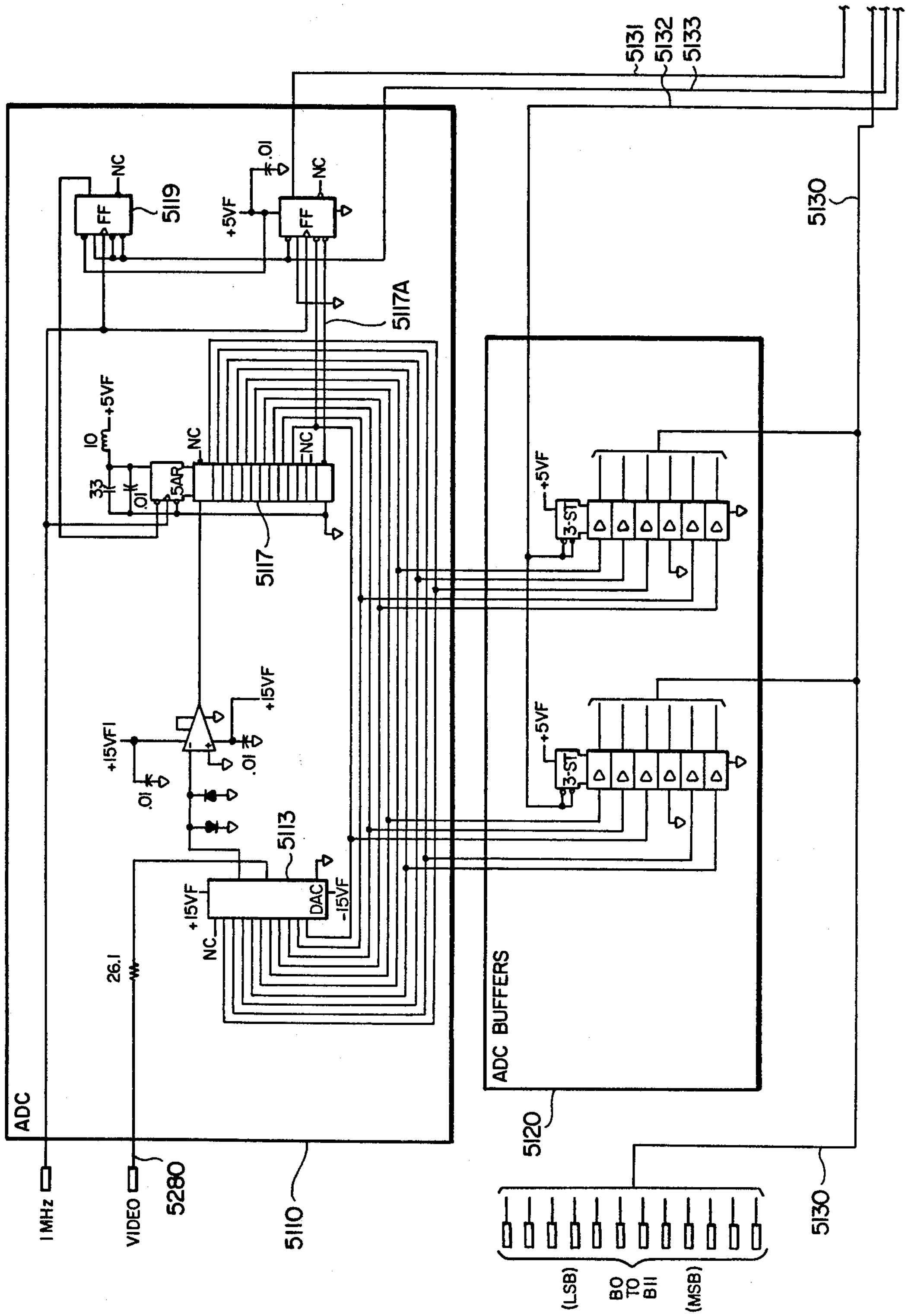
FIG_51A

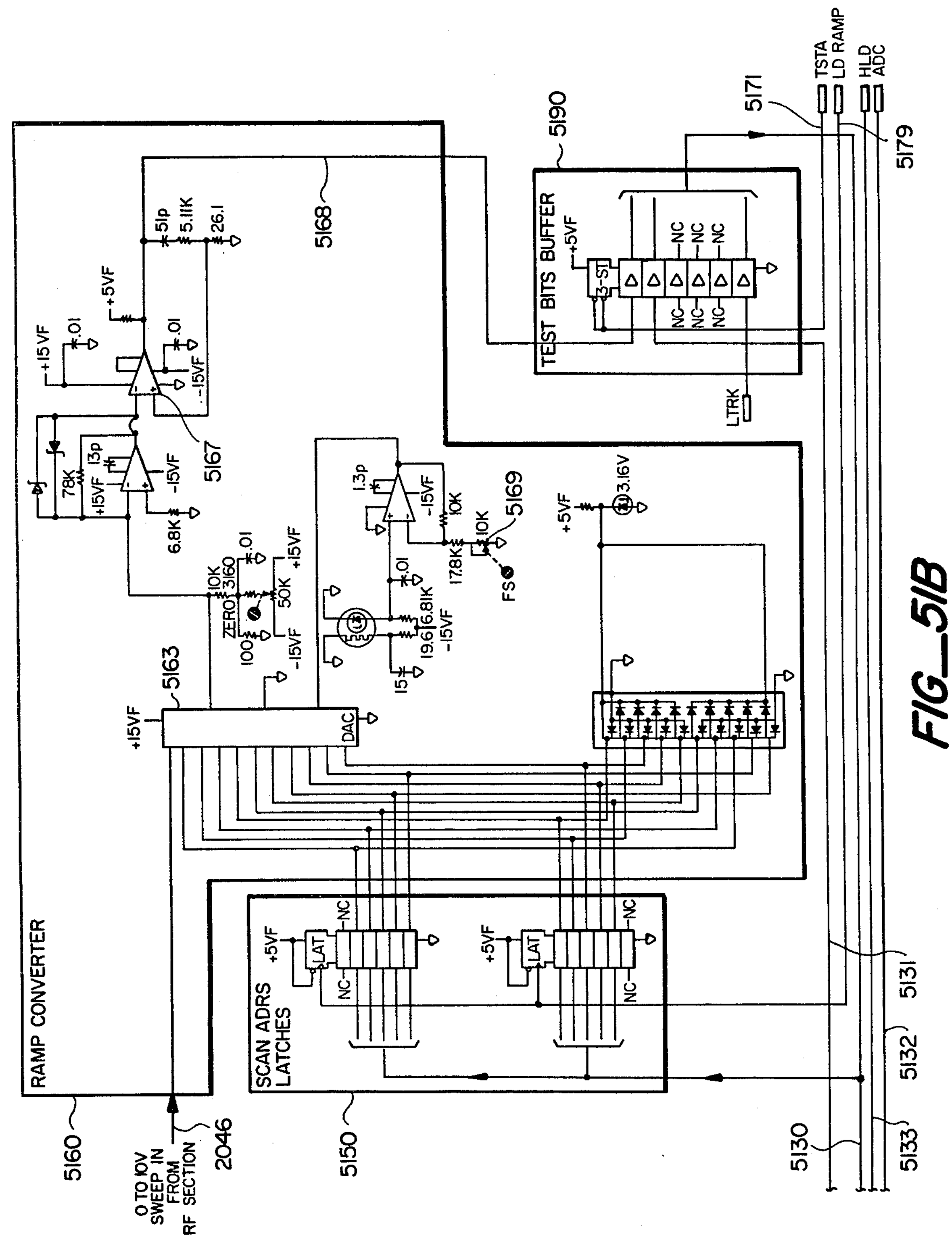
FIG_51B

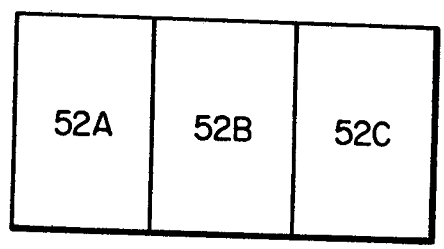
FIG_52

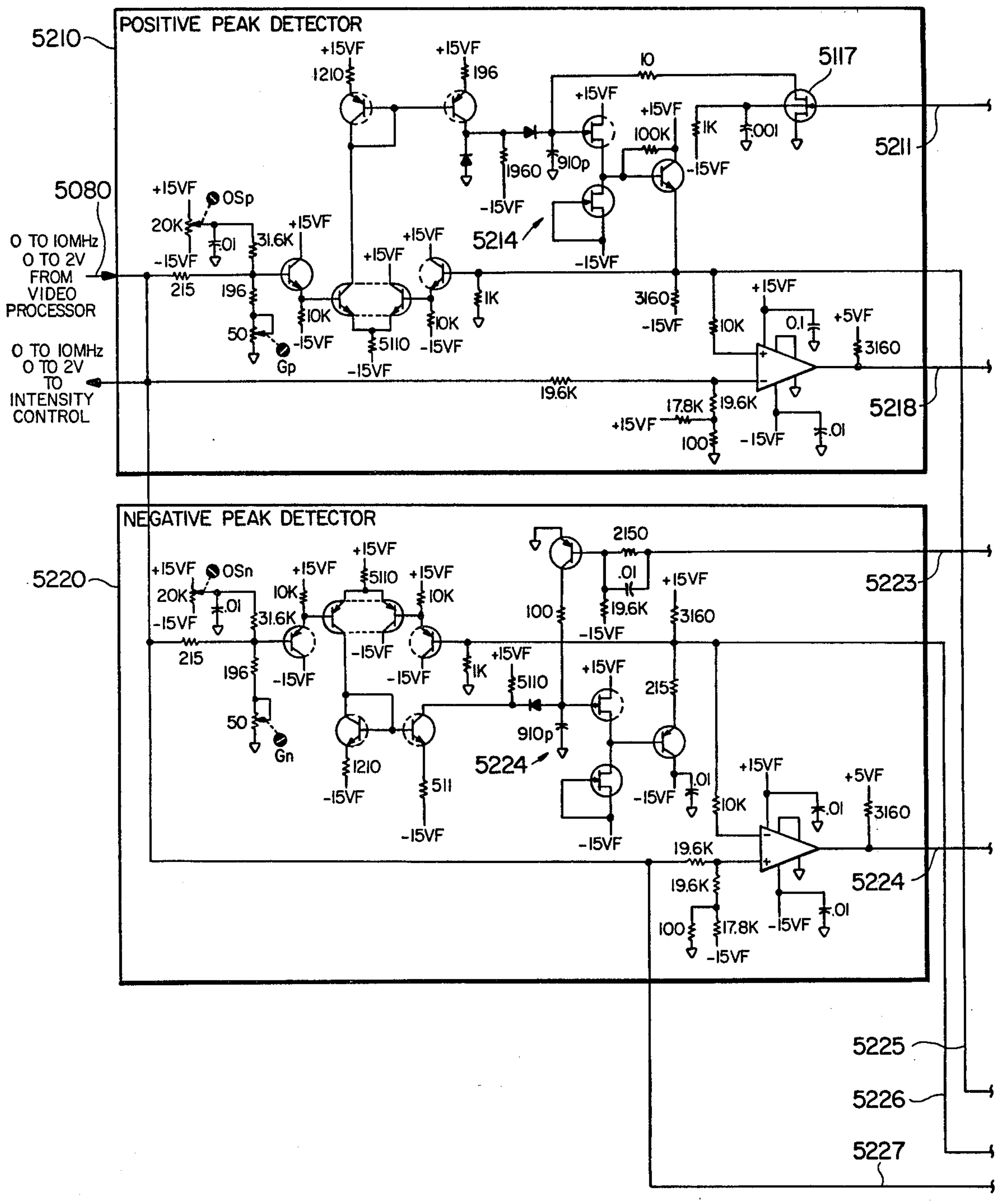
FIG_52A

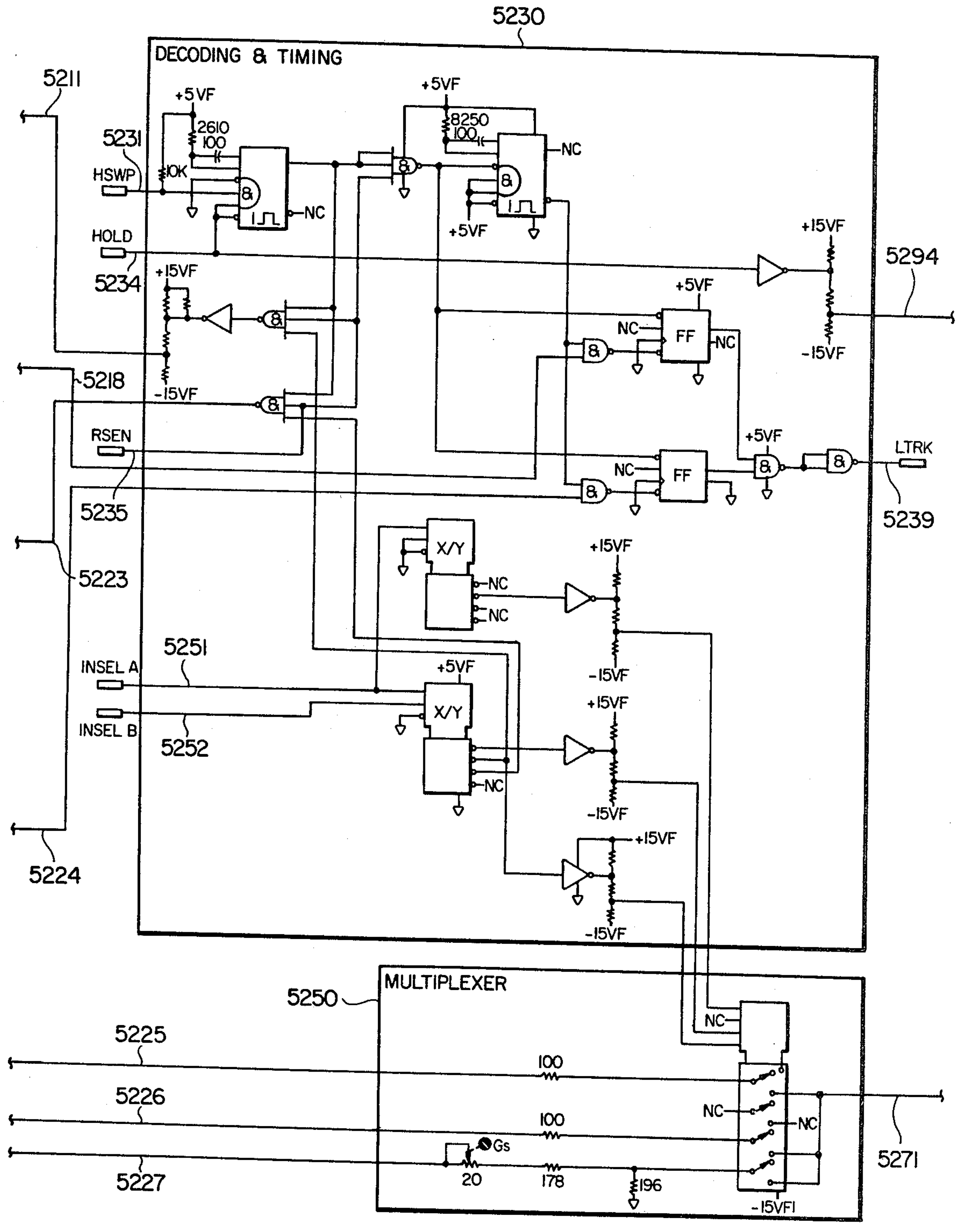
FIG_52B

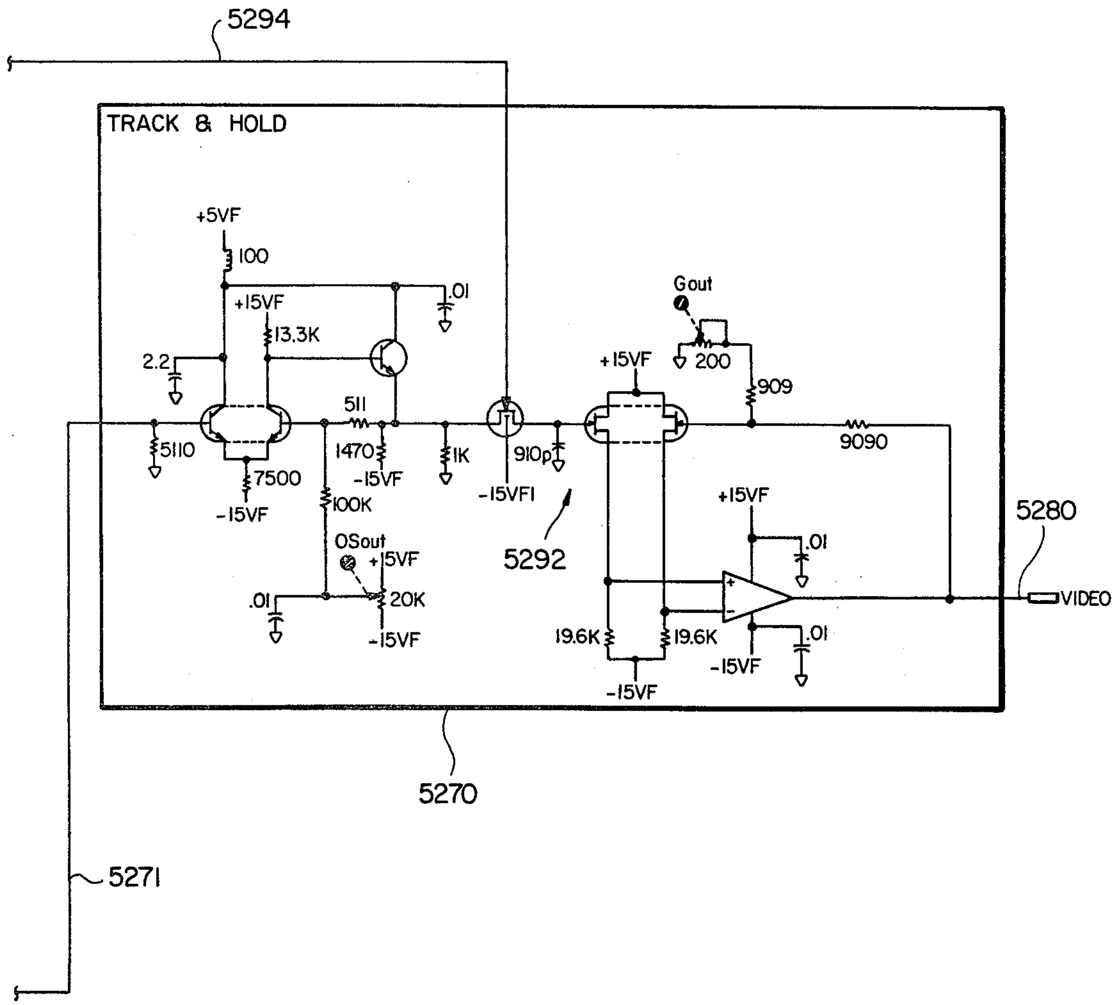
FIG_52C

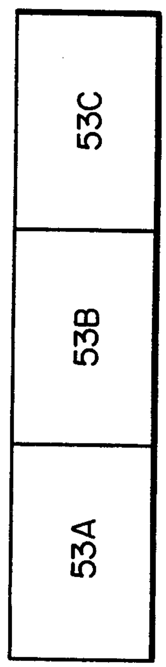
FIG_53

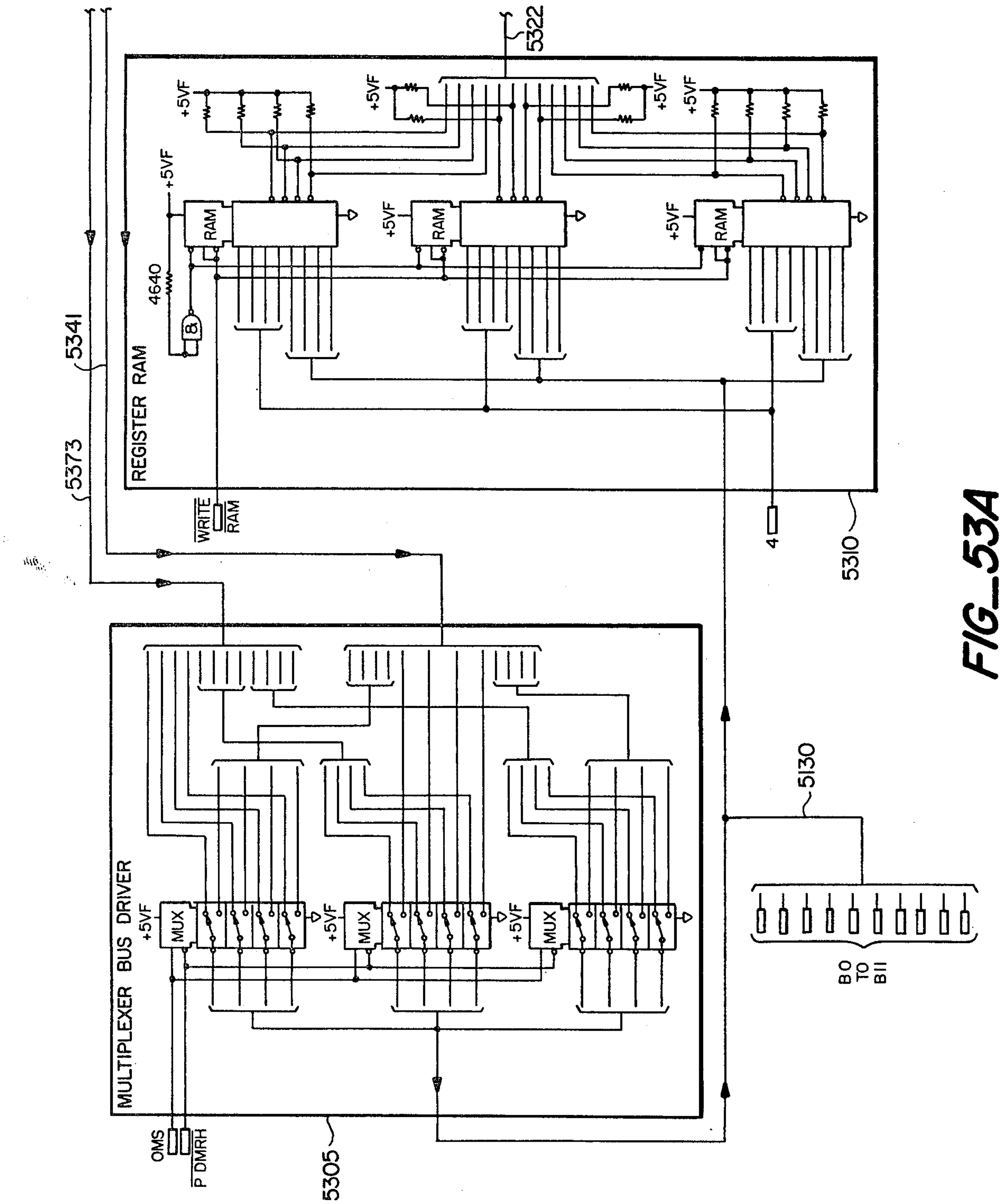
FIG_53A

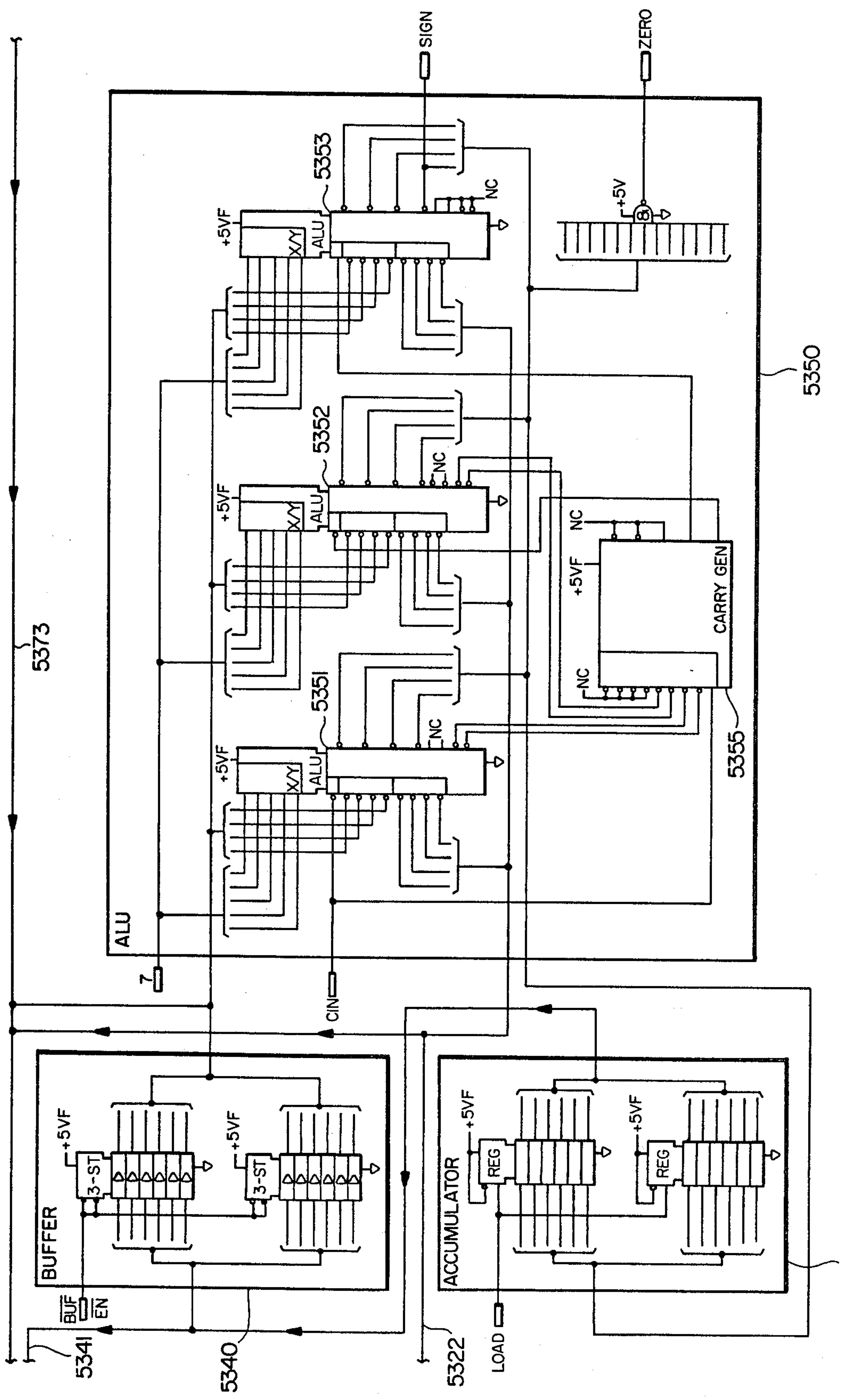
FIG_53B

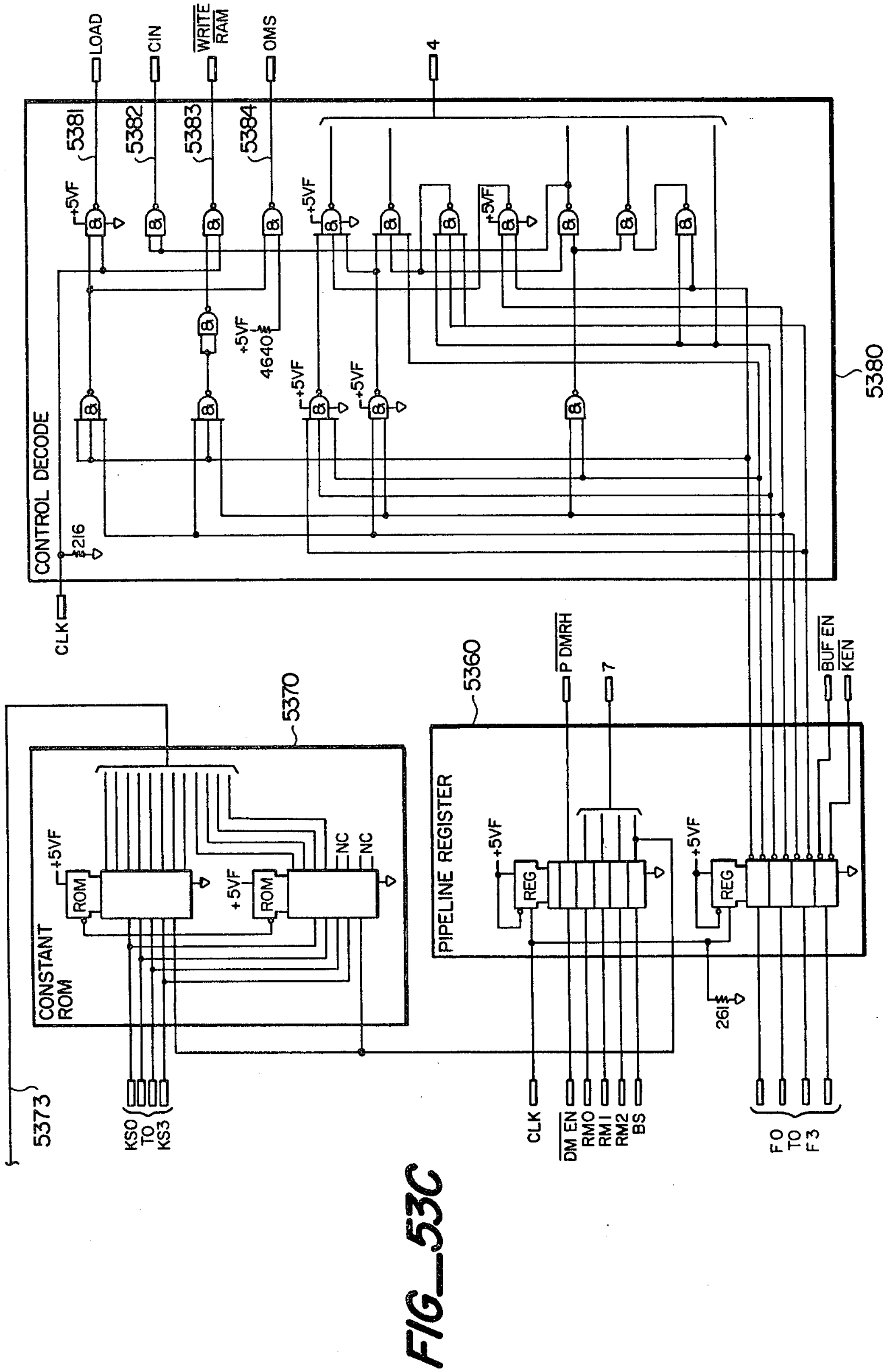
FIG_53C

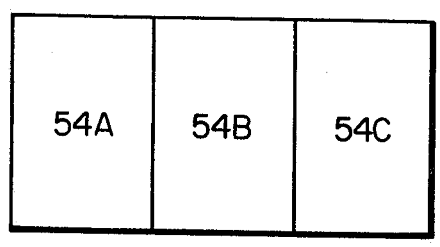
FIG_54

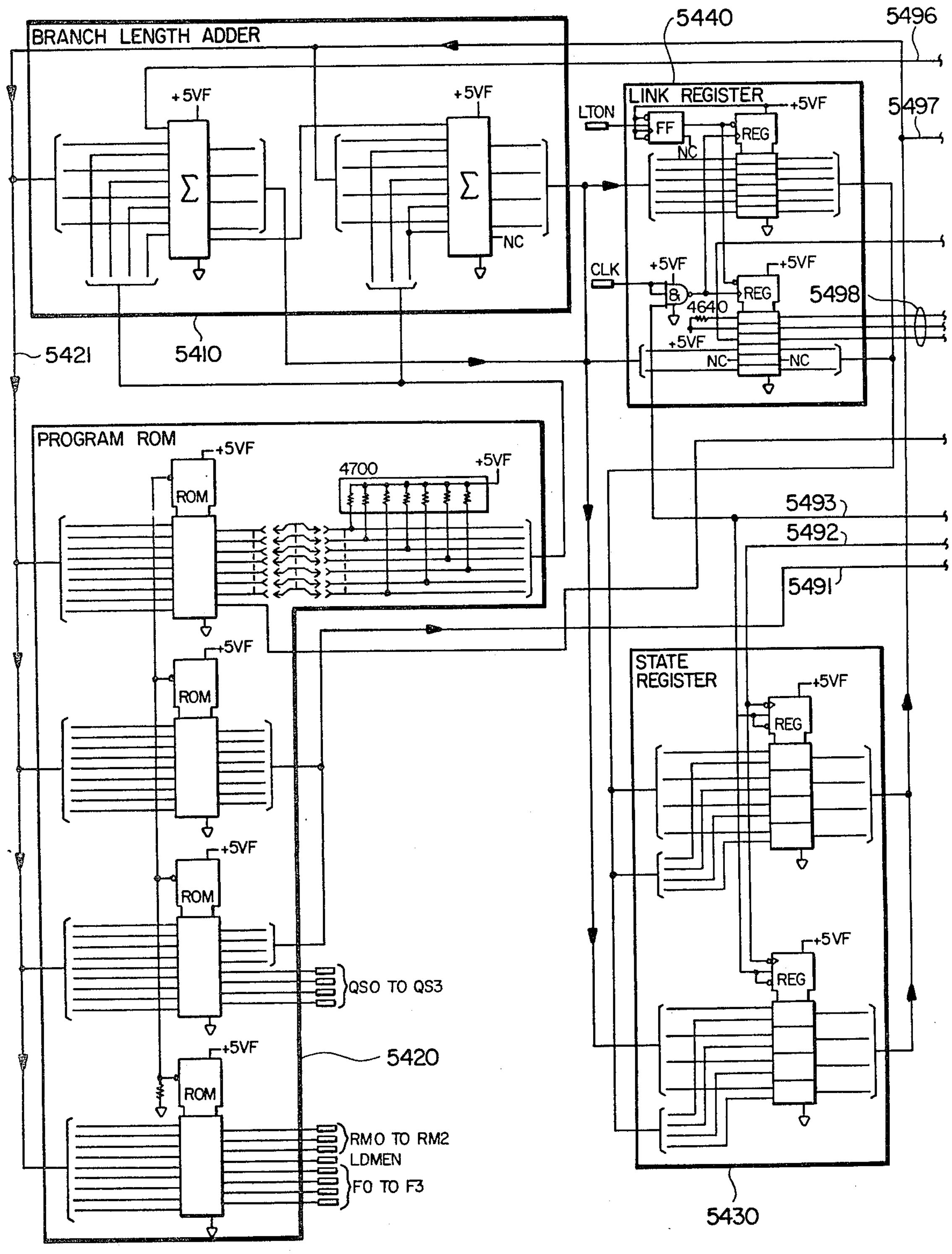
FIG_54A

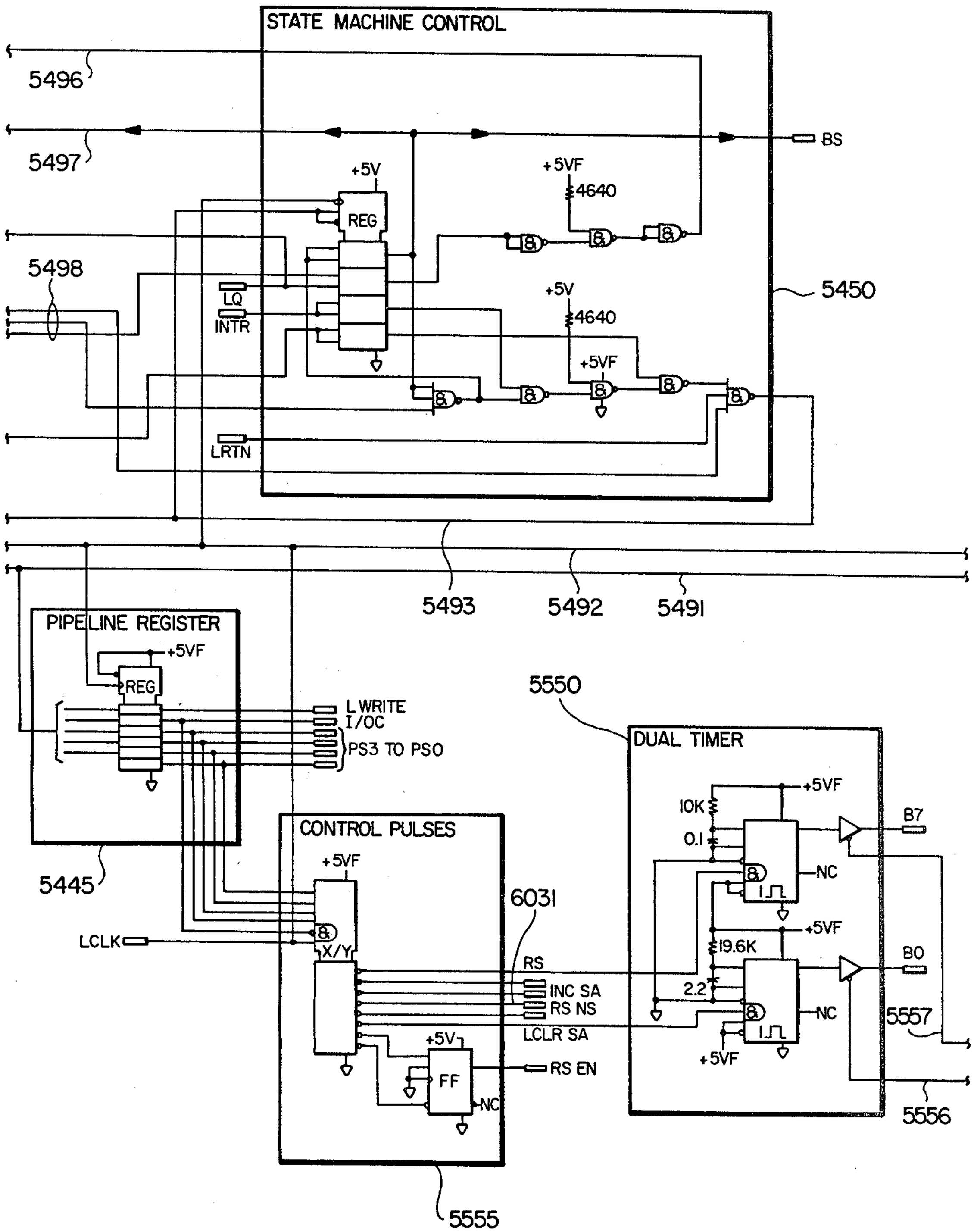
FIG_54B

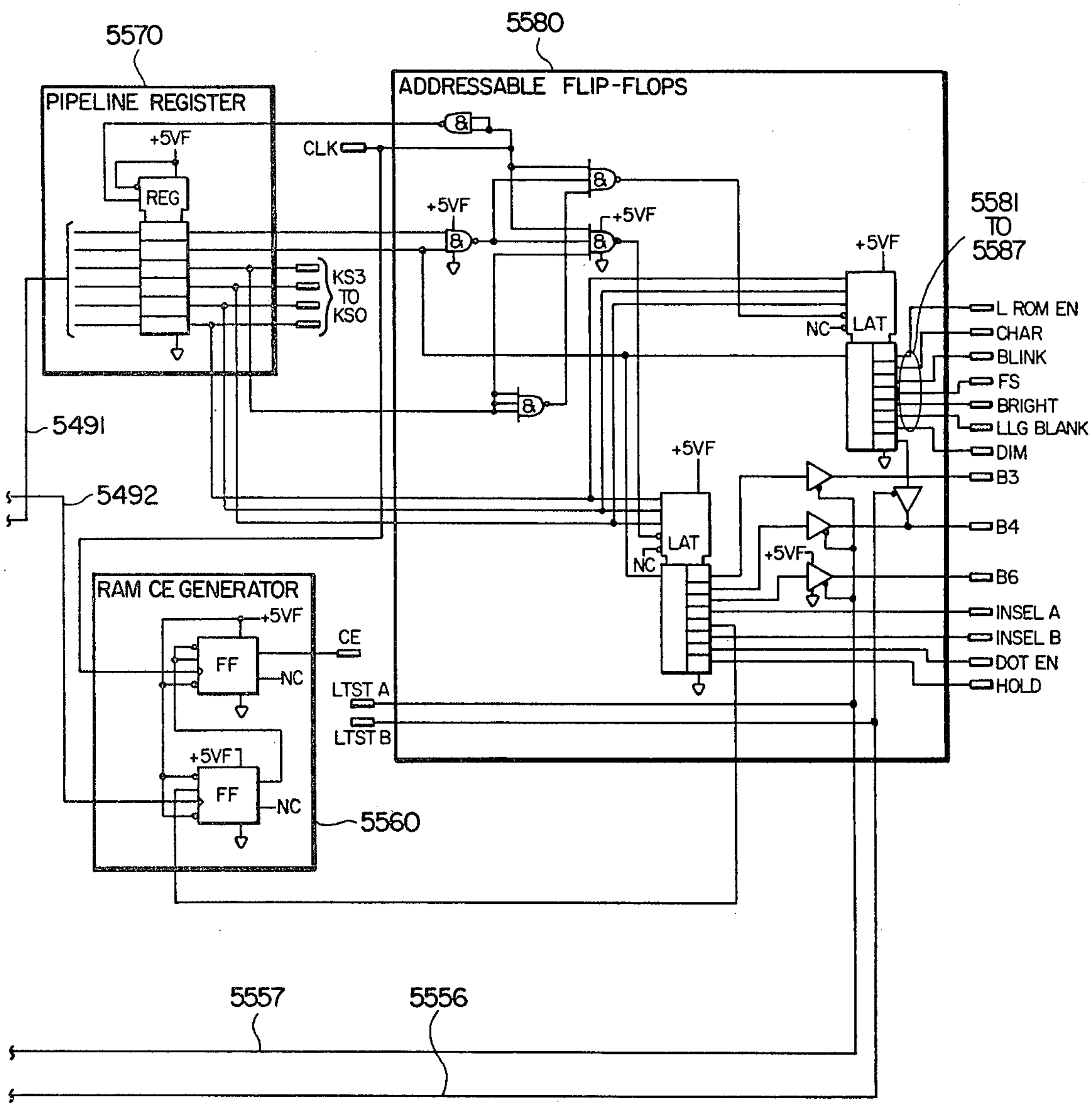
FIG_54C

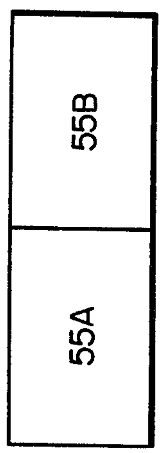
FIG_55

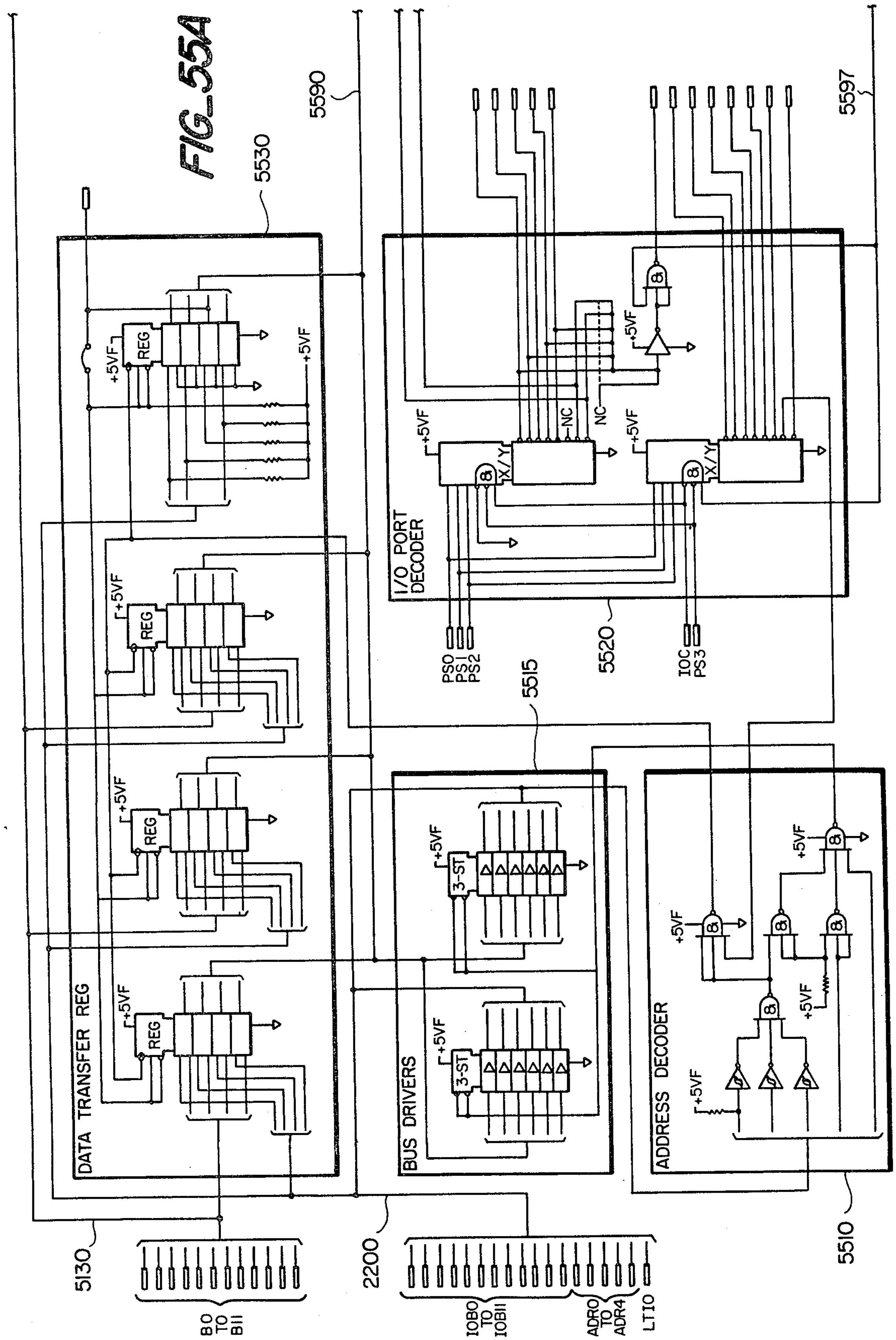
FIG_55A

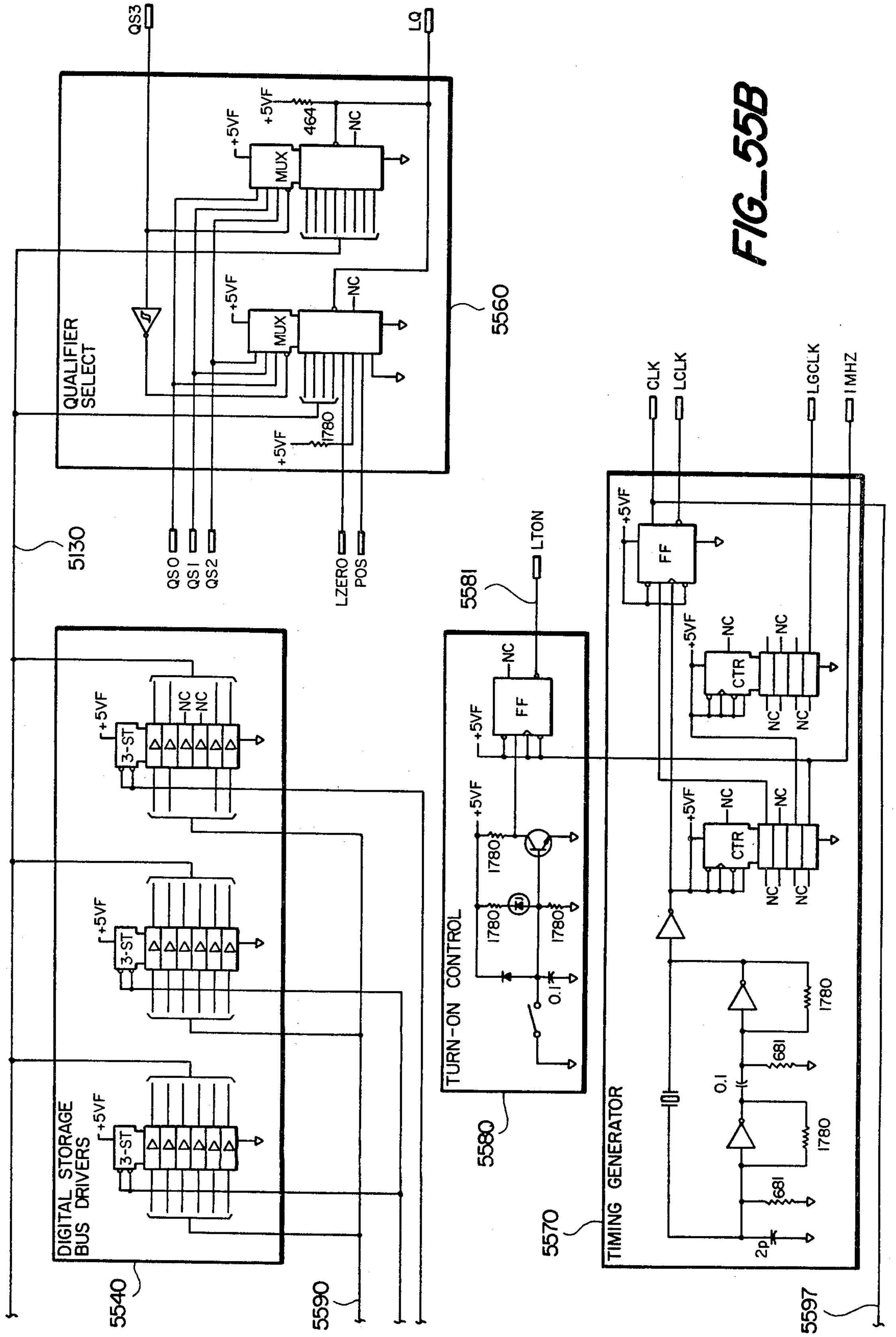
FIG_55B

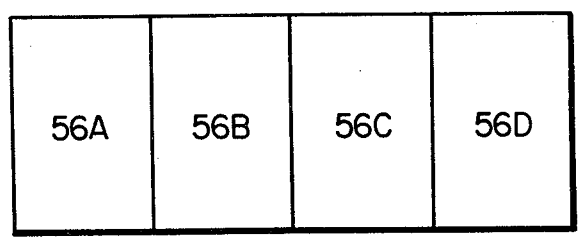
FIG_56

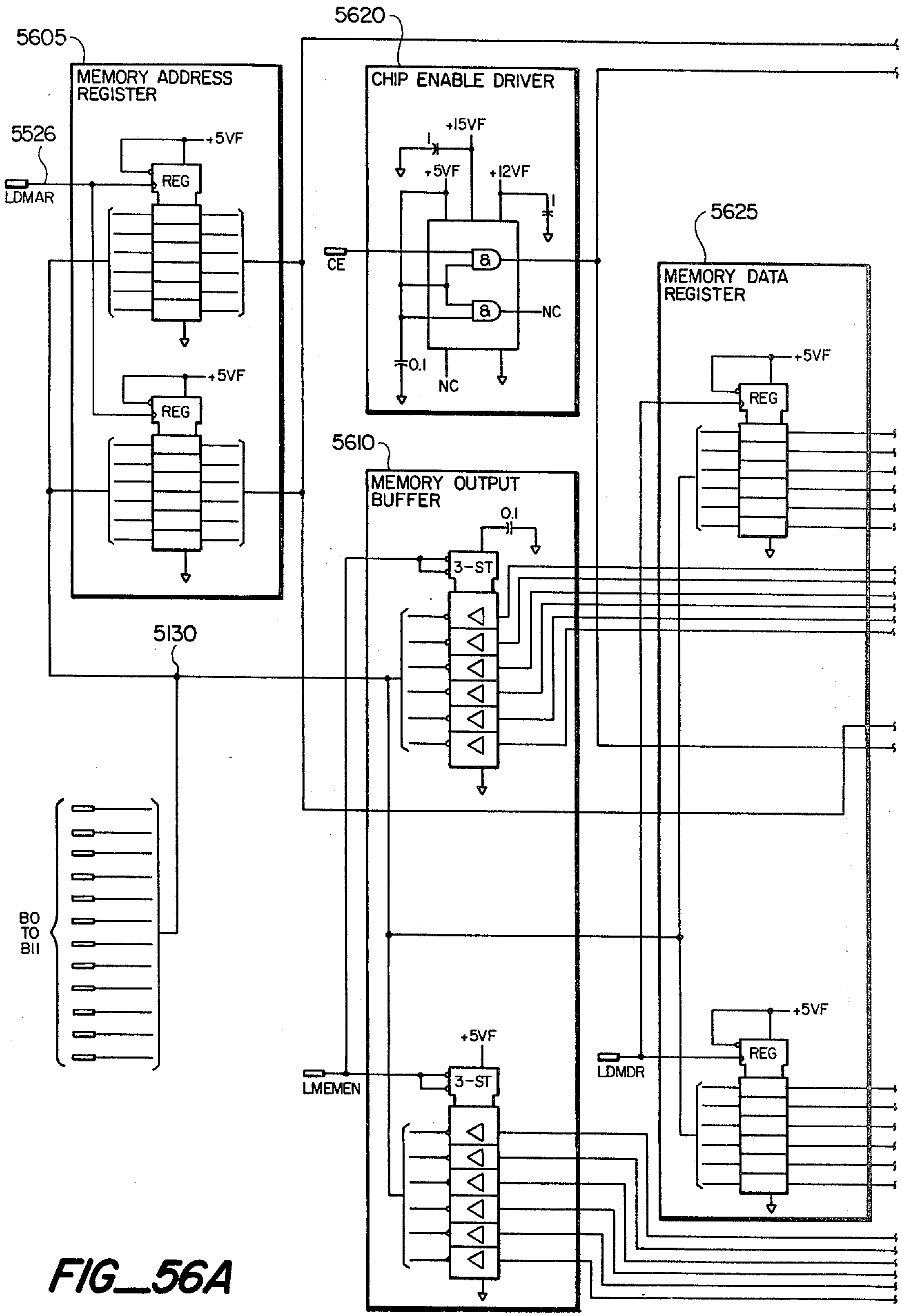
FIG_56A

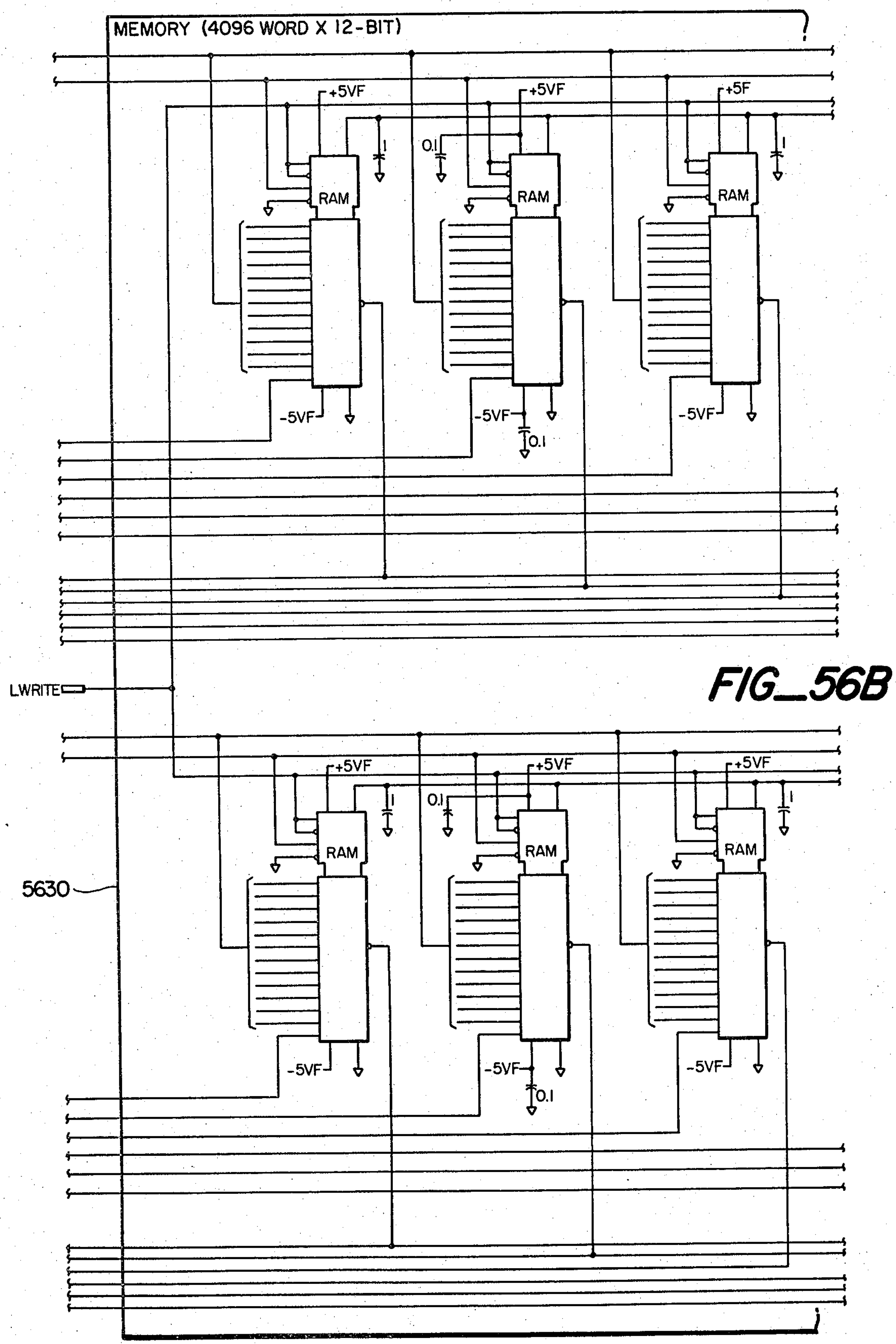
FIG_56B

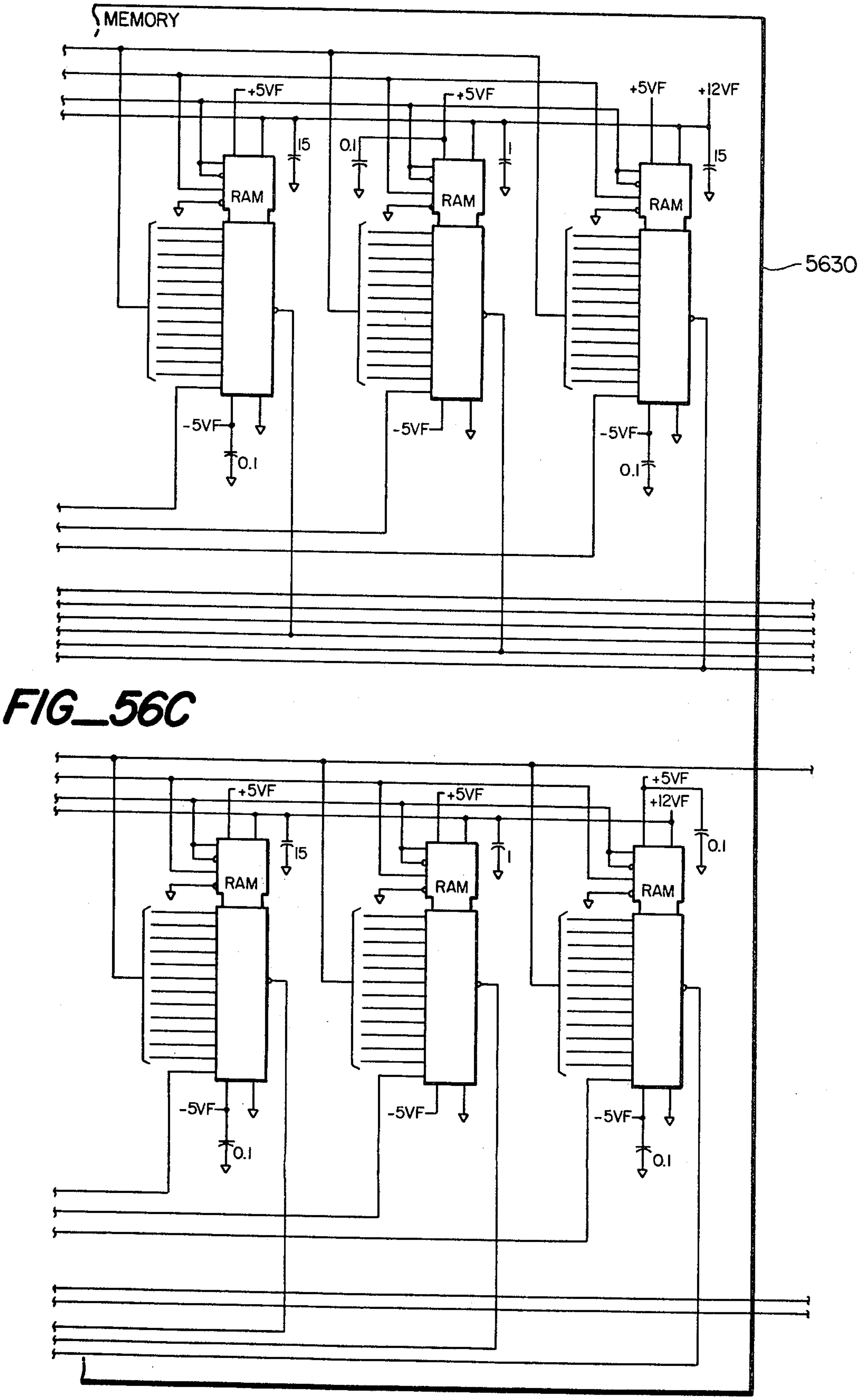
FIG_56C

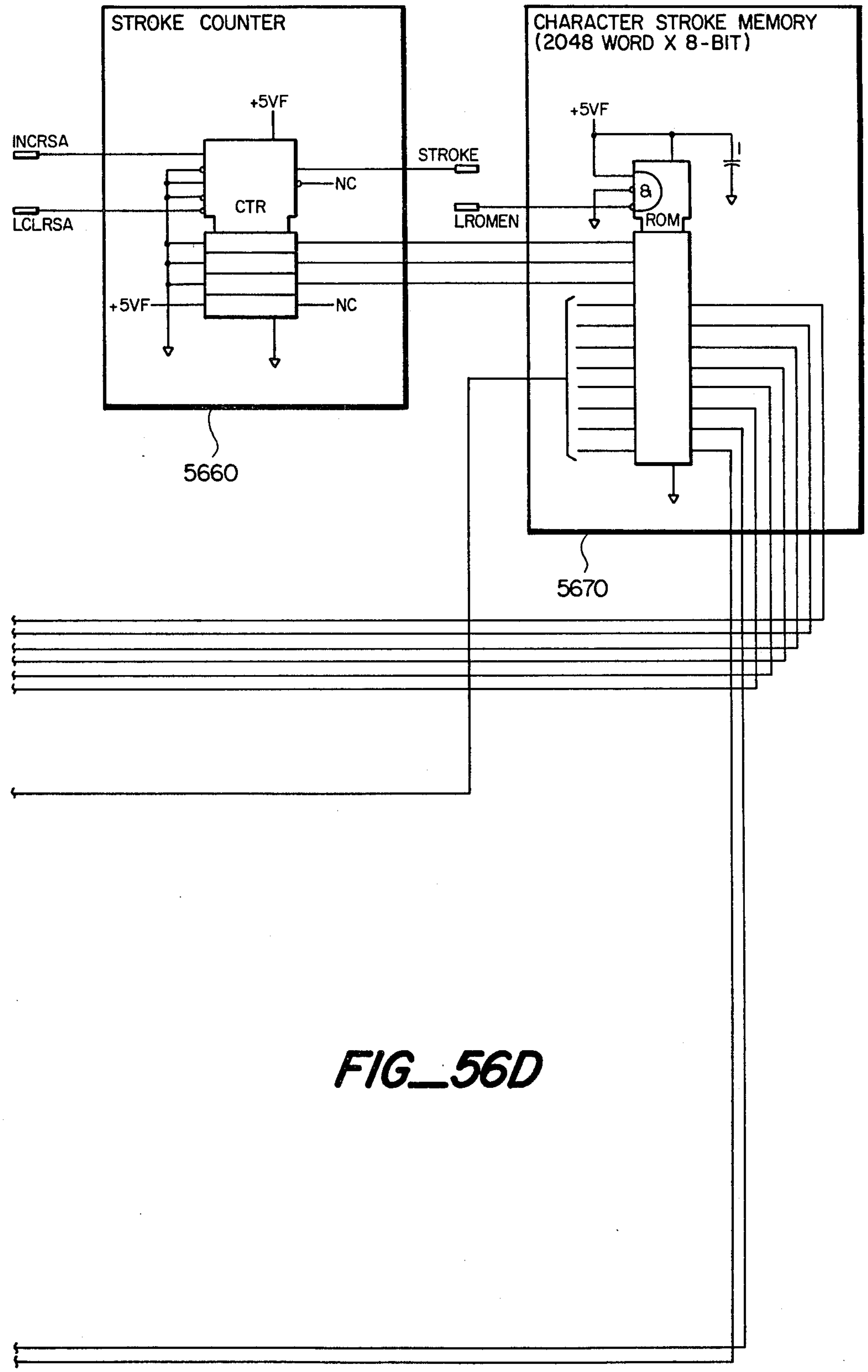
FIG_56D

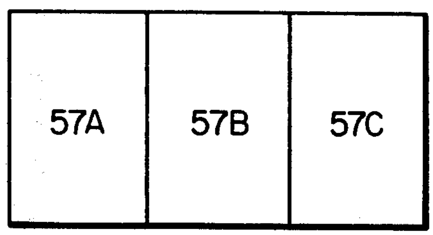
FIG_57

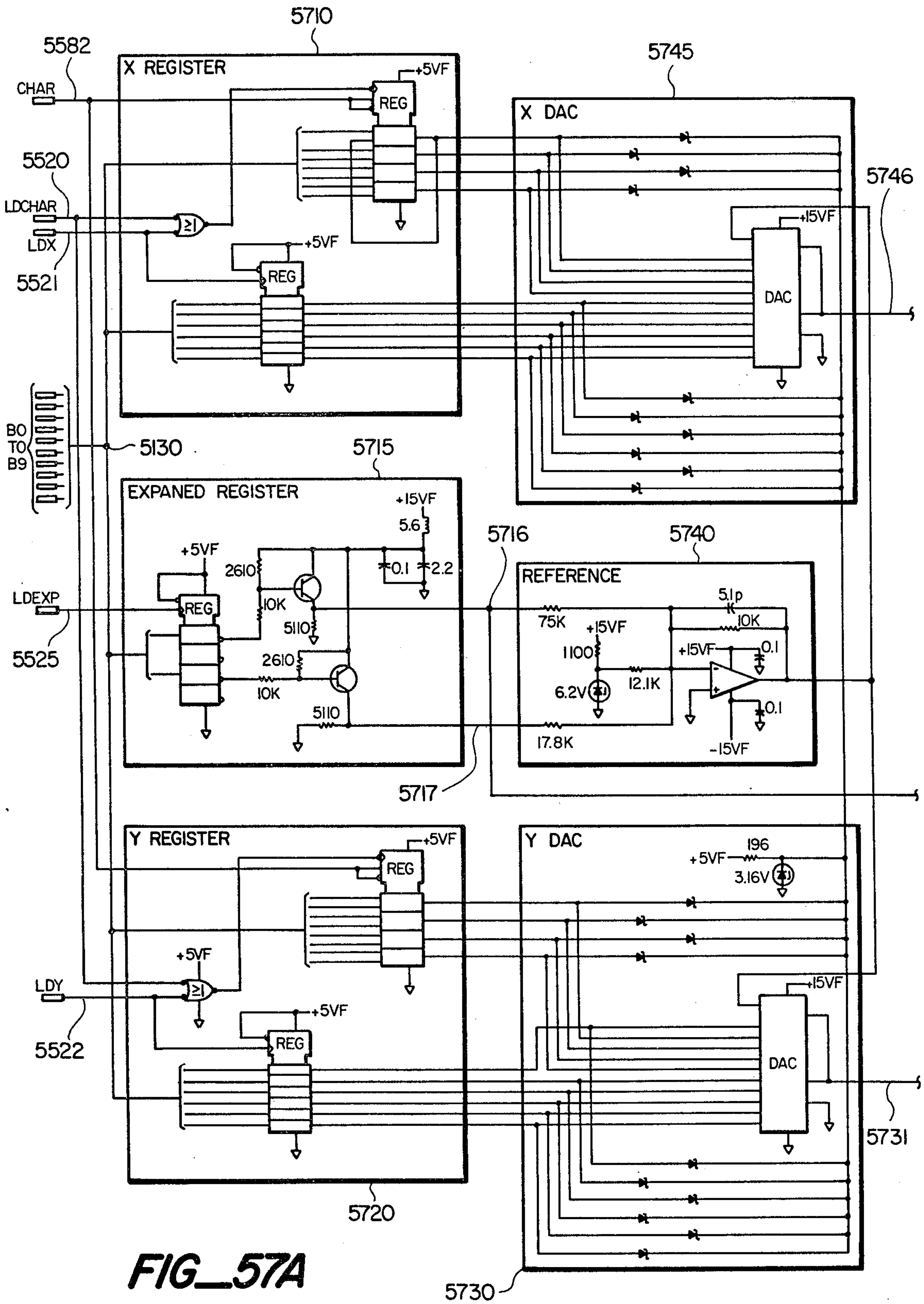
FIG_57A

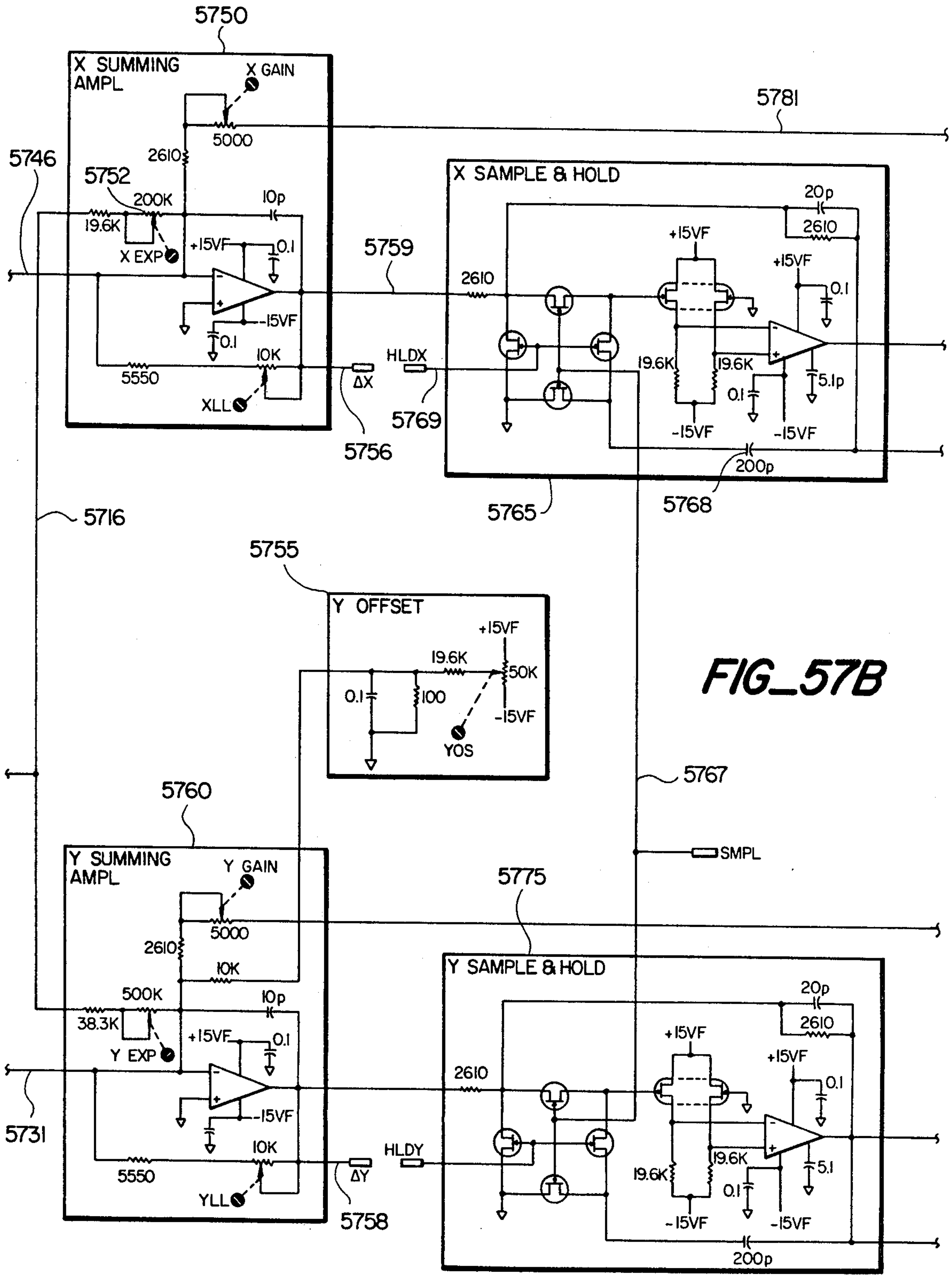
FIG_57B

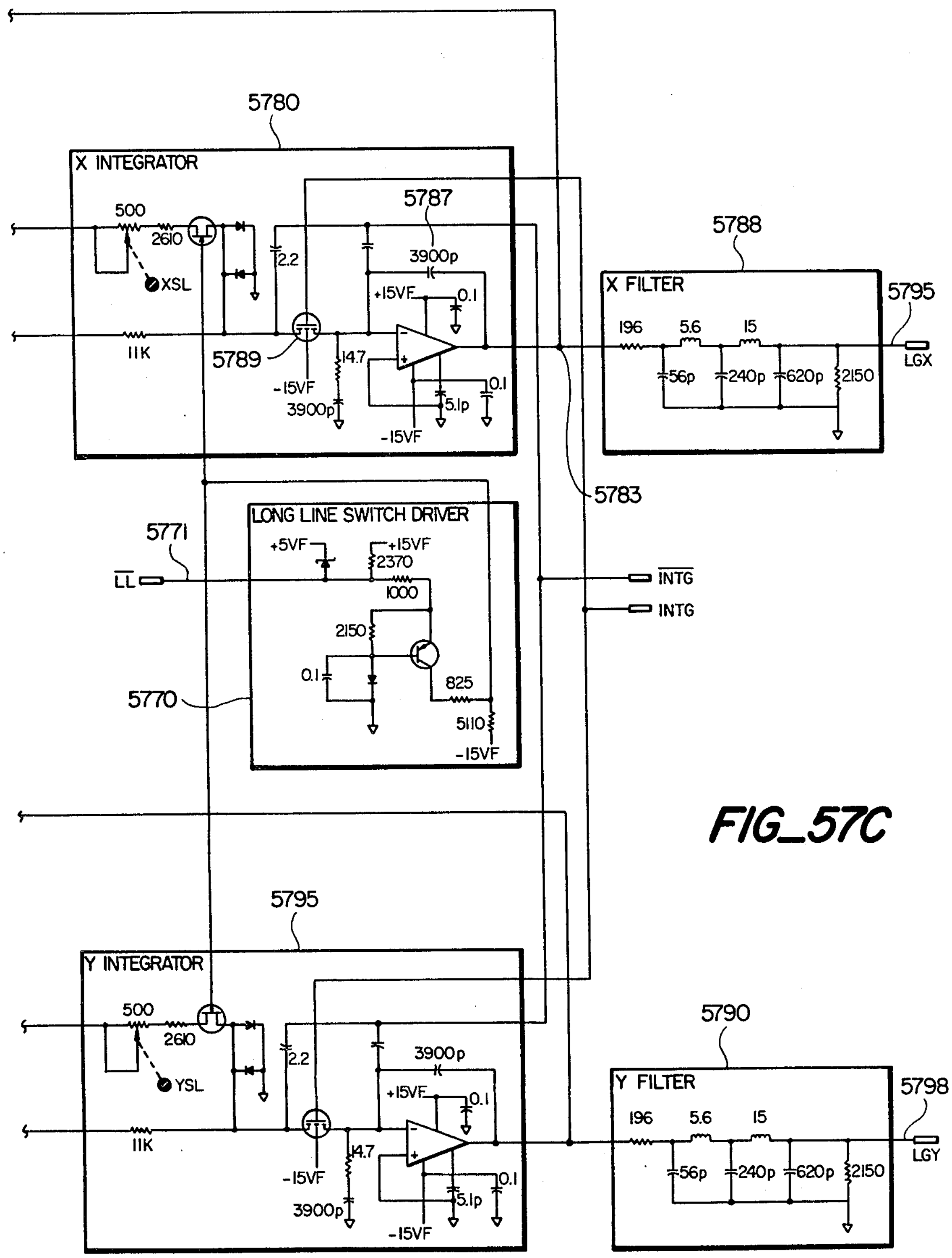
FIG_57C

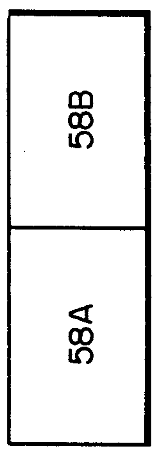
FIG_58

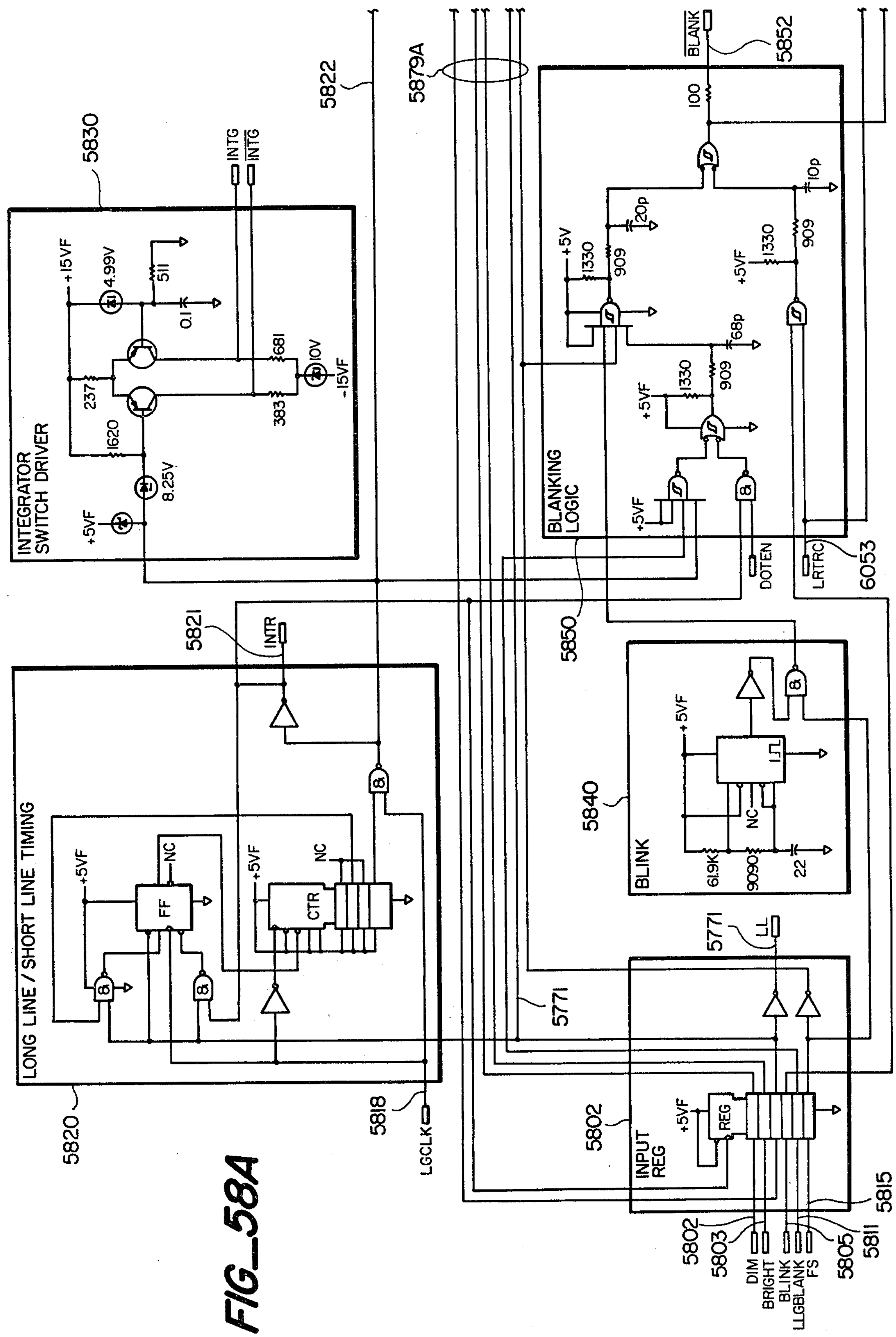
FIG_58A

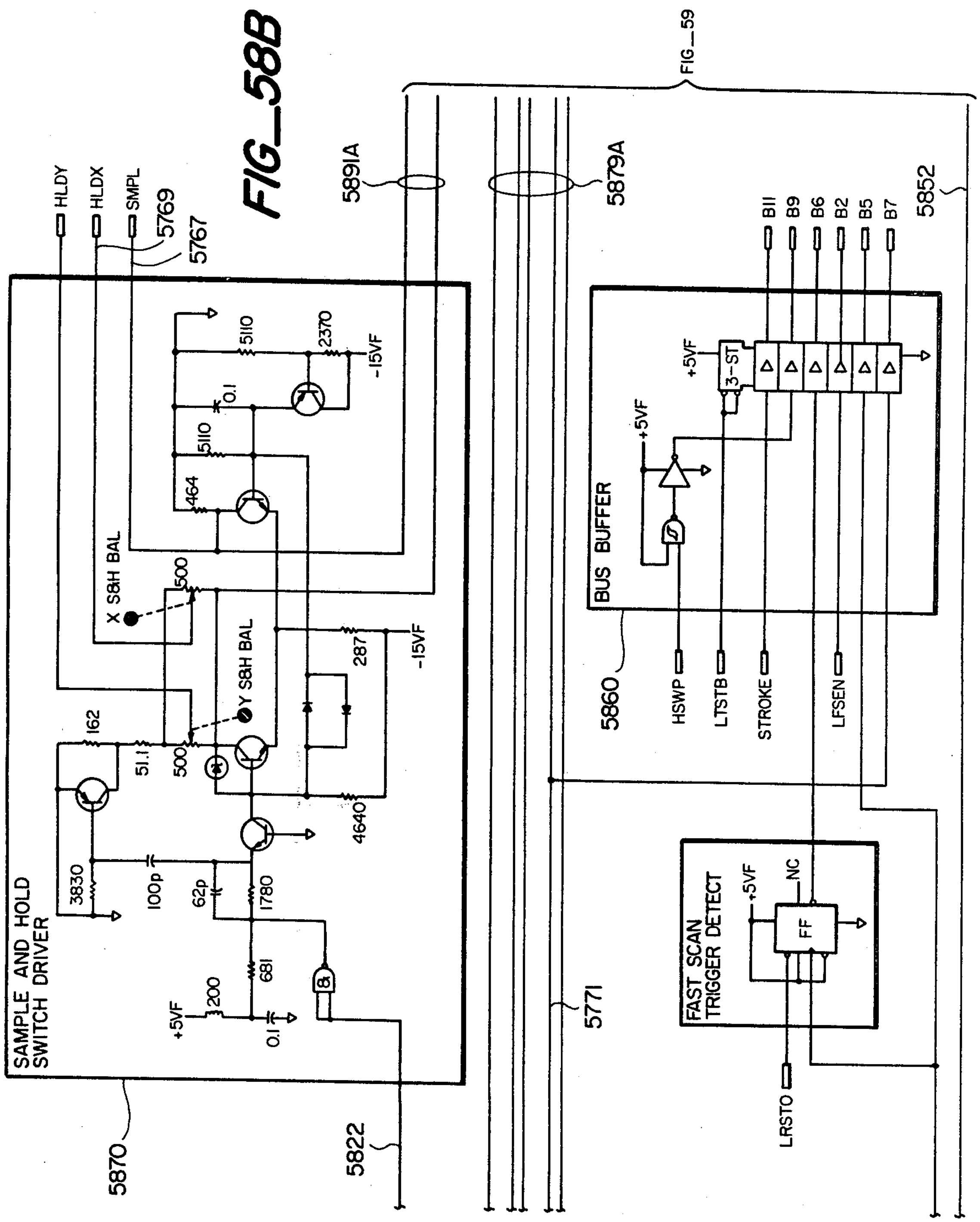
FIG_58B
SAMPLE AND HOLD SWITCH DRIVER
5870
5822
HLDY
HLDX
SMPL
5769
5767
5891A
5879A
FIG_59
X S&H BAL
Y S&H BAL
+5VF
-15VF
BUS BUFFER
5860
3-ST
B11
B9
B6
B2
B5
B7
5852
HSWP
LTSTB
STROKE
LFSEN
FAST SCAN TRIGGER DETECT
FF
NC
LRSTO
5771

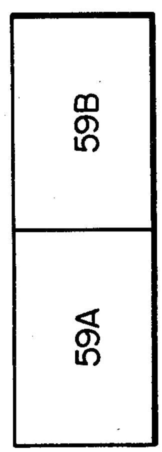
FIG_59

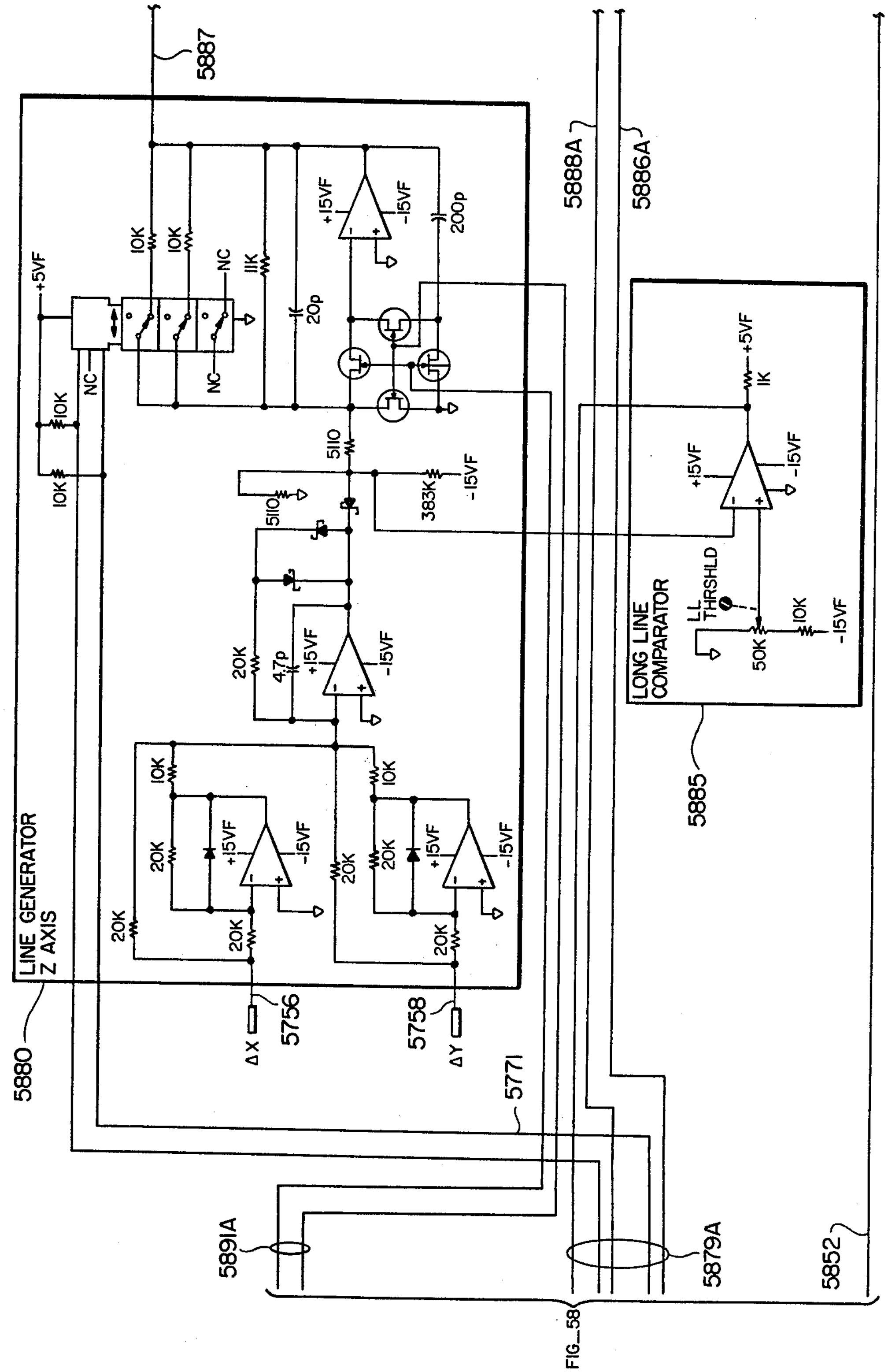
FIG_59A

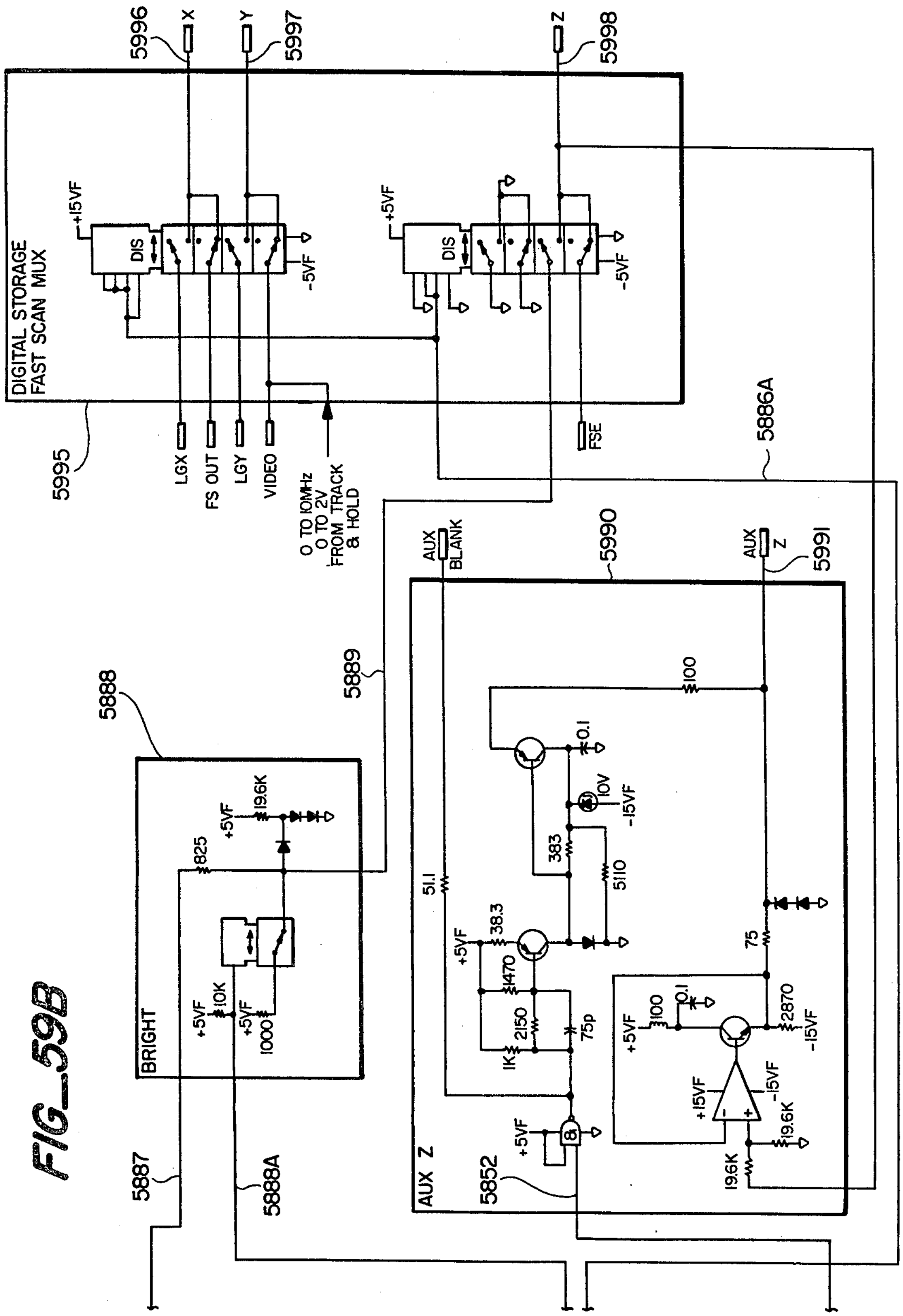
FIG_59B

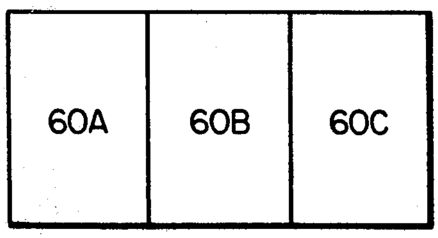
FIG_60

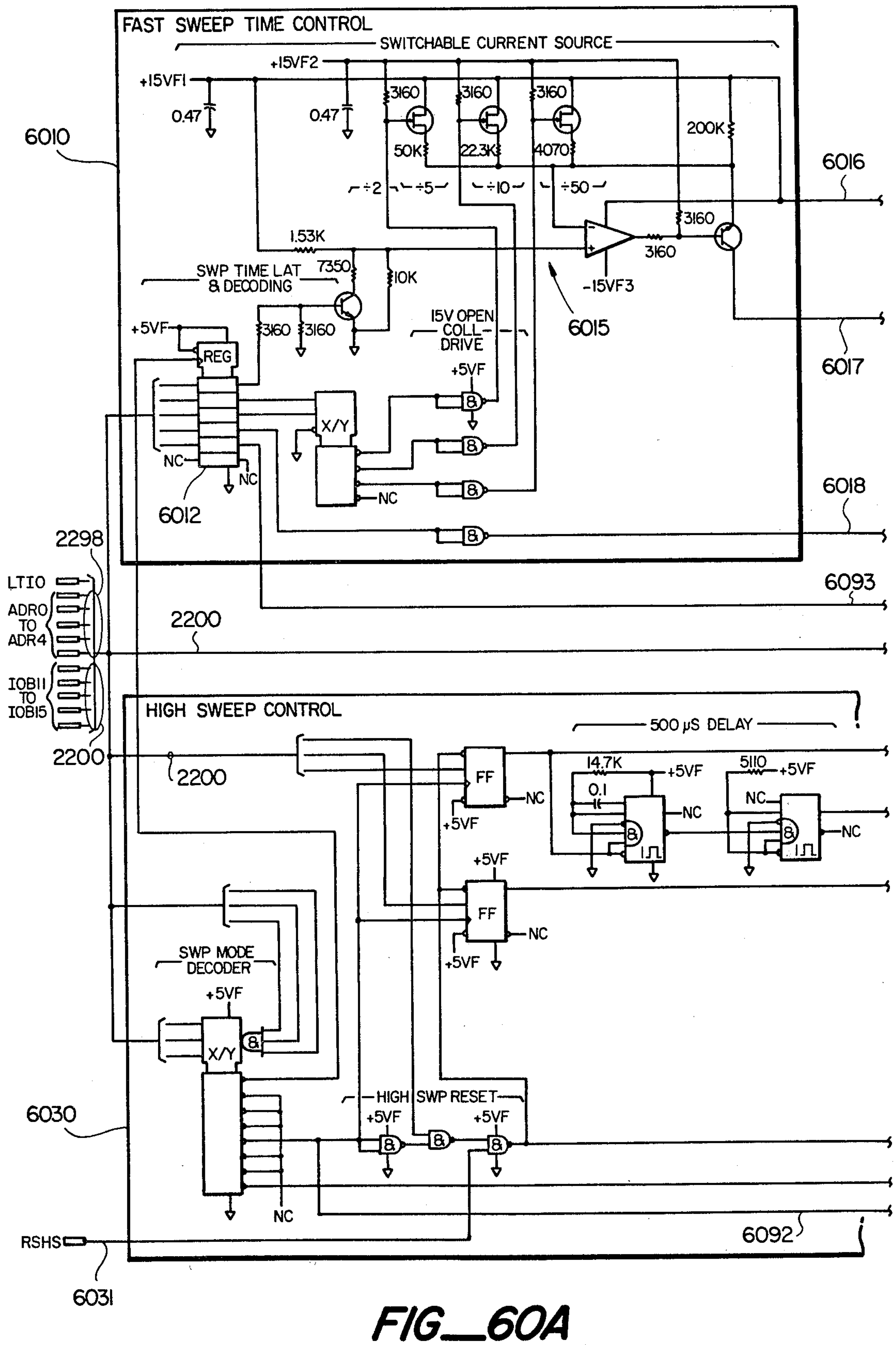
FIG_60A

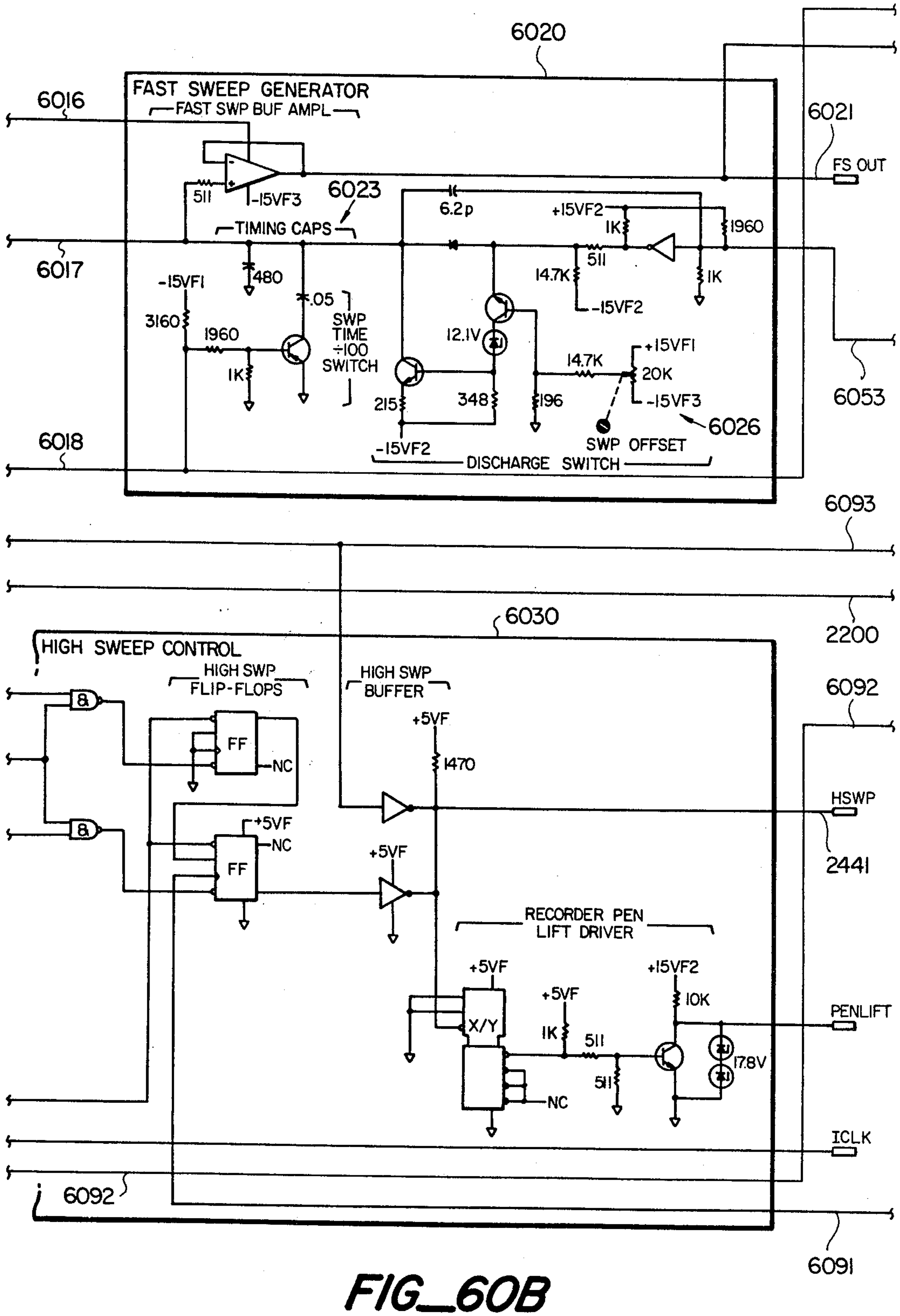
FIG_60B

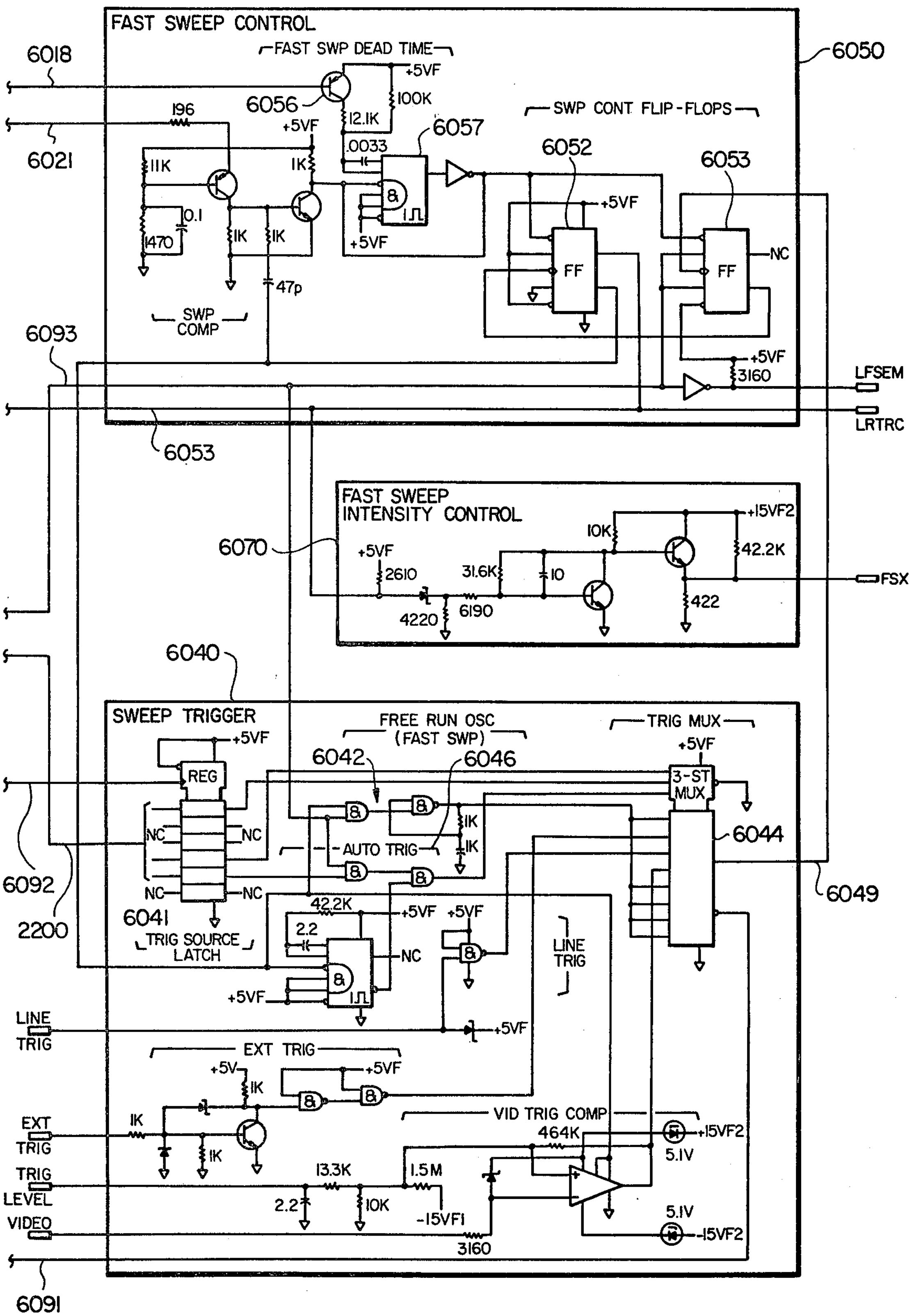
FIG_60C

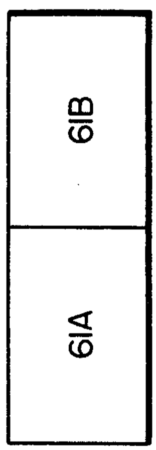
FIG_61

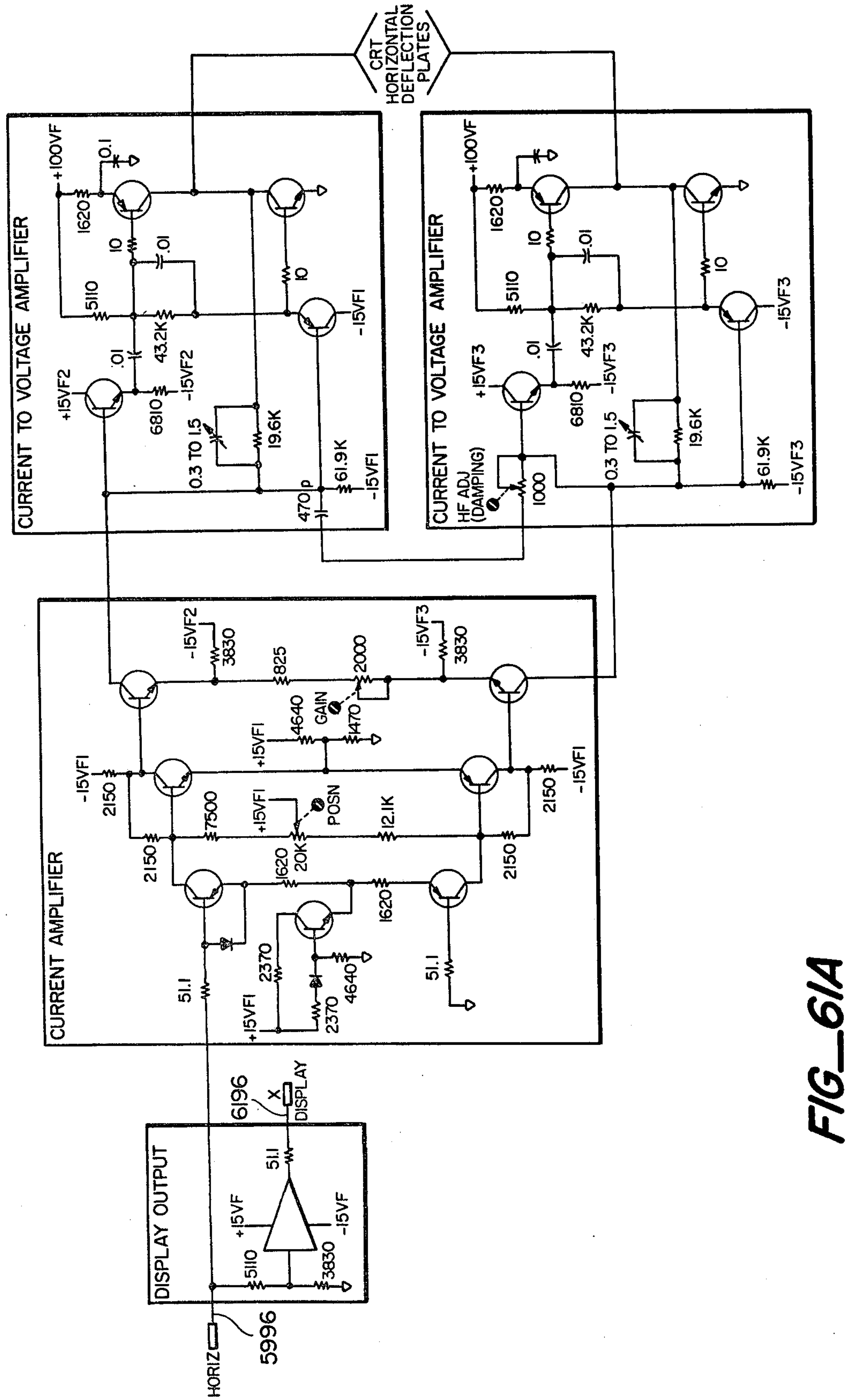
FIG_61A

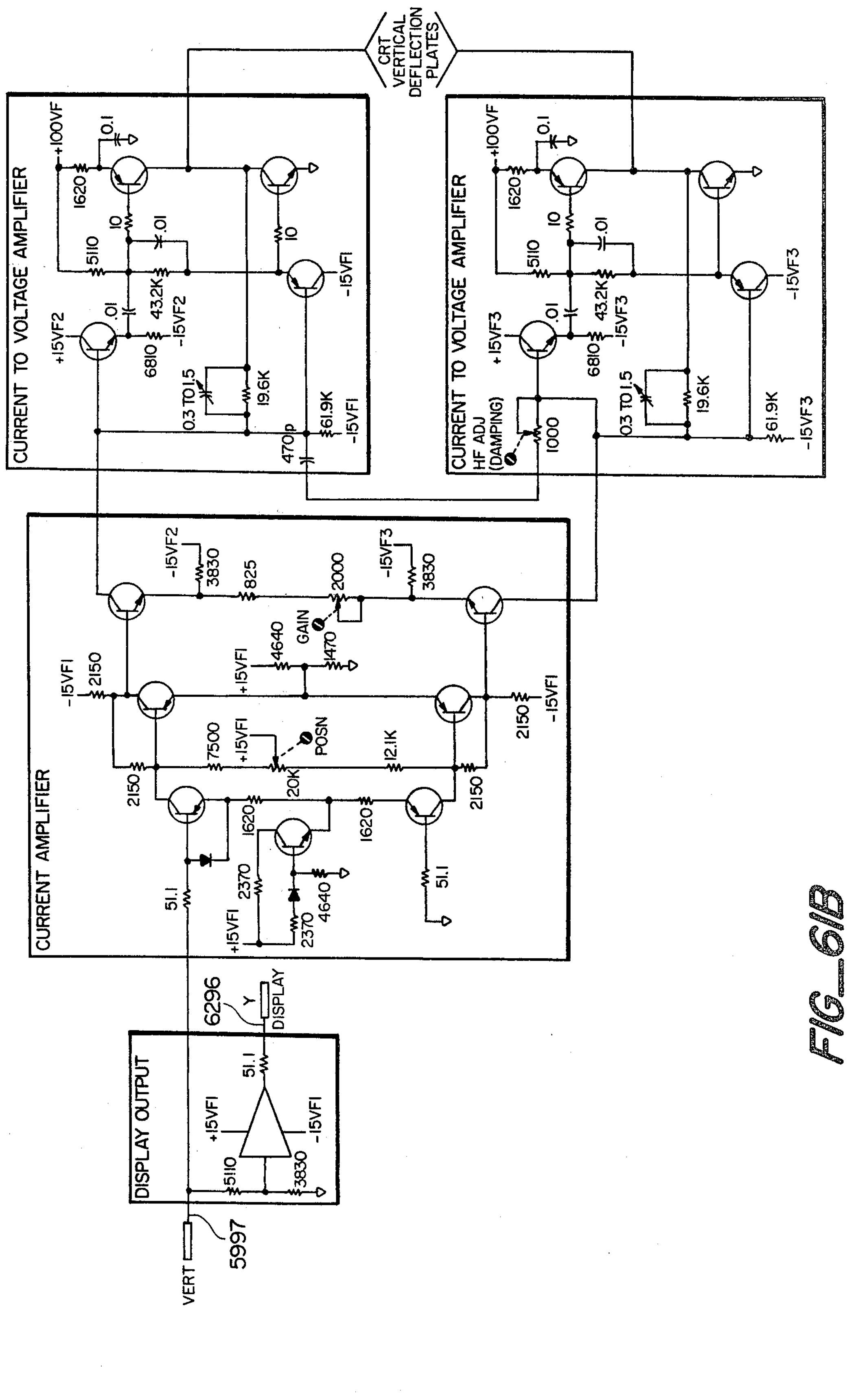
FIG_61B

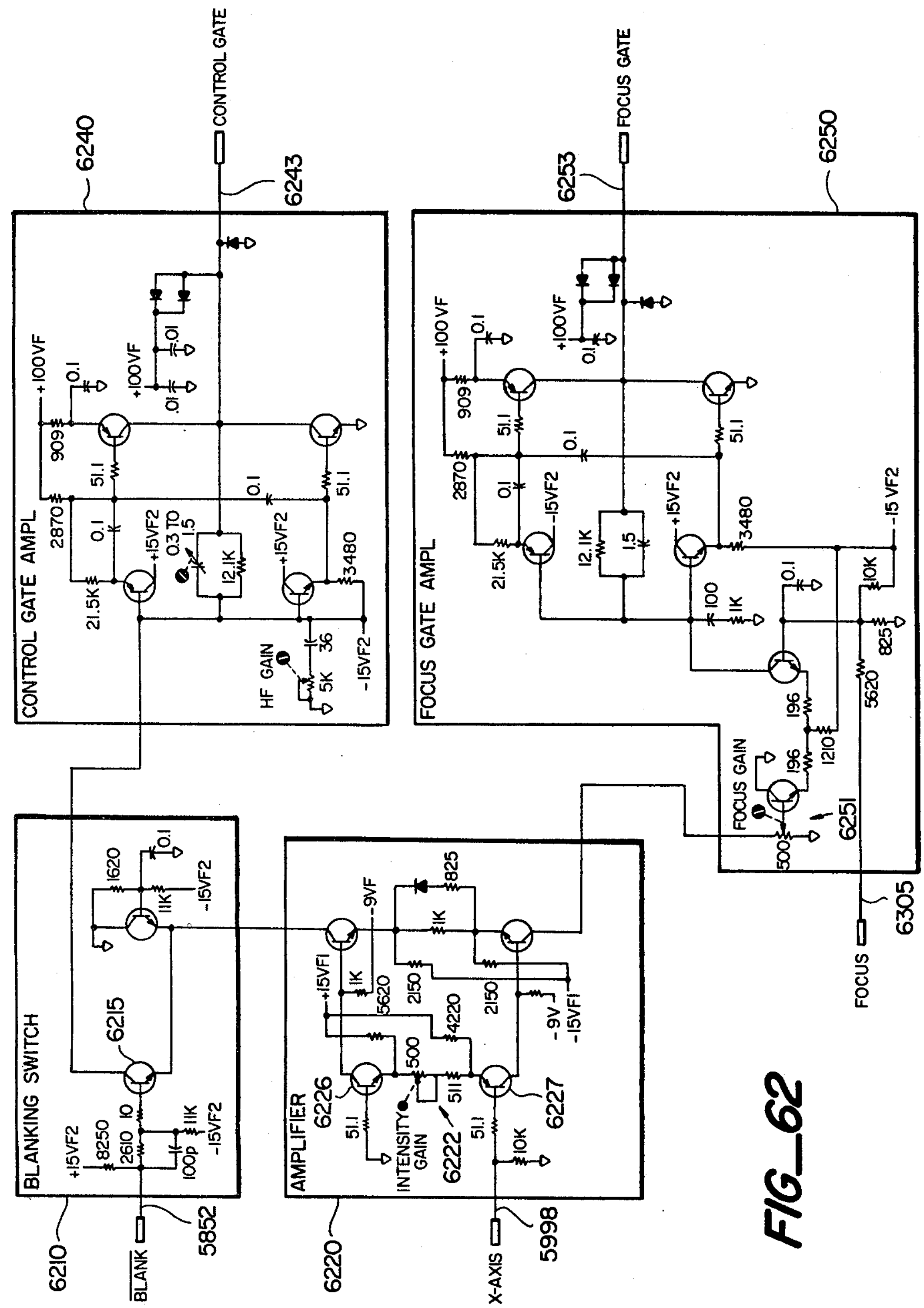
FIG_62

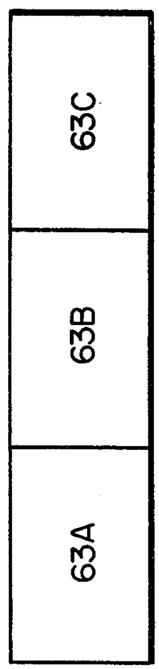
FIG_63

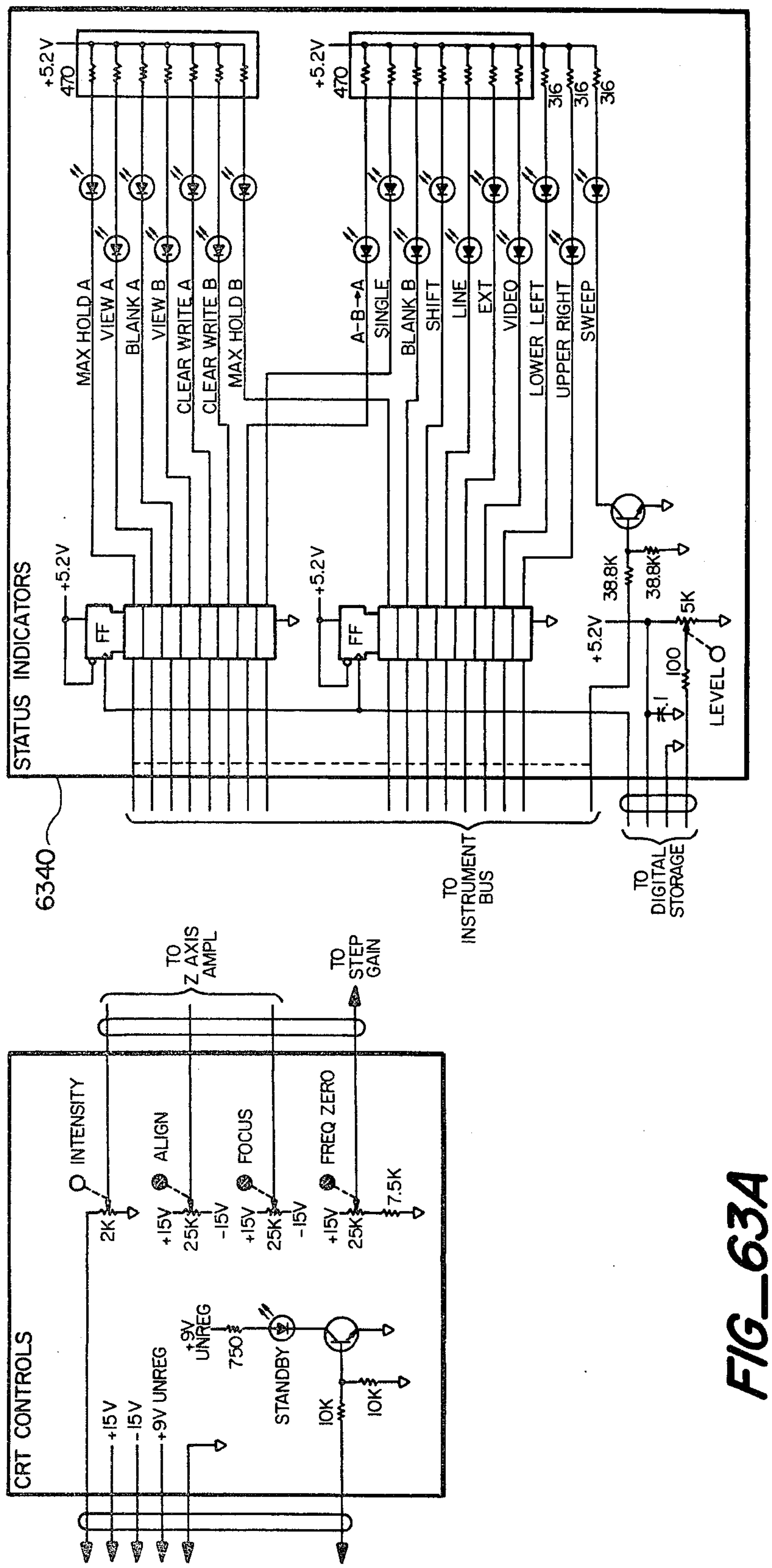
FIG_63A

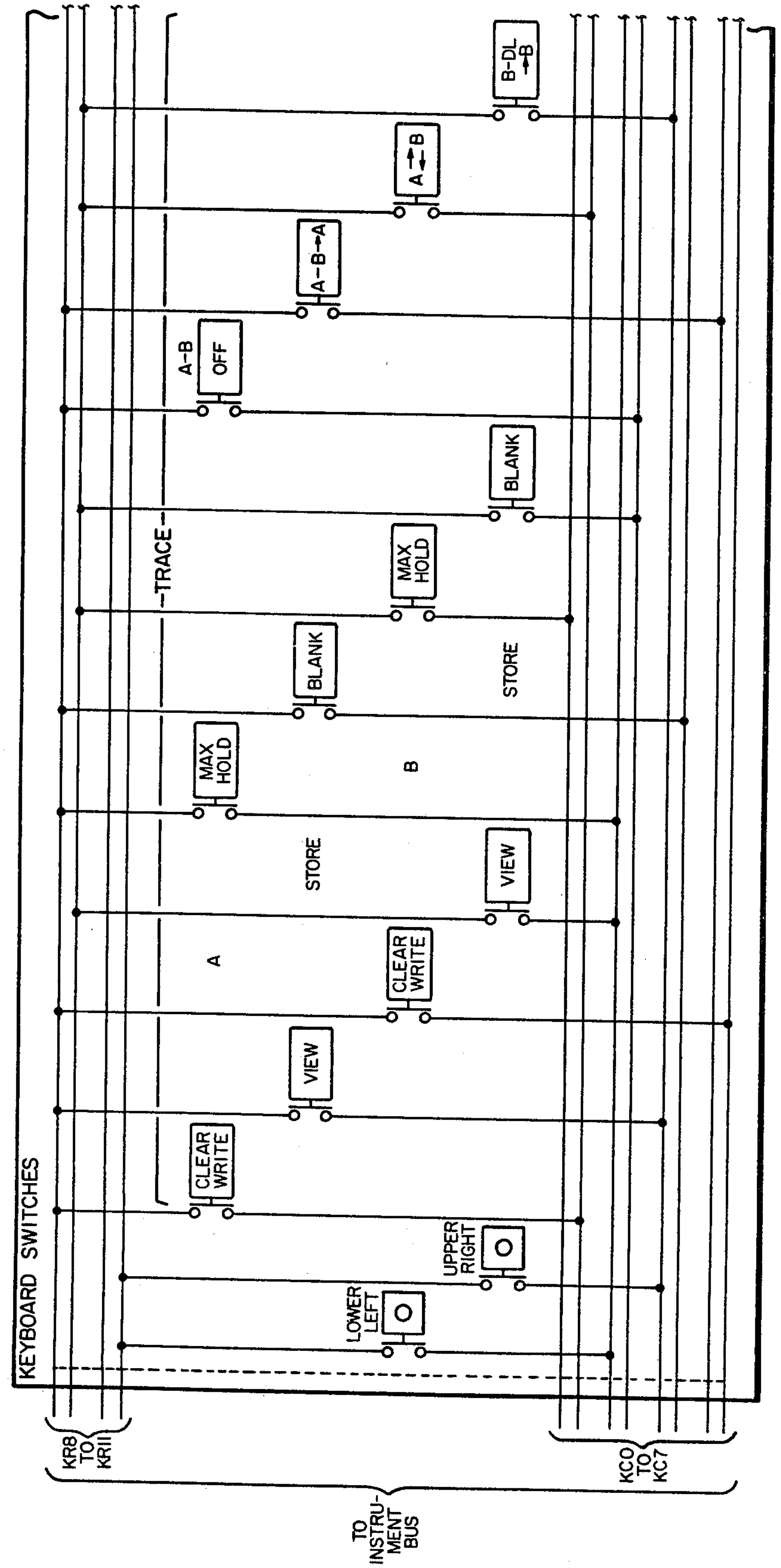
FIG_63B

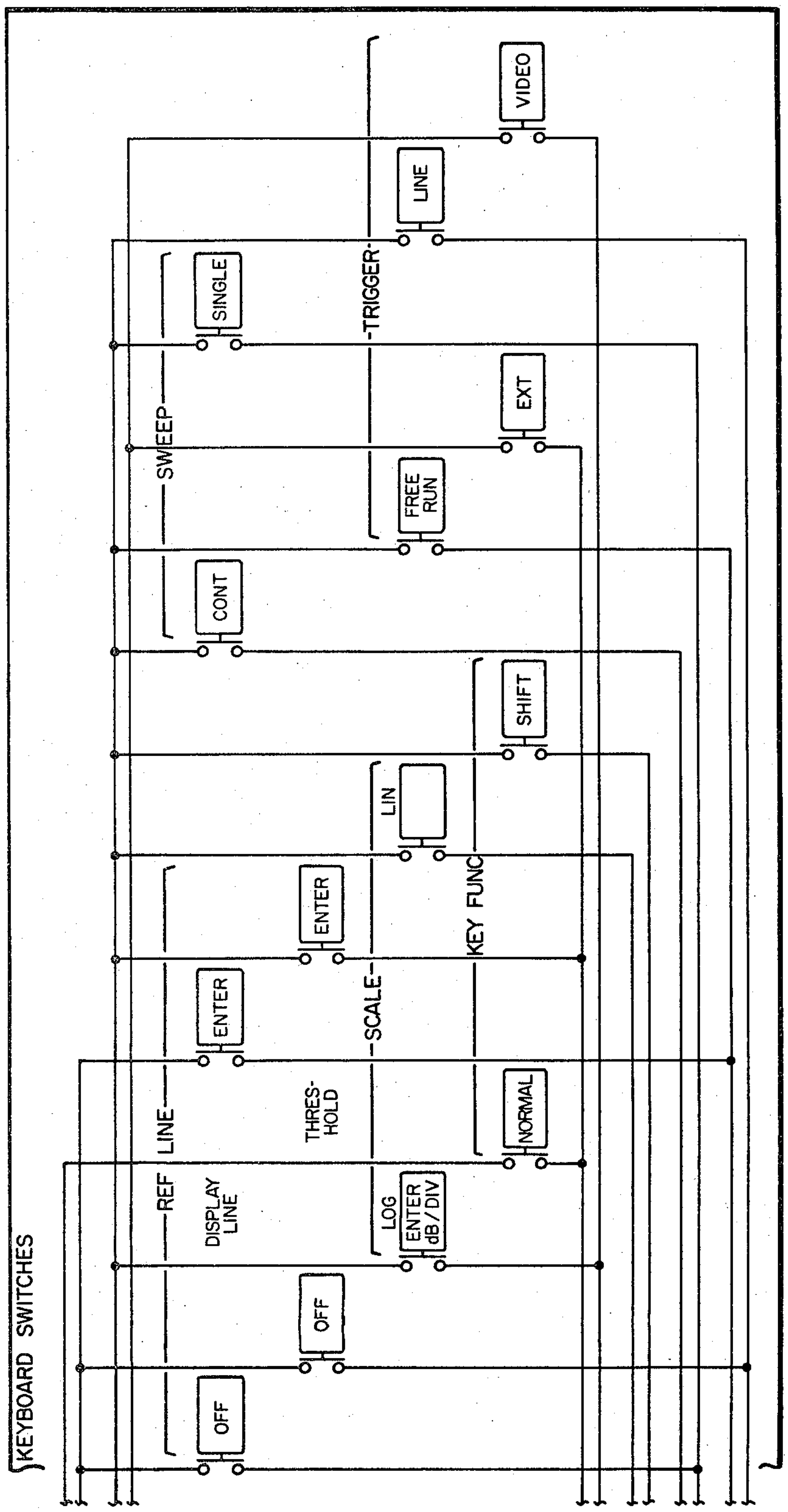
FIG_63C

VIDEO PROCESSOR FOR A SPECTRUM ANALYZER

BACKGROUND AND SUMMARY OF THE INVENTION

Spectrum Analyzers produce a display of amplitude vs. frequency of an input signal over a user settable frequency range. Typically, the user sets a center frequency and the unit scans over a predetermined band around the center frequency. Also, an amplitude reference is selected.

In previous spectrum analyzers, measurements of different relevant points on the displayed output was difficult to obtain accurately. In contrast, the preferred embodiment of the present invention provides a moveable marker which may be positioned on and moved along the displayed waveform. The frequency and amplitude at the present position of the marker is displayed and updated as the marker is moved. This moveable relative marker may also be used to facilitate the calculation of frequency and amplitude difference between any two selected points on the display. The marker is positioned on a first point. In response to a control button, a second marker is also provided at that point. This second marker image is then moved to the second measurement point. The difference in frequency and amplitude between these two relative positions is read out directly on the display screen itself.

The amplitude and frequency values at the marker position may be used to adjust various parameters in the machine. For example, the marker may be moved to a point on the display and that point may then be entered as a new center frequency, or it may become the amplitude reference level, or it may become the time interval for center frequency stepping, or using both markers, the interval between them may become the span-width for the entire display, i.e., the two marked positions become the start and stop frequencies.

In previous spectrum analyzers, it was difficult to select a particular portion of the displayed signal and then expand about that point as the center frequency. In the preferred embodiment, the marker may be positioned at any signal point, and using step-up and step-down keys, the frequency span-width about that point may be reduced or expanded.

To maintain the selected signal in the center of the display in previous spectrum analyzers, it was necessary to continuously tune the center frequency to coincide with the desired signal to be viewed as the center frequency. In the preferred embodiment, at the end of each scan, the marker may be positioned to coincide with the peak of the signal then being displayed. The frequency of this peak signal is then set to the center frequency, i.e., the center frequency is set to the value of the peak signal. This eliminates the need to reposition the marker as the scale is expanded since minor inaccuracies in positioning the marker are corrected during each expansion of the display. Therefore, as the span is reduced, the signal will remain in the center of the display. Also, if the signal is drifting, this feature will maintain the signal on the screen despite the drift.

Prior spectrum analyzers using rotating controls such as potentiometers and other tuning knobs have typically had fixed sensitivities for changing the control parameter in response to a rotation of the same magnitude, since the sensitivity of these controls was usually designed to accommodate the medium range positions. Therefore, the controls would be too sensitive to comfortably tune the lower bands and would move too slowly when tuning over larger bands. Prior spectrum analyzers have used multiple knobs or complicated clutch mechanisms with gear drives to overcome this problem. In contrast, the preferred embodiment; the sensitivity of the rotating control is controlled by the span-width selected, hence, regardless of the frequency range being displayed, a single rotation will still move the marker or other parameters being displayed the same distance across the display.

Previous spectrum analyzers used rotary controls having detent positions or continuously variable tuning. Each function on the spectrum analyzer was assigned either a detent rotary switch or a continuously variable switch. This had the disadvantage that this was not the optimum mode of entry for values for the most convenient way to enter values into the machine. In contrast in the preferred embodiment, a triple entry mode for data input is provided. Using this system, the parameter to be acted upon, e.g., the center frequency, frequency span, the start or stop frequency, etc. is selected, then the value is entered via a keyboard, step-up and step-down keys, or a rotary tuning control. This has the advantage that one may select the most convenient way to enter values for the mode he is operating in. The rotary knob is most useful when tuning or searching for a signal or specific frequency. The step-up and step-down keys are most convenient when one is progressing forward or backward through a limited set of even increments over a range. Of course, the keyboard is most useful for entering the desired value when the exact parameter is known.

In prior spectrum analyzers, if the input signal was preceded by a preamp, a down converter, an up converter, etc., it was necessary to calculate the actual frequency amplitude for the signal of interest. In contrast the preferred embodiment provides enterable offsets whereby the frequency or amplitude levels can be offset a predetermined amount to calibrate them to take into account the presence of the intervening circuit element.

Also, previous spectrum analyzers were limited to entering a center frequency and span values. In contrast, the preferred embodiment enables the user to input a start and stop frequency and the center frequency and span are automatically determined. In addition, one may enter a new start or stop frequency to increase or decrease the span without having to calculate a center frequency for the band of interest.

In a spectrum analyzer with a digital display, i.e., where the display is produced in response to data representing a discrete number of sampled points, there is the problem that there may not be enough sample points to properly describe the analog signal. The real solutions would be to increase the sampling rate and the number of points displayed, but this is costly and not practical. Other solutions are compromises which sacrifice some information in order to preserve that information which is most useful for spectrum analysis. The preferred embodiment ensures the display of the most important parameter, i.e., correct signal amplitude. It is obtained from a peak detector which precedes the A/D converter. The peak detector holds the max. signal which occurs between samples for the A/D. After sampling the peak detector output, the peak detector is re-set to the input signal level. Thus, no signal peak is lost. Also, the preferred embodiment employs both a positive and negative peak detector circuit to allow a better presentation of signal noise, i.e., give an indication of the amplitude and frequency excursions in the noise signal.

BRIEF DESCRIPTION OF THE DRAWINGS

FIG. 1 is a simple block diagram of the preferred embodiment.

FIG. 2 shows the front panel controls of the preferred embodiment.

FIG. 3 illustrates a typical waveform display in the preferred embodiment.

FIG. 4 illustrates the waveform of the preferred embodiment with the marker in use.

FIG. 5 illustrates the amplitude and frequency difference readouts using the relative marker technique of the preferred embodiment.

FIGS. 6, 7 and 8 illustrate the display which is produced when a frequency or amplitude offset is used.

FIG. 9 illustrates the various active function readouts provided by the preferred embodiment.

FIG. 10 illustrates the X and Y coordinate system used in the display of the preferred embodiment.

FIG. 11 illustrates the display waveforms present when all three traces available in the preferred embodiment are displayed simultaneously.

FIG. 12 is a block diagram of the sweep and refresh operations of the preferred embodiment.

FIG. 13 illustrates the use of the basic marker mode.

FIGS. 14A and 14B illustrate the reading of frequency and amplitude levels of displayed signals using the marker.

FIGS. 15A and 15B illustrate the differential marker technique of the preferred embodiment.

FIGS. 16A, 16B, 16C, 16D and 16E illustrate the marker zoom feature of the preferred embodiment.

FIGS. 17A and 17B illustrate an example of the automatic marker zoom feature of the preferred embodiment.

FIGS. 18A and 18B illustrate the use of the marker and the center frequency control to bring a signal of interest to the center of the display.

FIGS. 19A, 19B and 19C illustrate the changing of the center frequency by selecting start and stop frequencies using the markers.

FIGS. 19C, 19D and 19E illustrate the technique whereby the center frequency may be changed in increments equal to the frequency difference between the two marker positions.

FIG. 19F illustrates the use of the signal tracking feature of the preferred embodiment.

FIGS. 19F and 19G illustrate the signal tracking feature of the preferred embodiment.

FIG. 20 illustrates the relationship of FIGS. 20A and 20B.

FIGS. 20A and 20B taken together are a detailed block diagram of the preferred embodiment.

FIG. 21 illustrates the relationship of FIGS. 21A, 21B and 21C.

FIGS. 21A, 21B and 21C taken together are a circuit diagram of the front panel of the preferred embodiment.

FIG. 22 illustrates the relationship of FIGS. 22A, 22B, 22C, and 22D.

FIGS. 22A, 22B, 22C and 22D taken together illustrate the interface circuitry for the RF section to the processor 2015 of the preferred embodiment.

FIG. 23 is a schematic diagram of the 20 MHz reference circuit of the preferred embodiment.

FIG. 24 illustrates the relationship of FIGS. 24A and 24B.

FIGS. 24A and 24B taken together are a schematic diagram of the frequency control circuitry of the preferred embodiment.

FIG. 25 is a block diagram illustrating the relationship of the YTO, the YTO phase lock circuitry, and other circuits within the preferred embodiment.

FIG. 26 illustrates the relationship of FIGS. 26A and 26B.

FIGS. 26A and 26B taken together are a schematic diagram of the phase lock circuitry of the preferred embodiment.

FIG. 27 shows the relationship of FIGS. 27A and 27B.

FIGS. 27A and 27B taken together are a schematic diagram of the RF converter circuitry of the preferred embodiment.

FIG. 28 is a schematic diagram of the second IF amplifier of the preferred embodiment.

FIG. 29 is a schematic diagram of the third converter circuitry of the preferred embodiment.

FIG. 30 is a schematic diagram of the pilot second IF amplifier of the preferred embodiment.

FIG. 31 is a schematic diagram of the pilot third converter circuitry of the preferred embodiment.

FIG. 32 shows the relationship of FIGS. 32A and 32B.

FIGS. 32A and 32B taken together are a schematic diagram of the 275 MHz phase lock circuitry of the preferred embodiment.

FIG. 33 is a schematic diagram of the 249 MHz phase lock oscillator of the preferred embodiment.

FIG. 34 shows the relationship of FIGS. 34A and 34B.

FIGS. 34A and 34B taken together are a schematic diagram of the 275 MHz phase lock oscillator of the preferred embodiment.

FIG. 35 shows the relationship of FIGS. 35A and 35B.

FIGS. 35A and 35B taken together are a schematic diagram of the 50 MHz voltage tuned oscillator of the preferred embodiment.

FIG. 36 shows the relationship of FIGS. 36A, 36B and 36C.

FIGS. 36A, 36B and 36C taken together are a schematic diagram of the frequency counter circuitry of the preferred embodiment.

FIG. 37 shows the relationship of FIGS. 37A and 37B.

FIGS. 37A and 37B taken together are a schematic diagram of the 249 MHz phase lock circuit of the preferred embodiment.

FIG. 38 shows the relationship of FIGS. 38A, 38B, 38C and 38D.

FIGS. 38A, 38B, 38C and 38D taken together are a schematic diagram of the processor used in the preferred embodiment.

FIG. 39 is a simplified block diagram of the processor used in the preferred embodiment.

FIG. 40 shows the relationship of FIGS. 40A, 40B and 40C.

FIGS. 40A, 40B and 40C taken together are a schematic diagram of the bandwidth filter circuitry of the preferred embodiment.

FIG. 41 shows the relationship of FIGS. 41A and 41B.

FIGS. 41A and 41B taken together are a schematic diagram of the IF control circuitry of the preferred embodiment.

FIG. 42 shows the relationship of FIGS. 42A and 42B.

FIGS. 42A and 42B taken together are a schematic diagram of the log amplifier and filter circuitry of the preferred embodiment.

FIG. 43 shows the relationship of FIGS. 43A and 43B.

FIGS. 43A and 43B taken together are a schematic diagram of the log amplifier and detector circuitry of the preferred embodiment.

FIG. 44 shows the relationship of FIGS. 44A and 44B.

FIGS. 44A and 44B taken together are a schematic diagram of the step gain circuitry of the preferred embodiment.

FIG. 45 shows the relationship of FIGS. 45A and 45B.

FIGS. 45A and 45B taken together are a schematic diagram of the 3 MHz bandwidth filter circuitry of the preferred embodiment.

FIG. 46 shows the relationship of FIGS. 46A and 46B.

FIGS. 46A and 46B taken together are a schematic diagram of the attenuator bandwidth filter circuitry of the preferred embodiment.

FIG. 47 is a schematic diagram of the down converter circuitry of the preferred embodiment.

FIG. 48 is a schematic diagram of the up converter circuitry of the preferred embodiment.

FIG. 49A is block diagram of the video processing system of the preferred embodiment.

FIGS. 49B, 49C and 49D show the waveform improvement obtained using the video processing system of the preferred embodiment.

FIG. 50 shows the relationship of FIGS. 50A and 50B.

FIGS. 50A and 50B taken together are a schematic diagram of the video processor circuitry of the preferred embodiment.

FIG. 51 shows the relationship of FIGS. 51A and 51B.

FIGS. 51A and 51B taken together are a schematic diagram of the A/D converter circuitry of the preferred embodiment.

FIG. 52 shows the relationship of FIGS. 52A, 52B and 52C.

FIGS. 52A, 52B and 52C taken together are a schematic diagram of the track and hold circuitry of the preferred embodiment.

FIG. 53 shows the relationship of FIGS. 53A, 53B and 53C.

FIGS. 53A, 53B and 53C taken together are a schematic diagram of the data manipulator circuitry of the preferred embodiment.

FIG. 54 shows the relationship of FIGS. 54A, 54B and 54C.

FIGS. 54A, 54B and 54C taken together are a schematic diagram of the memory main control circuitry of the preferred embodiment.

FIG. 55 shows the relationship of FIGS. 55A and 55B.

FIGS. 55A and 55B taken together are a schematic diagram of the memory interface circuitry of the preferred embodiment.

FIG. 56 shows the relationship of FIGS. 56A, 56B and 56C.

FIGS. 56A, 56B and 56C taken together are a schematic diagram of the memory used in the preferred embodiment.

FIG. 57 shows the relationship of FIGS. 57A and 57B.

FIGS. 57A and 57B taken together are a schematic diagram of the line generator circuitry of the preferred embodiment.

FIG. 58 shows the relationship of FIGS. 58A and 58B.

FIG. 59 shows the relationship of FIGS. 59A and 59B.

FIGS. 58A, 58B, 59A and 59B taken together are a schematic diagram of the intensity control circuits of the preferred embodiment.

FIG. 60 shows the relationship of FIGS. 60A and 60B.

FIGS. 60A and 60B taken together are a schematic diagram of the sweep and video trigger circuits of the preferred embodiment.

FIG. 61 is a schematic diagram of the Y deflection amplifier of the preferred embodiment.

FIG. 62 is a schematic diagram of the X deflection amplifier of the preferred embodiment.

FIG. 63 is a schematic diagram of the status indicators and CRT controls of the preferred embodiment.

DESCRIPTION OF THE PREFERRED EMBODIMENT

Description of Basic Block Diagram

Figure 45A:
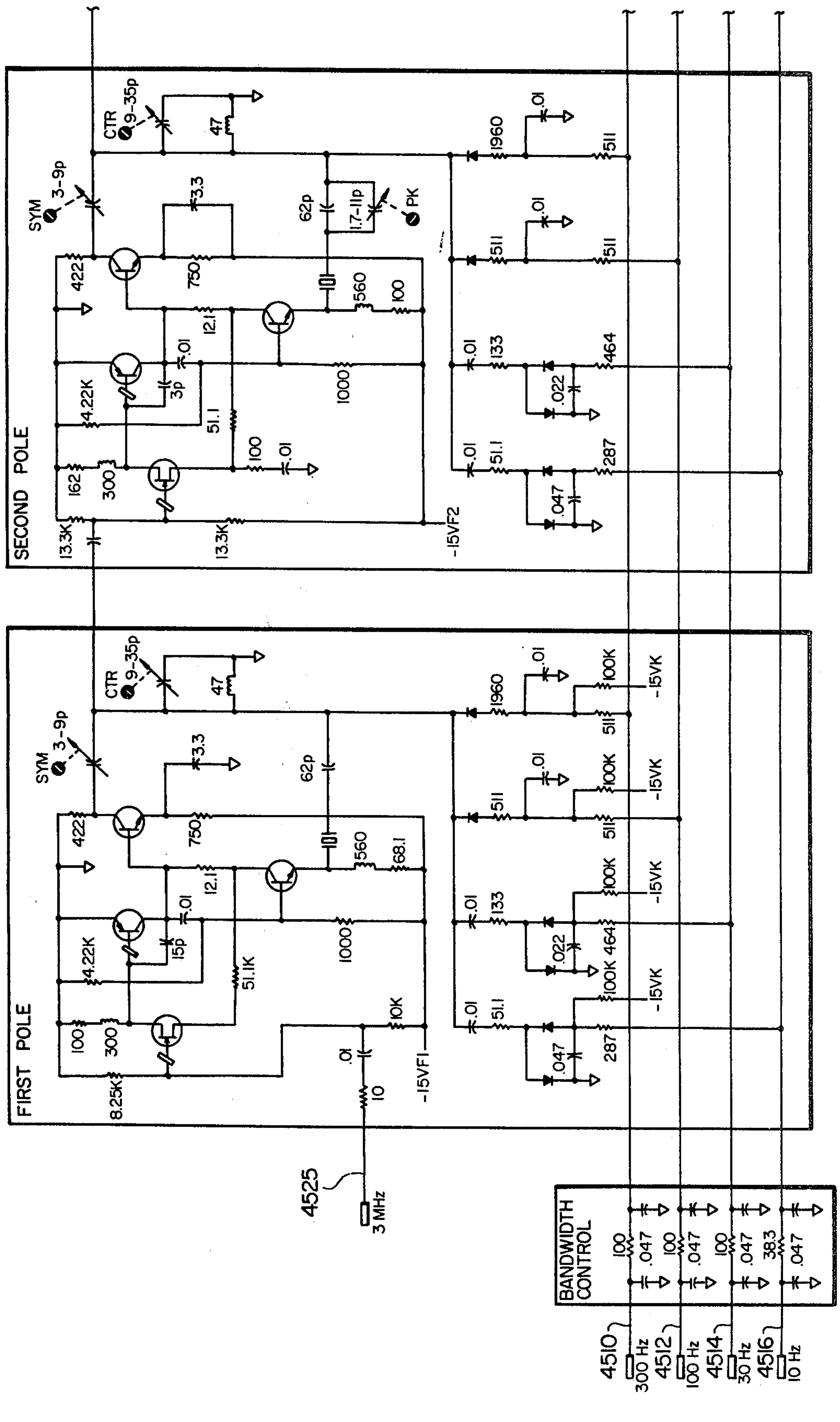

Referring to FIG. 1, there is shown a block diagram of the preferred embodiment. An input signal on line 102 is input to a mixer 104. The signal on line 102 is mixed with the output signals on line 106 from local oscillators 108 to produce intermediate frequency (IF) signals on line 105. These IF signals are then amplified and filtered by IF amplifiers 109. Local oscillators 108 are controlled by tuning control circuits 112 and scan control circuit 114. The output signals from IF amplifiers 109 are input to a detector 111 which generates a video signal on line 123. Under the control of video processor 125 and display controller 135, the output signal is digitized and stored in random access memory 140. The signal on line 115 from scanner 114 is used to determine the address where the digitized values are stored. Other data stored in memory 140 includes special trace constants, display annotations, the graticule, the display marker, and miscellaneous constants and values for other special functions.

The rate of acquisition of the data is controlled by the ramp time of the signal produced by scanner 114. Each ramp is logically divided into 1,000 intervals corresponding to the 1,000 addresses. Likewise, the display screen is divided into 1,000 steps from left to right, each address being one point on the display screen.

The display of the data occurs at a rate determined by display controller 135. Under control of the display controller 135, the data is read out of memory 140 to D to A converter 150 which provides an analog level to line generator 155 whose output is then coupled to the Y plates on CRT 175. At the same time that display controller 135 is reading the vertical data from memory 140, the horizontal corresponding to the address from which the data came is generated by D to A 160 and output to line generator 165 which is coupled to the X or horizontal plates of CRT 175.

Special display features and input data from front panel 210 are provided over a bus 190. This transfer of data from the front panel 210 to display controller 135 is under the control of the main control processor 250 which has its own ROM 251 and RAM 252 memories.

Activation of keys on front panel 210 which is shown more fully in FIGS. 2 and 63 are serviced by an interrupt type routine which interrogates the front panel to determine what operations have been selected. Once the operation which is selected has been determined, a microprogram corresponding to the operation selected and stored in ROM 251 is executed to perform that operation. Typically, this involves the transfer of data from the main processor to the display controller 135 which operates as a "slave" controller. Slave or display controller 135 then performs the necessary calculations or manipulation of data stored in memory 140 to change the display.

DESCRIPTION OF THE FRONT PANEL CONTROLS

Referring now to FIG. 2, there is shown the front panel controls of the preferred embodiment. Using the front panel controls shown, the user has convenient control over functions such as center frequency, frequency span, reference level, resolution bandwidth, and sweep time. For example, center frequency is controlled by a switch 260, frequency span is controlled by a switch 262, the start frequency is controlled by a switch 264, the stop frequency is controlled by a switch 266, and the reference level is controlled by a switch 268. Once a function is selected, its value can be changed by using the data control keys 314, 318, 310, and 300. For example, using data keyboard 300, one can enter an exact digital value. Using rotary control 310, one has continuous tuning capability. While using switches 314 and 318, one may change the value of the active function in steps. The changes in values and conditions which are input will also immediately cause the appropriate change in the displayed waveform on display 400.

Basically, the front panel controls are divided into two groups, i.e., function controls and data controls. The type of measurement of the signals input via channels 425 may be selected using the function controls. The data controls and the other miscellaneous functions provided add to the measurement efficiency, convenience and capability of the instrument.

To measure the frequency and amplitude of a signal input via input controls 425, the signal is first moved to the center of display 400 by pressing center frequency control 260 and then rotating rotary control 310 until the part of the signal waveform which is desired to be measured is centered in the display. When the signal is centered, the readout on display 400 will automatically display the signal frequency at positions 451 and 452 as shown in FIG. 3.

For better frequency resolution the frequency span of the display may be narrowed by pressing frequency span control 262 and then pressing step down control 314. The new span value would be displayed in position 453 as shown in FIG. 3. The signal peak would then be brought to the reference level by activating reference level switch 268, control 314 and then adjusting rotary control 310.

The most convenient place to start a new measurement is with a full 1500 MHz frequency span. This is most easily accomplished by pressing instrument preset control 230. This automatically presets all the analyzer functions to a 0 Hz to 1500 MHz display with a 0 dBm reference level. In this way, the entire 1500 MHz span possible with the preferred embodiment may be viewed to facilitate selection of the particular frequency range to investigate.

Signal frequencies and amplitudes as well as differences between various signals can be read out directly using the marker controls 380 and the various data controls described above. The marker is activated by pressing marker normal switch 381. The rotary control knob 310 is then used to position the marker 410 as shown in FIG. 4. The amplitude and frequency of the signal at the marker position are read out continuously at position 412. Therefore, as one moves the marker along the signal waveform by moving rotary control 310, the MHz and dBm displays are continuously updated.

Using this feature of the preferred embodiment it is possible to measure the differences between any two points on the displayed waveform. For example, if the marker was at position 410 and one measured the difference between the marker position 410 as shown in FIG. 4 and the next signal peak, 411, one would press marker control button 382 and use rotary control 310 to move the second marker to peak 411. The amplitude and frequency differences are then read out continuously in position 415 as shown in FIG. 5. More measurement techniques using the marker are discussed in more detail below.

The data controls are used to both enter and change function values for the selected function. Rotary control 310 and the data step keys 314 and 318 are used to make incremental changes to the value of the activated function. To the right of the function keys 390 is the data keyboard 300 which allows the stored value to be changed or an exact value input. Furthermore, these data controls change the activated function value in a manner which depends on the specific function selected and the current value of that function. For example, if the center frequency function has been selected by center frequency switch 260, the center frequency can be changed continuously with rotary control 310 or in steps proportional to the frequency span with the data step keys 314 and 318, or set exactly with the data number units keyboard 300. Resolution bandwidth can be set only to discrete values. An entry from the keyboard which may not coincide with an allowable bandwidth will select the nearest bandwidth. All data entries are displayed on the CRT as they are changed.

If it is desired to prevent data entry, the function can be deactivated by pressing hold switch 320. The active function readout is then blanked and the enabled light 321 goes out, indicating that no data entry can be made. The reenabling of the data controls is accomplished by pressing any function key.

Rotary data control 310 allows the continuous change of center frequency, frequency span, reference level, and the positions of the marker, display line and threshold. It can also change the function values which are only incremented. Clockwise rotation of the rotary control 310 will increase the functional value. For continuous changes, the sensitivity of rotary control 310 is determined by both the measurement range and the speed at which the knob is turned. For example, when the center frequency is activated, control knob 310 increases the value of the center frequency one horizontal division of span per one quarter turn.

Data step keys 314 and 318 allow rapid increase or decrease of the active function value. The step size is dependent either upon the analyzers measurements range, a preset amount, or, for those parameters with fixed values, the next value in a sequence. For example, if center frequency control 260 has been activated, step control 318 will increase the center frequency value by an amount equal to one division of the frequency span, i.e., 1/10 of the frequency span. If the center frequency step size has been preset using control 228, step control 318 will increase the center frequency by that preset amount. If the frequency span function was selected using control 262, step control 314 would change the span to the next lower value in predetermined sequence. If the center frequency is selected, each press of these step buttons results in a single step up or down of the center frequency value equal to the preselected value of 10% or to a preselected step value which has been stored using control 228.

The data keyboard 300 allows exact value entries to center frequency, frequency span, reference level, log scale and the positions of the markers, the display line, threshold and the coupled functions. Coupled functions are those in which selection of one parameter will automatically select certain values for other parameters. This operation occurs whenever machine is in the auto mode as selected by controls 210, 214, 218, 222 and 226. This function can be disabled by placing these controls in the manual position. Function control 268 changes the absolute amplitude level of the top graticule line. The amplitude scale, i.e., the number of amplitude units per division is entered from the scale control group 225. Signal responses below the top graticule are measured by bringing the response to the reference level by activating switch 268. The maximum reference level value available is dependent on the input attenuator setting. Levels to the input mixer which could cause gain compression will be displayed off the top of the reference level graticule. The maximum reference level limit can be extended by activating shift control switch 410 and attenuate control switch 223. The reference level can be changed from +30 dBm to −99.9 dBm in 0.1 dB steps. Reference level dBm units are selected by instrument preset control 230 or with key function shift control 410. Reference level units may be read in dBmV, dBuV and volts. Of course, when a unit change is made, all readouts are converted so as to preserve the absolute power levels of all the readouts on the display.

The display readout of frequency and amplitude can be offset by values entered through using shift control key 410. The offset values are read out on the display. An offset frequency is entered by pressing shift control key 410, center frequency key 260 and then inputting the desired value via the data entry controls. An amplitude offset is entered by pressing shift control key 410, reference level control 268, and then inputting the desired amplitude offset via the data entry controls, i.e., keyboard 300. The amplitude offset can be used to take into effect external R.F. attenuation or gain in the reference level reading so that the signal level measured is the level at the input of the amplitude conversion device which is interposed between the spectrum analyzer and the signal source. For example, frequency offsets can be input such that when the spectrum analyzer of the preferred embodiment is used following a down converter, the frequency parameters can be entered and read out in actual, i.e., high frequency values. In the reverse situation, when an external preamplifier is used, its gain or loss may be taken into account to display the true signal level of the signal of interest before the preamplifier stage. Frequency offset is entered by activating shift control 410 followed by center frequency 260, and then inputting the desired frequency offset via data entry controls 300, 310, 314 and 318. This frequency offset may be used, for example, to provide a base band frequency display scale for a signal which has been converted up or down. Amplitude offset is entered by activating shift key 410 followed by reference level control 268 and then inputting the desired amplitude offset via data keyboard 300, rotary control 310 and/or step control keys 314 and 318. This amplitude offset can be used to take into effect external R.F. attenuation or gain in the reference level reading so that the signal measurement corresponds to the level at the input of the amplitude conversion device.

To eliminate a frequency offset, one simply activates shift control 410, followed by center frequency control 260, and then inputs a data offset value of zero. Also, any frequency or amplitude offset can be eliminated by pressing instrument preset control 230. The frequency or amplitude offset is added to all the frequency or amplitude readouts, respectively, on the CRT display including the marker, the display line, threshold, and the start frequency and stop frequency values which are displayed.

Data entry from the keyboard may be in Hz, kHz, MHz or GHz for frequency and dBm, −dBm, mV and uV for amplitude. The amplitude offset readout is always in dB. An entry in voltage can be made and will be converted to dB offset. Least significant digits are rounded for frequency inputs and dropped for amplitude offset entries. An example of the display which is produced when a frequency or amplitude offset is used in the preferred embodiment is shown in FIG. 6. Note that the amplitude offset is displayed in position 610 while the frequency offset is displayed in positions 611 and 612.

For example, assume that a 102.6 MHz up converter with 12.7 dB attenuation is placed between a signal source and the preferred embodiment. The offsets can be set so that the CRT display shows the trace reference to the signal as input to the converter. Amplitude offset is entered as a positive value since the amplitude readout must represent a more powerful signal. To enter the offset value in this example, one would press shift control key 410, reference level control 268 and enter 12.7 on data entry keyboard 300 followed by +dBm units key 601. The offset is displayed in position 610 as shown in FIG. 7.

Frequency offset is entered as a negative, since the input to the converter is lower than the value displayed. To enter a frequency offset one would press shift control key 410, followed by hold key 320, followed by center frequency control 390, and then input 102.6 on data entry keyboard 300, followed by MHz units key 602. The frequency offset would be displayed in position 618 on the display and the new value for the center frequency would be displayed in position 619, as shown in FIG. 8.

Referring now to FIG. 9 there is shown the display of the preferred embodiment. The entire frequency span being analyzed is displayed across the horizontal width of the display, the start frequency occurring at the left-most edge 905 of the display while the stop frequency occurs at the right-most edge 907 of the display. The center frequency is represented by the center vertical line 911 in the middle of the display. Various function readouts are provided to help interpret the waveform 915 which is being displayed. For example, the reference level is displayed in position 917. Marker frequency and amplitude are displayed in position 922 whenever a marker option is selected. Sweep time is displayed in position 925. The start frequency or the center frequency are displayed in position 927, depending upon which function is active, while the stop frequency or frequency span is displayed in position 929, depending upon which function has been selected.

There is also an active function readout for the function which is under current data control. In FIG. 9, the start frequency has been selected to be changed via keyboard 300, rotary control 310 or step control buttons 314 and 318. Therefore, the word start is displayed in position 931. The start frequency was selected by start frequency control switch 264. Similarly, if the center frequency control 260, reference level control 268, stop frequency 266 or frequency span 262 were selected, the display would so indicate in position 931. If the marker functions 380 were selected, the marker frequency and amplitude would be displayed in this position. This display of the frequency and/or amplitude will change dynamically with the manipulation of the data controls.

The full scale sweep speed is indicated in position 925. The video bandwidth is displayed in position 935. The resolution bandwidth is displayed in position 936. The RF attenuation is displayed in position 940 while if the measurement is uncalibrated, this will be indicated in position 945. The threshold level is displayed in position 950, while the display line parameters are displayed in position 951 and the amplitude offset value is displayed in position 952. It should be noted that the displayed parameters shown in FIG. 9 are not necessarily always displayed together. For example, the measurement uncalibrated message shown in position 945 would only be present if the measurement were uncalibrated. Furthermore, the active function and value in position 931 would depend upon the function selected by the function control keys 390.

Display Traces

Three separate traces referred to as Trace A, Trace B and Trace C can be written onto the display. Each trace is generated from 1,001 points across the graticule, connected by 1,000 point-to-point straight line vectors. The location of each point is designated by an X and a Y location using the graticule as a system of rectangular coordinates. This may be more clearly shown in FIG. 10. In addition, a trace overrange area which is also calibrated is provided which comprises an additional 23 display units above the top reference level graticule.

Trace controls 1,000 as shown in FIG. 2, may be used for controlling the writing, storing and manipulating of trace data. The three different traces are differentiated by their intensity. Trace A is bright, while Trace B and Trace C are comparatively dimmer. However, when there is any doubt, the specific trace can be isolated using view control 1010, blank control 1011, view control 1012 and blank control 1013.

Four mutually exclusive trace modes for Traces A and B determine the manner in which the traces are displayed. Indicator lights such as indicator 1003 indicate the current trace mode. Clear-Write control 1001 causes the display of the input signal response in Trace A. Max hold control 1002 causes the display and holding of the maximum responses of the input signal in Trace A. Both these controls are referred to as write mode controls, since they deal with the trace during a sweeping operation.

Store mode controls such as view control 1010 and blank control 1011 act on the trace information when the preferred embodiment is not in the sweeping mode. The view controls such as view control 1010 causes the storing of the current trace information in memory and displays it on the CRT. The blank controls such as blank control 1011 causes the storing of the current trace information and blanks it from the CRT display. An illustration of the display when all three traces are present is shown in FIG. 11.

Trace Memory

Display traces are not written onto the display directly from the spectrum analyzers IF section. Instead, the analog signal response from the IF section is converted into digital words and stored in a trace memory. The contents of these trace memories is then used to create the display on the CRT display. The way in which this information in the trace memories is displayed depends upon the trace mode selected by trace controls 1,000. A block diagram showing these steps is shown in FIG. 12. The analyzers response is transferred into the trace memories at the sweep rate of the analyzer, i.e., its sweep time. The trace memory is then written onto the display at a refresh rate of about 50 Hz, rapid enough to prevent flickering of the trace on the CRT display. This refresh rate remains constant and therefore, the trace intensities also remain constant, regardless of how the sweep times of the spectrum analyzer are changed. Note that in the specification the word sweep refers to the spectrum analyzer sweeping from a start frequency to a stop frequency while the term refresh refers to the transfer of display memory data to the display.

For the write modes, those selected using the clear write and max hold controls 1001, 1002, 1008 and 1009, the analyzer signal response is written into trace memory during the sweep and the memory contents are then immediately displayed on the CRT. When first activated, the clear write controls of the 1001 and 1008 sets all the values in their respective trace memory to zero, i.e., the trace will sweep along the bottom line graticule if no data is input to the memory. The max hold controls 1002 and 1009 cause the latest analyzer signal response to be written into its respective trace memory only at those data words that correspond to the horizontal positions where the latest signal response is greater than the previously stored signal response values. When both clear write controls 1001 and 1008 are activated, the preferred embodiment will sweep and alternately write into trace memories A and B. Using the store mode controls 1010, 1011, 1012 and 1013, the previous memory data is saved, and no updating of the trace memory is made. The view controls 1010 and 1012 cause the trace data stored in their respective memories to be displayed on the CRT. Blank controls 1011 and 1013 cause the trace data not to be displayed on the CRT.

Marker

There are two basic types of functions which are possible using the marker. Marker modes under the control of controls 381, 382, 383, 384, 385 and 386 are used to enable or disable the markers and their related functions. Marker entry controls 387, 388, 389 and 379 are used to allow the scaling of the display frequency and amplitude using the marker information.

The term markers is used in the preferred embodiment to refer to bright spots which are created directly on the display trace. The horizontal position of an activated marker is controlled by the data controls, i.e., keyboard 300, rotary control 310 and step keys 314 and 318. Using these controls, the marker can be positioned at a specific frequency with the data keyboard moved along the trace using rotary control 310 or caused to move along the trace in predetermined intervals using the step control keys 314 and 318. The readout of the marker amplitude and frequency, i.e., the amplitude and frequency of the trace where the marker is currently located, appears in the upper right of the display outside the graticule. This is as shown in FIG. 13 in position 1301.

When a marker mode is active through the use of controls 381, 382, 383, 384 and 385, the amplitude and frequency will also be displayed in the active function area of the graticule, that is, position 931.

Briefly, the marker controls operate as follows: Control 386 is used to turn the marker function on and off. Normal control 381 causes the direct readout of the amplitude and frequency of the point where the marker is along the trace. To cause the direct readout of the amplitude and frequency differences between two points on the trace, one activates control 382. The present position of the marker on the trace when this control is activated then becomes the reference point for subsequent measurements as the marker is moved along the trace.

An activated marker mode can be deactivated by activating another function such as display line or by data hold control 320. This does not erase the marker itself, nor does it suspend the upper right display readout features. When the marker mode is reactivated, the data controls and active function readouts will simply continue from their last position.

Normal control 381 activates a single marker at the center of the display on the trace of highest priority if multiple traces are being displayed. Trace priority is defined in greater detail below. Once the marker is displayed on the trace, it may be moved along the trace by using the data entry controls 310, 314, 318 and the data entry keyboard 300. Rotation of rotary control 310 moves the marker continuously along the displayed trace at about five horizontal divisions for each full turn. The marker appears to move smoothly along the trace, but it is actually moving in the smallest display unit increments which in the preferred embodiment are 1,000 units for the full horizontal span. Step controls 314 and 318 move the marker along the trace one-tenth of the total width per step. In the preferred embodiment, step control 314 moves the marker to the left while step control 318 moves the marker to the right. For exact positioning of the marker, values entered via keyboard 300 will cause the marker to be placed at the frequency entered. If one enters a frequency which is out of range of the displayed span, the marker will be placed at the graticule edge.

The marker greatly simplifies reading the frequencies and amplitudes of displayed signals. This is explained with respect to FIGS. 14A and 14B. For a given display, the single marker is activated by pressing normal control 381. This causes the frequency and amplitude information to be read out in display areas 1402 and 1403. Assume, for example, that one was interested in determining the frequency and amplitude of the signal peaks 1404 and 1405. To read the frequency and amplitude values at peak 1405, one would move rotary control 310 to move the marker along the waveform until it was positioned at signal peak 1405 as shown in FIG. 14A. To read the information for signal peak 1404, one would move the rotary control 310 counter-clockwise until the marker 1400 was positioned at peak 1404 on waveform 1410. The frequency and amplitude information is read out continuously as the marker is moved. Therefore, as the marker is moved towards the peak, one can be sure when the peak is reached because it will be the highest amplitude displayed in display areas 1402 and 1403. As one moves the marker to either side of the peak of the signal waveform of interest, the amplitude reading would decrease. Thus, exact positioning of the marker is possible.

The differential marker technique using control 382 may be used to measure differences in frequency and amplitude between two points on the signal waveform. Activating control 382 causes a second marker to be generated at the position of the single marker already on the trace. If no single marker has been activated, control 382 will cause two markers to be generated at the center of the display. The first markers position is fixed. The second markers position, however, may be changed using the data controls 310, 314, 318 and keyboard 300. As the second marker is moved along the waveform, the first marker now stationary is used as a reference point. As the second marker is moved along the trace, the difference in frequency and amplitude between that markers position and the reference marker will be displayed in positions 1402 and 1403. An example showing the use of this differential marker technique is shown with respect to FIGS. 15A and 15B.

Referring now to FIG. 15A, assume that one is interested in determining the frequency and amplitude differential between the signal peak 1502 and the signal peak 1503. First, the marker would be set on one of the signal peaks, e.g., signal peak 1502 as shown, by using rotary control 310. Control 382 would then be activated to generate a second marker at this position.

Rotary control 310 would then be moved in the clockwise direction to move the second marker to peak 1503. The differences in the frequency and amplitude at the two signal peaks will then be read directly on the marker display in position 1402. In the example shown in FIG. 15B, the frequency difference is 7.67 MHz and −34.60 dB. As the marker is moved, the display in position 1402 changes dynamically. In this way, one can be sure that one is positioned at the very peak of the signal waveform at point 1503, since it will be the smallest differential displayed as one crosses the peak at point 1503.

Marker Zoom

Control 383 activates a single marker on the trace of highest priority. When the zoom mode is selected by control 383, rotary control 310 and step control keys 314 and 318 change the values of different functions. Rotary control 310 is used to position the marker along the signal waveform. Step controls 314 and 318, however, change the frequency span displayed by the spectrum analyzer and cause the frequency at the current marker position to become the new center frequency for the display. Thus, one moves the marker along the trace with rotary control 310 until a portion of the display is reached which is desired to be the new center frequency. Also, one may press zoom control 383 and then enter in an exact frequency via data keyboard 300. This will cause the marker to be positioned at that exact frequency on the display waveform. If that frequency is not on the display waveform, then the marker will be positioned at the graticule border.

For example, in wide frequency spans, it is often necessary to expand a portion of the frequency span about a specific signal in order to resolve questions regarding modulation sidebands or frequency drift. The use of the marker zoom feature to facilitate the display of the desired waveform and the desired frequency span is shown below with reference to FIGS. 16A, 16B, 16C, 16D and 16E.

Referring now to FIG. 16A there is shown a full span display from zero Hz to 1500 MHz. A specific signal of interest is selected by activating zoom control 383 and using rotary control 310 to position the marker at a waveform peak 1601. To center the marker and the signal peak in the display and also expand the frequency span in one step, one would simply press step control 314 to achieve the display shown in FIG. 16B. For further expansion of the display about this signal, one could simply press step control 314 twice more to achieve the display shown in FIG. 16C. The marker could then be more accurately positioned at the signal peak using rotary control 310 to achieve the display shown in FIG. 16D. This recentering and expanding can be continued until the desired display is achieved. For example, one could continue expanding the display using step control 314 and recentering the marker using rotary control 310 until the display as shown in FIG. 16E was achieved. Note that the frequency span in FIG. 16E is from 257.39 MHz to 262.39 MHz with a center frequency at 259.890 MHz. As with the other marker functions, the marker mode may be disabled using control 386 which will also cause the marker readout to be blanked from the CRT display.

Automatic Zoom

The preferred embodiment can automatically zoom in on a signal peak specified by a marker. The desired frequency span can be directly input via keyboard 300. To use this automatic zoom function of the preferred embodiment, one would press normal marker control 381 and position rotary control 310 to identify the signal to be zoomed in upon. Then one would press signal track control 385 followed by span control 262 and then the desired frequency span would be entered via data keyboard 300. When the selected units key, e.g., key 601, 602, 603 or 604, is activated, the zooming process will begin.

Referring now to FIG. 17A and 17B, there is shown an example using the zooming process. Assume that a single carrier needs to be examined in a 200 KHz span in order to see the side bands present. A marker would be placed on the carrier of interest by pressing normal control 381 and positioning the marker using rotary control 310. One would then press signal track control 385 followed by frequency span control 262. The value of the desired frequency span would be entered via keyboard 300 by pressing digit keys 2,0,0, and the units key for KHz. The auto zoom process would then be completed and a display as shown in FIG. 17B would be displayed.

Peak Search

Activation of peak search control 387 places a single marker at the highest trace position of the highest priority trace. The active function is not changed. Using this control, one may place the marker at the peak of the signal response without using any of the other controls. The marker seeks the maximum trace response.

Marker Entry

Marker to center frequency control 388, marker to reference level control 379 and marker delta control 389 are used to immediately set the corresponding function value equal to the readout of the active marker or markers. When one presses control 388, the frequency at the current position of the marker automatically becomes the center frequency. Similarly pressing marker to reference level control 379 causes the amplitude at the current marker position to become the reference level value. Also, one may use the marker delta control 382 to place a second marker on the screen. Thereafter, control 389 may be used to cause the step size affected by step control 314 and 318 to be equal to the difference between the two marker positions.

One of the fastest and most convenient ways to bring a signal of interest to the center of the display as the center frequency is by using control 388. One simply activates a single marker by, e.g., control 381 and brings it to the desired signal using rotary control 310 or peak search control 387 if it is the largest signal displayed. The signal frequency where the marker is positioned may then become the center frequency by simply pressing control 388. The display before and after pressing of control 388 is shown with reference to FIGS. 18A and 18B, respectively. A single marker is activated and brought to the desired signal point by pressing control 381 to activate a single marker and then using rotary control 310 to bring it to the desired signal point, for example, as shown in FIG. 18A. Note that if this signal point is also the highest trace position on the highest priority trace, peak search control 387 may be used to place the marker at this position. Once a marker is positioned, the center frequency may be changed to the marker frequency by simply pressing control 388.

Control 388 may also be used to change the center frequency if start and stop frequencies are read out. In this way, the markers may be used to tune to a particular portion of a spectrum being displayed. This is shown with respect to FIGS. 19A, 19B, and 19C. A single marker is activated and placed at either end of the desired frequency span using control 381 and rotary control 310. For example, at point 1901 as shown in FIG. 19A, a second marker is activated using control 382 and positioned using rotary control 310. The start and stop frequencies for the displayed frequency span may then be set equal to the left and right marker frequencies, respectively, by shift control key 410 followed by control 382. The frequency difference between the two marker positions then automatically becomes the frequency span for the display.

The data step keys 314 and 318 can also be used to move the center frequency in increments equal to the marker or marker differential frequency. This is illustrated with respect to FIGS. 19C, 19D and 19E wherein there is shown a technique for viewing a fundamental and its harmonics or any other evenly spaced portion of the spectrum with high resolution. First, one would narrow the frequency span displayed about the fundamental frequency of interest as necessary using zoom control 383 as described above, centering the carrier frequency as needed. One then sets the center frequency step size by positioning the markers and pressing control 389. The center frequency is now enabled by pressing control 390. Therefore, with each press of step control key 318, successive harmonics will be displayed. For example, as shown in FIGS. 19D and 19E, the first activation of step control key 318 would show the second harmonic, the next press of step control key 318 would give the third harmonic, and so on. Similar stepping can be accomplished using the marker controls 382 and 389 and step control keys 314 and 318 to locate intermodulation products or other evenly spaced signals such as communication channels.

Signal Tracking Using Automatic Frequency Control

The preferred embodiment is capable of automatically maintaining a drifting signal at the center of the display. This allows narrow band measurements to be made on unlocked oscillators by having the spectrum analyzer track the input signal and allows other measurements which were heretofore extremely difficult.

To operate the signal tracking feature of the preferred embodiment, one would press normal control 381 and place the marker on the signal to be tracked with rotary control 310. Signal track control 385 is then pressed to initiate the tracking operation. As the signal drifts, the center frequency will automatically change to bring the signal and the marker to the center of the display. Marker off control 386 or activation of any other marker mode or instrument preset control 230 will disable the tracking function.

As an example of the use of this feature, there is shown in FIG. 19F a signal of interest. The upper sideband of the transmitter is to be monitored as the carrier frequency is tuned. Therefore, the marker is activated using normal control 381 and positioned using rotary control 310 at the peak of the upper sideband signal 2105. Once signal track control 385 is pressed, the upper carrier sideband 2105 is tracked and may be "zoomed" in to produce the display of FIG. 19G by pressing frequency span control 262 followed by digit keys 1 and 0 and units KHz key 603. As the carrier frequency changes, the sideband response will remain in the center of the display. The center frequency and marker frequency readouts on the display in positions 2120 and 2130, respectively, will read out the sideband's frequency. Therefore, a combination of the features of the preferred embodiment activated by a signal track control 385 and marker control 382 allows the real time signal frequency drift to be read on the display.

Detailed Block Diagram

The detailed circuitry of the preferred embodiment will now be discussed in more detail. Referring first to FIGS. 20A and 20B, there is shown a detailed block diagram of the preferred embodiment. FIG. 20A is primarily a block diagram of the RF section, while FIG. 20B is primarily a block diagram of the IF and display section of the preferred embodiment. Much of the interaction of the circuitry of the preferred embodiment is controlled by a processor 2015 which is described later in more detail. This processor operates under the control of microprograms which are stored in a memory 2014. Operator commands are input via the front panel 2020. The signal to be analyzed is input on line 425 through the front panel controls to the RF converter 2023. There it is converted using the 20 MHz reference signal provided on line 2017 from 20 MHz reference 2016 or from the frequency control unit 2022. Signal thus produced is thereafter processed by If amplifiers 2019 or 2009 and converters 2020 and 2010. Pilot third local oscillator 2007 produces the precise frequency in the range 238.5 MHz to 259.5 MHz that will allow the preferred embodiment to be tuned to frequencies between the 20 MHz reference combs. This processing results in the providing of a signal on line 2040 to the IF and display sections for further processing and an IF counter output signal on line 2042 as well as sweep signals on line 2044 and 2046 to the video processor 2060 and the track and hold circuitry 2065. Various filters and converters in the circuit 2050 act with IF control 2055, data manipulator and memory control 2058 to cause the digital representations of the sampled signal to be stored in memory 2070. Data manipulator and control circuit 2058 along with trigger circuitry 2072 determine the sweep rate and the trigger level. Representations of the analyzed signal are then displayed on cathode ray tube 2078.

Each one of these circuits shown in FIGS. 20A and 20B is described in more detail with respect to the detailed schematic diagrams and the description below. The numbers in each block refer to the detailed schematic diagrams for the circuitry used in the preferred embodiment to perform the functions of that block.

Referring now to FIGS. 21A, 21B and 21C, there is shown the circuitry of the front panel of the preferred embodiment. In this schematic, various front panel push-button keys, switches, and indicator LEDs as well as the input terminals 425 for the signal to be analyzed are shown. Other swtich circuitry is shown in FIG. 63. The input select circuit 2102 includes two push-button switches, each with an LED in its center, i.e., switches 2104 and 2105. When switch 2105 is energized, input relay 2110 selects the input through the DC input connector 2112 for frequencies from 100 Hz to 1.5 GHz. Activation of switch 2104 selects the input through the blocking capacitor 2111 for frequencies from 100 KHz to 1.5 GHz.

Referring now to FIGS. 22A, 22B, 22C and 22D, there is shown the interface circuitry for the RF section to the processor 2015 shown in FIG. 20A and to the front panel controls. The keyboard is organized as a matrix of rows and columns of normally open single pole, single throw switches. This keyboard matrix 2210 includes drivers 2212 and 2214 for driving the rows of the matrix while drivers 2206 and 2208 gate the columns of the matrix onto the data bus. The processor determines which key has been activated by selectively polling the rows and columns through drivers 2206, 2208, 2212 and 2214 and causing them to be selectively read onto the data bus 2200.

The fact that a key has been pressed is determined by gate 2215. The circuit which includes transistor 2216 is used to de-bounce the key switch circuitry. Flip-flop 2213 latches when a key is pressed and is cleared later by the processor.

The instrument preset key generates the signal on line 2220 which presets various circuitry in the preferred embodiment. Also, the instrument preset signal on line 2220 causes the main processor to restart program execution at memory address 32. Service request circuitry 2230 encodes the various requests for service made by the Front Panel circuitry to the main processor 2015. For example, a signal on line 2231 is generated whenever the keyboard requires servicing, i.e., a key has been depressed. Similarly, the rotary pulse generator generates a request by providing a signal on line 2232. These requests are encoded by encoder 2236 and gated onto the data bus 2200 via gates 2238. Gates 2245A, 2245B, 2245C, 2245D detect any change in the signals HINT and LRMT on lines 2247 and 2248. Flip-flop 2249 is latched in response to detection of a change in their state. Transistor 2251 pulls the signal HSWP on line 2252 low whenever a request is pending. Whenever the signal HSWP drops to a low level, the flip-flop 2254 will be latched. Gates 2238 gate the encoded request onto data bus 2200. Gates 2238 also gate LHBZ, LZBZ and HINT onto the bus.

Rotary pulse generator circuit 2259 receives signals RPG1 and RPG2 on lines 2261 and 2262. From these two signals, the RPG circuit 2259 determines whether it should increment or decrement and the rate at which the incrementing or decrementing is to be done. For further description of this type of circuitry, refer to U.S. Pat. No. 4,016,432 issued on Apr. 5, 1977 to Michael S. Marzalek and entitled "Variable Rate Rotary Pulse Generator". The rotary pulse generator is coupled to the rotary control 310 on the front panel as shown in FIG. 2. Note that circuit 2263 provides a hold-off of about 70 milliseconds which prevents flip-flop 2265 from requesting a service request due to the rotation of rotary control 310 for that time period. This gives the preferred embodiment time to respond to the last service request from the rotary pulse generator and to continue or finish a sweep before the next request occurs. This enables the operator to have received visual feedback from the last manipulation of rotary control 310 before another input is acted upon.

Referring now to FIG. 22D, address decoder circuit 2285 decodes the address lines and enables the appropriate circuits to gate or store data onto data bus 2200. In FIG. 22C, phase-lock flag circuit 2280 provides signals or "flags" which indicate the presence or absence of certain preselected conditions in the preferred embodiment. The states of these flags are stored in register 2282 and may be read out onto data bus 2200 when desired through the enabling of the appropriate address decoder signal on a line 2283. Front panel LED drive circuit 2268 latches the state of the front panel LEDs (light emitting diodes) and sinks the current to light them. The signal LIPS clears these registers and causes the lighting of the LEDs anytime the instrument preset key 230 is pressed. RF attenuator drive circuit 2270 comprises register 2271 which latches the state of the RF attenuator at the input relay. Transistors 2272 and 2273 drive the input relay while transistors 2274A-E drive the RF attenuator. The bridge rectifiers 2275A, 2275B and 2275C act as transient suppressors for the RF attenuator solenoids.

Referring now to FIG. 23, there is shown the 20 MHz reference circuit of the preferred embodiment. A 10 MHz signal from a frequency standard is input via line 2302 and processed to provide 20 MHz reference signals to the front panel, the YIG-tuned oscillator phase-lock shown in FIG. 26, the 249 MHz phase-lock shown in FIG. 37, and the comb generator shown in FIG. 27A. During internal time base operation of the instrument, a 10 MHz signal is applied to doubler 2310 from time base circuit 2081. This signal is split by the resistor network 2311. Power is applied to the clock generator circuit 2320 and to the doubler buffer amplifier 2313. The 10 MHz signal input to the doubler is amplified by buffer 2313 and used to drive transistor amplifier 2315 through the impedance matching network comprising capacitor 2314 and inductor 2317. The output pulse produced from transitor 2315 is coupled into the 20 MHz resonator transformer 2316 and capacitor 2318 to produce the 20 MHz output signal on line 2319. The time base signal input on line 2302 is input to the clock generator circuit 2320 which provides a processor clock signal on line 2322 and a counter clock signal on line 2324.

The signal on line 2319 is input to crystal filter circuitry 2330 where it drives the emitter-follower circuit comprising transistor 2332 which in turn provides a low output impedance driver for the crystal filter. Center frequency adjustment 2334 is available to vary the center frequency of the filter. The filtered signal is amplified by the amplifier circuit comprising transistor 2335. Inductor 2336 and capacitor 2337 are used to match the impedance of PIN diode 2338. The current through the PIN diode 2338 sets the attenuation for the desired comb drive level for use in the comb generator circuitry described with respect to FIG. 27A.

A small amount of the comb drive signal is used by AGC amplifier circuitry 2340 to compare the drive level to a reference set by a comb drive adjustment 2342. Op amp 2345 compares the drive level on line 2346 to the reference level set via control 2342. The output from op amplifier 2345 is then set to bias PIN diode 2338 for a value of attenuation that will cause the rectified drive voltage to equal the reference voltage.

Indicator driver circuit 2360 compares the rectified drive voltage received via line 2368 with a fixed voltage. If the drive drops too low, op amp 2365 will turn on the NO REF LED.

Buffer amplifier circuit 2350 receives a small amount of 20 MHz comb drive signal via line 2351. This circuit provides a 20 MHz, minus 15 dBm reference signal to the YIG-tuned oscillator phase lock circuit described with respect to FIG. 26 and a 20 MHz minus 10 dBm signal to the 249 MHz phase lock described with respect to FIG. 33. Also supplied is drive for calibrator circuit 2370.

The 20 MHz reference signal received from buffer amplifier 2350 is amplified by an emitter coupled pair 2371. This signal is clipped by the emitter coupled pair 2372 to set a precise level. The output then goes through a low pass filter 2376 to reduce the harmonic content.

Referring now to FIG. 24A and FIG. 24B, there is shown the frequency control circuitry of the preferred embodiment. This circuitry provides the tuning voltage to the 50 MHz voltage tuned oscillator (VTO) described with respect to FIG. 35, current to the YIG-tuned oscillator (YTO) described with respect to FIG. 26, sweep to the selected oscillator, and bias to the YTO. It also provides latching of data for the RF converter which is described with respect to FIG. 25 as well as latching of data for the above mentioned oscillators. It also indicates to the RF interface circuitry shown in FIG. 23 when there is an over range of the phase lock voltage and it supplies a frequency analog voltage to the third converter described with respect to FIG. 29.

The sweep generator circuit 2410, the sweep reference voltage circuit 2420, and the sweep generator current source 2430 provide the sweep signal for the VTO, shown in FIG. 35, and YTO, shown in FIG. 26. This circuit also provides the horizontal display signal for the IF section.

The processor may stop the sweep at any time via signal HSWP on a line 2441. The timing capacitor 2412 receives a constant drive from transistor 2411 to provide the ramp for the sweeping frequency. The base emitter voltage of transistor 2411 sets the current. This voltage is determined by sweep generator current source circuit 2430 and by the output operational amplifier 2422 in the sweep refereence voltage circuit 2420. "Fast" potentiometer 2414 and "slow" potentiometer 2413 are provided to adjust sweep times to fit the particular characteristic curve of transistor 2411. Transistor 2415 acts as a buffer between transistor 2411 and sweep timing capacitor 2412 and also enables the sweep to be stopped by the sweep stop switch circuitry 2240 whenever the signal on line 2441 is low. The remainder of the sweep generator circuitry 2410 provides amplification to provide a useable sweep voltage. In the preferred embodiment, the sweep voltage on lines 2417 and 2418 varies between 0 and 10 volts. Sweep reference voltage circuitry 2420 basically provides temperature compensation of the sweep reference voltage.

Sweep generator current source 2430 comprises transistors 2433A, 2433B, 2433C, 2433D, 2433E and 2433F. These transistors are current switches which are controlled by register 2432. Register 2432 is loaded with a data word from I/O bus 2200 under control of address 5 signal on command bus 2299. The transistors switch resistors to provide appropriate current paths for the selected sweep times. Transistor 2434 is used for temperature compensation and causes a linear increase in the base emitter voltage of transistor 2411 in sweep generator 2410, causing an exponential increase in sweep time. In the preferred embodiment, when all six transistor switches 2433A-F are saturated, a 10 millisecond sweep will result; if transistor 2433A is off a times 10 multiplier is added causing a 100 millisecond sweep. Other multipliers are indicated on the schematic diagram.

The stopping of the sweep is accomplished by circuit 2440. The signal HSWP on line 2441 causes transistor 2445 to divert charging current from timing capacitor 2412 to ground thus stopping the sweep. An LED indicator 2447 is provided to provide an indication that the sweep has been stopped.

Decoder 2451 decodes the signals on address bus 2299 and provides the decoded address bus signals on line 2298. Decoded signals used to control circuitry elsewhere in the preferred embodiment are output by decoder 2253.

Referring now to FIGS. 24B and 24C, sweep attenuator circuit 2460 receives the sweep signal on line 2419 from sweep generator 2410 and provides an attenuated sweep signal on line 2461. D/A converter 2462 is a multiplying digital to analog converter whose input signal sweeps plus and minus five volts while the output signal which is buffered by op amp 2464 sweeps plus or minus five volts times N/1023 where N is the binary number input via lines 2463.

Various sweep options are selected by sweep select switches 2465 while reference voltages are provided by reference voltage circuits 2468.

Digital to analog converter circuits 2470 provide the VTO tune signal on line 2473 in response to the digital words received on data bus 2200. The digital words received from data bus 2200 are latched into registers 2474, 2476, 2477 and 2478. Circuits 2479A and 2479B are ten-bit multiplying digital to analog converters, similar to those manufactured by Analog Devices, Inc., and others.

The tuning signal provided on line 2478 is used to tune the VTO shown as block 2007 in FIG. 20A and described in more detail with respect to FIG. 35.

In a similar manner, circuits 2481, 2482, 2483, 2484, 2485 and 2486 provide control currents and bias voltages to the YIG-tuned oscillator (YTO). Tuning digital to analog converter 2481 receives digital words from data bus 2200 under control of address 3 on decoded address bus 2298. Circuit 2481 comprises a ten-bit digital to analog converter 2481C which responds to the data stored in latches 2481A and 2481B. YTO tuning signal is generated on a line 2481D and input to the YTO main coil tune driver circuit 2482 which sums the YTO tune signal with the sweep signal on line 2466.

The YIG-tuned oscillator is phase-locked to a reference voltage from the 20 MHz reference source 2016 shown in FIG. 20A by the phase lock circuitry shown in FIG. 26. The relationship of the YTO, the YTO phase lock circuitry and various other portions of the preferred embodiment is shown in the block diagram of FIG. 25.

Referring to FIGS. 26A and 26B, the phase lock circuitry phase locks the YTO to the 20 MHz reference voltage received from the circuitry shown in FIG. 23. A lock indication is provided and a filtered output of the pilot third IF amplifier circuit is routed to the frequency counter shown in FIG. 36. For wide sweeps, a sample/hold circuit retains the output voltage. 20 MHz reference amplifier 2605 receives the 20 MHz reference signal and provides such functions as impedance matching as well as setting the current and voltage levels necessary for the operation of phase frequency detector 2620.

Phase frequency detector 2620 is a dual D flip-flop 4-$\pi$-radian type detector consisting of D flip-flops 2621 and 2622. In the preferred embodiment, these are ECL flip-flops similar to 10131P manufactured by Motorola and others. If the signals at PIN 6 and 11 are in phase, outputs at PINS 2 and 14 will cancel when summed. If the signals are out of phase, outputs at PINS 2 and 14 will sum to an offset. When both flip-flops become set with active high (Q) outputs being at a logic high, gate 2623 will reset both flip-flop 2621 and flip-flop 2622. Note also that a low logic signal on line 2627 disables the phase frequency detector 2620.

Loop amplifier 2630 is configured as an integrator. Loop filter sample and hold circuit 2635 can be switched to several configurations, i.e., 10 KHz break point, loop grounded, or sample and hold.

Phase lock indicator 2640 circuit senses flip-flops 2621 and 2622 of phase frequency detectors 2620 and provides the signal HUL1 on a line 2641 which indicates an unlocked YTO phase lock loop when in the high logic state.

Referring now to FIGS. 27A and 27B, there is shown the RF converter circuitry of the preferred embodiment. The RF converter circuitry has two conversion paths. In the first, the signal from the front panel is input via a line 2704 to first converter circuit 2705. The output is filtered, converted by converter 2760 and output via line 2763 to the IF amplifier shown in FIG. 28.

The second conversion path starts with the comb generator 2720. The comb generator takes the 20 MHz signal received from the 20 MHz reference 2016 which is shown in FIG. 23 and forms a pulse containing the harmonics of 20 MHz. This pilot signal provided on a line 2723 is input to pilot first converter 2730 which mixes power from circuit 2710 with the pilot signal. The output is filtered down, converted by down converter 2760 and sent to the second IF amplifier shown in FIG. 30.

The first LO distribution circuit 2710 takes power from YIG oscillator 2703 and splits and amplifies it for input to first converter circuit 2705 and pilot first converter 2730. The net result is that the IF signals on line 2763 and 2767 are provided to the second IF amplifier 2019 which is shown in greater detail in FIG. 28 and to pilot second IF amplifier 2009 which is shown in more detail in FIG. 30.

Referring now to FIG. 28, there is shown a second IF amplifier which receives the IF signal from the second converter shown in FIG. 27 which is processed through low pass filter 2805 which has a cutoff of about 500 MHz and filters out the LO frequency and harmonics from the RF converter. It is then amplified by amplifier 2810 which is a common emitter amplifier circuit with approximately 19 dB gain. The signal is then input to band pass filter 2815 which rejects the image frequency from the second converter. The 3 dB bandwidth of the filter is about 9 MHz.

The signal thus produced is input to the third converter circuitry 2020 shown in FIG. 29 where it is input to balance mixer 2910 and mixed with the signal provided by oscillator 2950 and amplified by amplifier 2940. The output from the mixer is then input to variable gain amplifier 2915. The output of oscillator 2950 is also input to buffer amplifier 2930 which provides the signal on line 2932 to the 275 MHz mixer described with respect to FIG. 32.

Referring now to FIG. 30, there is shown the pilot second IF amplifier which receives the signal on line 2767 from the second converter circuit shown in FIG. 27. This signal is processed by low pass filter 3010 which has a cutoff of approximately 500 MHz. It is amplified by common emitter amplifier 3015 which has a gain of approximately 19 dB and is then processed by band pass filter 3020 which has a 3 dB bandwidth of approximately 23 MHz. The filtered amplified signal thus obtained is output on line 3040 to the circuitry shown in FIG. 31. In the circuitry shown in FIG. 31, this signal on line 3040 is mixed by mixer 3110 with the signal received on line 3045 from the phase lock oscillator shown in FIG. 33. This signal thus produced is then amplified and filtered and provided to the YIG tuned oscillator phase lock circuitry shown in FIG. 26 via line 3150.

Referring now to FIGS. 32A and 32B, there is shown the 275 MHz phase lock circuitry of the preferred embodiment. In this circuit, the signal on line 3220 which is received from the circuitry shown in FIG. 34 is mixed with the signal received on line 2932 from the circuitry shown in FIG. 29. The difference frequency signal on line 3230 is then compared with the reference signal received on line 3210 from the 50 MHz voltage tuned oscillator. In response to this comparison, the 275 MHz tune control signal on line 3260 is generated. Detection of the phase lock loop is indicated by lock detector circuit 3250. When the loop is locked, the signal on line 3251 will be low. When it is unlocked, the output level on this line will be high.

Referring now to FIG. 34, there is shown the 275 MHz phase lock oscillator circuit of the preferred embodiment. This circuit provides a variable offset from the nominal 280 MHz signal. The circuit receives the 275 MHz tune signal on line 3260 which determines the frequency of the 275 MHz oscillator 3457. The output of the oscillator on line 3459 is mixed by mixer 3475 with the signal on line 3045 and the resulting signal is amplified and filtered and provided on line 3450 to the 249 MHz phase lock circuitry shown in FIG. 36.

Referring now to FIG. 35, the 50 MHz oscillator 3550 is tuned by the 50 MHz tune signal 3510 and the 50 MHz sweep signal on line 3520. These signals are shaped by shaping network 3530 and filtered by filter 3540 and used to tune the 50 MHz oscillator 3550. The output is divided by dividers 3570 and 3580 and the respective outputs are provided on line 3572 to the frequency counter circuitry shown in FIG. 36 or on line 3210 to the phase lock circuitry shown in FIG. 32.

In FIGS. 36A, 36B and 36C, there is shown the frequency counter circuitry of the preferred embodiment. This circuit counts the following frequencies: the 50 MHz voltage-tuned oscillator signal received on line 3572, the IF signal received on line 3611 and the pilot IF signal from the phase lock circuitry shown in FIG. 26. The respective signals are amplified by amplifier circuits 3612, 3614 and 3616. The amplified signals are then input to multiplexer 3740. Also input to multiplexer 3640 is the 10 MHz reference signal from counter control circuit 3630. The multiplexer gates one of these signals to the output line 3650 in response to the input selected by the code placed in register 3632 from the data bus 2200. Strobing of the data word from the data bus 2200 into register 3632 is accomplished via address decoder circuit 3660. The strobe signal is supplied on line 3661 and the selection of the frequency counter circuitry is determined by decoding the address signals received on lines 3664. The decoding of certain octal addresses is used for specific purposes. For example, the decoding of octal address 24 will result in a signal being produced on line 3667. This will cause the counter and bus registers 3680 and various other circuitry in the frequency counter to be reset. The decoding of address 25 will result in a signal on line 3668, and will cause the high order four digits to be read from counter 3680. In a similar fashion, the decoding of an octal address 26 will cause a signal to be provided on line 3669 and the lower four bits of counter circuit 3680 will be read out onto the data bus 2200.

Referring now to FIGS. 37A and 37B, there is shown the 249 MHz phase lock circuitry. The frequency of the signal received on line 3450 from the 275 MHz phase lock oscillator shown in FIG. 34 is divided by variable modulo frequency divider circuit 3725. Phase frequency detector 3710 then compares the signal provided by circuit 3725 with the signal produced by divider circuit 3705 in response to the 20 MHz reference signal received on line 3610. If the two inputs are out of phase control voltage is generated to force a change in the frequency of the 249 MHz phase lock oscillator shown in FIG. 33 until the inputs are in phase. Also, an indication of the locked or unlocked state of the phase lock loop is provided by circuit 3735. An LED 3735 is illuminated when the loop is unlocked and also a high logic signal is provided on a line 3736 to indicate the unlocked state.

Referring now to FIGS. 38A, 38B, 38C and 38D, there is shown the circuitry of the processor 2015 for the RF section of the preferred embodiment. The interface circuitry connecting the processor to the other circuitry of the preferred embodiment is shown in FIG. 38. Basically, these consist of memory interface 3880, bus circuits 3885, 3840 and 3830 as well as timing and synchronizing circuits such as timer 3805, clock circuit 3815, synchronizing circuit 3810 and clock drivers 3825. The processor executes the instructions shown in Appendix A to control the various operations of the preferred embodiment. A block diagram of the microprocessor used in the preferred embodiment is shown in FIG. 39. An explanation of the notation used in this processor and definitions of all the instructions are contained in Appendix A. The various programs used in the preferred embodiment are contained in Appendices B-1 through B-30. The signals produced by the instructions in the programs are detailed in Appendix B-31. Program execution by the processor is suspended through stop processor circuit 3801. This circuit responds to the controls on the front panel and to various other conditions throughout the machine.

The processor reset signal POP is provided on line 3811. Whenever this line goes low, the processor is reset and forced to begin the execution of the program which begins with the instruction at octal address 40 as soon as the line returns high. This may be caused by the pressing of the instrument preset button 230 on the front panel which causes the generation of the signal LIPS on line 3806 and by when power is first applied to the unit as indicated by the signal on line 3807. Once execution begins at instruction 40, various subprograms are executed which cause specific operations to occur in a predetermined sequence. Some examples of these operations are: phase lock the YIG-tuned oscillator, tune the voltage-tuned oscillator, select the correct scan time, select an appropriate frequency span width, set the IF section to the correct bandwidth and sensitivity, display the appropriate control settings on the CRT, etc. These programs interrogate the settings of the controls on the front panel and are responsive to changes in the circuitry and the front panel controls.

The subprograms which are in Appendices B-1 through B-30 are stored in a read-only memory which is read by the processor using a handshake interface circuit 3880. Any suitable ROM memory may be used. The address is output to the memory on lines 3992 and the signal HSTM on line 3994 is brought high. The positive edge of the signal on line 3994 causes the memory address register to receive the address on lines 3992.

The circuits shown in FIGS. 40A-C and 46A and 46B are bandwidth filters which operate at 21.4 MHz and are variable in bandwidth from 3 KHz to 3 MHz. The narrower bandwidths 3 KHz to 30 KHz are obtained from synchronously tuned crystal filters while the wider bandwidths are obtained from four synchronously tuned LC tank circuits. The IF control circuitry of the preferred embodiment is shown in FIGS. 41A and 41B. Control information for the IF video circuits is transmitted over data bus 2200. Address lines 2299 are monitored and decoded by circuit 4120 which controls the loading of the data on the bus 2200 into the input latches 4130. Data is strobed into the latches in response to the signal LTIO on line 4123 in response to the data word, gain control outputs are produced by circuit 4140, and predetermined attenuation steps are controlled by circuit 4150. In a similar fashion, bandwidth control circuit 4160 provides control signals on lines 4161, 4162, 4163, 4164, 4165, 4166, 4167, 4168. These signals control the crystal filters in LC tank circuits shown in FIGS. 40 and 46. The log linear control signal on line 4180 is provided by op amp circuit 4182. This signal is used in the circuitry shown in FIGS. 42A and 42B.

The log amplifier and filtering circuitry of FIGS. 42A and 42B provides the ability in the preferred embodiment to display signals in either a linear or a logarithmic mode. In the logarithmic mode, the calibrated display range is 90 dB. The circuitry of FIGS. 42A and 42B contains the first five of nine logarithmic stages and the circuitry shown in FIGS. 43A and 43B contains the circuitry for the last four logarithmic stages. After the IF signal received on line 4080 is processed by the five logarithmic amplifier stages of amplifier circuit 4230, the IF signal is processed by bandpass filter circuit 4240 and lowpass filter 4250 to yield the IF signal on lines 4280. All this circuitry is under control of the log/lin control signal on line 4180 and the AGC control signal on line 4193, and the LGIO control signal on line 4195. The AGC signal on line 4193 is used in the linear mode of display. The gain increases as the voltage of this signal becomes more negative. The signal varies between 0 and 15 volts and controls a gain range of approximately 65 dB. The LGIO signal controls circuitry within amplifier 4230 which is used to activate a 10 dB gain step in the linear mode.

The log amplifier detector circuitry shown in FIGS. 43A and 43B contains the last four of the nine logarithmic amplifier stages (the first five stages are in the amplifier/filter circuitry shown in FIG. 42). Stages 6 and 7 of amplifiers 4320 are also used in the linear mode as a switchable 20 dB gain step. The output signal from the amplifiers on line 4321 is applied to the PIN diode attenuator circuit 4325. When in the logarithmic mode, this attenuation is varied with temperature to compensate for bias variations in the logarithmic amplifier stages. The IF signal output on line 4326 is then detected by detector circuit 4340 to produce the vertical video signal on line 4342 which is input to video processor 2060 which is described in greater detail with respect to FIG. 50. The counter output limiter circuit 4350 provides an amplitude/limited signal at the IF frequency which is used for frequency counting. The circuitry shown in FIG. 44 provides three functions: oscillator circuit 4410 provides an 18.4 MHz LO frequency to the up converter and down converter circuitry shown in FIGS. 47 and 48 respectively. These signals are provided on lines 4413 and 4415 after being amplified by amplifier circuit 4412. Also, the circuitry of FIGS. 44A and 44B provides 65.9 dB of gain in discrete 0.1 dB steps (from −15.9 dB to +50 dB). This is accomplished through step gain circuits 4430, 4440 and 4450 as well as attenuators 4460. The level of gain or attenuation is determined by the control signals on lines 4431, 4441, 4451, 4461, 4462, 4463 and 4464. The resulting IF signal is output on line 4480. The control signals received are provided in response to the program control of processor 2015 and the settings of the front panel controls.

The 3 MHz filter circuitry shown in FIGS. 45A and 45B is a variable bandwidth filter centered at 3 MHz. The bandwidths are controlled from 10 Hz to 300 Hz in a 1-3-10 sequence by the control lines 4510, 4512, 4514 and 4516. The signal being filtered is received on line 4525 from the down converter circuitry shown in FIGS. 46A and 46B and the filtered output on line 4582 is input to the up converter circuitry shown in FIG. 47. The filter circuit shown in FIGS. 45A and 45B forms a five pole synchronously tuned bandpass filter. Each amplifier has a negative output impedance to compensate for the series resistance of the crystal resonator.

Figure 46B:
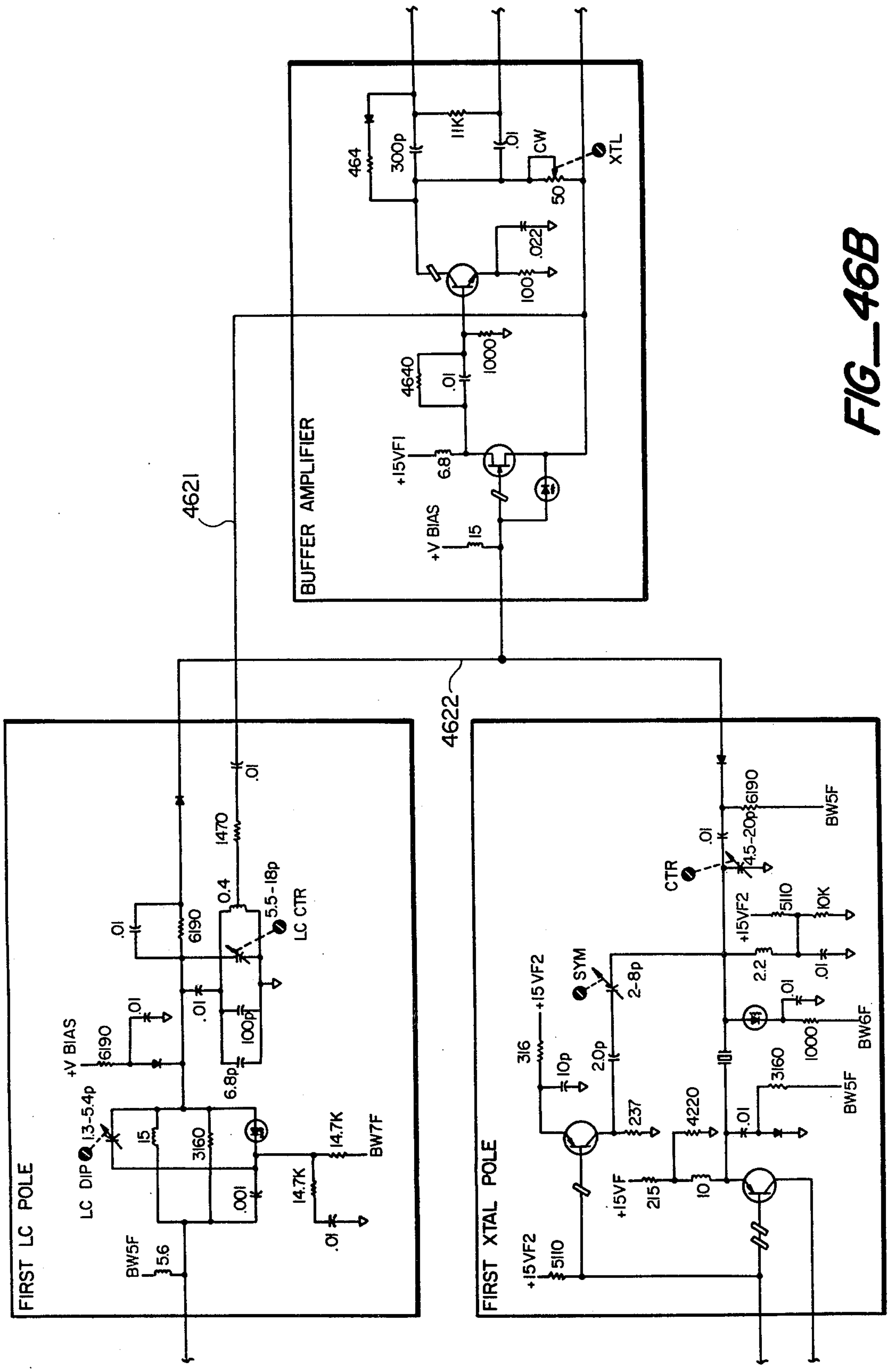

Referring now to FIGS. 46A and 46B, there is shown attenuator and bandwidth filter circuitry of the preferred embodiment. Attenuation of the input signal received on line 4601 is supplied by attenuator/amplifier circuit 4610 in response to the control signals 4603 and 4605. As in the bandwidth filter circuitry shown in FIG. 40, the narrower bandwidths of the filter are obtained from synchronously tuned crystal filters while the wider bandwidths are obtained from four synchronously tuned LC tank circuits.

In FIG. 47 there is shown the up converter of the preferred embodiment. For the narrow bandwidths, i.e., less than or equal to 1 KHz, this circuitry converts the 3 MHz IF signal received on line 4582 and converts it to a 21.4 MHz IF signal on line 4772. This is accomplished by mixing the 3 MHz signal on line 4582 with the 18.4 MHz signal received on line 4413.

FIG. 48 shows the down converter circuitry of the preferred embodiment whereby the 21.4 MHz IF signal received on line 4682 is converted to a 3 MHz IF signal and output on line 4525.

Video Processor

As mentioned above, in a spectrum analyzer with a digital display, i.e., where the display is produced in response to data representing a discrete number of sampled points, there is the problem that there may not be enough sample points to properly describe the analog signal. For example, assume that the display is made up of 1000 horizontal positions and their corresponding 1000 amplitude levels at those points. In that case, the resolution is 1/1000 of the full scale along the axis. For a 1000 MHz wide scan with an IF-bandwidth $<1$ MHz there would be a good chance of missing a signal or of displaying it with less than its true amplitude, because no sample was taken while the analyzer was sweeping across the signal. To avoid this problem, the ratio of scanwidth to bandwidth cannot exceed a certain ratio.

With 1000 samples per scanwidth, this ratio should be $\leqq 200$ so that at least five samples are taken while the signal is within the 3 dB bandwidth of the IF filter. This would keep the amplitude error to $<0.1$ dB for a 100 dB full screen display.

A problem is the aspect ratio (SW/BW = aspect ratio) limitation of digital storage, as well as the limitation of the absolute speed at which incoming data gets converted into digital. The Nyquist theorem for sampling a band limited signal has to be satisfied ($f_s > 2BW$) in order to retain all the information. With a max. conversion rate of 50 KHz from analog to digital, the widest IF-bandwidth which satisfies Nyquist is $\simeq 10$ KHz. The analyzer has a max. IF-BW of 3 MHz and thus the 50 KHz sampling rate will lead to inaccurate descriptions of signals which have a 3 MHz information bandwidth, such signals as noise and impulse signals like RADAR.

Another problem is the sampling rate limitation. The previous aspect ratio limitation is really another form of sampling rate limitation. It is caused by the fact that there are insufficient numbers of samples to describe the display.

The real solutions would be to increase the sampling rate and the numbers of points displayed, but this is costly and not practical.

Other solutions are compromises which sacrifice some information in order to preserve that information which is most useful for spectrum analysis. In this regard, the most important parameter is correct signal amplitude. It can be obtained from a peak detector which precedes the A/D converter. The peak detector holds the max. signal which occurs between samples for the A/D. After sampling the peak detector output, the peak detector is reset to the input signal level. Thus, no signal peak is lost. Also, the preferred embodiment employs both a positive and negative peak detector circuit to allow a better presentation of signal noise, i.e., give an indication of the amplitude excursions in the noise signal.

A problem using the peak detector is that the displayed signal peak may show one address later than it actually occurred so that there would be an error in frequency. The seriousness of this problem depends on how many horizontal addresses are used.

Also, the peak detector will give a misleading display of noise as it traces out only the peaks of the noise impulses. The user might be misled into thinking that the noise has been smoothed by videofiltering. In that case, he would read the absolute noise level incorrectly, since the peak noise is many dB above the RMS noise level.

Another problem with using a positive peak detector only is that a signal which is just a few dB above the noise will look clean and again the user might not be aware that he is looking at the sum of signal plus peak noise. Measuring the signal level he could get several dB errors.

The preferred embodiment provides a better presentation of the noise which is present by using a negative peak detector in addition to the previously described positive peak detector. The outputs from these two peak detectors are then displayed in a predetermined manner. For example, the display might simply alternate between the outputs from the positive and the negative peak detectors.

Video Signal Conditioning

The video processing technique of the present invention accommodates the requirements of digital storage. During a frequency sweep, 1000 samples of the video signal are taken and stored. However, simply taking and storing 1000 samples does not give adequate results with all combinations of resolution bandwidth, frequency span, and sweep time.

Consider, for example, an often-encountered spectrum analyzer input: short duration RF pulses occurring at a relatively low repetition rate. When the analyzer sweeps across the RF pulse spectrum, the output of the video detector is a series of short pulses. The shape of these pulses corresponds to the impulse response of the spectrum analyzer system (approximately Gaussain) and their rise time is 0.12$\mu$s when the resolution bandwidth is at its widest setting (3 MHz). Representing this signal with sampled data would require a sampling rate higher than 6 MHz but there are other limiting factors, such as CRT resolution.

A high-quality CRT display might have a 10-cm horizontal axis and a resolution of 40 lines/cm. RF spectrum analyzers typically sweep no faster than 20 ms per sweep, so multiple video signals occurring within a 50-$\mu$s sweep segment (20 ms$\times$1/400) will not be resolved, but will appear on the display as a single vertical line having the amplitude of the largest video signal and an intensity proportional to the summation of all the signals occurring within the segment. Thus, a peak detector that retains the peak value encountered during each 50-$\mu$s period would permit sampling at a 20-kHz rate for the 20-ms sweep. However, the information contained in the intensity modulation would be lost, corresponding to the loss of information resulting from the use of the slower sampling rate (as compared to 6 MHz).

Wideband impulse-type signals are not the only ones that can cause difficulties for the conversion process. CW signals can also be misrepresented when the analyzer is set for a high-aspect-ratio display (aspect ratio is defined as the ratio of frequency span to resolution bandwidth). Because the video signal resulting from a CW signal during a frequency sweep is a replica of the shape of the resolution-bandwidth filter response curve, at least five samples must be taken within the −3-dB points on the response curve to assure that the peak amplitude is captured with less than 0.1-dB error. This would limit the aspect ratio to 200 for a 1000-point display using sampled data.

For larger aspect ratios, a peak detector enables the peack amplitude to be captured by only one sample per data point. The trade-off is a sacrifice in frequency accuracy of 0.1% of the frequency span, but this is well within the visual resolution of the displayed spectrum.

A peak detector can give a misleading representation of noise. With noise as the input signal, the video signal can be considered as a tightly packed random sequence of individual impulse responses. However, a peak detector retains only the noise peaks and information on the variance is lost. Indeed, this can lead to erroneous results in measurements of low-level signals that are barely above the noise level. The peak-detected waveform may look very much like a video-averaged waveform whereas the peak is much higher than the true average because of the noise fluctuations.

For this reason, the preferred embodiment has both a negative peak detector and a positive peak detector driven in parallel by the video detector. The general scheme is to display the positive peak values for the odd-numbered data points and the negative peak values for the even-numbered points, giving a realistic reconstruction of noisy signals. However, this introduces a complication because it is desired to retain only the positive peak values of clean signals so amplitude measurement accuracy is preserved. Therefore, the video processor of the preferred embodiment displays positive and negative peaks alternately only when noise is present. Otherwise, only the positive peaks are displayed. FIG. 49B illustrates the concept.

A block diagram of the video processor is shown in FIG. 49A. The video signal is applied to the positive and negative peak detectors simultaneously. Before the start of a sweep, the switches in the peak detectors are closed and the capacitors charge to the value of the video signal. At the start of the sweep, the display's digital processor opens the switches and the positive peak detector tracks increases in the video signal while the negative peak detector tracks decreases. For example, the output of the positive peak detector increases only when the video signal increases above the value already stored on the capacitor and, of course, it never decreases.

When the processor determines the end of a data position (sampling interval), it selects the output of one of the two peak detectors to represent the signal at the A-to-D converter. If it selected the positive peak detector, it would then close the corresponding switch, reinitializing the capacitor to the present value of the video signal. If it had selected the negative peak detector, it would not reset the positive peak detector, but would retain the value stored on the capacitor for use in the next data position. However, for reasons given later, the negative peak detector is reinitialized at the end of every data position.

Detecting Noise

The most important information the processor needs to decide which peak detector to choose is whether or not the incoming signal contains noise. As shown in FIG. 49B, a noisy video signal is characterized by many variations and large deviations. Noise is present in each of the ordinals 400 through 404 and the signal rises and falls repeatedly. However, in ordinals 405 through 407 there is no noise and the signal increases monotonically. Using these signal properties, it is a relatively simple matter to determine whether or not a data position contains noise.

The "rosenfell" detector of FIG. 49A tells the processor when noise is present. The input stage of the rosenfell detector consists of two comparators. The upper comparator detects when the instantaneous video signal is less than the positive peak detector output, which can only mean that the video signal is falling. In a similar manner, the other comparator indicates when the video signal is rising.

When the video signal falls, it causes the "fell" flip-flop to be set and whenever it rises, it causes the "rose" flip-flop to be set. If the video signal both rose and fell within a data position, the AND gate would send a "rosenfell" indication to the processor, signifying the presence of noise within the data position. Both flip-flops are reset at the beginning of the next data position.

To Reset or Not

The success of the detection technique at reconstructing the video signal hinges on the rules for resetting the peak detectors. Assume that FIG. 49C-1 shows a video signal of interest. FIG. 49C-2 shows the waveform obtained by the preferred embodiment using the positive peak detector only. FIG. 49C-3 shows the waveform obtained by the preferred embodiment using only the negative peak detector. Combining the use of the positive and negative peak detectors allows the reconstruction and accurate display of the video signal. These figures demonstrate the importance of resetting the positive peak detector only when it had been chosen to represent the signal for the data position. The aspect ratio for this case is 3000, so the video signal rises out of the noise, reaches its maximum, and returns to the noise level all within one data position. The rosenfell detector would indicate the presence of noise and, if the ordinal were even, the processor would choose the negative peak detector output. However, since the positive peak detector is not reset on this data position, it holds the maximum signal value for the next data position, where the positive peak value is chosen. Thus, the video signal is reconstructed appropriately.

Again, assume that FIG. 49D-1 shows a video signal of interest. Also, as above, FIG. 49D-2 illustrates the display obtained using only the positive peak detector where FIG. 49D-3 illustrates the display obtained using only the negative peak detector. FIG. 49D-4 shows the reconstructed video signal obtainable using both the positive and negative peak detectors. These figures demonstrate the importance of resetting the negative peak detector at the end of every data position. When a noise-free video signal reverses direction at its peak, the rosenfell detector sees both a rise and a fall and indicates that noise is present within the data position. Then if the processor is also at an even ordinal, the negative peak value would be chosen. But, since the negative peak detector was reset to the value of the signal at the beginning of the data position, its value will be only slightly different from the positive peak detector value and the smooth reconstruction of the video signal is not disturbed perceptibly. At the next data position, the positive peak detector, which retained the maximum value, is chosen.

When the preferred embodiment is used for measuring noise or when it operates in a digital averaging mode, the rosenfell detector is bypassed and the video signal is sampled directly by the A-to-D converter.

The hardware implementation of this detection technique could encounter some practical problems when the analyzer sweeps slowly. The duration of a data position can become as long as 1.5 seconds and a peak value captured by either peak detector could be lost because of gradual discharge of the detector capacitor. This becomes a problem whenever the data position is 75 82 s or longer; that is, the sweep time is 75 ms or longer. To avoid the loss of these values, the processor retrieves the value of both peak detectors from the A-to-D converter at least once every 30 μs, obtaining as many as 50,000 positive and negative peak detector values for the 1.5-second data positions. The processor, however, saves only the maximum and minimum values and at the end of the data position, chooses one or the other to represent the signal for that data position according to the same algorithm described above. These peak values, which the processor stores in its registers, are then reset whenever the peak detectors are reset. In effect, the processor simply extends the range of the peak detectors by carrying out the detection process digitally.

The A-to-D converter has 10-bit resolution, equivalent to a resolution of 0.1%. At the end of each data position, the display system processor takes the chosen value, performs any calculations that may be called for (max hold, A-B), and stores the result in memory along with sweep position information. The measurement data can be stored in any one of three areas (A, B, or C) reserved for these data arrays. During the display cycles, the data from any one of these areas can be displayed individually or simultaneously with data from the other areas.

The definitions and method steps used in the preferred embodiment are briefly summarized below:

A "sample" is defined as a video a - d conversion which occurs every 20-50 μsec. A "data position" is defined as 1/1000 of the horizontal display. Each data position has a specific memory address:

Even Data Position = 2, 4, 6, . . . 1000

Odd Data Position = 1, 3, 5, . . . 1001

The time range per data position = 20 μs→1.5 sec. While the number of samples per data position may vary from 1 to 50 thousand, only one sample per data position can be displayed.

Positive and negative peak detectors are used to find maximum deviations. A positive peak is the maximum value within a data position, a negative peak is the minimum value. The reset of a peak detector initializes the peak detector to the present value of the video signal.

"Video signal falling" is defined as the condition when the incoming video signal is less than the value held on the positive peak detector. "Video signal rising" is defined as the condition when the incoming video signal is greater than the value held on the negative peak detector. "Video signal fell" indicates that a condition of "video signal falling" has occurred within a data position. "Video signal rose" indicates that a condition of "video signal rising" has occurred within a data position. "Video signal rosenfell" indicates that the video signal both rose and fell within a data position. The reset of the "rosenfell" detector clears the indication of "video signal rose" and "video signal fell."

In the preferred embodiment, odd data positions will always contain positive peak values. Even data positions will contain negative peak values only if the video signal is defined as "noise." Otherwise, even data positions will contain positive peak values. The presence of "noise" is indicated by the presence of a "video signal rosenfell."

The negative peak detector is reset at the end of every data position. The positive peak detector is reset after the positive peak value has been chosen for the data position. Therefore, when a negative peak value is chosen for an even data position, the psoitive peak detector will not be reset until the end of the following data position. This ensures that any positive peak occurring during the time of the even data position will be retained. The rosenfell detector is reset at the end of every data position.

For data positions of long duration, one or more pairs of positive and negative peak detector values are converted. When more than one pair is converted, the digital processor selects and keeps only the maximum and minimum values. At the end of the data position, the maximum value is assigned to be the positive peak value and the minimum value is assigned to be the negative peak value. The algorithm stated above is then followed, and the rule for resetting the positive and negative peak detectors is applied to resetting the positive and negative peak values.

To make noise density measurements, the peak detectors are bypassed and the video signal is sampled and converted directly. This allows noise computations on direct samples of the video signal.

It should be emphasized that the method used in the preferred embodiment is weighted towards preserving the positive peak excursions of the signal. Since this is the most important parameter for a spectrum analyzer, the negative excursions are preserved only to the extent necessary to indicate the signal variations as for noise. These sequences of variations between using the information from the positive and negative PD could also be effectively used.

Referring now to FIGS. 50A and 50B, there is shown the schematic diagram for the video processor circuit of the preferred embodiment. This circuit filters the detected IF signal received on line 4342 from the circuitry shown in FIG. 43. The circuit also sets the DB/DIV log scale and the reference level offsets. Also, it provides the IF video output signal on line 5080 as well as recorder output control signals on lines 5090 and 5091. Video filter circuit 5020 is an RC low pass filter with selectable R and C elements. The series resistance R is one of two values controlled by switch 5022. When the switch is closed or in the zero position, the 147 K resistor 5024 is short-circuited, and the series resistance is minimum. In this state, video bandwidths from 3 KHz to 3 MHz are attainable. The 3 MHz bandwidth is attained when transistors 5027A, B, C, D, E, F and G are turned off. When switch 5022 is open, the series resistance R is high, approximately equal to resistor 5024, and video bandwidths from 1 Hz to 1 KHz are attainable. The shunt capacitors 5029A through 5029G are selected by switching transistors 5027A through 5027G respectively. Only one of these switching transistors can be on at any time and each capacitor except capacitor 5029G is used with the high series resistance for the lower bandwidths and the low series resistance for the higher bandwidths.

Log expand circuitry 5040 allows four different amplitude scales, 10, 5, 2 or 1 dB per division. Changes in the amplitude scale are accomplished by first amplifying the video signal and then attenuating it various amounts. Amplification is provided by FET input amplifier 5042 which has a gain of 5. The signal thus produced on line 5043 is then attenuated by voltage divider circuits under control of transistors 5045, 5046 and 5047. Diodes 5048A and 5048B clamp this attenuated signal at about minus 1.2 volts to prevent forward biasing any of the transistor 5045, 5046 and 5047 switch circuits in the forward state. A final amplifier consisting of transistor circuits 5049, 5050 and 5055 amplifies the attenuated signal by 4 and offsets the output plus 2 volts (a plus 2 volt output corresponds to a full scale signal). Log offset current source 5010 simulates log gain for reference levels below minus 60 dBm. This is achieved by offsetting the zero volt to 1 volt video input signal by driving current through the source resistance 5012. This current is changed by supplying different currents into the emitter of transistor 5014, the transistor current source. Currents are controlled by switching transistors 5015A, 5015B and 5015C.

The decode logic circuit 5030 performs additional decoding on control lines receives from the IF control circuitry described with respect to FIG. 41. The signals VBWA, VBWB, VBWC and VBWD are received on lines 5031, 5032, 5033 and 5034 respectively. They are then decoded by a 1 of 8 decoder 5037 and the signals are then inverted by inverters 5039. In this way, the control signals are produced which control the capacitors in the video filter circuit 5020. The signals A LOG and B LOG are also decoded by decoding circuit 5030 which produces the control signals on lines 5041A, 5041B and 5041C which drive the switches that vary the attenuators in the log expand circuit 5040.

Referring now to FIGS. 51A and 51B, there is shown the analog/digital converter circuit of the preferred embodiment. This circuit is used to produce storable graph data. It converts analog data received from the track and hold circuitry shown in FIG. 52 on line 5280 and transfers this data to the digital storage bus 5130. The digital storage bus 5130 is used for all data input and output. The signal ADC on a line 5173 controls the loading of the digitized signals from ADC buffers 5120 onto data bus 5130. The signal HLD on a line 5177 is used to reset the ADC circuits 5110 and 5120 and to initiate the next analog to digital conversion. The signal LD RAMP on a line 5179 causes the updating of the ramp digital to analog converter 5160 by causing the loading and updating of the scan address latches 5150 with a new scan address. The signal TSTA on line 5171 enables the test bits from buffer 5190 onto the digital storage bus 5130.

The ADC circuit 5110 converts analog data into 10 bits of binary data which is placed in ADC buffers 5120 through the technique of successive approximation. The circuit comprises digital to analog converter 5113 and successive approximation register 5117. To begin a conversion, the ADC is first reset to all zeros by the signal HLD on line 5177 going low. When the signal HLD goes high, each bit is individually tried in a "trial" conversion starting with the most significant bit. A decision is made to retain or drop the bit based on the comparator output. Once the decision has been made for each of the 10 bits, a conversion complete signal on line 5117A sets flip-flop 5119. This signal called BUSY can be transferred onto the digital storage bus through test bits buffer circuit 5190.

Ramp converter circuit 5160 makes a comparison between the analog sweep signal received on line 2046 and the scan address (X axis) received on the digital storage bus 5130 and input to latches 5150. Comparator 5167 makes the comparison and provides a signal RAMP on a line 5168. When this signal is high, it indicates that the scan address needs to be updated. When an update occurs, a new address is loaded into scan address latches 5150 and a new data point is sampled for A/D conversion. When a new address is placed in scan address latches 5150, an updated comparison between the sweep signal on line 2046 and the scan address in latches 5150. The signal SWP IN thus sets the sample rate. Minor adjustment can be made using variable potentiometer 5169.

Referring now to FIGS. 52A-C, the track and hold circuitry shown is used to insure that the true peak of the RF signal and a true representation of noise are displayed on the CRT display. This is accomplished by positive and negative peak detection circuits. The positive peak detector circuit 5210 acquires the most positive voltage to appear at its input on line 5080 and holds that voltage on holding capacitor 5214 until the circuit is reset by a pulse from the decoding and timing circuits 5230. C26 is discharged when the reset pulse turns on transistor 5117.

Negative peak detector circuit 5220 also receives the signal on line 5080 and acquires the most negative voltage to appear and holds that voltage on holding capacitor 5224 until reset by the reset pulse from decoding and timing circuits 5230.

Decoding and timing circuits 5230 provide the reset pulses to the peak detectors and the control signals to multiplexer circuit 5250. Signals received on lines 5251 and 5252 are used to control multiplexer circuit 5250. Signals HSWP on line 5231 and signal HOLD on line 5234 and signal RSEN on line 5235 control the providing of the reset pulses to positive and negative peak detectors 5210 and 5220. The status of the track and hold circuitry can be monitored by the control processor by monitoring status signal LTRK on line 5239. Track and hold circuit 5270 monitors the positive and negative peak detector output signals which are multiplexed through multiplexer 5250 onto line 5271. Track and hold circuit 5290 samples the signal on line 5271 and holds the sampled voltage on capacitor 5292. The output of the track and hold circuit on a line 5280 is then used by the analog to digital converter circuitry shown in FIG. 51 which converts it into Y axis graph data.

FIGS. 53A-C are a schematic diagram of the data manipulator circuitry of the preferred embodiments. This circuit contains 16 random access memory registers 5310 which are used for data storage during data manipulation. Thirty-two 12-bit ROM registers 5370 are used to store constants used during calculations. The arithmetic and logic unit 5350 is used to perform various arithmetic and logic functions upon the stored data. ALU circuits 5351, 5352 and 5353 are similar to the 74S181 circuits or the like manufactured by Texas Instruments and others. Circuit 5355 is a high-speed, look-ahead carry circuit similar to the 74S182 or the like manufactured by Texas Instruments and others. A pipeline register 5360 holds instructions received from the processor in sequential order. These instructions are then decoded by circuit 5380 and the appropriate arithmetic or logical functions are performed upon the stored data. Also, data words may be input and output to other areas of the circuitry of the preferred embodiment over I/O bus, i.e., digital storage bus 5130.

Referring now to FIGS. 54A-C, there is shown the main control circuitry or state machine which controls the digital storage processor. The digital storage processor includes the control circuitry shown in FIG. 54, the interface circuitry to the remainder of the spectrum analyzer of the preferred embodiment shown in FIG. 55, the data manipulating circuitry shown in FIG. 53 and the memory circuitry shown in FIG. 56.

State register 5430 indicates the present state and the position in the sequence of operations being performed. This present state data is supplied to program ROMs 5420 on lines 5421 where it causes the program ROMs to read out the appropriate memory contents. The digital storage processor alternates between two programs. One is the main program shown in Appendix C1; the other is the interrupt program shown in Appendix C2. Link register 5440 is used to store the respective returning positions and store multiplexed qualifier to the respective programs as they are being executed and interrupts and other monitored machine conditions cause the processor to switch from one program to the other. Thus, each program resumes at the correct state when the other is completed or temporarily suspended. Control signals for the input section and the CRT display section are provided by control pulse circuit 5555 and addressable flip-flop circuit 5580. The instruction definitions for the program stored in program ROM 5420 are shown in Appendix C3.

In FIGS. 55A and 55B, there is shown the interface circuitry which provides data transfer between processor 2015 which is described with respect to FIG. 20 and the digital storage processor which is described with respect to FIGS. 53, 54, 55 and 56. Basically, this circuit provides for the inputting and outputting of circuitry via the two processors and through the preferred embodiment using instrument bus 2200 and digital storage bus 5130.

The memory circuitry shown in FIGS. 56 A-C contains 4,096 12-bit words of random access memory storage in memory circuits 5630 and also contains 2,048 8-bit words in memory 5670. In memory circuits 5630 are stored all the data that may be displayed on the CRT including the display annotation data such as center frequency, reference level, the graticule, all characters and complete data for traces A, B and C. Character stroke memory 5670 contains the stroke description of each character, the length and direction of each stroke required to draw a character, i.e., all the alphabetic characters as well as all the numerals and other indicia used on the display.

Referring now to FIGS. 57A and 57B, there is shown the line generator circuitry of the preferred embodiment. This circuit receives a series of digital X and Y values which are loaded into X register circuit 5710 and Y register 5720. These values are received via bus 5130 and are clocked into the respective registers under control of the signals LDX and LDY. If signal LDX on line 5521 is present, the value on data bus 5130 will be loaded into the X register. If the signal LDY on line 5522 is present, then the digital word on data bus 5130 will be loaded into Y register 5720. The values placed in the X register 5710 and Y register 5720 are then converted to analog values by X digital to analog converter 5745 and Y digital to analog converter 5730. The successive X and Y values are connected with straight lines by a process called line generation which is similar to that of connecting dot-to-dot drawings on paper. Two independent line generators are required. The line generator circuit for the X values comprises summing-amplifier 5750, sample and hold circuit 5765, X integrator 5780 and filter 5785. The Y line generator circuit comprises summing-amplifier 5760, simple and hold circuit 5775, Y integrator 5795 and Y filter 5790. For each line drawn, there is a set up period followed by a drawing period. During the set up period, i.e., the conversion to analog values for each set of X and Y data, the display is blanked by the intensity control circuitry shown in FIG. 58 under control of the signal LLGBLANK on line 5811 and INTR on line 5821. X summing-amplifier 5750 receives the analog value for the next position on line 5746. It also receives an input indicating the present X value from integrator 5780 on line 5781 and it receives a shift value on line 5716 from expand register 5715. The three signals are summed to give a delta X equal to "next X" plus X shift minus present X. The X shift signal on line 5716 is a binary signal of zero volts or plus 5 volts and the amount of shift is adjusted by the potentiometer 5752.

Sample and hold circuit 5765 receives the new X value provided on line 5759 and holds it for input to the integrator 5780. Sample and hold circuit 5765 samples for 1 microsecond during the set up period and then holds the value during the drawing period which is either 4 microseconds or 19 microseconds. The sample mode is controlled by the signal SMPL on line 5767 while the hold mode is controlled by the signal HLDX on line 5769. Capacitor 5768 is the holding capacitor.

X integrator 5780 includes amplifier 5785, capacitor 5787 and transistor 5789 which form an integrate and hold circuit whose output is an analog signal on line 5783 which is the X display position. X filter 5788 is a 2.5 MHz low pass filter which smooths out transients from the X integrator and provides the signal LGX on line 5795. The Y circuitry works in a similar fashion and provides the signal LGY on line 5798. Y offset circuit 5755 supplies a signal to the Y summing amplifier 5760 such that the output of the Y line generator on line 5798 will be zero volts when the Y register contains all zeros and no origin shift for the display is present.

Referring now to FIGS. 58A and 58B, there is shown the intensity control circuitry of the preferred embodiment. This circuitry receives the delta X and delta Y signals on lines 5756 and 5758 respectively. It then approximates the line length and controls the Z axis level to the display. This circuitry also sets and controls the duration of the line generator drawing period which is either 4 microseconds or 19 microseconds depending on the approximate line length. The drawing period is controlled by providing the signal LL on line 5771. This circuitry also provides the drive signals to the line generator switches, and through the blanking logic 5850, it controls all display blanking.

The intensity level is modulated as a function of both delta X and delta Y signals received on lines 5756 and 5758. Line generator Z-axis circuit 5880 receives these signals and the magnitudes of these two signals are summed together to approximate line length. The output of this summing operation is provided to bright circuit 5888 on a line 5887. Bright circuit 5888 sets the Z-axis signal to maximum when bright lines are drawn. The signal LGZ on a line 5889 is output by bright control circuit 5888 and is input of multiplexer 5995 where it is multiplexed with the FSZ signal from the trigger circuitry shown in FIG. 60 and becomes the Z signal to the display. The Z signal also goes to the auxiliary Z circuit 5990 which provides the auxiliary Z signal on line 5991.

The line length approximation from the line generator Z-axis circuit 5880 also goes to the long line comparator circuit 5885 which decides whether the line should be drawn as a long line (19 microsecond drawing time) or a short line (4 microsecond drawing time). This decision is stored at the input register and sent to the line generator as the signal LL on line 5771. The long/-short line timing circuit 5820 uses the signal LL and the signal LGCLK on line 5818 to control the line generator set up and drawing periods. It provides the signal INTR on a line 5821 which is used by the main control circuitry shown in FIG. 54 to determine when to send new X and Y values to the line generator circuitry. It also provides timing signals to the integrator switch driver 5830 and the sample and hold switch driver 5870. These two circuits form the drive signals needed for the line generator.

The control of display blanking begins at the input register 5802. Blinking and blanking information are held in this register during the line drawing period. The blanking logic circuit 5850 controls the display blanking. It unblanks, blanks or blinks lines as required by input register 5802. It multiplexes the digital storage blanking with the fast sweep retrace blanking.

Referring now to FIG. 60 there is shown the trigger circuitry of the preferred embodiment. The most important function of the circuitry is to provide the HSWP signal on line 2441. This signal is generated by high sweep control circuit 6030. This signal is used by the A3 digital storage circuitry shown in FIG. 56 to control signal tracking and conversion. It is also used by the frequency control circuitry shown in FIG. 24 to control the sweep generator in that circuit (the sweep is in progress when the signal HSWP is high and is stopped immediately at any point during the sweep when the signal HSWP goes low). Several circuits in the RF section sweep under certain conditions. For example, when a front panel key is pressed the A15 processor described with respect to FIGS. 38A-D pulls HSWP low to immediately stop the sweep. The signal HSWP is caused to go high by the occurrence of a sweep trigger or by a command which is input over instrument bus 2200.

The fast sweep generator circuit 6020 produces a linear ramp voltage from zero volts to approximately plus 2.2 volts which is used as horizontal sweep for the CRT display. This signal is provided on line 6021. Data on instrument bus line 2200, lines 11 through 14 specify the fast sweep generator sweep time. The data is latched into register 6012 in fast sweep time control circuit 6010. The data on bus 2200 is strobed into register 6012 when the address line on address bus 2298 is address 51 and strobe signal LTIO occurs. Once the value is loaded into register 6012, switchable current sources 6015 provide the control signals on line 6016 and 6017 which are used along with the most significant bit signal on line 6018 by fast sweep generator 6020 to provide the fast sweep ramp signal on line 6021.

Fast sweep control 6050 contains circuitry for the end of sweep detection and controls fast sweep dead time as well as fast sweep triggering. End of sweep detection is determined as follows: When the sweep ramp signal on line 6021 reaches about 2.2 volts, flip-flop 6052 is set and generates the signal on line 6053. This causes discharge switch 6026 to discharge timing capacitors 6023. This signal LRTRC on line 6053 is high during the sweep and supplies the retrace blanking signal to the intensity control circuitry shown in FIG. 59.

Multivibrator circuit 6057 controls the sweep dead time. The multivibrator is triggered at the end of the fast sweep ramp and holds flip-flop 6052 and 6053 reset for a time which is determined by the RC network 6056. In the preferred embodiment, the dead time is about 15 microseconds for sweep times and from one microsecond through 100 milliseconds and about 120 microseconds for sweep times from 200 microseconds through 10 milliseconds. Sweep trigger circuit 6040 produces triggers for all sweep times. It contains the video, external and line trigger circuits. The fast sweep free run oscillator 6042 triggers multiplexer circuit 6044 which provides the desired trigger signal on line 6049 and the fast sweep auto trigger circuit 6046. A valid trigger signal is provided on line 6049 when a negative going transition at the selected input of trigger multiplexer 6044 occurs. This trigger signal will start a sweep only if the fast sweep control circuit 6050 and the high sweep control circuit 6030 are in the proper states. Note that the trigger source desired is latched into trigger register 6041 and is received via data bus 2200.

In fast sweep mode, the X output of the line generator circuitry of FIG. 57 on line 5795 and the fast sweep ramp must be multiplexed to the X deflection amplifier shown in FIG. 61 to produce the display consisting of the graticule and characters with the fast sweep ramp and the analog video signal. The video signal from the video processor shown in FIG. 50 is multiplexed to the Y deflection amplifier shown in FIG. 60, when the fast sweep ramp is multiplexed to the X deflection amplifier. In fast sweep mode, the output from the line generator circuits of FIG. 57 is applied to the CRT deflection amplifiers following the completion of at least one fast sweep ramp.

To provide uniform intensity between the fast sweep trace and the other information displayed on the CRT, the fast sweep intensity control circuit 6070 generates a voltage to control the CRT beam intensity (Z-axis) when the fast sweep ramp is being multiplexed with the other signals. The FSZ signal is dependent on the duty cycle of the fast sweep ramp, i.e., the ratio of time during which the ramp is in progress to the sum of dead time and sweep time. In the preferred embodiment, this signal FSZ varies from about 150 millivolts for low beam intensity for high duty cycle operation to about 2 volts (high beam intensity for very low duty cycle operation). The signal LRTRC on line 6053 high during the fast sweep ramp provides a digital waveform which is averaged and inverted by transistors 6071 and its associated circuitry. This provides an output voltage to transistor 6072 that is dependent on the average value of the LRTRC signal.

Note that the signal HSWP on line 2441 may be cleared by setting instrument bus 2200 bit 13 high, selecting address 50 which will cause HSWP to be cleared at the next occurrence of strobe signal LTIO. Note that the signal HSWP may also be cleared by the digital control circuitry of FIG. 54 which provides the signal RSHS on line 6031.

FIGS. 61A and 61B show the X and Y deflection amplifiers which provide the drive signals to the CRT horizontal and vertical deflection plates.

Referring now to FIG. 62, there is shown the Z-axis circuitry of the preferred embodiment. This circuit receives two control signals from the intensity control circuitry shown in FIG. 58. One of these is a Z-axis signal on line 5998 which is a zero to 2 volt signal which is proportional to the CRT writing rate; the other is the blanking signal BLANK on line 5852. The Z signal after attenuation by the front panel intensity potentiometer 6222 drives the input stage of an amplifier comprising transistors 6226 and 6227. This amplifier supplies a differential current output to the focus gate amplifier circuitry 6250 and through the blanking switch circuitry 6210 to the control gate amplifier 6240.

The control gate amplifier 6240 is a virtual ground current summing junction. When the signal BLANK on line 5852 is low, transistor 6215 is off and the output of the control gate amplifier 6240 on line 6243 drops to a few volts blanking the CRT display.

The focus gate amplifier supplies a correction voltage on line 6253 to the focus grid of the CRT to compensate for defocusing effects which occur with varying intensity levels. The magnitude of this correction voltage is set by focus gain adjustment 6251.

FIG. 63 shows the schematic diagram of the keyboard switches of the preferred embodiment. Also shown is the circuitry for the status indicators which are activated as described in more detail above.

Refer to U.S. Pat. No. 4,253,152 issued Feb. 24, 1981 for computer printout.

15/842 20/842 25/842 30/842 35/842 40/842 45/842 50/842 55/842 60/842 65/842 70/842 75/842 80/842 85/842 90/842 95/842 100/842 105/842 110/842 115/842 120/842 125/842 130/842 135/842 140/842 145/842 150/842 155/842 160/842 165/842 170/842 175/842 180/842 185/842 190/842 195/842 200/842 205/842 210/842 215/842 220/842 225/842 230/842 235/842 240/842 245/842 250/842 255/842 260/842 265/842 270/842 275/842 280/842 285/842 290/842 295/842 300/842 305/842 310/842 315/842 320/842 325/842 330/842 335/842 340/842 345/842 350/842 355/842 360/842 365/842 370/842 375/842 380/842 385/842 390/842 395/842 400/842 405/842 410/842 415/842 420/842 425/842 430/842 435/842 440/842 445/842 450/842 455/842 460/842 465/842 470/842 475/842 480/842 485/842 490/842 495/842 500/842 505/842 510/842

We claim:

1. Apparatus for use in the analysis of an input signal, said apparatus comprising:

input means for providing an intermediate frequency signal in response to said input signal and a sampling signal;

signal processing means coupled to said input means for providing a first digital signal representing amplitude levels at a plurality of preselected frequency values in response to said intermediate frequency signal, said signal processing means including first detector means for detecting maximum signal amplitude during frequency intervals defined between said preselected frequency values and for providing a first detection signal in response thereto;

a second detector means coupled to said signal processing means for detecting minimum signal amplitude values and for providing a second detection signal in response thereto;

first hold means coupled to said signal processing means for retaining a representation of maximum signal amplitude detected during a frequency interval until reset to a first reset level by a first reset control signal;

memory means coupled to said signal processing means for storing electrical representations of amplitude values in response to said digital signal, said first detection signal, and said second detection signal.

2. The apparatus as in claim 1 wherein said signal processing means includes second hold means for retaining a representation of minimum signal amplitude detected during a frequency interval until reset to a second reset level by a second reset control signal.

3. Apparatus as in claim 2 and further comprising display means coupled to said memory means for providing a waveform display in response to display control signals and said electrical representations; and display control means coupled to said display means for providing said display control signals.

4. The apparatus as in claim 3 wherein said display control means causes said waveform display to comprise the alternate display of the maximum and minimum amplitudes detected by said first and second detector means in response to a first amplitude display signal.

5. The apparatus as in claim 4 and further comprising third detector means for detecting noise in said input signal and for providing a noise control signal indicating the presence of noise in said input signal; and said display means causes the minimum amplitudes detected by said second detector means to be displayed in response to said noise control signal.

6. Apparatus as in claim 5 and further comprising first reset means coupled to said first hold means for providing said first reset signal in response to said maximum amplitude value being displayed by said display means.

7. The apparatus as in claim 3 and further comprising second reset means coupled to said second hold means for providing said second reset control signal at the termination of each frequency interval.

8. The apparatus as in claim 7 wherein said first detector means comprises first storage means for storing the maximum value detected by said first detector means at preselected sub-intervals of said frequency interval.

9. The apparatus as in claim 8 wherein said first storage means is reset to a first preselected reset value at the end of each frequency interval.

10. The apparatus as in claim 9 wherein said second detector means comprises second storage means for storing the minimum value detected by said second detector means at preselected sub-intervals of said frequency interval.

11. The apparatus as in claim 10 wherein said second storage means is reset to a second preselected reset value at the end of each frequency interval.

12. The apparatus as in claim 11 wherein said first and second preselected reset values comprise the amplitude of said input signal.

13. A method for use in providing an analysis of the frequency spectrum of an input signal from a first frequency to a last frequency, said method comprising the steps of:

receiving an input signal;

defining a predetermined number of data positions representing frequency values, said data positions being interspersed between said first frequency and said last frequency, said data positions defining frequency intervals therebetween;

detecting maximum amplitude values in said input signal for each frequency interval;

14. The method as in claim 13 and further comprising the step of detecting the occurrence of a decrease in signal amplitude with respect to a predetermined reference amplitude within a frequency interval.

15. The method as in claim 14 and further comprising the step of determining the occurrence of both an increase and a decrease in signal amplitude with respect to said preselected reference amplitude during a frequency interval.

16. The method as in claim 15 and further comprising the step of providing an indication that signal noise is present in response to said determination that there has been both an increase and a decrease in signal amplitude with respect to said preselected reference amplitude during a frequency interval.

17. The method as in claim 16 and further comprising the step of determining a minimum amplitude value during each frequency interval.

18. The method as in claim 17 and further comprising the step of alternately displaying said minimum and maximum amplitude values in response to said indication that signal noise is present in the input signal.

19. The method as in claim 18 and further comprising the steps of determining a new minimum signal amplitude at the completion of each frequency interval.

20. The method as in claim 19 and further comprising the step of preserving the maximum amplitude value detected during a frequency interval during a subsequent frequency interval;

determining a subsequent maximum amplitude value for the subsequent frequency interval; and displaying the greater of the maximum amplitude value or the subsequent maximum amplitude value.

determining minimum amplitude values during each frequency interval.

alternately displaying said minimum and maximum amplitude values; and detecting the occurrence of an increase in signal amplitude with respect to a preselected reference amplitude value within a frequency interval.

* * * * *